United States Patent
Wada et al.

(10) Patent No.: US 6,440,843 B1
(45) Date of Patent: Aug. 27, 2002

(54) SEMICONDUCTOR DEVICE AND METHOD FOR MANUFACTURING THE SAME

(75) Inventors: Junichi Wada; Atsuko Sakata; Tomio Katata, all of Yokohama; Takamasa Usui, Kawasaki; Masahiko Hasunuma; Hideki Shibata, both of Yokohama; Hisashi Kaneko, Fujisawa; Nobuo Hayasaka, Yokosuka; Katsuya Okumura, Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/556,961

(22) Filed: Apr. 21, 2000

Related U.S. Application Data

(62) Division of application No. 08/997,328, filed on Dec. 23, 1997, now Pat. No. 6,071,810.

(30) Foreign Application Priority Data

| Dec. 24, 1996 | (JP) | ............................................ 8-344264 |
| Dec. 24, 1996 | (JP) | ............................................ 8-344265 |
| Dec. 19, 1997 | (JP) | ............................................ 9-350382 |

(51) Int. Cl.$^7$ ............................................ H01L 23/58
(52) U.S. Cl. ..................................................... 438/635
(58) Field of Search ................................ 438/635, 637, 438/688, 658, 660, 663, 668

(56) References Cited

U.S. PATENT DOCUMENTS

| 5,227,329 A | 7/1993 | Kobayashi et al. | .......... 437/101 |
| 5,578,523 A | 11/1996 | Fiordalice et al. | .......... 437/190 |

FOREIGN PATENT DOCUMENTS

| JP | 59-154040 | 9/1984 |
| JP | 60-46024 | 3/1985 |
| JP | 61-258453 | 11/1986 |
| JP | 21-99838 | 8/1990 |
| JP | 7-66203 | 3/1995 |

*Primary Examiner*—Caridad Everhart
*Assistant Examiner*—Calvin Lee
(74) *Attorney, Agent, or Firm*—Finnegan, Henderson, Farabow, Garrett, & Dunner L.L.P.

(57) ABSTRACT

A method of manufacturing semiconductor device which comprises the steps of forming an insulating film on an Si substrate provided with a wiring layer, forming a contact hole connected to the wiring layer and a wiring groove in the insulating film, filling the contact hole with an Si film, successively forming an Al film and a Ti film all over the substrate, performing a heat treatment thereby to substitute the Al film for the Ti film, and to allow the Si film to be absorbed by the Ti film, whereby filling the contact hole and wiring groove with the Al film, and removing a Ti/Ti silicide which is consisting of Ti silicide formed through the absorption of the Si film by the Ti film and a superfluous Ti, whereby filling the contact hole with an Al plug and filling the wiring groove with an Al wiring.

3 Claims, 50 Drawing Sheets

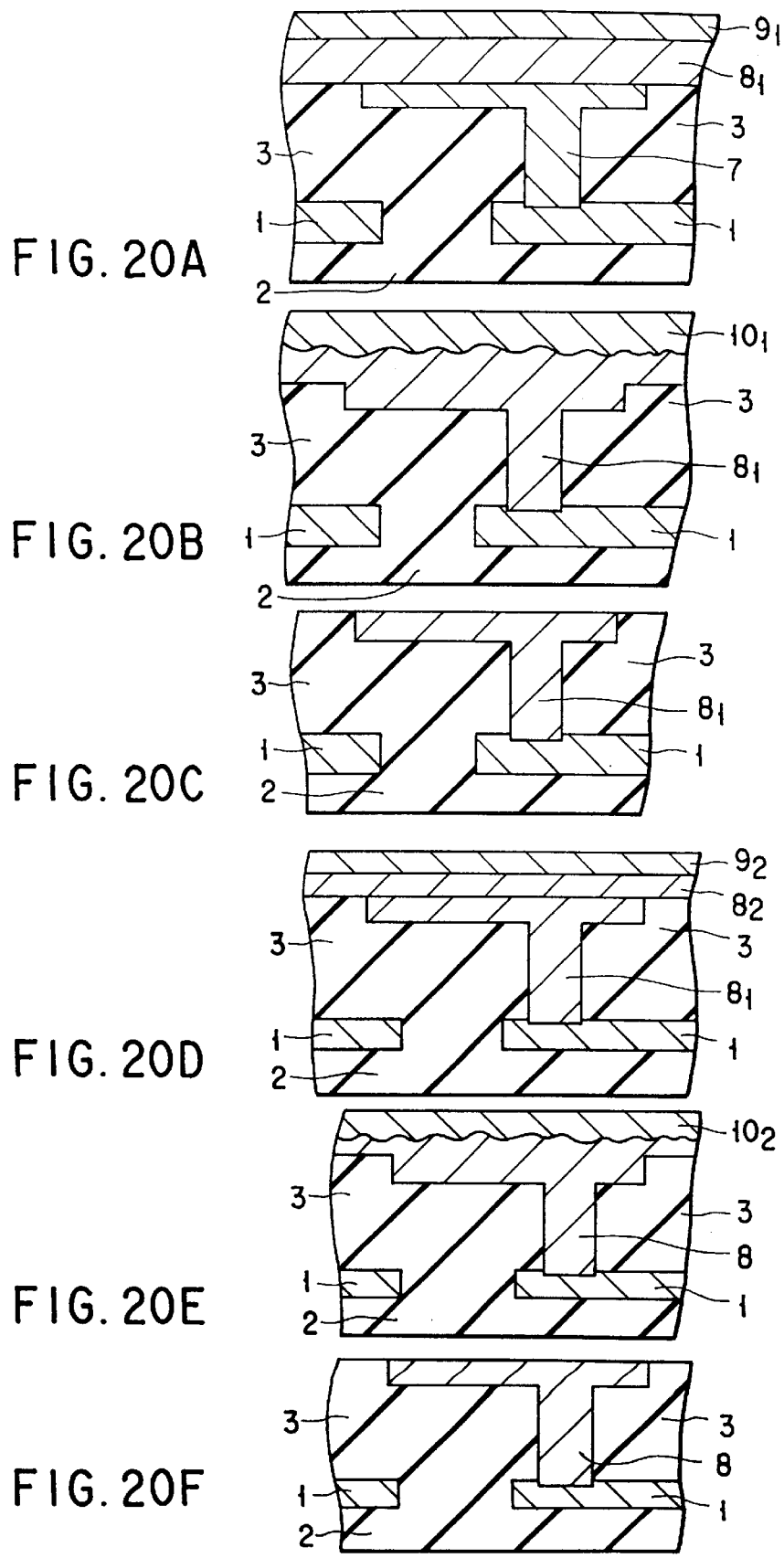

SEMICONDUCTOR DEVICE AND METHOD FOR MANUFACTURING THE SAME

This is a division of application Ser. No. 08/997,328, filed Dec. 23, 1997 now U.S. Pat. No. 6,071,810, all of which are incorporated herein by reference.

BACKGROUND OF THE INVENTION

This invention relates to a semiconductor device having a structure provided with contact holes and wiring grooves in an insulating film, and a method for manufacturing such a semiconductor device.

At present, a wiring comprising Al as a main constituent material is employed in a semiconductor device. In particular, the wiring most popularly employed is manufactured by a process wherein a barrier film for inhibiting the Al film from reacting with an underlying layer is formed under an Al film, or a antireflection film for inhibiting the irregular reflection of light at the occasion of lithography is formed on an Al film, and then these laminated films involving the Al film thus deposited are etched by means of RIE. Further, with an increase in integration density of LSI, the wiring is now demanded to be formed into a multi-layer wiring structure, thus necessitating a development of a plug-forming technique for making a connection between an upper wiring and a lower wiring.

On the other hand, with an increase in integration density of semiconductor devices, the wiring becomes increasingly fine, resulting in an decrease in cross-sectional area of the wiring and hence in an increase in wire resistance. Moreover, the distance between each wirings becomes narrower, resulting in an increase in inter-wiring capacity.

Such increases in wire resistance and in inter-wiring capacity lead to an RC delay, thus hindering the operation of LSI. With an increase in fineness of LSI, a multi-layer wiring is becoming more important as a factor for determining the operation speed of LSI. Therefore, the lowering in resistance of wiring as well as the lowering of dielectric constant of interlayer insulating film are now urgently desired.

As one of the conventional plug-forming techniques, W (tungsten)-CVD technique is known to be excellent in step coverage. FIG. 1A shows a cross-sectional view of the conventional multi-layer wiring structure which has been formed by making use of the W-CVD. technique. In FIG. 1A, the reference numeral 81 denotes an interlayer insulting film, 82 denotes a W plug and 83 denotes an Al wiring.

This W-CVD technique can be classified into two kinds, i.e. "blanket deposition" and "selective deposition". The "blanket deposition" is a method wherein a W film is deposited all over a substrate including the inner surface of contact holes. On the other hand, the "selective deposition" is a method wherein a W film is deposited selectively only on the bottom surface of contact holes.

Both methods are performed under a thermal condition which is different from each other. In the case of the "selective deposition", the interior of the contact holes can be filled with a W film in a single step. Whereas, in the case of the "blanket deposition", an etch-back step or a CMP step is required as a post treatment for removing part of W film which has been deposited outside the contact holes.

The W plug formed by making use of the aforementioned W-CVD technique is accompanied with problems that it is high in resistance and poor in EM (electromigration) resistance.

The EM is a phenomenon where Al atoms in an Al wiring are caused to move due to the collision thereof with electrons as an electric current is passed through the Al wiring. W is a material which is more resistive to EM as compared with Al. When an upper Al wiring and a lower Al wiring are connected with each other through a W plug, an accumulation of Al atoms takes place at the upstream side of the flow of Al atoms while a depletion of Al atoms takes place at the downstream side.

The accumulation of Al or depletion of Al of this kind may give rise to the generation of hillocks or voids, thus leading to a short circuit between wirings or a disconnection of wiring.

Further, in the case of the "blanket deposition", part of W film which has been deposited outside the. contact holes is required to be removed, thus leading to an increase in number of manufacturing step. On the other hand, in the case of the "selective deposition" where a step of removing W film deposited outside the contact holes is not required, the selectivity of deposition is frequently deteriorated at present so that a step of RIE etch-back is also required subsequently.

As an alternative plug-forming technique, an Al reflow technique is also known wherein a plug is formed by making use of Al which is lower in resistance than W. This method is featured in that it takes advantage of the fluidity through the surface diffusion of an Al film. This method is advantageous in that the interior of the contact hole can be filled with Al by simply heating a substrate, thus making it possible to decrease the number of the manufacturing step.

As a result of extensive studies, an underlying layer made for instance of Ti (titanium) which is excellent in wettability in relative to Al is frequently employed in the deposition of Al film. Furthermore, a two-step reflow method, wherein Al is sputtered at first without heating and then Al is sputtered again under a heated condition, is increasingly employed at present, since it is possible with this method to lower the fluidization temperature and to fill even a contact hole of high aspect ratio (A.R.) (aspect ratio=depth of contact hole/pore diameter of contact hole).

Additionally, there have been various proposals wherein a reflow technique is combined with a sputtering technique of high directivity, such as a low pressure-long distance sputtering, a collimation sputtering and an HDP (high density plasma) sputtering.

On the other hand, there is a problem in the aforementioned Al reflow technique that it is very difficult with this method to effectively fill a contact hole of high A.R. with Al. Since the Al reflow technique is based on sputtering, it is inherently poor in step coverage.

Thus, the film thickness of Al becomes relatively thin at the bottom portion of contact hole, and the Al may be agglomerated when it is heated for fluidization, generating voids in the Al film buried in the contact hole. For the purpose of overcoming this problem, a material such as Ti which is excellent in wettability to Al is employed as an underlying film as mentioned above, whereby preventing the agglomeration of Al.

However, when an underlying film is formed by a sputtering of Ti, an over-hang may be caused to develop at the opening portion of the contact hole, and the surface of Ti thus formed may become rugged. This rugged surface can be ascribed to the crystal face dependency of the crystal growth of Ti. The overhanging of Ti as well as the rugged surface of Ti prevents not only the adhesion of Al but also the reflow property of Al. Moreover, even if a directional sputtering of Ti is employed, it is almost impossible to deposit a sufficiently thick Al film on the side wall of contact hole according to the current technique.

Further, since Ti is reactive to Al, an $Al_3Ti$ film is formed on the bottom of contact hole, and this $Al_3Ti$ film may become a cause for deteriorating the EM resistance of the Al plug as in the case of the W plug.

The application of the Al reflow technique to a damascene structure or a dual damascene structure is recently studied. FIG. 1B illustrates a cross-sectional view of the conventional dual damascene multi-layer wiring structure which has been formed by making use of the Al reflow technique. In FIG. 1B, the reference numeral 84 denotes a Ti/TiN laminate film, 82 and 83 denotes an $Al_3Ti$ film.

This dual damascene structure (DD structure) can be obtained by a process wherein contact holes and wiring grooves are formed in advance in an insulating film, and, after the interiors of these contact holes and wiring grooves are concurrently filled with Al film in a single step, any excessive externally exposed Al film is removed by means of CMP (chemical mechanical polishing), whereby simultaneously forming Al wirings and Al plugs. It is possible, according to this dual damascene structure, to simplify the manufacturing process and to save the manufacturing cost.

However, when a Ti film is employed as an underlying film and the Al—DD structure is formed by making use of the Al reflow technique, the $Al_3Ti$ film may be formed also on the inner surface of the wiring grooves, since the wiring grooves are disposed at the upper portion of the contact hole. Since $Al_3Ti$ is high in electric resistance, the formation of $Al_3Ti$ within the wiring may invite a reduction of the effective volume of the Al film and an increase in wire resistance. This problem becomes more serious as the width of wiring becomes increasingly narrow.

As explained above, there have been proposed various kinds of plug-forming technique for filling a contact hole of high aspect ratio with a conductive material. Among them, the Al reflow technique is directed to the formation of a dual damascene structure. However, when the dual damascene structure is formed by making use of the Al reflow technique, $Al_3Ti$ is caused to be formed due to a Ti/TiN laminate film to be employed as an underlying film, thus giving rise to the problem of an increase in wire resistance.

Aside from the aforementioned conventional-methods, a method of covering a step portion (overhang portion) through a substitution between an Si film and an Al film has been proposed (Japanese Patent Unexamined Publication S/60-46024).

This method is known to be excellent in step coverage and can be performed by making use of the Si-CVD technique which has been employed in the manufacture of an LSI. Namely, according to this method, the overhang portion is covered in advance with an Si film, an Al film is then deposited on the Si film by means of sputtering, and the resultant layers are heat-treated thereby substituting the Al film for the Si film.

According to this method, it is possible to perform the covering of an overhang portion with an Al film, which could not be realized if only a sputtering method is employed, or to perform the filling of a contact hole of high aspect ratio with an Al film.

However, if the quantity of Si diffused into the Al film exceeds over the solid solution limit (the extent of solid solution) thereof in this method, an Si nodule (precipitation) may be formed at another location. If this Si nodule is formed within a wiring, it may become a cause for increasing the electric resistance of the wiring, and if this Si nodule is formed between wirings, it may become a cause for a short circuit between the wirings.

For the purpose of minimizing the development of Si nodule, there has been proposed a method wherein a Ti film is formed on an Al film, and then the Si diffused into the Al film is allowed to be trapped by making use of the Ti film (Japanese Patent Unexamined Publication S/63-70455).

According to this method, since the Si in the Al film can be absorbed by the Ti film, it is possible to suppress an increase in resistance of an Al—Si alloy wiring due to the Si nodule that may be generated at the bottom of contact hole during a heat treatment.

This method however is accompanied with a problem that since Ti is contained in the wiring, a high resistant $Al_3Ti$ is formed during heat treatment as in the case of the aforementioned reflow, so that the volume of Al in relative to the volume of wiring is substantially decreased, thus increasing the wire resistance. This problem of increase in wire resistance becomes more serious as the wiring becomes higher in integration and in fineness.

There is also proposed a method (Japanese Patent Unexamined Publication H/2-199838) which is substantially a combination of the method disclosed in Japanese Patent Unexamined Publication S/60-46024 and the method disclosed in Japanese Patent Unexamined Publication S/63-70455.

According to this method, the interior of contact hole is filled in advance with an Si film by making use of the Si-CVD technique, and then an Al film is substituted for the Si film, whereby making it possible to carry out the filling of a contact hole of high aspect ratio, any excessive Si film being absorbed by making use of a Ti film.

According to this method, it is possible to fill a contact hole of high aspect ratio with an Al film. The Al film is subsequently worked by means of RIE to form an Al wiring.

However, this method is accompanied with the following problems. Namely, the Al film to be obtained according to this method contains a product of high resistance such as $Al_3Ti$, which may be formed through a reaction between Ti silicide to be formed through an absorption of the Al film by the Ti film and the Al film, or through a reaction between an excessive Ti film which has not been served for the absorption of the Si film and the Al film.

Therefore, when the Al film containing a product of such a high resistance is worked by means of RIE to form an Al wiring, an Al wiring 83 containing a high resistance product 87 on its upper surface as. shown in FIG. 2A, or an Al wiring 83 containing a high resistance product 87 on its upper surface and side walls as shown in FIG. 2B would be obtained.

The Al wiring 83 containing such a high resistance product 87 is too high in resistance to use it as a fine wiring. The reference numeral 86 shown in these FIGS. 2A and 2B denotes a first wiring.

BRIEF SUMMARY OF THE INVENTION

This invention has been accomplished under the aforementioned circumstances, and the objects of-this invention is to provide a semiconductor device having a contact structure of high reliability that is formed in an insulating film provided with contact holes and wiring grooves.

Another object of this invention is to provide a method of manufacturing a semiconductor device having a contact structure of high reliability that is formed in an insulating film provided with contact holes and wiring grooves.

The present inventor has at first found but a method of manufacturing an Al damascene structure or an Al dual damascene structure, which is featured in that an Al film is substituted for an Si film at first, any superfluous portion of the Si film is allowed to be absorbed by a Ti film during or after the substitution, and reaction products which are high in resistance and formed between the Al film and Ti film or between the Ti film and Si film are removed by means of the CMP method. As matter of fact, it has been confirmed by the present inventor that the reaction products causing an increase in wire resistance can be easily removed, thus making it possible with this method to lower the resistance of the wiring.

It has been also found out by the present inventor that the aforementioned method is accompanied with various problems as explained below. Namely, the quantity of Si to be substituted becomes excessive depending on the layout of pattern at the occasion of carrying out the substitution between the Si film and the Al film after the interiors of the wiring groove and contact hole are filled with the Si film.

As a result, a long period of time is required for the substitution, thus lowering the throughput. Furthermore, a Si nodule tends to be partially developed, thus increasing the electric resistance of wiring if the nodule is formed on the wiring. The generation of the Al nodule may become a cause for generating a flaw in the subsequent CMP process. Namely, it has been found that the aforementioned method is accompanied with various problems to be solved before it is put into an actual use.

This invention has been accomplished with a view to solve the aforementioned problems.

[1] Namely, this invention provides; a method of manufacturing semiconductor device which comprises the steps of:

forming an insulating film on a semiconductor substrate provided with a conductive layer;

forming a contact hole through the insulating film to a depth reaching to the conductive layer and forming a wiring groove in the insulating film;

forming a substitutive film (a film to be substituted) so as to incompletely fill interiors of the contact hole and the wiring groove, but at least partially filling the interior of contact hole with the substitutive film;

forming a conductive film at a region comprising the contact hole and the wiring groove;

forming an absorption layer on the conductive film, and filling the interiors of the contact hole and the wiring groove with the conductive film by substituting the conductive film for the substitutive film and by allowing the substitutive film to be absorbed by the absorption layer under a heat treatment; and removing a compound formed in the process of allowing the substitutive film to be absorbed by the absorption layer, and forming a plug comprising the conductive film in the contact hole as well as a wiring comprising the conductive film in the wiring groove by working the conductive film so as to selectively leave the conductive film in the interiors of the contact hole and the wiring groove.

It has been also found as a result of studies made by the present inventor that if the quantity of Ti is too large, a void is more likely to be formed in the Al film. This phenomenon can be ascribed to the fact that when the Si filled in the wiring groove or in the contact hole is absorbed by the upper Ti layer so as to be substituted by Al, a reaction layer formed as a result of reaction of Si with Ti gives a stress to the Al film.

Namely, an AlTi compound layer is formed at the interface of Al/Ti in the heat treatment for effecting the substitution between Si and Al, and at the same time, the Si diffused through the Al film is caused to react with Ti to form a TiSi compound layer, thus giving rise to the generation of void in the Al film due to stress exerted by the AlTi compound layer and the TiSi compound layer. In particular, the stress gradient that will be given by the AlTi compound to the Al film is relatively large, so that some measures are required to suppress the formation of the AlTi compound.

The dual damascene structure comprises an Al wiring in the lower layer thereof, so that when the Si filled in the upper wiring groove and contact hole is substituted by Al, the void may be generated in this lower Al wiring layer too. When the lower wiring is not formed with an Al wiring but with W, the void can be observed in the interior of the upper wiring groove. This pattern dependency of void may be attributed to the phenomenon that the void tends to generate at a location which minimizes the surface free energy of the void.

The void may become a cause for a disconnection of wiring and for a deterioration of electromigration resistance or stress migration resistance, and hence some measures are required to be taken to solve the problems in actual use.

Followings are specific embodiments of the aforementioned method [1] of manufacturing a semiconductor device.

(a) The wiring groove is formed after the contact hole is formed.

(b) A barrier film or a CMP stopper layer is formed after the contact hole is formed, and then the wiring groove is formed.

(c) The contact hole is formed after the wiring groove is formed.

(d) A barrier film or a CMP stopper layer is formed after the wiring groove is formed, and then the contact hole is formed.

(e) A barrier film or a CMP stopper layer is formed after the contact hole and the wiring groove are formed.

(f) The contact hole and the wiring groove are formed after a barrier film or a CMP stopper layer is formed on the insulating film.

[2] This invention further provides; a method of manufacturing semiconductor device which comprises the steps of:

forming a first insulating film on a semiconductor substrate provided with a conductive layer;

forming a contact hole through the first insulating film to a depth reaching to the conductive layer;

forming a substitutive film in an interior of contact hole;

forming a second insulating film all over an upper surface of the substrate;

forming a wiring groove in the second insulating film in a manner to connect it with the substitutive film;

forming a conductive film at a region comprising the contact hole and the wiring groove;

forming an absorption layer on the conductive film, and filling the interiors of the contact hole and the wiring groove with the conductive film by substituting the conductive film for the substitutive film and by allowing the substitutive film to be absorbed by the absorption layer under a heat treatment; and removing a compound formed in the process of allowing the substitutive film to be absorbed by the absorption layer, and forming a plug comprising the conductive film in the contact hole as well as a wiring comprising the conductive film in the wiring groove by working the conductive film so as to selectively leave the conductive film in the interiors of the contact hole and the wiring groove.

Followings are specific embodiments of the aforementioned method [2] of manufacturing a semiconductor device.

(a) The contact hole is formed by means of RIE after an RIE stopper layer is formed on the first insulating film.

(b) A barrier film is formed after the contact hole is formed.

[3] This invention further provides; a method of manufacturing semiconductor device which comprises the steps of:

forming an insulating film on a semiconductor substrate provided with a conductive layer;

forming a contact hole through the insulating film to a depth reaching to the conductive layer;

forming a substitutive film at least in an interior of the contact hole;

forming a wiring groove in the insulating film;

forming a conductive film at a region comprising the contact hole and the wiring groove;

forming an absorption layer on the conductive film, and filling the interiors of the contact hole and the wiring groove with the conductive film by substituting the conductive film for the substitutive film and by allowing the substitutive film to be absorbed by the absorption layer under a heat treatment; and removing a compound formed in the process of allowing the substitutive film to be absorbed by the absorption layer, and forming a plug comprising the conductive film in the contact hole as well as a wiring comprising the conductive film in the wiring groove by working the conductive film so as to selectively leave the conductive film in the interiors of the contact hole and the wiring groove.

Followings are a specific embodiment of the aforementioned method [3] of manufacturing a semiconductor device.

(a) The contact hole is formed after a CMP stopper layer is formed on the first insulating film.

Followings are specific embodiments of the aforementioned methods [1] to [3] of manufacturing a semiconductor device.

(a) A substitutive film is formed all over the upper surface of the substrate to such a thickness that the substitutive film overflows from the contact hole, and then the substitutive film is etched back so as to selectively leave the substitutive film in the interior of the contact hole.

(b) A substitutive film is formed by means of a CVD method all over the upper surface of the substrate to such a thickness that the substitutive film overflows from the contact hole, and then the substitutive film is etched back so as to selectively leave the substitutive film in the interior of the contact hole.

(c) A substitutive film is formed by means of a CVD method all over the upper surface of the substrate to such a thickness that the substitutive film overflows from the contact hole, and then the substitutive film is etched back by means of a CDE etch-back method, an RIE etch-back method, a CMP method or at least two methods selected from these methods so as to selectively leave the substitutive film in the interior of the contact hole.

(d) The substitutive film is formed by means of a selective CVD method or a plating method.

(e) In subsequent to the formation of the absorption layer, the substrate is subjected to a heat treatment thereby to allow the substitutive film to be substituted by the conductive film and to allow the substitutive film to be absorbed by the absorption layer.

(f) In simultaneous with the formation of the absorption layer, the substrate is subjected to a heat treatment thereby to allow the substitutive film to be substituted by the conductive film and to allow the substitutive film to be absorbed by the absorption layer.

(g) The conductive film is formed by means of a sputtering method or a CVD method.

(h) The conductive film is formed by means of a reflow so as to cover a step portion formed by a formation of the wiring groove.

(i) The absorption layer is formed by means of a sputtering method or a CVD method.

(j) The absorption layer is formed without breaking vacuum after the conductive film is formed in a vacuum, or the absorption layer is formed after a native oxide film and/or impurities are removed subsequent to the formation of the conductive film in a vacuum.

(k) The removal of the absorption layer and the product, and the working of the conductive film are all performed by means of a CMP method, an RIE etch-back method, a CDE etch-back method, a wet etching method or a combination of at least two methods selected from these methods.

(l) The conductive film is formed of a material which exhibits a lower volume density when it is employed in a form of a non-crystalline structure as compared with when it is employed in a form of a crystalline structure.

(m) The conductive film is formed of a porous crystalline material or an amorphous material.

(n) The conductive film contains at least partially a crystal defect or a region containing a rare gas.

[4] This invention further provides; a semiconductor device which comprises:

a semiconductor substrate provided with a conductive layer;

an insulating film formed on the substrate and having a flat upper surface;

a plug and a wiring formed on the insulating film and filled in interiors of a contact hole connected with the conductive layer and of a wiring groove, respectively; and a barrier film interposed between a side wall of the contact hole and the conductive layer, between a side wall of the wiring groove and the wiring, and between a bottom of the wiring groove and the wiring.

[5] This invention further provides; a semiconductor device which comprises:

a semiconductor substrate provided with a conductive layer;

an insulating film formed on the substrate and having a flat upper surface;

a plug and a wiring formed on the insulating film and filled in interiors of a contact hole connected with the conductive layer and of a wiring groove, respectively; and a barrier film interposed between a side wall and bottom of the contact hole and the conductive layer, and between a side wall and bottom of the wiring groove and the wiring.

[6] This invention further provides; a semiconductor device which comprises:

a semiconductor substrate provided with a conductive layer;

an insulating film formed on the substrate and having a flat upper surface;

a plug and a wiring formed on the insulating film and filled in interiors of a contact hole connected with the conductive layer and of a wiring groove, respectively; and a barrier film interposed between a side wall and bottom of the contact hole and the conductive layer.

[7] This invention further provides; a semiconductor device which comprises:

a semiconductor substrate provided with a conductive layer;

an insulating film formed on the substrate and having a flat upper surface;

a plug and a wiring formed on the insulating film and filled in interiors of a contact hole connected with the conductive layer and of a wiring groove, respectively; and a barrier film interposed between a side wall and bottom of the wiring groove and the conductive layer.

Followings are specific embodiments of the aforementioned semiconductor devices [4] to [7].

(a) A CMP stopper layer or an insulating barrier film is formed on an entire surface of insulating film excluding a region where the contact hole and the wiring groove are located.

(b) A barrier film is formed on a surface of the wiring.

(c) The conductive layer, the wiring and the plug are all formed of the same material.

(d) The conductive layer, the wiring and the plug are all formed of Al, an Al alloy, Cu or a Cu alloy.

(e) The conductive layer, the wiring and the plug are all formed of Al, an Al alloy, Cu or a Cu alloy, and the barrier film is formed of a refractory metal or a refractory metal compound.

[8] This invention further provides; a method of manufacturing semiconductor device which comprises the steps of:

forming an insulating film on a semiconductor substrate provided with a conductive layer;

forming a contact hole through the insulating film to a depth reaching to the conductive layer and forming a wiring groove in the insulating film;

forming a substitutive film by means of a CVD method to a thickness which enables it to cover inner surfaces of the contact hole and the wiring groove and to incompletely fill interiors of the contact hole and the wiring groove;

filling almost entirely the interiors of the contact hole and the. wiring groove with a conductive film;

forming an absorption layer on the conductive film;

filling the interiors of the contact hole and the wiring groove completely with the conductive film by substituting the conductive film for the substitutive film and by allowing the substitutive film to be. absorbed by the absorption layer under a heat treatment; and removing a compound formed in the process of allowing the substitutive film to be absorbed by the absorption layer, and forming a plug comprising the conductive film in the contact hole as well as a wiring comprising the conductive film in the wiring groove by working the conductive film so as to selectively leave the conductive film in the interiors of the contact hole and the wiring groove.

[9] This invention further provides; a method of manufacturing semiconductor device which comprises the steps of:

forming an insulating film on a semiconductor substrate provided with a conductive layer;

forming a contact hole through the insulating film to a depth reaching to the conductive layer and forming a wiring groove in the insulating film;

forming a substitutive film by means of a CVD method to a thickness which enables it to cover inner surfaces of the contact hole and the wiring groove and to incompletely fill interiors of the contact hole and the wiring groove;

filling almost entirely the interiors of the contact hole and the wiring groove with a conductive film;

forming an absorption layer on the conductive film, and filling the interiors of the contact hole and the wiring groove completely with the conductive film by substituting the conductive film for the substitutive film and by allowing the substitutive film to be absorbed by the absorption layer under a heat treatment; and removing a compound formed in the process of allowing the substitutive film to be absorbed by the absorption layer, and forming a plug comprising the conductive film in the contact hole as well as a wiring comprising the conductive film in the wiring groove by working the conductive film so as to selectively leave the conductive film in the interiors of the contact hole and the wiring groove.

Followings are specific embodiments of the aforementioned methods [8] and [9] of manufacturing a semiconductor device.

(a) The conductive film is formed by means of a reflow method, a non-selective CVD method, a selective CVD method or a plating method, thereby filling almost entirely the interiors of the contact hole and the wiring groove with the conductive film.

(b) In subsequent to the formation of the conductive film by means of a sputtering method, the interiors of the contact hole and the wiring groove are filled almost entirely with the conductive film by means of a reflow method which enables the conductive film to be fluidized with heating.

(c) In subsequent to the formation of the conductive film by means of a sputtering method without heating, the conductive film is additionally formed by means of a sputtering method with heating, and then the interiors of the contact hole and the wiring groove are filled with the conductive film by means of a two-step reflow method which enables the conductive film to be fluidized.

(d) In subsequent to the formation of the conductive film by means of a directional sputtering method without heating, the conductive film is additionally formed by means of a sputtering method with heating, and then the interiors of the contact hole and the wiring groove are filled with the conductive film by means of a two-step reflow method which enables the conductive film to be fluidized.

(e) A barrier film is formed after the contact hole and the wiring groove are formed.

[10] This invention further provides; a method of manufacturing semiconductor device which comprises the steps of:

forming an insulating film on a semiconductor substrate provided with a conductive layer;

forming a contact hole through the insulating film to a depth reaching to the conductive layer and forming a wiring groove in the insulating film;

forming a substitutive film in the interiors of the contact hole and the wiring groove;

removing a native oxide film and/or impurities on a surface of the substitutive film;

forming a conductive film on a region comprising the contact hole and the wiring groove;

forming an absorption layer on the conductive film, and filling the interiors of the contact hole and the wiring groove with the conductive film by substituting the conductive film for the substitutive film and by allowing the substitutive film to be absorbed by the absorption layer under a heat treatment; and removing a compound formed in the process of allowing the substitutive film to be absorbed by the absorption layer, and forming a plug comprising the conductive film in the contact hole as well as a wiring comprising the conductive film in the wiring groove by working the conductive film so as to selectively leave the conductive film in the interiors of the contact hole and the wiring groove.

Followings are specific embodiments of the aforementioned method [10] of manufacturing a semiconductor device.

(a) The native oxide film and/or impurities are removed by means of a wet etching, a physical etching or a chemical etching.

(b) The native oxide film and/or impurities are removed by means of a wet etching, and then the surface of the substitutive film is subjected to a hydrogen termination treatment.

(c) After the native oxide film and/or impurities are removed by means of a physical etching, the substrate is kept in a vacuum until the conductive film is formed.

(d) After the native oxide film and/or impurities are removed by means of a chemical etching, the substrate is kept in a vacuum until the conductive film is formed.

[11] This invention further provides; a method of manufacturing semiconductor device which comprises the steps of:

forming an insulating film on a semiconductor substrate provided with a conductive layer;

forming a contact hole through the insulating film to a depth reaching to the conductive layer and forming a wiring groove in the insulating film;

forming a substitutive film to such a thickness that the interiors of the contact hole and the wiring groove are filled with the substitutive film and the substitutive film overflows from the contact hole and from the wiring groove;

removing the substitutive film in a vacuum by means of an RIE etch-back method or a CDE etch-back method to such an extent that the substitutive film is left remained at least in the interiors of the contact hole and the wiring groove;

forming a conductive film on a region comprising the contact hole and the wiring groove without breaking vacuum;

forming an absorption layer on the conductive film, and filling the interiors of the contact hole and the wiring groove with the conductive film by substituting the conductive film for the substitutive film and by allowing the substitutive film to be absorbed by the absorption layer under a heat treatment; and removing a compound formed in the process of allowing the substitutive film to be absorbed by the absorption layer, and forming a plug comprising the conductive film in the contact hole as well as a wiring comprising the conductive film in the wiring groove by working the conductive film so as to selectively leave the conductive film in the interiors of the contact hole and the wiring groove.

[12] This invention further provides; a method of manufacturing semiconductor device which comprises the steps of:

forming an insulating film on a semiconductor substrate provided with a conductive layer;

forming a contact hole through the insulating film to a depth reaching to the conductive layer and forming a wiring groove in the insulating film;

forming a substitutive film to such a degree that the interiors of the. contact hole and the wiring groove are filled with the substitutive film;

forming a conductive film on a region comprising the contact hole and the wiring groove in a heated condition which enables a native oxide film formed on a surface of the substitutive film to be decomposed through a reaction between the conductive film and the substitutive film during the formation of the conductive film;

forming an absorption layer on the conductive film, and filling the interiors of the contact hole and the wiring groove with the conductive film by substituting the conductive film for the substitutive film and by allowing the substitutive film to be absorbed by the absorption layer under a heat treatment; and removing a compound formed in the process of allowing the substitutive film to be absorbed by the absorption layer, and forming a plug comprising the conductive film in the contact hole as well as a wiring comprising the conductive film in the wiring groove by working the conductive film so as to selectively leave the conductive film in the interiors of the contact hole and the wiring groove.

Followings are a specific embodiment of the aforementioned method [12] of manufacturing a semiconductor device.

(a) The conductive film is formed by means of a thermal sputtering.

[13] This invention further provides; a method of manufacturing semiconductor device which comprises the steps of:

forming a conductive layer on a semiconductor substrate;

forming an insulating film to cover the conductive layer formed on the substrate;

forming a contact hole through the insulating film to a depth reaching to the conductive layer and forming a wiring groove in the insulating film;

removing a native oxide film and/or impurities on a surface of the substitutive film, which has been exposed at a bottom of the contact hole;

forming a substitutive film at least in the interiors of the contact hole;

forming a conductive film on a region comprising the contact hole and the wiring groove;

forming an absorption layer on the conductive film, and filling the interiors of the contact hole and the wiring groove with the conductive film by substituting the conductive film for the substitutive film and by allowing the substitutive film to be absorbed by the absorption layer under a heat treatment; and removing a compound formed in the process of allowing the substitutive film to be absorbed by the absorption layer, and forming a plug comprising the conductive film in the contact hole as well as a wiring comprising the conductive film in the wiring groove by working the conductive film so as to selectively leave the conductive film in the interiors of the contact hole and the wiring groove.

Followings are specific embodiments of the aforementioned method [13] of manufacturing a semiconductor device.

(a) After the native oxide film and/or impurities are removed in a vacuum by means of a physical etching or a chemical etching employing a halogen gas as an etching gas, the substrate is kept in a vacuum until the substitutive film is formed.

(b) After the native oxide film and/or impurities are removed by means of a physical etching or a chemical etching employing a halogen gas as an etching gas, the conductive film is formed by making use of a single-wafer processing type CVD apparatus, wherein the entire process beginning from the removal of the native oxide film and/or impurities until the formation of the substitutive film is finished is performed in a vacuum so as to prevent a reoxidation of the surface of the conductive layer.

(c) After the native oxide film and/or impurities are removed by means of a physical etching or a chemical etching employing a halogen gas as an etching gas, the conductive film is formed by making use of a high-speed single-wafer processing type CVD apparatus, wherein the entire process beginning from the removal of the native oxide film and/or impurities until the formation of the substitutive film is finished is performed in a vacuum so as to prevent a reoxidation of the surface of the conductive layer.

(d) After the native oxide film and/or impurities are removed by means of a chemical etching employing a halogen gas as an etching gas, the conductive film is formed by making use of a batch type CVD apparatus, wherein the entire process beginning from the removal of the native oxide film and/or impurities until the formation of the substitutive film is finished is performed in a vacuum so as to prevent a reoxidation of the surface of the conductive layer.

(e) The native oxide film and/or impurities are removed in a vacuum by means of a reduction reaction employing a reducing agent.

(f) After the native oxide film and/or impurities are removed, a barrier film is formed.

[14] This invention further provides; a method of manufacturing semiconductor device which comprises a step of:

substituting a conductive film for a substitutive film in the interior of a contact hole and/or a wiring groove, the conductive film being formed in advance on the substitutive film, rendering the substitutive film to be absorbed by an absorption layer to form a compound, whereby filling the contact hole and/or the wiring groove with the conductive film; and wherein the conductive film is formed to have a roughened surface whereby increasing a contact area thereof with the absorption layer.

Followings are a specific embodiment of the aforementioned method [14] of manufacturing a semiconductor device.

(a) The conductive film is formed in a heated condition thereby forming a roughened surface.

[15] This invention further provides; a method of manufacturing semiconductor device which comprises a step of:

substituting a conductive film for a substitutive film in the interior of a contact hole and/or a wiring groove, the conductive film being formed in advance on the substitutive film, and rendering the substitutive film to be absorbed by an absorption layer to form a compound, whereby filling the contact hole and/or the wiring groove with the conductive film; and wherein the conductive film formed is heat-treated whereby rendering the element of the substitutive film to diffuse into the conductive film, and then the absorption layer formed subsequently is heat-treated whereby rendering the element diffused into the conductive film to be absorbed by the absorption layer.

[16] This invention further provides; a method of manufacturing semiconductor device which comprises a step of:

substituting a conductive film for a substitutive film in the interior of a contact hole and/or a wiring groove, the conductive film being formed in advance on the substitutive film, and rendering the substitutive film to be absorbed by an absorption layer to form a compound, whereby filling the contact hole and/or the wiring groove with the conductive film; and wherein the conductive film and the absorption layer are successively formed and then heat-treated whereby rendering the element of the substitutive film in the conductive film to be absorbed by the absorption layer.

Followings are a specific embodiment of the aforementioned method [16] of manufacturing a semiconductor device.

(a) After the heat treatment, the heat treatment for rendering the element of the substitutive film in the conductive film to be absorbed by the absorption layer is performed at least once more.

[17] This invention further provides; a method of manufacturing semiconductor device which comprises the steps of:

forming an insulating film on a semiconductor substrate provided with a conductive layer;

forming a contact hole through the insulating film to a depth reaching to the conductive layer and forming a wiring groove in the insulating film;

forming a substitutive film at least in the interiors of the contact hole and the wiring groove;

forming a conductive film containing a plurality of absorption bodies on a region comprising the contact hole and the wiring groove;

filling the interiors of the contact hole and the wiring groove with the conductive film by substituting the conductive film for the substitutive film and by allowing the substitutive film to be absorbed by the absorption layer under a heat treatment; and removing a compound formed in the process of allowing the substitutive film to be absorbed by the absorption layer, and forming a plug comprising the conductive film in the contact hole as well as a wiring comprising the conductive film in the wiring groove by working the conductive film so as to selectively leave the conductive film in the interiors of the contact hole and the wiring groove.

[18] This invention further provides; a method of manufacturing semiconductor device which comprises the steps of:

forming an insulating film on a semiconductor substrate provided with a conductive layer;

forming a contact hole through the insulating film to a depth reaching to the conductive layer;

forming a substitutive film in the interior of the contact hole;

forming a conductive film having at the bottom thereof a plurality of absorption bodies, the absorption bodies also formed on a region excluding the contact hole;

filling the interior of the contact hole with the conductive film by substituting the conductive film for the substitutive film and by allowing the substitutive film to be absorbed by the absorption layer under a heat treatment; and removing a compound formed in the process of allowing the substitutive film to be absorbed by the absorption layer, and forming a plug comprising the conductive film in the contact hole by working the conductive film so as to selectively leave the conductive film in the interior of the contact hole.

[19] This invention further provides; a method of manufacturing semiconductor device which comprises the steps of:

forming an insulating film on a semiconductor substrate provided with a conductive layer;

forming a contact hole through the insulating film to a depth at least reaching to the conductive layer and forming a substitutive film in an interior of a wiring groove;

forming a conductive film having at the bottom thereof a plurality of absorption bodies, the absorption bodies also formed on a region excluding the contact hole;

filling the interiors of the contact hole and the wiring groove with the conductive film by substituting the conductive film for the substitutive film and by allowing the substitutive film to be absorbed by the absorption layer under a heat treatment; and removing a compound formed in the process of allowing the substitutive film to be absorbed by the absorption layer, and forming a plug comprising the conductive film in the contact hole as well as a wiring comprising the conductive film in the wiring groove by working the conductive film so as to selectively leave the conductive film in the interiors of the contact hole and the wiring groove.

[20] This invention further provides; a method of manufacturing semiconductor device which comprises the steps of:

forming an insulating film on a semiconductor substrate provided with a conductive layer;

forming an absorption layer on the insulating film;

forming a contact hole through the insulating film to a depth at least reaching to the conductive layer and a wiring groove, and working the absorption layer to obtain a plurality of partitioned absorption bodies;

forming a substitutive film in the interiors of the contact hole and the wiring groove;

forming a conductive film in a region comprising the contact hole, the wiring groove and the plurality of absorption bodies;

filling the interiors of the contact hole and the wiring groove with the conductive film by substituting the conductive film for the substitutive film and by allowing the substitutive film to be absorbed by the absorption layer under a heat treatment; and removing a compound formed in the process of allowing the substitutive film to be absorbed by the absorption layer, and forming a plug comprising the conductive film in the contact hole as well as a wiring comprising the conductive film in the wiring groove by working the conductive film so as to selectively leave the conductive film in the interiors of the contact hole and the wiring groove.

[21] This invention further provides; a method of manufacturing semiconductor device which comprises the steps of:

forming an insulating film on a semiconductor substrate provided with a conductive layer;

forming a contact hole through the insulating film to a depth reaching to the conductive layer and forming a wiring groove in the insulating film;

forming a substitutive film at least in the interiors of the contact hole and the wiring groove;

forming a conductive film not containing an absorption layer on a region comprising the contact hole and the wiring groove;

filling the interiors of the contact hole and the wiring groove with the conductive film by substituting the conductive film for the substitutive film and by allowing the substitutive film to be absorbed by the absorption layer under a heat treatment; and removing a compound formed in the process of allowing the substitutive film to be absorbed by the absorption layer, and forming a plug comprising the conductive film in the contact hole as well as a wiring comprising the conductive film in the wiring groove by working the conductive film so as to selectively leave the conductive film in the interiors of the contact hole and the wiring groove.

Followings are specific embodiments of the aforementioned methods [20] and [21] of manufacturing a semiconductor device.

(a) The conductive film is formed in such a manner that a plurality of absorption bodies are existed in the same layer.

(b) The conductive film is formed by making use of a shadow mask in such a manner that a plurality of absorption bodies are existed at a desired location in the same layer.

(c) The conductive film is formed in such a manner that a plurality of absorption bodies are existed at a desired location in the same layer and at desired plural levels within the same layer.

(d) The conductive film is formed in such a manner that a plurality of absorption bodies are existed at a desired location in the same layer and at desired plural levels within the same layer, each absorption layer being horizontally off-set from another absorption layer disposed over or below the each absorption layer.

(e) The conductive film is formed by making use of a shadow mask in such a manner that a plurality of absorption bodies are existed at a desired location in the same layer and at desired plural levels within the same layer, each absorption layer being horizontally off-set from another absorption layer disposed over or below the each absorption layer.

(f) The plurality of absorption bodies contained in the conductive film are respectively formed as a laminate film constituting together with the conductive film a laminate layer.

(g) The quantity of the plurality of absorption bodies disposed over a layer containing a relatively large quantity of the substitutive film is made larger as compared with that of absorption bodies disposed over a layer containing a relatively small quantity of the substitutive film.

(h) The plurality of absorption bodies are formed by making use of ion-implanting.

(i) The absorption bodies are constituted by fine particles.

(j) The conductive film containing a plurality of absorption bodies therein is formed by depositing fine particles consisting of a constituent material of the conductive film and a constituent material of the absorption bodies on a region of substrate comprising the contact hole and the wiring groove.

(k) The conductive film containing a plurality of absorption bodies therein is formed by coating a dispersion containing fine particles consisting of a constituent material of the conductive film and a constituent material of the absorption bodies on a region of substrate comprising the contact hole and the wiring groove.

(l) The conductive film containing a plurality of absorption bodies therein is formed of a film comprising a mixture consisting of a constituent material of the conductive film and a constituent material of the absorption bodies.

(m) The conductive film containing a plurality of absorption bodies therein is formed of an amorphous film comprising a mixture consisting of a constituent material of the conductive film and a constituent material of the absorption bodies.

(o) The conductive film containing a plurality of absorption bodies therein is formed by means of sputtering method employing a first target consisting mainly of a constituent material of the conductive film and a second target consisting mainly of a constituent material of the absorption bodies.

(p) The conductive film containing a plurality of absorption bodies therein is formed by means of sputtering method employing a sputtering target comprising a mixture of a constituent material of the conductive film and a constituent material of the absorption bodies.

[22] This invention further provides; a method of manufacturing semiconductor device which comprises a step of:
  substituting a conductive film for a substitutive film in the interior of a contact hole and/or a wiring groove, the conductive film being formed in advance on the substitutive film, and rendering the substitutive film to be absorbed by an absorption layer to form a compound, whereby filling the contact hole and/or the wiring groove with the conductive film; and
  wherein the step is performed by repeating a heat treatment at least twice, each heat treatment being performed at a different temperature from each other, whereby rendering the element of the substitutive film to be substituted by the conductive film, and rendering the substitutive film to be absorbed by the absorption layer.

Followings are specific embodiments of the aforementioned method [22] of manufacturing a semiconductor device.
  (a) The heat treatment is performed in such a manner that a temperature of the final heat treatment is the lowest among that of other heat treatment(s).
  (b) The heat treatment is performed at a temperature which permits a formation of the compound as well as at a temperature which does permit a formation of the compound.

[23] This invention further provides; a method of manufacturing semiconductor device which comprises a step of:
  substituting a conductive film for a substitutive film in the interior of a contact hole and/or a wiring groove, the conductive film being formed in advance on the substitutive film, and rendering the substitutive film to be absorbed by an absorption layer to form a compound, whereby filling the contact hole and/or the wiring groove with the conductive film; and
  wherein the step is performed at first by means of heat treatment, whereby rendering the element of the substitutive film to be substituted by the conductive film, and rendering the substitutive film to be absorbed by the absorption layer, whereby producing the compound, and then by annealing the conductive film.

[24] This invention further provides; a method of manufacturing semiconductor device which comprises a step of substituting a conductive film for a substitutive film in the interior of a contact hole and/or a wiring groove, the conductive film being formed in advance on the substitutive film, and rendering the substitutive film to be absorbed by an absorption layer to form a compound, whereby filling the contact hole and/or the wiring groove with the conductive film; and which is featured to include the steps of:
  filling the interior of a contact hole and/or a wiring groove with a conductive film by substituting the conductive film formed on the substitutive film for the substitutive film filled in the interior of a contact hole and/or a wiring groove, and by rendering the substitutive film to be absorbed by a first absorption layer to form a first compound;
  removing the first compound and the conductive film disposed on a region other than the contact hole and the wiring groove;
  forming a second absorption layer on a surface of the conductive film left remained after the previous step;
  forming a second compound by rendering the substitutive film left remained in the conductive film to be absorbed by the second absorption layer by making use of a heat treatment; and
  removing the second absorption layer and the second compound.

[25] This invention further provides; a method of manufacturing semiconductor device which comprises a step of:
  filling a contact hole and/or a wiring groove with a conductive film through a substitution/absorption treatment, the substitution/absorption treatment being performed by substituting the conductive film for a substitutive film in the contact hole and/or the wiring groove, the conductive film being formed in advance on the substitutive film, and at the same time, by rendering the substitutive film to be absorbed by an absorption layer to form a compound; and
  wherein the step is performed by introducing into the conductive film an element which differs from constituent materials of the conductive film and the absorption layer during or after the substitution/absorption treatment.

Followings are specific embodiments of the aforementioned method [25] of manufacturing a semiconductor device.
  (a) The conductive film is formed of a single conductive element.
  (b) The element is an element which is capable of lowering the solid solution limit of the constituent material of the substitutive film in the conductive film after the substitution/absorption treatment, or an element which is capable of improving electromigration resistance or stress migration resistance of the conductive film.
  (c) The element is an element which is capable of improving electromigration resistance and/or stress migration resistance of the conductive film after the substitution/absorption treatment.
  (d) The element is introduced into the conductive film by forming a film containing the element on a surface of at least one of the substitutive film, the conductive film and the absorption layer.
  (e) The element is introduced into the conductive film by employing at least one of the substitutive film, the conductive film and the absorption layer, each containing the element.

(f) The element is introduced into the conductive film by forming a film containing the element and then rendering the element to enter into the conductive film by making use of a heat treatment.

(g) The element is introduced into the conductive film by forming a film containing the element and then rendering the element to enter into the conductive film by making use of a heat treatment, and a barrier film is formed at an interface between the film containing the element and the insulating film so as to prevent the film containing the element from directly contacting with the insulating film in which the contact hole and/or the wiring groove is formed.

(h) The element is introduced into the conductive film by forming a film containing the element and then rendering the element to enter into the conductive film by making use of a heat treatment, and a barrier film is formed at an interface between the film containing the element and the insulating film so as to prevent the film containing the element from directly contacting with the insulating film in which the contact hole and/or the wiring groove is formed, the barrier film being selected from the group consisting of a mono-layer film (such as an SiN film, a TiN film, a TaN film or WN film); and a laminate film (such as a Ti—Si—N film, a W—Si—N film or Ta—Si—N film).

[26] This invention further provides; a method of manufacturing semiconductor device which comprises a step of:
  filling a contact hole and/or a wiring groove with a conductive film through a substitution/absorption treatment, the substitution/absorption treatment being performed by substituting the conductive film for a substitutive film in the contact hole and/or the wiring groove, the conductive film being formed in advance on the substitutive film, and by rendering the substitutive film to be absorbed by an absorption layer to form a compound; and
  wherein a constituent material of the substitutive film to be combined with a constituent material of the absorption layer is selected so as to form the compound, and a diffusion velocity of the constituent material of the substitutive film in the conductive film at the substitution/absorption treatment temperature is higher than a diffusion velocity of the constituent material of the absorption layer in the conductive film.

Followings are specific embodiments of the. aforementioned method [26] of manufacturing a semiconductor device.

(a) A compound comprising the constituent material of substitutive film and the constituent material of absorption layer is produced at a faster rate than a compound comprising the constituent material of conductive film and the constituent material of absorption layer.

(b) A combination between the constituent material of substitutive film and the constituent material of conductive film is selected so as to produce a eutectic in the substitution/absorption treatment.

[27] This invention further provides; a method of manufacturing semiconductor device which comprises a step of filling a contact hole and/or a wiring groove formed in the same insulating film with a conductive film through a substitution between the substitutive film and the conductive film formed on the substitutive film, and which is featured to include the steps of:
  forming the conductive film in the interior of the wiring groove after the substitutive film is formed in the interior of the contact hole; and
  filling a contact hole and/or a wiring groove with a conductive film by substituting the conductive film for the substitutive film and by rendering the substitutive film to precipitate on the surface of the conductive film through a heat treatment.

[28] This invention further provides; a method of manufacturing semiconductor device which comprises a step of filling a contact hole and/or a wiring groove formed in the same insulating film with a conductive film through a substitution between the substitutive film and the conductive film formed on the substitutive film, and which is featured to include the steps of:
  forming the substitutive film in the interiors of the contact hole and the wiring groove;
  forming the conductive film in a region comprising the contact hole and the wiring groove;
  substituting the conductive film for the substitutive film and rendering the substitutive film to precipitate on the surface of the conductive film through a heat treatment; and
  removing the substitutive film protruded from the wiring groove, whereby forming a plug comprising the conductive film in the contact hole and/or a wiring comprising the conductive film in the wiring groove.

[29] This invention further provides; a method of manufacturing semiconductor device which comprises a step of filling a contact hole and/or a wiring groove formed in the same insulating film with a conductive film through a substitution between the substitutive film and the conductive film formed on the substitutive film, and which is featured to include the steps of:
  forming the substitutive film in the interiors of the contact hole and the wiring groove;
  forming the conductive film in a region comprising the contact hole and the wiring groove;
  forming a precipitation-promoting layer for precipitating the element of the substitutive film in a region neighboring to the conductive film;
  substituting the conductive film for the substitutive film and rendering the substitutive film to precipitate on the surface of the precipitation-promoting layer through a heat treatment; and
  removing the substitutive film protruded from the wiring groove, whereby forming a plug comprising the conductive film in the contact hole and/or a wiring comprising the conductive film in the wiring groove.

Followings are a specific embodiment of the aforementioned method [29] of manufacturing a semiconductor device.

(a) The precipitation-promoting layer is formed of the same element as that of the substitutive film.

[30] This invention further provides; a method of manufacturing semiconductor device which comprises a step of filling a contact hole and/or a wiring groove formed in the same insulating film with a conductive film through a substitution between the substitutive film and the conductive film formed on the substitutive film, and which is featured to include the steps of:
  forming the substitutive film in the interiors of the contact hole and the wiring groove;
  forming the conductive film in a region comprising the contact hole and the wiring groove;
  forming a precipitation-promoting layer for precipitating the element of the substitutive film in the conductive film, the precipitation-promoting layer containing a rare gas, crystal defects or impurities;
  substituting the conductive film for the substitutive film and rendering the substitutive film to precipitate on the surface of the precipitation-promoting layer through a heat treatment; and removing the substitutive film protruded from the wiring groove, whereby forming a plug comprising the conductive film in the contact hole and/or a wiring comprising the conductive film in the wiring groove.

[31] This invention further provides; a method of manufacturing semiconductor device which comprises a step of filling a contact hole and/or a wiring groove formed with a conductive film through a substitution between the substitutive film formed in the contact hole and/or the wiring groove and the conductive film formed on the substitutive film, and which is featured to include the steps of:

substituting the conductive film for the substitutive film by making use of a heat treatment in a gaseous atmosphere containing a material capable of producing a compound with the substitutive film, and rendering the compound to precipitate at an interface between the conductive film and the wiring groove and/or at an interface between the contact hole and the wiring groove; and removing the conductive film, the substitutive film and the compound which are protruded from the wiring groove.

Followings are a specific embodiment of the aforementioned method [31] of manufacturing a semiconductor device.

(a) The gaseous atmosphere contains N, O, H or at least two kinds of element selected from N, O and H.

[32] This invention further provides; a method of manufacturing semiconductor device which comprises a step of filling a contact hole and/or a wiring groove formed with a conductive film through a substitution between the substitutive film formed in the contact hole and/or the wiring groove and the conductive film formed on the substitutive film, and which is-featured to include a step of:

substituting the conductive film for the substitutive film by making use of a heat treatment in a gaseous atmosphere containing a material capable of producing a compound with the substitutive film, and removing the substitutive film by making use of a gas of the compound to be formed between the substitutive film and the material.

Followings are a specific embodiment of the aforementioned method [32] of manufacturing a semiconductor device.

(a) The gaseous atmosphere contains F, Br, Cl, I or at least two kinds of element selected from F, Br, Cl and I.

(b) A combination of a constituent material of the substitutive film, a constituent material of conductive film and a constituent material of the gaseous atmosphere is selected such that a compound to be produced through a reaction between constituent materials of the substitution film and gaseous atmosphere can be produced at a lower temperature as that of a compound to be produced through a reaction between constituent materials of the substitution film and conductive film.

(c) The gaseous atmosphere contains an ionized gas.

(d) A combination between the constituent material of substitutive film and the constituent material of conductive film is selected so as to produce a eutectic in the heat treatment.

(e) The constituent material of conductive film is Cu or a Cu alloy, and the constituent material of substitutive film is W, Ta, Nb, Bi, Si, Sn or Ti.

[33] This invention further provides; a method of manufacturing semiconductor device which comprises a step of forming a laminated insulating structure comprising at least two insulating films, each insulating film being provided with a contact hole and a wiring groove, each deposited with a substitutive film in the interior thereof, the step comprises the sub-steps of:

filling an interior of wiring groove of the uppermost insulating film with among the wiring grooves formed in the insulating films;

forming a conductive film on the uppermost insulating film;

forming an absorption layer in the conductive film, and filling the interiors of the contact hole and the wiring groove with the conductive film by substituting the conductive film for the substitutive film and by allowing the substitutive film to be absorbed by the absorption layer under a heat treatment; and removing a compound formed in the process of rendering the substitutive film to be absorbed by the absorption layer, and forming a plug comprising the conductive film in the contact hole as well as a wiring comprising the conductive film in the wiring groove by working the conductive film so as to selectively leave the conductive film in the interiors of the contact hole and the wiring groove.

Followings are specific embodiments of the aforementioned method [33] of manufacturing a semiconductor device.

(a) Each substitutive film filled in the wiring groove is connected with each other via the substitutive film filled in the contact hole.

(b) All of the substitutive films disposed within the insulating films of the laminated insulating structure are concurrently substituted by the conductive film by means of the heat treatment.

(c) Each substitutive film disposed within the insulating films of the laminated insulating structure is at least partially contacted with the absorption layer via the conductive film before the heat treatment.

(d) The substitutive film filled in the wiring groove formed in the uppermost insulating film of the laminated insulating structure is contacted with the absorption layer via the conductive film.

(e) The substitutive film is formed via a refractory metal film or via a high-melting point alloy film in the contact hole and the wiring groove formed in at least one of the insulating films of the laminated insulating structure before the heat treatment.

(f) A portion of the contact hole is not required to be employed in an electric circuit.

(g) The manufacturing method further comprises a step of forming an insulating film provided with a plurality of wiring grooves each filled with the substitutive film, which comprises the sub-steps of; forming a plurality of wiring grooves on the surface of the insulating film; forming the substitutive film all over the surface of the insulating film; and removing all of the substitutive film excluding those formed in a region of the plurality of wiring grooves.

[34] This invention further provides; a method of manufacturing semiconductor device which comprises the steps of:

forming a contact hole in an insulating film;

filling the contact hole with a plug containing a refractory metal;

forming a wiring groove in the insulating film;

forming a conductive film in a region including the wiring groove to a thickness, thereby allowing the conductive film to be protrude from the wiring groove;

removing the conductive film to an extent to allow the surface of the insulating film to be exposed, thereby filling the wiring groove with a wiring consisting of the conductive film; and forming a high-melting point conductive film containing a refractory metal on the wiring.

Followings are specific embodiments of the aforementioned method [34] of manufacturing a semiconductor device.

(a) The wiring groove is formed in a region including the plug in a manner to allow the plug to be left in the interior of the wiring groove.

(b) The plug is formed by means of a selective. CVD method in a process of filling the contact hole with the plug.

(c) A conductive film containing a refractory metal is formed to a height protruding from the contact hole in a region including the contact hole by means of a CVD method, and then a surface of the conductive film is etched back by means of a CMP method, a CDE etch-back method or an RIE etch-back method so as to fill the contact hole with a plug containing the refractory metal.

(d) A conductive film containing a refractory metal is formed as a plug in a region including the contact hole, and then the conductive film is fluidized by means of a reflow method so as to fill the wiring groove with the conductive film.

(e) The wiring groove is filled with a substitutive film, a conductive film is deposited on the substitutive film, and then the substitutive film is substituted by the conductive film, whereby forming the conductive film in a region including the wiring groove to a height protruding from the wiring groove.

(f) The plug is directly contacted with the high melting point conductive film.

(g) A treatment for removing a native oxide film by means of a physical etching or a wet etching is performed prior to the formation of the high-melting point conductive film.

(h) The plug is a tungsten plug.

[35] This invention further provides; a method of manufacturing semiconductor device which comprises a step of:

filling a contact hole and/or a wiring groove with a conductive film by substituting the conductive film for a substitutive film in the contact hole and/or the wiring groove, the conductive film being formed in advance on the substitutive film, and by rendering the substitutive film to be absorbed by an absorption layer; and wherein the absorption layer, a compound formed in the above process of absorbing the substitutive film by the absorption layer, and the conductive film are successively removed.

Followings are specific embodiments of the aforementioned method [35] of manufacturing a semiconductor device.

(a) The absorption layer, the compound and the conductive film are removed by means of a CMP method.

(b) The absorption layer is removed by means of a wet etching, a CDE etch-back method or an RIE etch-back method, and the compound and the conductive film are removed by means of a CMP method.

(c) The absorption layer and the compound are removed by means of a wet etching, a CDE etch-back method or an RIE etch-back method, and the conductive film is removed by means of a CMP method.

(d) The absorption layer, the compound and the conductive film are removed by means a wet etching, a CDE etch-back method or an RIE etch-back method.

[36] This invention further provides; a method of manufacturing semiconductor device which comprises the steps of:

forming an insulating film on a semiconductor substrate provided with a conductive layer;

forming a contact hole through the insulating film to a depth reaching to the conductive layer and forming a wiring groove in the insulating film;

forming a substitutive film containing a diffusion-promoting agent in the contact hole and/or the wiring groove;

forming a conductive film at a region comprising the contact hole and the wiring groove;

forming an absorption layer on the conductive film, and filling the interiors of the contact hole and the wiring groove with the conductive film by substituting the conductive film for the substitutive film and by allowing the substitutive film to be absorbed by the absorption layer under a heat treatment; and removing a compound formed in the process of allowing the substitutive film to be absorbed by the absorption layer, and forming a plug comprising the conductive film in the contact hole as well as a wiring comprising the conductive film in the wiring groove by working the conductive film so as to selectively leave the conductive film in the interiors of the contact hole and the wiring groove;

the diffusion-promoting agent functioning to promote an mutual diffusion between the substitutive film and the conductive film.

Followings are a specific embodiment of the aforementioned method [36] of manufacturing a semiconductor device.

(a) The diffusion-promoting agent is formed of boron, the conductive film is formed of an amorphous silicon film, the absorption layer is formed of titanium, and the compound is titanium silicide.

[37] This invention further provides; a method of manufacturing semiconductor device which comprises the steps of:

forming an insulating film on a semiconductor substrate provided with a conductive layer;

forming a contact hole through the insulating film to a depth reaching to the conductive layer and forming a wiring groove in the insulating film;

forming a substitutive film containing a diffusion-inhibiting agent in the contact hole and/or the wiring groove;

forming a conductive film at a region comprising the contact hole and the wiring groove;

forming an absorption layer on the conductive film, and filling the interiors of the contact hole and the wiring groove with the conductive film by substituting the conductive film for the substitutive film and by allowing the substitutive film to be absorbed by the absorption layer under a heat treatment; and removing a compound formed in the process of allowing the substitutive film to be absorbed by the absorption layer, and forming a plug comprising the conductive film in the contact hole as well as a wiring comprising the conductive film in the wiring groove by working the conductive film so as to selectively leave the conductive film in the interiors of the contact hole and the wiring groove;

the diffusion-inhibiting agent functioning to react with the absorption film to form a diffusion-inhibiting film to inhibit the absorption film from diffusing into the conductive film, and the location of the diffusion-inhibiting film being at or near an interface between the absorption film and the conductive film.

Followings are specific embodiments of the aforementioned method [37] of manufacturing a semiconductor device.

(a) The diffusion-inhibiting agent is formed of boron, the conductive film is formed of an amorphous silicon film, the absorption layer is formed of titanium, the compound is titanium silicide, and the diffusion-inhibiting film is a titanium boride film.

(b) The substitutive film is formed by means of a CVD method employing a mixed gas containing plural kinds of feed gas.

(c) As the substitutive film, a boron-containing amorphous silicon film is formed by means of a CVD method employing a mixed gas containing disilane gas and diborane gas.

(d) As the substitutive film, a boron-containing amorphous silicon film is formed by means of a CVD method employing a mixed gas containing disilane gas and diborane gas at a temperature range which does not cause any deformation of the plug due to a thermal stress.

(e) As the substitutive film, a boron-containing amorphous silicon film is formed by means of a CVD method employing a mixed gas containing disilane gas and diborane gas at a temperature of not more than 400° C. which does not cause any deformation of the plug due to a thermal stress.

[38] This invention further provides; a method of manufacturing semiconductor device which comprises the steps of:

forming an insulating film on a semiconductor substrate provided with a conductive layer;

forming a contact hole through the insulating film to a depth reaching to the conductive layer and forming a wiring groove in the insulating film;

forming a substitutive film in the contact hole and the wiring groove;

successively forming an absorption layer and a conductive film at a region comprising the contact hole and the wiring groove;

filling the interiors of the contact hole and the wiring groove with the conductive film by substituting the conductive film for the substitutive film and by allowing the substitutive film to be absorbed by the absorption layer under a heat treatment; and removing a compound formed in the process of allowing the substitutive film to be absorbed by the absorption layer, and forming a plug comprising the conductive film in the contact hole as well as a wiring comprising the conductive film in the wiring groove by working the conductive film so as to selectively leave the conductive film in the interiors of the contact hole and the wiring groove.

[39] This invention further provides; a method of manufacturing semiconductor device which comprises the steps of:

forming an insulating film on a semiconductor substrate provided with a conductive layer;

forming a contact hole through the insulating film to a depth reaching to the conductive layer;

forming a substitutive film in the contact hole;

successively forming an absorption layer and a conductive film at a region comprising the contact hole;

filling the interior of the contact hole with the conductive film by substituting the conductive film for the substitutive film and by allowing the substitutive film to be absorbed by the absorption layer under a heat treatment; and removing a compound formed in the process of allowing the substitutive film to be absorbed by the absorption layer, and forming a plug comprising the conductive film in the contact hole by working the conductive film so as to selectively leave the conductive film in the interior of the contact hole.

[40] This invention further provides; a method of manufacturing semiconductor device which comprises the steps of:

forming an insulating film on a semiconductor substrate provided with a conductive layer;

forming a contact hole through the insulating film to a depth reaching to the conductive layer and forming a wiring groove in the insulating film;

forming a substitutive film in the contact hole and/or the wiring groove;

forming a conductive film at a region comprising the contact hole and the wiring groove;

forming a diffusion-inhibiting layer on the conductive film;

forming an absorption layer on the diffusion-inhibiting layer and filling the interiors of the contact hole and the wiring groove with the conductive film by substituting the conductive film for the substitutive film and by allowing the substitutive film to be absorbed by the absorption layer under a heat treatment; and forming a plug comprising the conductive film in the contact hole as well as a wiring comprising the conductive film in the wiring groove by working the conductive film so as to selectively leave the conductive film in the interiors of the contact hole and the wiring groove.

[41] This invention further provides; a method of manufacturing semiconductor device which comprises the steps of:

forming an insulating film on a semiconductor substrate provided with a conductive layer;

forming a contact hole through the insulating film to a depth reaching to the conductive layer and forming a wiring groove in the insulating film;

forming a substitutive film in the contact hole and/or the wiring groove;

forming a conductive film at a region comprising the contact hole and the wiring groove;

forming an absorption layer on the conductive film and forming a diffusion-inhibiting layer and filling the interiors of the contact hole and the wiring groove with the conductive film by substituting the conductive film for the substitutive film and by allowing the substitutive film to be absorbed by the absorption layer under a heat treatment; and forming a plug comprising the conductive film in the contact hole as well as a wiring comprising the conductive film in the wiring groove by working the conductive film so as to selectively leave the conductive film in the interiors of the contact hole and the wiring groove;

the heat treatment being performed at first at a lower temperature thereby to form the diffusion-inhibiting layer, and then at a higher temperature thereby to accelerate the absorption of the substitutive film by the absorption layer.

[42] This invention further provides; a method of manufacturing semiconductor device which comprises the steps of:

forming an insulating film on a semiconductor substrate provided with a conductive layer;

forming a contact hole through the insulating film to a depth reaching to the conductive layer and forming a wiring groove in the insulating film;

forming a substitutive film containing a diffusion-promoting agent in the contact hole and/or the wiring groove;

forming a conductive film at a region comprising the contact hole and the wiring groove;

forming an absorption layer on the conductive film, and filling the interiors of the contact hole and the wiring groove with the conductive film by substituting the conductive film for the substitutive film and by allowing the substitutive film to be absorbed by the absorption layer under a heat treatment; and removing a compound formed in the process of allowing the substitutive film to be absorbed by the absorption layer, and forming a plug comprising the conductive film in the contact hole as well as a wiring comprising the conductive film in the wiring groove by working the conductive film so as to selectively leave the conductive film in the interiors of the contact hole and the wiring groove;

a combination of the temperature and time of the heat treatment being controlled such that the total of: the resistive component of the conductive film originating from the constituent material of the substitutive film remaining in the conductive film filled in the contact hole and wiring groove and the resistive component of the conductive film originating from the constituent material of the absorption layer remaining in the conductive film filled in the contact hole and wiring groove becomes minimum or nearly minimum.

[43] This invention further provides; a method of manufacturing semiconductor device which comprises a step of:

filling a contact hole and/or a wiring groove with a conductive film through a substitution/absorption treatment, the substitution/absorption treatment being performed by substituting the conductive film for a substitutive film in the contact hole and/or the wiring groove, the conductive film being formed in advance on the substitutive film, and by rendering the substitutive film to be absorbed by an absorption layer to form a compound; and wherein the substitution/absorption treatment is performed in a gaseous atmosphere which enables the constituent material of the absorption layer that has been diffused through the conductive film to be discharged out of the conductive film; or an additional heat treatment is performed after the substitution/absorption treatment in a gaseous atmosphere which enables the constituent material of the absorption layer that is remained in the conductive film to be discharged out of the conductive film.

[44] This invention further provides; a method of manufacturing semiconductor device which comprises a step of:

filling a contact hole and/or a wiring groove with a conductive film by substituting the conductive film formed on a substitutive film for the substitutive film filled in the contact hole and/or the wiring groove and by rendering the substitutive film to be absorbed by an absorption layer; and wherein a compound formed in the absorption of the substitutive film by the absorption layer is removed, and the conductive film is worked to selectively leave the conductive film in the interiors of the contact hole and the wiring groove, whereby forming a plug comprising the conductive film in the contact hole as well as a wiring comprising the conductive film in the wiring groove; and then a heat treatment is performed in a gaseous atmosphere which enables the constituent material of the absorption layer that is remained in the conductive film to be discharged out of the conductive film.

Followings are a specific embodiment of the aforementioned methods [42] to [44] of manufacturing a semiconductor device.

(a) The gaseous atmosphere contains N, O, H, C, B or at least two kinds of element selected from N, O, H, C and B.

[45] This invention further provides; a method of manufacturing semiconductor device which comprises a step of:

filling a contact hole and/or a wiring groove with a conductive film through a substitution/absorption treatment, the substitution/absorption treatment being performed by substituting the conductive film for a substitutive film in the contact hole and/or the wiring groove, the conductive film being formed in advance on the substitutive film, and by rendering the substitutive film to be absorbed by an absorption layer to form a compound; and wherein the compound is removed after the substitution/absorption treatment; the conductive film is worked to selectively leave the conductive film in the interiors of the contact hole and the wiring groove, whereby forming a plug comprising the conductive film in the contact hole as well as a wiring comprising the conductive film in the wiring groove; then the conductive film is heat-treated at a temperature which is higher than that of solid solution limit at the solid solution concentration of constituent material of the absorption layer remained in the conductive film and which is lower than the substitution/absorption treatment temperature, after which the conductive film is annealed, whereby discharging the constituent material of the absorption layer remained in the conductive film to be discharged out of the conductive film; and a reaction product layer containing the constituent material of the absorption layer that has been discharged on the surface of the conductive film is removed.

Followings are a specific embodiment of the aforementioned methods [42], [43] and [45] of manufacturing a semiconductor device.

(a) The reaction product layer is removed by means of an RIE etch-back method or a CMP method.

[46] This invention further provides; a method of manufacturing semiconductor device which comprises a step of:

filling a contact hole and/or a wiring groove with a conductive film through a substitution/absorption treatment, the substitution/absorption treatment being performed by substituting the conductive film for a substitutive film in the contact hole and/or the wiring groove, the conductive film being formed in advance on the substitutive film, and by rendering the substitutive film to be absorbed by an absorption layer to form a compound; and wherein the conductive film is formed on the substitutive film to such a thickness which is sufficient enough to reduce the quantity of constituent material of the absorption layer diffusing into the interior of the contact hole and wiring groove at the occasion of the substitution/absorption treatment.

[47] This invention further provides; a method of manufacturing semiconductor device which comprises a step of filling a contact hole and/or a wiring groove formed with a conductive film through a substitution between a substitutive film and the conductive film formed on the substitutive film, and which is featured to include the steps of:

forming the substitutive film in the interiors of the contact hole and the wiring groove;

forming the conductive film in a region comprising the contact hole and the wiring groove;

forming an absorption layer on the conductive film;

forming a film on the absorption layer, which is capable of giving a compressive stress in conformity with a tensile stress in the direction of the conductive film due to a voluminal change of the absorption layer;

substituting the conductive film for the substitutive film and allowing the substitutive film to be absorbed by the absorption layer under a heat treatment; and removing the substitutive film and absorption layer disposed higher than the wiring groove, whereby forming a plug comprising the conductive film in the contact hole as well as a wiring comprising the conductive film in the wiring groove.

[48] This invention further provides; a method of manufacturing semiconductor device which comprises a step of filling a contact hole and/or a wiring groove formed with a conductive film through a substitution between a substitutive film and the conductive film formed on the substitutive film, and which is featured to include the steps of:

forming the substitutive film in the interiors of the contact hole and the wiring groove;

forming the conductive film in a region comprising the contact hole and the wiring groove;

forming a film in the conductive film, which enables the constituent elements of the substitutive film and conductive film to pass therethrough and is capable of alleviating a tensile stress in the direction of the conductive film due to a voluminal change of the absorption layer;

forming an absorption layer on the conductive film;

substituting the conductive film for the substitutive film and allowing the substitutive film to be absorbed by the absorption layer under a heat treatment; and removing the substitutive film and absorption layer disposed higher than the wiring groove, whereby forming a plug comprising the conductive film in the contact hole as well as a wiring comprising the conductive film in the wiring groove.

[49] This invention further provides; a method of manufacturing semiconductor device which comprises a step of filling a contact hole and/or a wiring groove formed with a conductive film through a substitution between a substitutive film and the conductive film formed on the substitutive film, and which is featured to include the steps of:

forming the substitutive film in the interiors of the contact hole and the wiring groove;

forming the conductive film in a region comprising the contact hole and the wiring groove;

forming an absorption film which exhibits little change or shrinkage in volume in a heat treatment for substitution where the substitutive film is tendered to be absorbed by the absorption film;

substituting the conductive film for the substitutive film and allowing the substitutive film to be absorbed by the absorption layer under a heat treatment; and removing the substitutive film and absorption layer disposed higher than the wiring groove, whereby forming a plug comprising the conductive film in the contact hole as well as a wiring comprising the conductive film in the wiring groove.

In the aforementioned method of manufacturing a semiconductor device, the constituent material of the conductive film may be selected from Al and an Al alloy; the constituent material of the substitutive film may be selected from Si and Ge; and the constituent material of the absorption layer may be selected from Ti, Hf, V, Zr, W, Co, Ni, Pd and Fe.

[50] This invention further provides; a semiconductor device which comprises:

a semiconductor substrate;

an insulating film formed on the substrate and having a recessed portion; and a conductive film formed in the recessed portion;

the conductive film containing a trace amount of a substance having a lower melting point than that of element mainly constituting the conductive film.

[51] This invention further provides; a semiconductor device which comprises:

a semiconductor substrate;

an insulating film formed on the substrate and having a recessed portion;

a thin film formed at least partially on an inner surface of the recessed portion and consisting of a barrier metal or a material exhibiting a higher surface energy than that of the insulating film; and a conductive film formed in the recessed portion;

the conductive film containing a substance having a lower melting point than that of element mainly constituting the conductive film, a quantity of the substance being not more than a maximum concentration thereof that can be solid-solubilized.

Followings are specific embodiments of the aforementioned semiconductor devices [50] and [51].

(a) The maximum concentration of the substance that can be solid-solubilized is selected such that, when the element mainly constituting the conductive film and the lower melting point substance are in a state of solid-liquid equilibrium, it corresponds to a maximum concentration of the lower melting point substance in the solid phase consisting of the element and the lower melting point substance which is equilibrated with the liquid phase.

(b) The element mainly constituting the conductive film and the substance having a lower melting point than that of element mainly constituting the conductive film are capable of forming an eutectic.

(c) The element mainly constituting the conductive film is at least one element selected from the group consisting of Al, Cu, Ag, W, Si, Ge and SiGe.

(d) The substance having a lower melting point than that of element mainly constituting the conductive film (hereinafter referred to as a lower melting point substance) is at least one element selected from the group consisting of Sn, Ga, Hg and Ge, if the element mainly constituting the conductive film is Al; the lower melting point substance is Bi, if the element mainly constituting the conductive film is Cu; the lower melting point substance is Tl, if the element mainly constituting the conductive film is Ag; the lower melting point substance is at least one element selected from the group consisting of Ge, Ga, Bi, Sn and Ce, if the element mainly constituting the conductive film is W; the lower melting point substance is at least one element selected from the group consisting of Zn, In, Cd, Zg, Sn and Al, if the element mainly constituting the conductive film is Si, Ge or SiGe.

[52] This invention further provides; a method of manufacturing semiconductor device which comprises the steps of:

forming an insulating film on a semiconductor substrate;

forming a recessed portion in the insulating film;

forming a liquid phase containing a conductive element and a substance having a lower melting point than that of the conductive element in the recessed portion;

forming a conductive film at least in the recessed portion by shifting the composition of the liquid phase from an equilibrium composition to a composition where the conductive element is excessive, thereby precipitating the conductive element; and removing all of materials from the surface of the insulating film excluding those formed on the recessed portion.

[53] This invention further provides; a method of manufacturing semiconductor device which comprises the steps of:

forming an insulating film on a semiconductor substrate;

forming a recessed portion in the insulating film;

forming a barrier metal or a material exhibiting a higher surface energy than that of the insulating film forming a liquid phase containing a conductive element and a substance having a lower melting point than that of the conductive element in the insulating film;

forming a conductive film at least in the recessed portion by shifting the composition of the liquid phase from an equilibrium composition to a composition where the conductive element is excessive, thereby precipitating the conductive element; and removing all of materials from the surface of the insulating film excluding those formed on the recessed portion.

Followings are specific embodiments of the aforementioned methods [52] and [53] of manufacturing a semiconductor device.

(a) The step of forming a liquid phase containing a conductive element and a substance having a lower melting point than that of the conductive element in the recessed portion is performed in such a manner that a solid phase alloy layer containing the conductive element and the substance having a lower melting point than that of the conductive element is formed in the recessed portion, and then the solid phase alloy layer is heated to melt.

(b) The step of forming a liquid phase containing a conductive element and a substance having a lower melting point than that of the conductive element in the recessed portion is performed in such a manner that a layer of the substance having a lower melting point than that of the conductive element is formed at least in the recessed portion, a layer of the conductive element is formed at least in the recessed portion, and then the layer of the substance having a lower melting point is heated to form a melt, thereby allowing the conductive element to be diffused in the melt.

(c) The step of forming a liquid phase containing a conductive element and a substance having a lower melting point than that of the conductive element in the recessed portion is performed in such a manner that a layer of the substance having a lower melting point than that of the conductive element is formed at least in the recessed portion, and then the layer of the substance having a lower melting point is heated to form a liquid phase, into which the conductive element to introduced.

(d) The step of forming a liquid phase containing a conductive element and a substance having a lower melting point than that of the conductive element in the recessed portion is performed in such a manner that a melt of the substance having a lower melting point than that of the conductive element, or a melt consisting of the conductive element and the substance having a lower melting point is forced to fill in the recessed portion under pressure.

(e) The step of shifting the composition of the liquid phase from an equilibrium composition to a composition where the conductive element is excessive thereby to precipitate the conductive element is performed in such a manner that a process of lowering the temperature of the liquid phase, or a process of lowering the temperature of the liquid phase to a solid-liquid two-phase temperature region and maintaining this temperature is performed at least once.

(f) The step of shifting the composition of the liquid phase from an equilibrium composition to a composition where the conductive element is excessive thereby to precipitate the conductive element comprises the sub-steps of; lowering the temperature of the liquid phase to a solid-liquid two-phase temperature region, maintaining this temperature thereby allowing the conductive element to precipitate; increasing the temperature of the phase to restore the liquid phase; introducing the conductive element into the liquid phase; and lowering the liquid phase; the sub-steps being performed at least once.

(g) The step of shifting the composition of the liquid phase from an equilibrium composition to a composition where the conductive element is excessive thereby to precipitate the conductive element includes a step of heat treatment in an atmosphere containing at least one element selected from the group consisting of N, O and H.

(h) The step of shifting the composition of the liquid phase from an equilibrium composition to a composition where the conductive element is excessive thereby to precipitate the conductive element includes a step of heat treatment in an atmosphere enabling a formation of a gas phase compound containing the substance having a lower melting point, and a step of removing the gas phase compound.

(i) The step of removing all of materials from the surface of the insulating film excluding those formed on the recessed portion comprises the sub-steps of; introducing a gas containing a halogen to form a halide; and removing the halide.

(j) The step of removing all of materials from the surface of the insulating film excluding those formed on the recessed portion comprises the sub-steps of; introducing a gas containing at least one element selected from chlorine, fluorine, iodine and bromine to form a chloride, fluoride, iodide or bromide; and removing the halide.

[54] This invention further provides; a method of manufacturing semiconductor device which comprises the steps of:

forming an insulating film on a semiconductor substrate;

forming a recessed portion in the insulating film;

forming a liquid phase containing a conductive element and a substance having a lower melting point than that of the conductive element in the recessed portion;

forming a conductive film in the recessed portion by shifting the composition of the liquid phase from an equilibrium composition to a composition where the conductive element is excessive, thereby precipitating the conductive element; and removing all of materials from the surface of the insulating film excluding those formed on the recessed portion;

an additive element is introduced into the conductive element during or after the precipitation of the conductive element.

Followings are specific embodiments of the aforementioned method [54] of manufacturing a semiconductor device.

(a) The conductive element is formed of a single kind of element.

(b) The additive element is an element which is capable of improving the electromigration resistance or stress migration resistance of the conductive film after the precipitation.

(c) The additive element is an element which is capable of lowering the solid solution limit of the substance having a lower melting point after the precipitation.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 20A to 20F show respectively a cross-sectional view illustrating the manufacturing steps of the semiconductor device according to Example 16;

DETAILED DESCRIPTION OF THE INVENTION

Figure 1A:
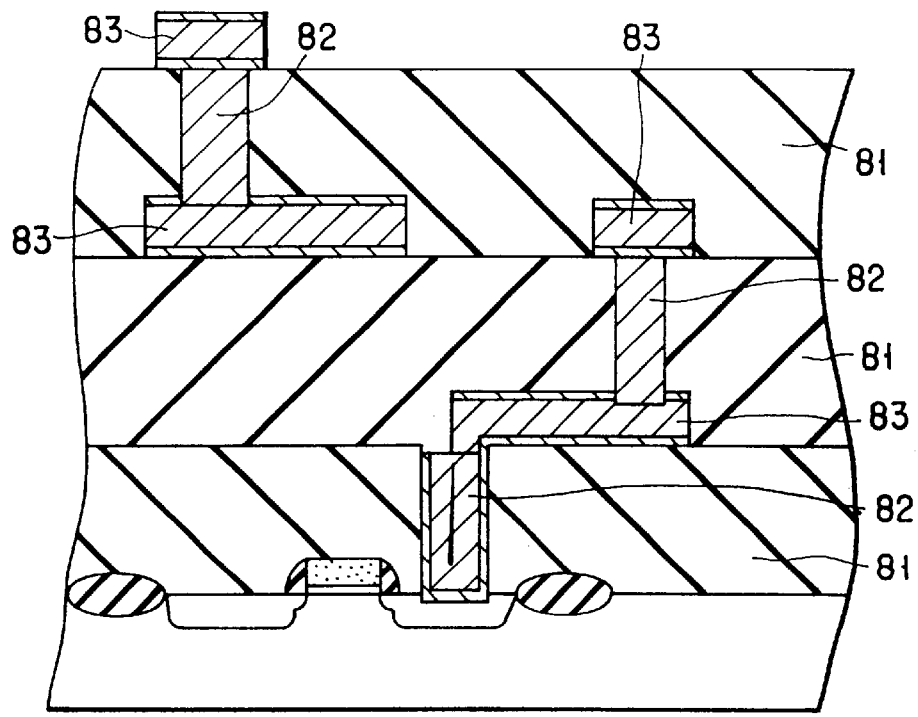
FIGS. 1A and 1B illustrate respectively a cross-sectional view of a multilayer wiring structure to be produced according to the conventional method.
Figure 1B:
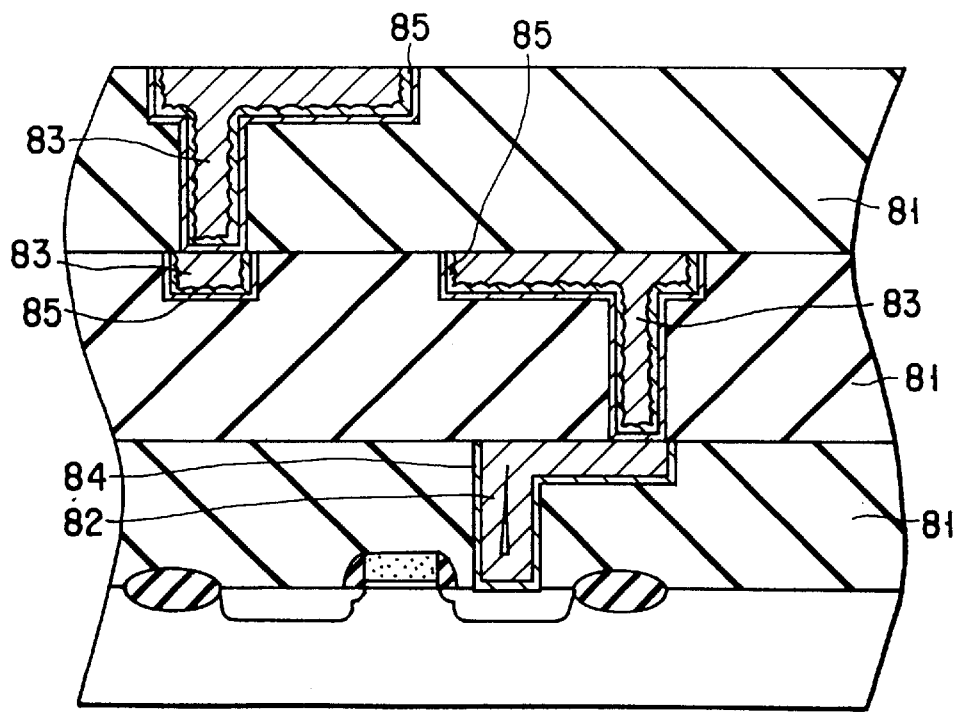
Figure 2A:
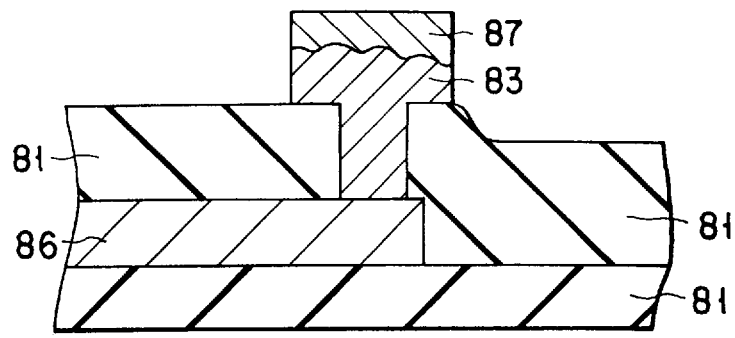
FIGS. 2A and 2B show respectively a cross-sectional view of a multilayer wiring structure to be produced according to the conventional method, illustrating problems involved therein.
Figure 2B:
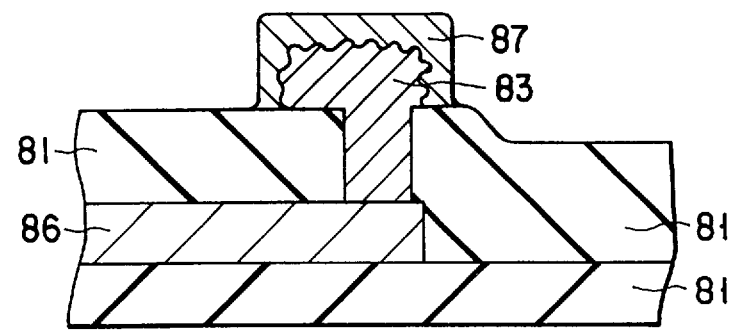

According to a first aspect of this invention, there is provided a structure provided with a contact hole and a wiring groove which is featured in that the interiors of the contact hole and wiring groove are incompletely filled with a substitutive film (a film to be substituted).

In this invention, as a method of filling a recessed portion of high aspect ratio, a method of substituting a conductive film for a substitutive film after the deposition of this substitutive film is employed. In this case, it is preferable to employ a deposition method which is excellent in step coverage for the formation of the substitutive film.

If only the bottom portion of the contact hole is filled with the substitutive film in this case, the aspect ratio of the recessed portion, i.e. the contact hole and wiring groove to be filled with a conductive film can be reduced, so that, if the aspect ratio of the recessed portion is reduced in this manner, the conventional filling technique, e.g. a co-use of sputtering and reflow can employed for filling the recessed portion.

Generally, the aspect ratio of wiring (thickness of wiring/width of wiring) to be employed for an LSI does not exceed over 1. Moreover, as far as the longitudinal direction of the wiring groove is concerned, even if the incident angle of the sputtering particles (the angle between the direction normal to the substrate and the moving direction of particles) is relatively large, the influence of shadowing can be avoided, so that it is possible to easily fill the wiring groove even if a deposition method which is high in throughput but low in directivity, such as the ordinary sputtering method, is employed.

Since the quantity of the substitutive film can be minimized, an increase in wire resistance due to the constituent material of the substitutive film remaining in a conductive film can be inhibited. Furthermore, the time for substitution can be saved, and the temperature for the substitution can be lowered, thus expanding the process margin and process window.

A second aspect of this invention is featured in the location of forming a barrier film.

For example, the barrier film on the inner surface of wiring groove is effective, in addition to its inherent properties of preventing a reaction and diffusion, in improving the reliability of wiring. If an electromigration is caused to occur when electric current is passed through a wiring, or if stress migration is caused to occur due to a stress from the peripheral materials, a large number of voids and hillock would be generated in the wiring. However, if a barrier film is formed in advance around a wiring, the electric current would be allowed to continue to flow through the barrier film, thus preventing the disconnection of wiring.

Moreover, the barrier film functions, depending on the material thereof, to reduce a native oxide film formed on the surface of a conductive layer such as a lower wiring. For example, when a barrier film is formed on a conductive layer formed on the bottom of contact hole, it becomes possible to directly (without intervened by a native oxide film) electrically connect the plug with the conductive layer, thus decreasing the contact resistance.

On the other hand, if the plug and the wiring are formed of the same material, there would be no diffusion barrier to migration, whereby making it possible to improve the reliability of the device. As for the improvement of EM resistance and SM resistance, or for the lowering of resistance, any appropriate structure can be adopted according to the end-use.

A third aspect of this invention is featured in the employment of the substitutive film as a film for improving the wettability at the occasion of filling with a conductive film, superfluous substitutive film being removed after the filling of conductive film is finished.

For example, in the method of filling a conductive film by making use of a combination of sputtering method and reflow method, the wettability of the inner surfaces of contact hole and wiring groove gives much influence to the filling property of conductive film. A film for improving wettability is called liner in the technique of reflow, and a contact hole or a wiring groove of high aspect ratio is required to be slightly covered with this liner.

As hereinafter explained with reference to the specific embodiments, an Si film which is capable of easily covering a recessed portion of high aspect ratio exhibits an excellent wettability to an Al film, so that it is suited for use as a liner material.

Since the liner also functions a diffusion barrier to migration, the liner should preferably be removed after it is employed for filling a conductive film. Moreover, since the liner formed on the inner surface of wiring groove leads to a substantial reduction in volume of low resistant conductive film and hence an increase of wire resistance, it is desirable, in this respect too, to remove the liner.

In view of this, a method of causing the liner (substitutive film) and the conductive film to undergo a mutual diffusion or a substitution, and rendering the liner to be absorbed by an absorption layer in a separate region thereby to remove the liner is effective.

A fourth aspect of this invention is featured in the employment of a substitution/absorption treatment which is performed after a native oxide film or impurities attached to the surface of the substitutive film are removed.

The native oxide film or impurities attached to the surface of the substitutive film obstruct the mutual diffusion between the substitutive film and the conductive film, thus prolonging the substitution time, and as a result, the substitution between the substitutive film and the conductive film as well as the absorption of the substitutive film by the absorption film may become insufficient, thus increasing the wire resistance.

As a method for preventing the increase of wire resistance due to the presence of native oxide film or impurities, it is conceivable to employ various methods, such as a method of removing the native oxide film, etc., a method of preventing the generation of the native oxide film, etc., a method of decomposing the native oxide film, etc. Since the steps to be performed before and after this method as well as the transferring system of substrate (sheet system or batch system) are also related to this method, these methods should be suitably selected taking the specific processes into consideration.

A fifth aspect of this invention is featured in the formation of a substitutive film after a native oxide film or impurities which are attached to the surface of a lower wiring or of a conductive layer are removed.

When the plug or wiring is to be formed through the substitution of a conductive film as in the case of this invention, it is very important to perform a cleaning of the surface of the conductive layer in the step of filling a substitutive film prior to the substitution step. If a native oxide film or impurities, i.e. insulating materials are left remained on the surface of the conductive layer, the contact resistance between the conductive layer and the wiring disposed on the conductive layer would be increased, thus raising a problem.

A sixth aspect of this invention is featured in the acceleration of the substitution process by making use of a conductive film having a roughened surface, by performing a heat treatment, or by forming a plurality of absorption bodies.

When a plurality of absorption bodies are formed on the same level or different level (thickness-wise) in a substrate in particular, the area of interface between the conductive film and the absorption layer can be increased by minimizing an overlapped portion of each absorption layer. Further, it is important, in view of lowering the wire resistance, to prevent the absorption layer and a reaction product from being left remained in the contact hole or the wiring groove.

A seventh aspect of this invention is featured in the process of suppressing an increase in resistance of the conductive film, wherein the substitutive film is substituted by the conductive film under a heat treatment, whereby filling the contact hole or wiring groove with the conductive film, and at the same time, the substitutive film thus substituted is allowed to be absorbed by the absorption layer.

The quantity of the constituent material of the substitutive film to be solid-solubilized in the conductive film at the occasion of heat treatment is determined depending on the temperature of the heat treatment. Therefore, a multi-heat treatment is employed in this invention as the aforementioned heat treatment, i.e. a heat treatment wherein the temperature is changed from a higher temperature to a lower temperature, and a heat treatment wherein temperature is decreased gradually after heat treatment.

Namely, the aforementioned substitution, filling and absorption are performed in a high temperature heat treatment (preferably, a high temperature heat treatment of short time), and then the temperature is lowered so as to lower the solid solution limit of the constituent material of the substitutive film in the conductive film.

As a result, the constituent material of the substitutive film which is solid-solubilized in the conductive film in the aforementioned high temperature heat treatment is allowed to be discharged out of the conductive film until the solid solution limit corresponding to the lowered temperature is taken place. Accordingly, the quantity of the constituent material of the substitutive film in the conductive film is sufficiently minimized, thus effectively suppressing an increase of resistance of the conductive film. Through this simply heat treatment, a wiring exhibiting a low resistance which is substantially equivalent to the inherent resistance of the conductive film can be obtained.

An eighth aspect of this invention is featured in the process of further suppressing an increase in wire resistance, wherein the constituent material of the substitutive film, which is still remained in the plug or wiring which has been formed through the aforementioned substitution/absorption treatment is re-absorbed in a heated condition by an additional absorption layer which has been newly formed on the surface of the contact hole or wiring groove.

Further, when a conductive layer such as a lower wiring is formed by the substitution/absorption of the conductive film, it is possible to allow the constituent material of the substitutive film remaining in the conductive layer to be re-absorbed in the absorption layer via the plug in the contact hole at the occasion of heat treatment wherein the substitutive film is substituted by the conductive film and at the same time, the substitutive film is absorbed by the absorption layer.

A ninth aspect of this invention is featured in that, for the purpose of improving the reliability or for the purpose of lowering the wire resistance, an element (additive element) which is different from the constituent material of the substitutive film or of the absorption layer is added in the conductive film during or after the substitution/absorption treatment.

If this additive element is added to the conductive film in advance, the additive element may be reacted with the constituent material of the substitutive film or of the absorption layer during the substitution/absorption treatment. If such is the case, a conductive film consisting of a single element is employed in the substitution/absorption treatment, and then the additive element is added to the conductive film as proposed by this invention.

Although the constituent material of the substitutive film is still included in the conductive film during or after the substitution/absorption treatment, if this additive element is added to the conductive film, the solid solution limit of the constituent material of the substitutive film might be lowered, thus further reducing the resistance of the conductive film. In this case, a combination of materials wherein the additive element is allowed to react with the conductive film thereby to greatly increase the resistance thereof should be avoided.

A tenth aspect of this invention is featured in that the diffusion rate of the constituent material of the substitutive film inside the conductive film is made faster than that of the constituent material of the absorption layer.

Only when the aforementioned relationship is met, it is possible to allow the substitutive film (which is located at the place where a conductive film is intended to be filled) to diffuse in the direction toward the absorption layer and to be absorbed by the absorption layer.

When the constituent material of the substitutive film is absorbed by the absorption layer, i.e. when a compound is formed as a result, this compound functions sometimes as a barrier layer to inhibit the diffusion of the absorption layer into the conductive film or to inhibit the reaction between the absorption layer and the conductive film. Therefore, it is possible to employ a barrier film meeting the aforementioned relationship regarding the diffusion rate and having the aforementioned function and to interpose it between the absorption layer and the conductive film.

An eleventh aspect of this invention is featured in that although the filling of conductive film is performed through a substitution between the conductive film and the substitutive film, the absorption layer is not employed. Namely, according to this invention, the conductive film is substituted for the substitutive film, and at the same time, the substitutive film thus substituted by the conductive film is allowed to precipitate on the surface of the conductive film, the precipitated substitutive film being subsequently left as it is or removed if it is no more necessary.

If the combination between the conductive film and the substitutive film is suitably selected, the constituent material of the substitutive film or the compound thereof can be easily precipitated on the surface of the conductive film by heat-treating the conductive film and the substitutive film in a vacuum or in a gaseous atmosphere. Therefore, it is possible according to this invention to dispense with the absorption layer, so that the filling process of the conductive film can be simplified by taking advantage of the substitution between the conductive film and the substitutive film.

Further, if a material which is capable of forming a compound gas in a gaseous atmosphere is selected as a constituent material of the substitutive film, and then the heat treatment is performed in the gaseous atmosphere, the substitutive film precipitated on the surface of the conductive film can be removed in the form of the compound gas, so that the subsequent step of removing the substitutive film can be simplified.

A twelfth aspect of this invention is featured in that the substitutive films in the contact hole and wiring groove each formed in the insulating film of each layer are concurrently substituted by the conductive film in a single heat treatment, so that the process can be simplified extremely.

Further, if a material having a high melting point is selected as a constituent material of the substitutive film, there is no possibility of being deformed under the influence of heat in contrast to a low melting point metal such as Al, an insulating film which is high in film-forming temperature can be employed.

Since an insulating film which is high in film-forming temperature is relatively free from impurities such as water, it is possible to improve the current leak property, thus improving the reliability of the device. If the substitution by the conductive film is to be effected en bloc, a heat treatment at a higher temperature can be performed since it does not include, as an underlying layer, a low melting point material such as Al which may raise a problem of deformation, thus saving the substitution time even if the quantity of the substitutive film is relatively large.

According to thirteenth aspect of this invention, it is possible to easily manufacture a structure which is featured in that the interior of the contact hole is filled with a plug consisting of a high melting point metal, and that the plug is contacted at the upper surface of the wiring with a high melting point conductive film containing a melting point metal.

It is possible, with this structure, to continue to pass electric current to the plug via the high melting point conductive film formed on the upper surface of the wiring even if a void due to an electromigration or a stress migration is generated in the wiring, thus improving the reliability of the device. Furthermore, when the plug is protruded into the wiring groove, the contact area with the wiring can be increased, thus lowering the contact resistance.

A fourteenth aspect of this invention is featured in that, after the substitution between the substitutive film and the conductive film as well as the absorption of the substitutive film by the absorption layer are performed, a superfluous absorption layer, the compound formed as a result of the absorption, and a superfluous conductive film which are left outside the wiring groove are successively removed.

An abrasion en bloc of a laminate film consisting of different kinds of material by means of the CMP method requires a combination of various abrasives and abrasive cloths, thus complicating the process. However, it is possible to perform the CMP process by a single step by wet-etching or dry-etching the upper layer portion of the laminate film as suggested by this invention, thereby making it possible to simplify the process.

A fifteenth aspect of this invention is featured in that, the substitutive film contains a diffusion-promoting material or a diffusion-inhibiting material. It is possible, through the inclusion of the diffusion-promoting material in the substitutive film, to promote the mutual diffusion between the substitutive film and the conductive film. On the other hand, it is possible, through the inclusion of the diffusion-inhibiting material in the substitutive film, to inhibit the diffusion of the absorption film into the conductive film.

A sixteenth aspect of this invention is featured in that the diffusion of the constituent material of the absorption layer into the conductive film is inhibited. As a result, an increase in resistance of the conductive film due to the diffusion of the constituent material of the absorption layer into the conductive film can be prevented.

A seventeenth aspect of this invention is featured in that a film which is capable of giving a compressive stress in conformity with a tensile stress in the direction of the conductive film, a layer for alleviating the tensile stress or a shrinkable absorption film is formed. As a result, it is possible to inhibit the formation of void in the conductive film.

The principle of an eighteenth aspect of this invention resides in a filling technique for a contact hole of high aspect ratio, which comprises a process of forming a precipitation seed layer by making use of a solid-liquid reaction, thereby to grow a conductive material.

The eighteenth aspect of this invention is related to a process of forming a wiring/electrode material of a semiconductor device such as FET on the surface of substrate or in the contact hole, wiring groove or other recessed portion in the vicinity of an element; wherein an alloy comprising a wiring/electrode material and a material having a lower melting point than that of the material and capable of forming a simple eutectic, a single-layer film constituted by the alloy, or a laminate film constituted by the alloy is deposited at least in the recessed portions, (or the low melting point metal is preliminarily deposited at least in the recessed portion before the alloy is deposited in the recessed portion); and, after the substrate is heated to obtain a liquid phase in the vicinity of desired process temperature, the wiring/electrode material is allowed to precipitate; by cooling the liquid phase; by selectively removing the low melting point metal; or by supplying the wiring/electrode material to the liquid phase whereby allowing a portion of the wiring/electrode material to be precipitated out of the equilibrium composition of the initial liquid phase; the precipitated wiring/electrode material being utilized as a seed phase, whereby forming the wiring/electrode material on the surface of the substrate or in the recessed portions.

In this case, the composition of molten alloy before the precipitation of wiring/electrode material may be those which enables a liquid phase to be obtained at a temperature lower than the upper limit of the desired process temperature. This temperature enabling a liquid phase to be obtained may be a temperature which is not lower than the melting point of the single low melting point material constituting the liquid phase and which is higher than that of the eutectic line of a mixture consisting of the low melting point material and wiring/electrode material constituting the liquid phase.

The eighteenth aspect of this invention is also featured in that the nucleus of wiring/electrode material is preferentially generated at the location where a high density of nucleus can be non-uniformly generated, e.g. at the interface between a wiring material and an insulating film, i.e. the surfaces of contact hole and wiring groove, at the bottom of the wiring groove, at the edge of the bottom of the contact hole, and at the surface of an lower wiring, whereby depositing the wiring/electrode material on a desired surface or in a desired recessed portion.

Next, the examples according to this invention will be explained with reference to the accompanying drawings.

EXAMPLE 1

A method of manufacturing a semiconductor device according to this example will be explained with reference to FIGS. 3A to 3F.

First of all, a first wiring layer 1 is formed on an Si substrate (not shown) provided with an element. This first wiring layer 1 is partially separated from each other via an insulating film 2. Then, an interlayer insulating film 3 is formed all over the surface of the Si substrate.

Then, the interlayer insulating film 3 is selectively etched by making use of photolithography and RIE to a depth reaching to the first wiring layer 1, thus forming a contact hole 4, and at the same time a wiring groove 5 is selectively formed likewise at a region including this contact hole 4. Namely, the contact hole 4 connected with the first wiring layer 1 and the wiring groove 5 are successively formed.

Figure 3A:
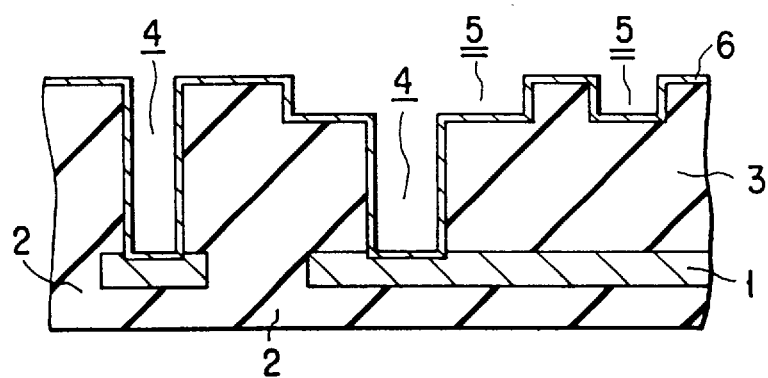
FIGS. 3A to 3F show respectively a cross-sectional view illustrating the manufacturing steps of the semiconductor device of Example 1.

In this example, the wiring groove 5 is also formed at a region where the contact hole 4 is not included. Then, a TiN film 6 is formed as a barrier film by means of sputtering method all over the surface of the resultant substrate (FIG. 3A). FIG. 5 illustrates a partially cross-sectioned perspective view of the substrate at this stage.

Figure 3B:
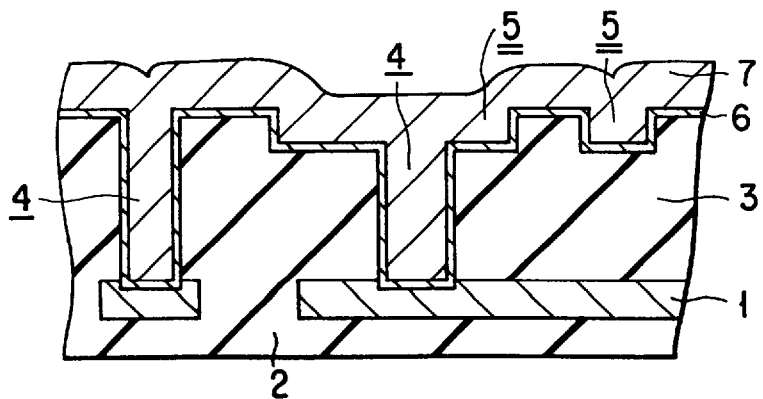

Then, an Si film 7 is deposited all over the substrate by means of LP-CVD method in a manner to avoid the generation of voids in the interior of the contact hole 4 (FIG. 3B).

When this CVD method is employed, an Si film can be formed in conformity with the shape of the hole. Accordingly, when the Si film 7 is deposited to a thickness equal to at least a half of the pore diameter of the contact hole 4, the interior of the contact hole 4 can be completely filled with the Si film 7.

Further, when LP-CVD method is employed, it is possible to deposit various kinds of Si film such as a polycrystalline Si film, an amorphous Si film, a boron doped amorphous Si film, etc. An Si film of any kinds can be employed in this invention. Since the substituting performance such as substitution rate of Si film differs from each other depending on the kinds of the Si film, the Si film should be suitably selected taking this difference into consideration.

Further, since the deposition temperature of Si film also differs depending on the kinds of the Si film, some kinds of Si film may not be suited for use depending on the structure of the underlying layer.

For example, if the first wiring layer 1 is formed of a high melting point metal or alloy such as W and WSi, a polycrystalline Si which requires a deposition temperature of about 600° C. may be usable. However, if the first wiring layer 1 is formed of a low melting point metal such as Al, the Si film to be used should preferably be confined to an amorphous Si film or a boron doped amorphous Si film, which can be formed with a deposition temperature of about 350 to 450° C.

Because, when the substrate is heated under the condition where the contact hole connected to the first wiring layer 1 of a low melting point metal is kept open, the low melting point metal may protrude into the interior of the contact hole, thus resulting in the generation of void in the wiring portion.

The boron doped amorphous Si film is formed of an Si film which can be produced from a mixture of $Si_2H_6$ and $B_2H_6$. In this case, $B_2H_6$ is effective in promoting the decomposition of the $Si_2H_6$. Therefore, if boron doped amorphous Si film is employed, the deposition temperature of the Si film can be easily lowered.

Figure 3C:
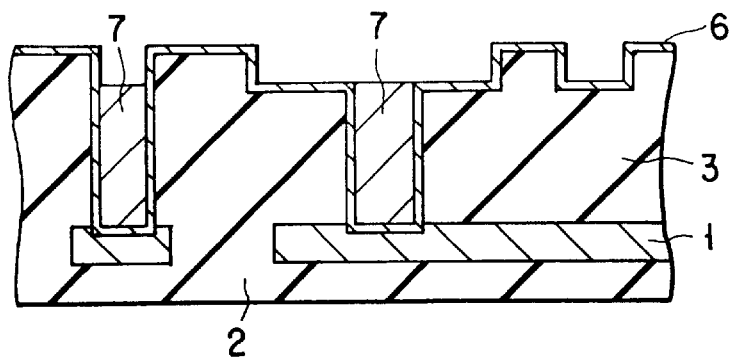

Then, the Si film 7 is partially etched away by means of CDE employing $CF_4$ gas in such a manner that at least the portion of the Si film 7 which is disposed inside the contact hole 4 is left remained therein. (FIG. 3C).

The CDE is an etching method wherein a gas containing halogen such a $CF_4$ is decomposed by means of microwave discharge thereby to form an active halogen radical such as F* (F radical), which is then introduced toward the surface of the substrate so as to isotropically etch the layer to be etched.

When the Si film 7 that has been deposited by means of CVD is etched to a depth corresponding to the deposited thickness by making use of CDE, the Si film 7 that has been deposited on the surface excluding that filled in the interior of the contact hole 4 can be removed.

Furthermore, the etching rate of Si by the F radical can be accelerated, through adjustment of etching condition, 50 times faster than the etching rate of TiN or $SiO_2$, thus making it possible to avoid any deformation of wiring grooves. It is also possible to remove the Si film 7 by making use of the RIE etch-back method.

Figure 7A:
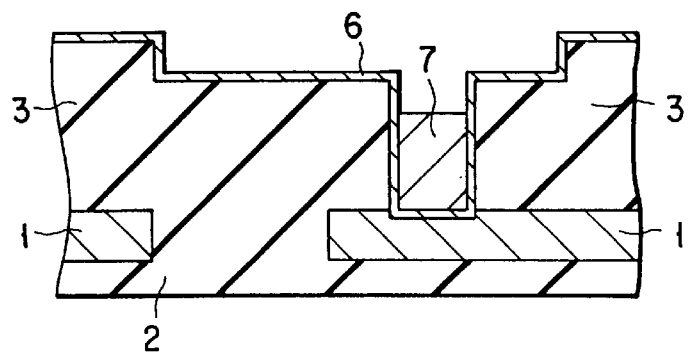
FIGS. 7A to 7C show respectively a cross-sectional view illustrating the quantity of Si to be left in the wiring groove and contact hole.
Figure 7B:
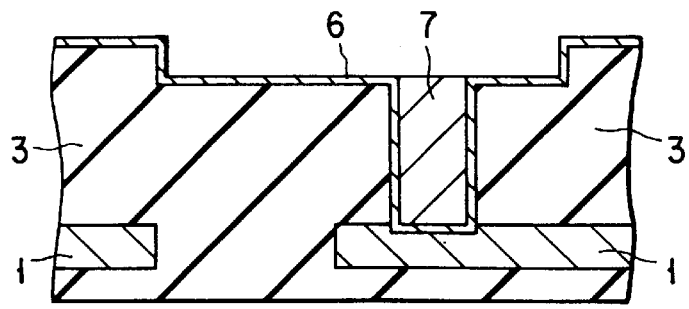
Figure 7C:
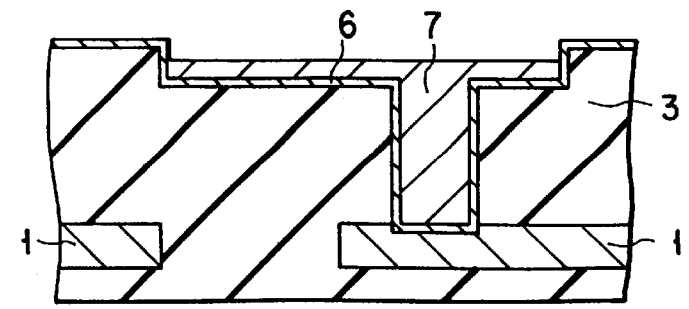

Depending on the layout of pattern, the quantity of Si film 7 may become large. In this case, the post heat treatment for substituting the Al film for the Si film 7 may be prolonged. Therefore, the quantity of Si film to be left in the wiring groove and contact hole should preferably be adjusted as shown in FIGS. 7A to 7C.

In the foregoing explanation of this example, the Si film 7 is deposited all over the surface of the substrate, and then the Si film 7 is etched away in such a manner that only the portion of Si film 7 that has been filled in the contact hole is left remained in the contact hole. However, it is also possible to selectively fill the contact hole with Si film by means of a selective CVD method or any other methods. When the selective CVD method is employed, the removal of Si film in a subsequent step is no more required, thus making it possible to minimize the number of the manufacturing step.

Further, it is also possible to employ another process wherein all of Si film 7 except those filled in the contact holes 4 and wiring grooves 5 is removed by means of the CMP method, and then the Si film 7 filled in the wiring grooves 5 is removed by means. of the CDE etch-back method or the RIE etch-back method, thus leaving only the interior of the contact hole 4 filled with the Si film 7.

Figure 5A:
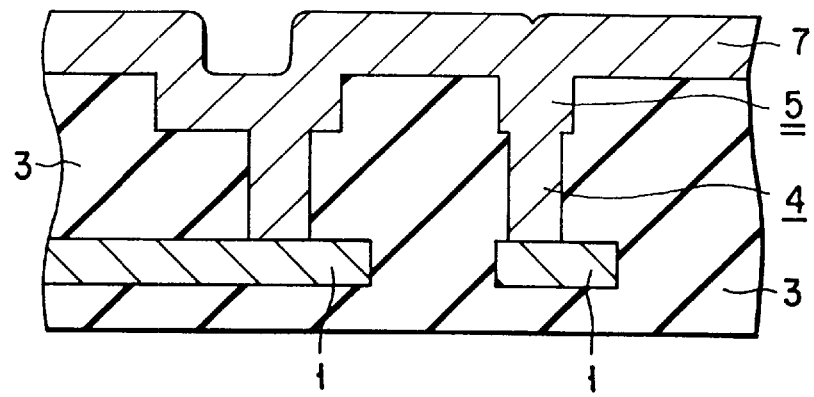
FIGS. 5A and 5B show respectively a cross-sectional view illustrating problems involved when wiring grooves of various widths are existed.
Figure 5B:
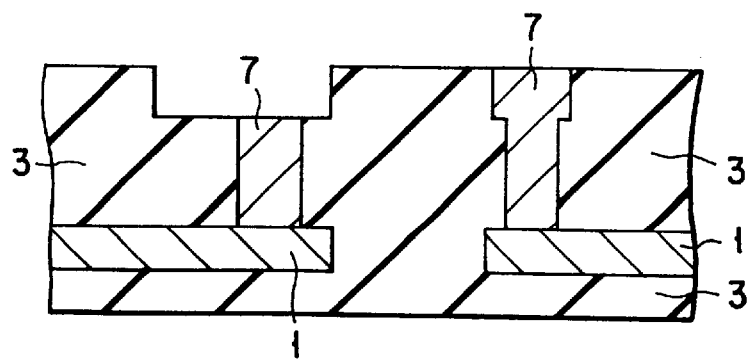

The reason for not performing the CDE etch-back method or the RIE etch-back method immediately after the deposition of the Si film 7 is as follows. Namely, when a wiring groove 5 differing in width from the rest of the wiring groove 5 is existed as shown in FIG. 5A, even though the Si film 7 which has been filled in a wiring groove 5 of relatively wide width can be removed by the etch-back of the film to an extent that corresponds to the deposited thickness of the Si film 7, the Si film 7 which has been fully filled in a wiring groove 5 of relatively narrow width cannot be completely removed, thus leaving a portion thereof in the wiring groove 5 as shown in FIG. 5B.

Figure 6A:
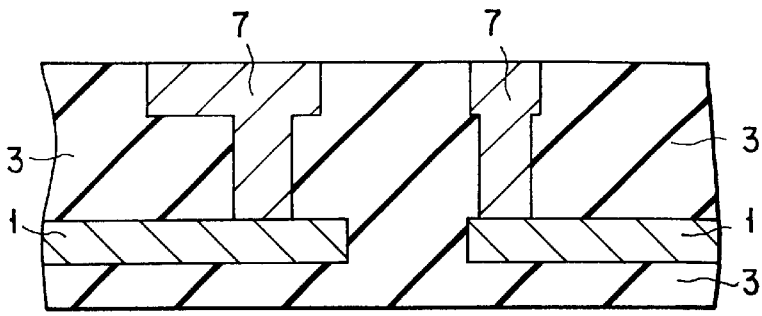
FIGS. 6A and 6B show respectively a cross-sectional view illustrating how to solve the problems involved when wiring grooves of various widths are existed.
Figure 6B:
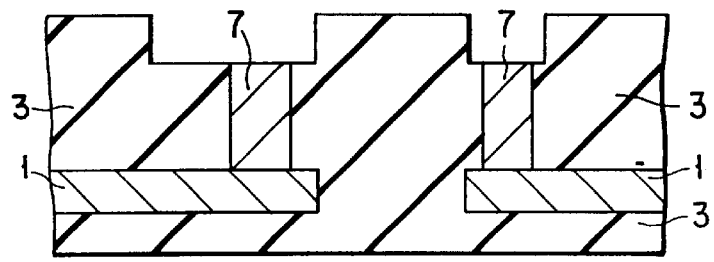

Accordingly, in the case of pattern layout where the wiring grooves of narrow width are densely formed, the Si may left in large quantity, thus increasing a possibility that a portion of the Si film 7 that has been failed to be absorbed by a Ti film 9 may formed into a nodule. If there is such a possibility, the Si film should be treated at first by means of the CMP as mentioned above (FIG. 6A), and then subjected to the etch-back, thus leaving the Si film 7 in the interior of the contact hole 4 (FIG. 6B).

Alternatively, another method may be employed wherein a resist is formed all over a substrate, and then the resist is subjected to an etch-back under a condition where the etching rate of the resist is adjusted to become equal to that of Si film 7, thus leaving the Si film 7 in the same height throughout the surface of substrate where a plurality of Si films are originally disposed at a different level.

Alternatively, when the Si film 7 is deposited to a thickness equal to at least a half of the width of the wiring groove, all of the grooves can be completely filled with the Si film 7, so that the problem of difference in surface level of the Si film 7 in the subsequent etch-back step can be solved.

In this case however, Si is required to be deposited excessively, thus prolonging the deposition time. It can be the generally in the CVD of Si that under the condition where the deposition rate is determined by the feeding of raw material, the deposition rate can be accelerated but the step coverage property becomes poor, and that under the condition where the deposition rate is determined by the reaction, the deposition rate is slow but the step coverage property becomes excellent.

In the case of this invention, the interior of the contact hole is required to be excellent in step coverage, so that the deposition under the condition where the reaction rate prevails is desired. However, the Si film is required to be deposited in heavy in order to fill all of the recessed portions including the wiring groove, thus prolonging the deposition time.

In this case, the deposition of Si may be performed under the condition where the reaction rate prevails in the stage of filling the contact hole, and then under condition where the raw material-feeding rate prevails so as to accelerate the deposition rate in the subsequent stage of increasing the film thickness. By the employment of this method it is possible to simultaneously realize the improvement of step coverage and the saving of deposition time. This step-wise film-forming method is useful in particular where a single-wafer processing type CVD apparatus dealing with a long throughput is to be employed.

Figure 3D:
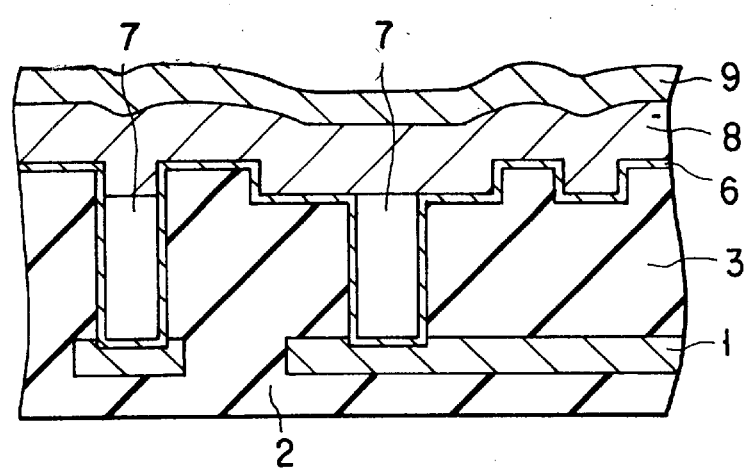

Then, the native oxide film and impurities such as F and C on the surface of the Si film 7 are removed by means of Ar ion sputtering (reverse sputtering) in a vacuum, and then an Al film 8 and a Ti film 9 are successively formed on the entire surface of the Si film 7 in a vacuum in order to prevent the surface of the Si film 7 from being reoxidized or soiled (FIG. 3D). This Al film 8 may be a pure Al film or an Al alloy film containing Cu for instance.

The Ar ion sputtering may be performed by making use of a physical etching wherein a high-frequency power is applied to the substrate to generate a discharge and the ionized Ar ions are allowed to be pulled by the self-bias of the substrate whereby etching the aforementioned native oxide film and impurities.

The sputtering method for forming the Al film 8 may be performed by the conventional sputtering method. However, since this Al film 8 is required to be formed even in the interior of the wiring groove and also required to be excellent in step coverage, it may be advisable to employ a directional sputtering method or a reflow method which is a combination of a directional sputtering method and a thermal sputtering method.

The formation of Al film 8 and Ti film 9 after the removal of the aforementioned native oxide film and impurities can be performed by making use of a cluster tool for instance. This cluster tool is a composite apparatus provided with a wafer-transferring mechanism with which a substrate (wafer) can be transferred between a plurality of vacuum chambers, so that it is possible with this cluster tool to continuously perform the removal of the natural oxidation film and the process of sputtering in a vacuum without exposing the substrate to the external atmosphere.

Thereafter, the substrate is heat-treated for one hour at a temperature of 450° C., whereby allowing the Si film 7 to be substituted by the Al film 8 and at the same time allowing a silicide-forming reaction to take place between the Si film 7 and the Ti film 9. Through the formation of the silicide, the Si film 7 is absorbed by the Ti film 9 (FIG. 3E).

Figure 3E:
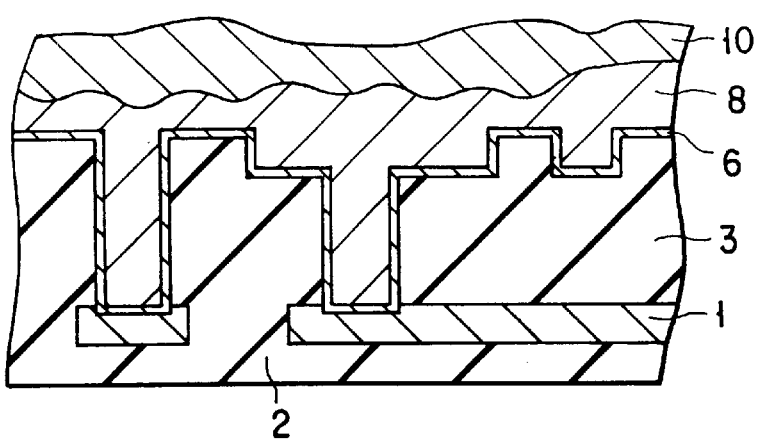

In FIG. 3E, the reference numeral 10 represents an excessive portion of Ti film 9 which is not employed for the formation of the silicifying reaction and the aforementioned Ti silicide (hereinafter referred to as a Ti/Ti silicide film). In this Ti/Ti silicide film, the region thereof facing the Al film 8 is predominantly occupied by the Ti silicide film while the surface region is predominantly occupied by the Ti film.

The heat treatment in this case may be performed by making use of either a single-wafer processing type or a batch type heat treatment apparatus.

Figure 3F:
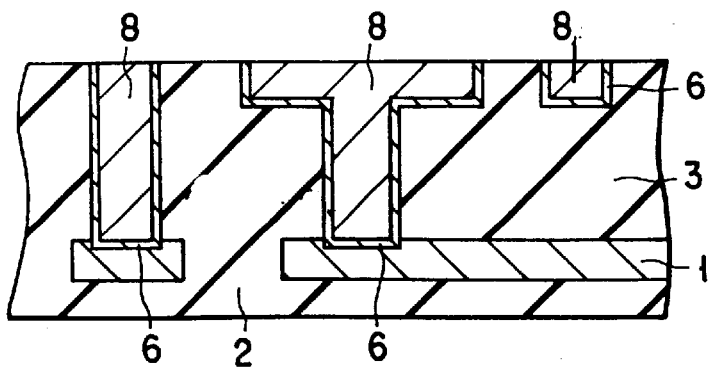
Figure 4:
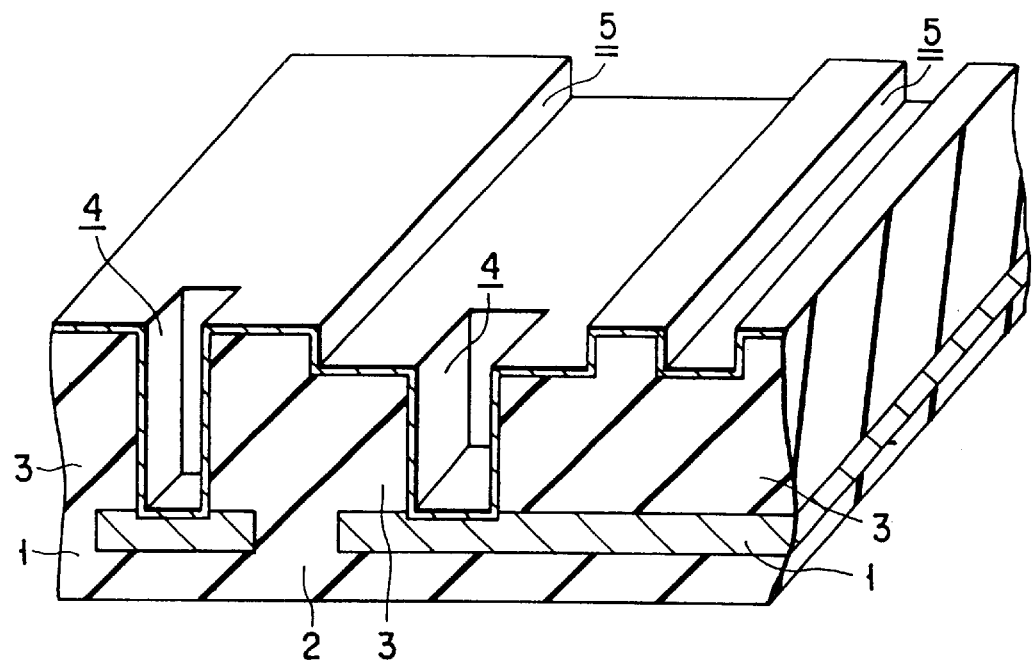
FIG. 4 is a partially cross-sectioned perspective view illustrating a structure in the middle of the manufacturing steps of the semiconductor device of Example 1.

Finally, the Ti/Ti silicide film and any excessive Al film 8 are removed by means of the CMP method. In this occasion, the TiN film 6 employed as a barrier film and disposed on the upper portion of the substrate is concurrently removed (FIG. 3F). As a result, an Al plug and an Al wiring layer (a second wiring layer) both consisting of the Al film 8 are formed in the interiors of the contact hole 4 and the wiring groove 5, respectively.

In the explanation of this example, the Si film 7, the Al film 8 and the Ti film 9 are employed as a film to be substituted, a conductive film and an absorption film, respectively. In this case, the Al film 8 is substituted for the Si film 7, and the Si film 7 is absorbed by the upper Ti film 9 through a silicifying reaction between the Si film 7 and the Ti film 9.

This phenomenon can be explained as follows. Namely, an inter-diffusion is caused to take place between the Si film 7 and the Al film 8, and the Si atoms diffused into the Al film 8 are then allowed to pass through the Al film 8 to reach the Ti film 9, whereby causing a silicifying reaction to take place. Because of this silicifying reaction, the concentration of Si at the boundary region of the Al film 8. with the Ti film 9 is caused to diminish, thus generating a concentration gradient of Si. As a result, Si atoms are forced to further diffuse toward the Ti film 9 to be absorbed by the Ti film 9.

Since the Si film 7 filled in the interior of the wiring groove is removed by means of the CDE etch-back in this example, the quantity of Si film 7 (quantity of. Si) to be substituted by the Al film 8 is minimized, so that the heat treatment time for the substitution can be substantially shortened.

Moreover, since the quantity of Si in the Al film 8 is relatively small at the portion of the wiring groove 5 locating remote from the contact hole 4, the electric resistivity of the wiring layer can be lowered as a whole.

Since the quantity of Si can be minimized as mentioned above, the film thickness of the Ti film 9 functioning as an absorbent can be also minimized, and hence the thickness of Ti silicide to be produced would become thinner so that the time required for removing the Ti/Ti silicide film can be shortened.

Furthermore, since the quantity of Si can be minimized as mentioned above, it is possible to suppress the generation of Si nodules, and hence to suppress an increase in electric resistance resulting from the formation of the Si nodules. Further, since it is possible to suppress the generation of Si nodules, the generation of scratch due to the Si nodules in the step of removing the Si nodules by means of the CMP method can be prevented.

According to this example, a barrier film 6 is formed after the formation of the contact holes 4 and the wiring grooves 5, whereby forming a structure where the entire inner surfaces of the contact holes and the wiring grooves are covered by the barrier film 6. However, it is also possible to adopt another structure as shown in FIGS. 8A to 8F.

Figure 8A:
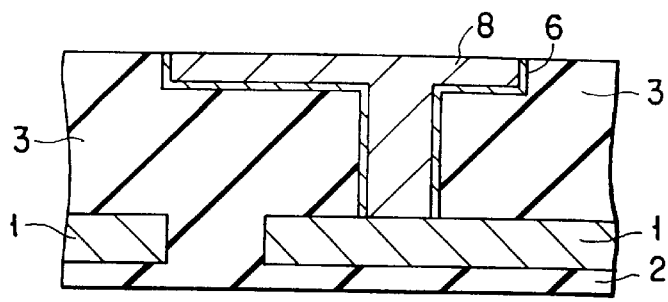
FIGS. 8A to 8F show respectively a cross-sectional view of various kinds of dual damascene wiring structure which differ from each other in location of a barrier film.

For example, if the barrier film 6 is formed by means of a sputtering method which is low in coverage property in the step of forming the barrier film 6 after the formation of the contact holes 4 and the wiring grooves 5, a wiring structure where no barrier film 6 is deposited on the bottom of the contact hole 4 can be obtained (FIG. 8A).

In the case where the first wiring layer 1 is formed of an Al wiring layer, the presence of the barrier film 6 on the bottom of the contact hole 4 becomes an obstacle for the diffusion of electromigration (EM), thus inviting the discontinuity of diffusion rate and hence a cause for the deterioration of the EM resistance.

By contrast, the barrier film 6 deposited on the side walls of the wiring groove 5 functions also as a compensating lead wire allowing electric current to pass therethrough when a void is generated due to the EM in the wiring portion. Therefore, when the structure shown in FIG. 8A is adopted, the reliability of the bottom of the contact hole 4 and the wiring portion can be improved.

Figure 8B:
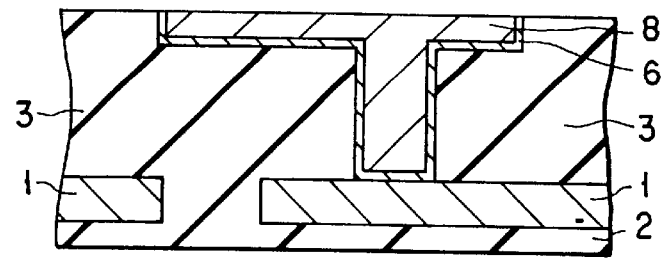

On the contrary, when the first wiring layer 1 is formed of a W wiring layer, the presence of barrier 6 is required for the purpose of suppressing the reaction between the W wiring layer and the Al film 8. In this case, a sputtering method excellent in directivity or a CVD method excellent step coverage can be employed after the formation of both contact hole 4 and wiring layer 5, whereby forming the barrier film 6 even on the bottom of the contact hole 4 (FIG. 8B).

Figure 8C:
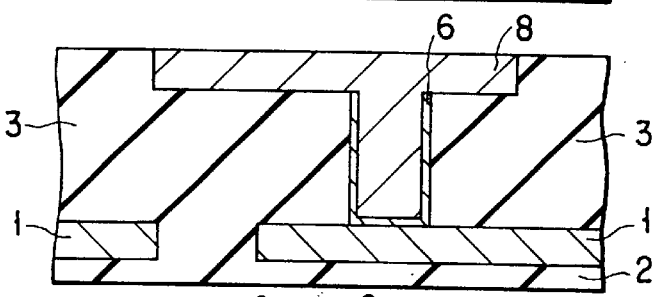
Figure 8D:
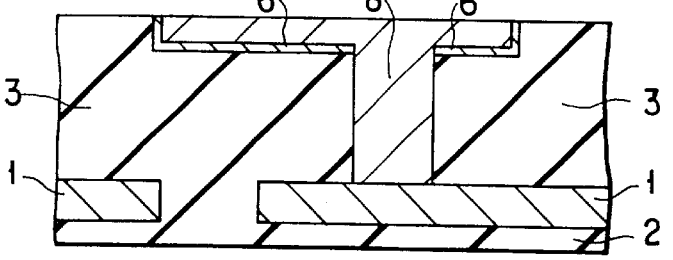

Alternatively, if the barrier film 6 is formed after the formation of the contact hole 4 and then the wiring groove 5 is formed, it is possible to form the barrier film 6 only on the inner surface of the contact hole 4 (FIG. 8C). Further, if the barrier film 6 is formed after the formation of the wiring groove 5 and then the contact hole 4 is formed, it is possible to form the barrier film 6 only on the inner surface of the wiring groove 5 without depositing the barrier film 6 on the inner surface of the contact hole 4 (FIG. 8D).

Figure 8E:
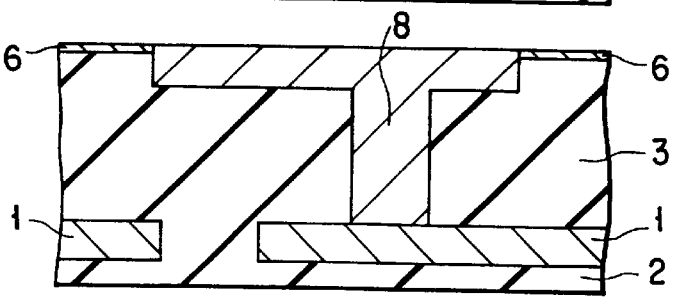

Further, if the wiring groove 5 and contact hole 4 are formed after the formation of barrier film 6, it is possible to form the barrier film 6 on the region other than the wiring groove 5 and contact hole 4 (FIG. 8E). In this case, an insulating material is employed for the barrier film 6.

Figure 8F:
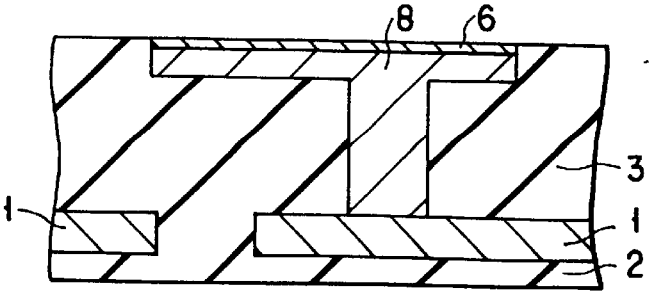

It is also possible to form the barrier film 6 only on the upper surface of the wiring layer. For example, as shown in FIG. 8F, the wiring groove 5 is filled with the Al film 8 at first and then the superfluous portions of the Al film 8 and Ti/Ti silicide film are remove by means of the CMP taking a long polishing time of the CMP. As a result, a structure where the upper surface of the Al film 8 functioning as a wiring layer is lowered than the upper surface of the interlayer insulating film 3 due to the phenomenon of dishing can be obtained.

After the barrier film 6 is formed all over the surface of the resultant structure, the barrier film 6 is etched to an extent to leave the barrier film 6 only on the upper surface of the wiring layer. It is also possible to obtain the similar structure as mentioned above by making use of a selective CVD method such as the W-CVD method which makes it possible to selectively deposit a material only on a conductive material.

Figure 9A:
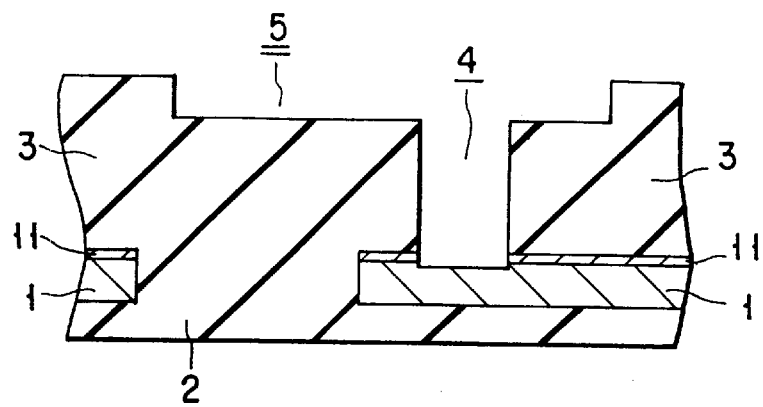
FIGS. 9A and 9B show respectively a cross-sectional view illustrating the manufacturing steps of the semiconductor device according to a modified example of Example 1.
Figure 9B:
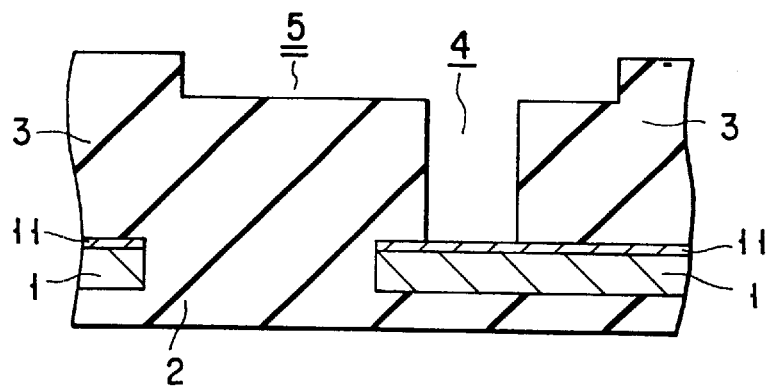

It is also possible, at the occasion of forming a contact hole 4 by means of the RIE method so as to connect with the first wiring layer 1 covered. on its upper surface with a barrier film 11, to selectively remove a portion of the barrier film 11 disposed on the upper surface of the first wiring layer 1 as shown in FIG. 9A, or to stop the etching by the RIE method immediately after the upper surface of the barrier film 11 is exposed as shown in FIG. 9B.

The barrier film may be substituted by a CMP-stopper layer or by a film functioning as a barrier film as well as a CMP-stopper layer. The CMP-stopper layer may be formed of either a conductive film or an insulating film as long as it is low in abrasion rate as compared with the abrasion rate of the Al film 8 in the CMP polishing. However, if an insulating film is to be employed, it can not be disposed on the bottom of the contact hole 4.

EXAMPLE 2

A method of manufacturing a semiconductor device according to this example will be explained with reference to FIGS. 10A to 10F.

First of all, a first wiring layer 1 is formed on an Si substrate (not shown) provided with an element. This first wiring layer 1 is partially separated from each other via an insulating film 2. Then, a first interlayer insulating film 3 is formed all over the surface of the Si substrate.

Then, the first interlayer insulating film 3 is selectively etched by making use of photolithography and RIE to a depth reaching to the first wiring layer 1, thus forming a contact hole. Namely, the contact hole. connected with the first wiring layer 1 is formed.

Figure 10A:
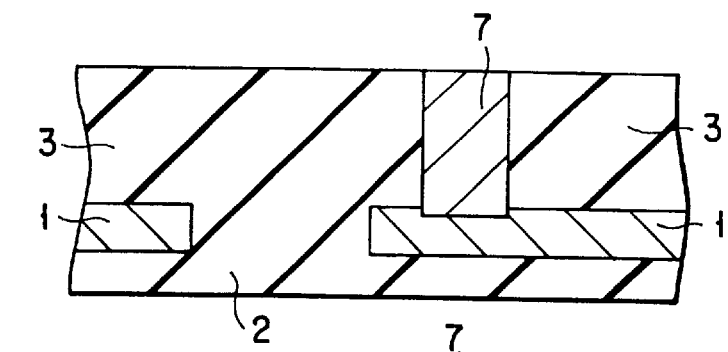
FIGS. 10A to 10F show respectively a cross-sectional view illustrating the manufacturing steps of the semiconductor device according to Example 2.

Then, an Si film 7 is deposited all over the substrate by means of LP-CVD method, and abraded by means of the CMP method in such an extent that the Si film 7 is left remained in the interior of the contact hole (FIG. 10A).

Figure 10B:
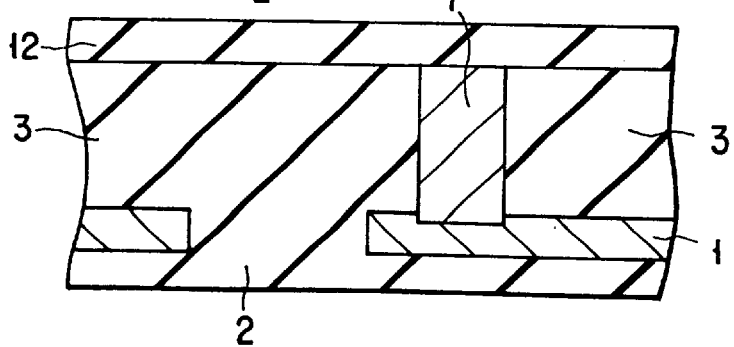
Figure 10C:
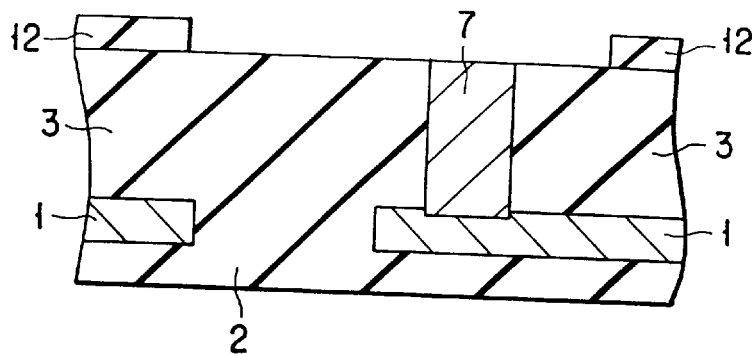

Then, a second interlayer insulating film 12 is formed all over the upper surface (FIG. 10B) and then worked by making use of photolithography process and RIE process to form a wiring groove (FIG. 10C). In the step of FIG. 10B, the thickness of the second inter-layer insulating film 12 should be made almost the same as that of a second wiring layer to be formed in the subsequent step.

Figure 10D:
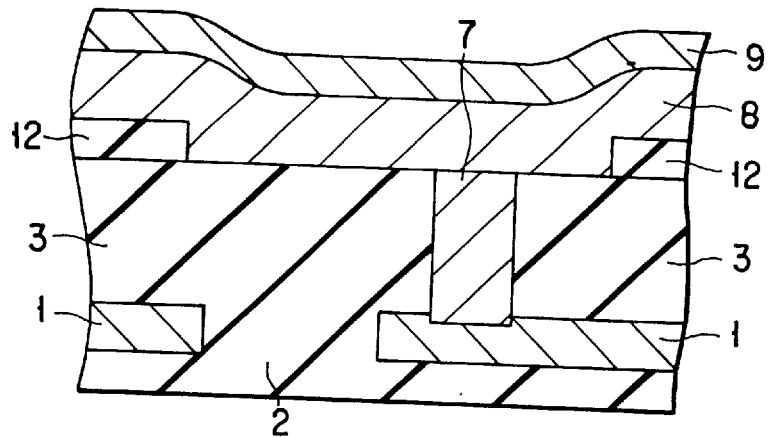

Then, the native oxide film and impurities on the surface of the Si film 7 are removed by means of Ar ion sputtering in a vacuum, and then an Al film 8 and a Ti film 9 are successively formed on the entire surface of the Si film 7 in a vacuum in order to prevent the surface of the Si film 7 from being reoxidized or contaminated (FIG. 10D).

Figure 10E:
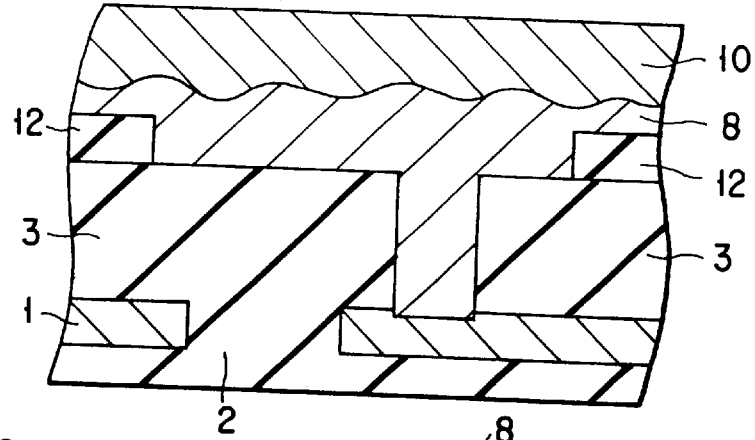

Thereafter, the substrate is heat-treated for one hour at a temperature of 450° C., whereby allowing the Si film 7 to be substituted by the Al film 8 and at the same time allowing a silicide-forming reaction to take place between the Si film 7 and the Ti film 9. Through the formation of the silicide, the Si film 7 is absorbed by the Ti film 9. As a result of this step, a Ti/Ti silicide film 10 is formed (FIG. 10E).

Figure 10F:
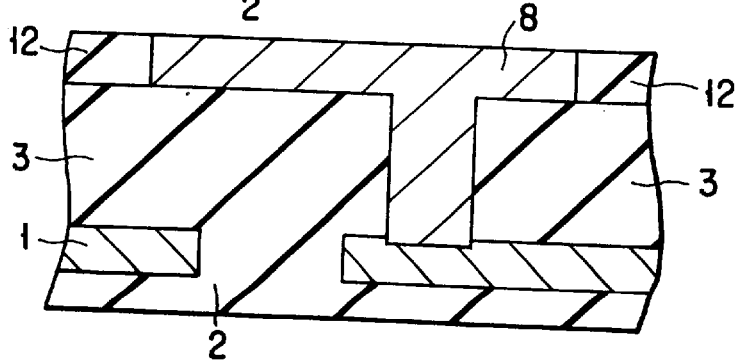

Finally, the Ti/Ti silicide film 10 and a superfluous portion of the Al film 8 are removed by means of the CMP method. As a result, an Al plug and an Al wiring layer (a second wiring layer) both consisting of the Al film 8 are formed in the interiors of the contact hole 4 and the wiring groove 5, respectively (FIG. 10F).

Since the quantity of Si to be substituted by the Al film 8 is limited as in the case of the Example 1, the quantity of Si to be solid-solubilized in the Al film 8 can be minimized, thus making it possible to lower the electric resistivity of the wiring layer.

According to this example, the second interlayer insulating film 12 is formed directly on the surface of the first interlayer insulating film 3. However, it is also possible to form an RIE-stopper layer.

For example, if an insulating film exhibiting a high selectivity in relative to the second interlayer insulating film 12 in the RIE process is formed on the surface of the first interlayer insulating film 3 and then employed as an RIE-stopper layer at the occasion of forming a wiring groove, it is possible to inhibit the trenching (a phenomenon that the bottom of wiring groove is caused to curve) that can be seen at the occasion of forming the wiring groove.

It is also possible to form a TiN film as a barrier film in subsequent to the formation of the contact hole and then to form the Si film 7. When a barrier film is formed in this manner, it is possible to inhibit the reaction between the first wiring layer 1 and the Al film 7 at the bottom of the contact hole.

EXAMPLE 3

A method of manufacturing a semiconductor device according to this example will be explained with reference to FIGS. 11A to 11E.

First of all, a first wiring layer 1 is formed on an Si substrate (not shown) provided with an element. This first wiring layer 1 is partially separated from each other via an insulating film 2. Then, an interlayer insulating film 3 consisting of $SiO_2$ is formed all over the surface of the Si substrate.

Then, the interlayer insulating film 3 is selectively etched by making use of photolithography and RIE to a depth reaching to the first wiring layer 1, thus forming a contact hole. Namely, the contact hole connected with the first wiring layer 1 is formed.

Figure 11A:
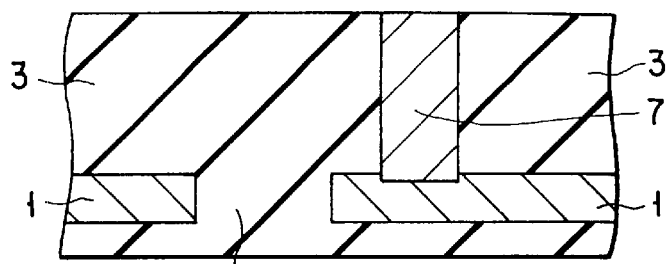
FIGS. 11A to 11E show respectively a cross-sectional view illustrating the manufacturing steps of the semiconductor device according to Example 3.

Then, an Si film 7 is deposited all over the substrate by means of LP-CVD method in a manner to avoid the generation of voids in the interior of the contact hole, and abraded by means of the CMP method in such an extent that the Si film 7 is left remained in the interior of the contact hole (FIG. 11A).

Figure 11B:
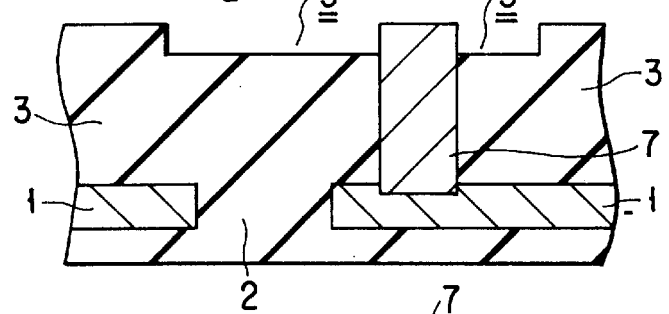

Then, a wiring groove 5 is formed in the interlayer insulating film 3 (FIG. 11B). This wiring groove 5 is formed so as to include the region of the contact hole.

Figure 11C:
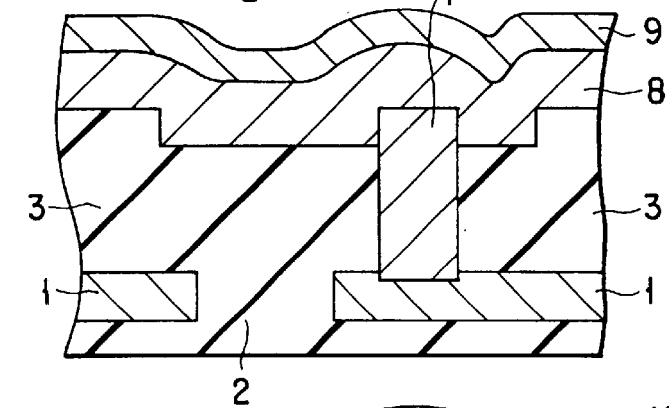

Then, the native oxide film and impurities on the surface of the Si film 7 are removed by means of Ar ion sputtering (reverse sputtering) in a vacuum, and then an Al film 8 and a Ti film 9 are successively formed on the entire surface of the Si film 7 in a vacuum in order to prevent the surface of the Si film 7 from being reoxidized or contaminated (FIG. 11C).

Figure 11D:
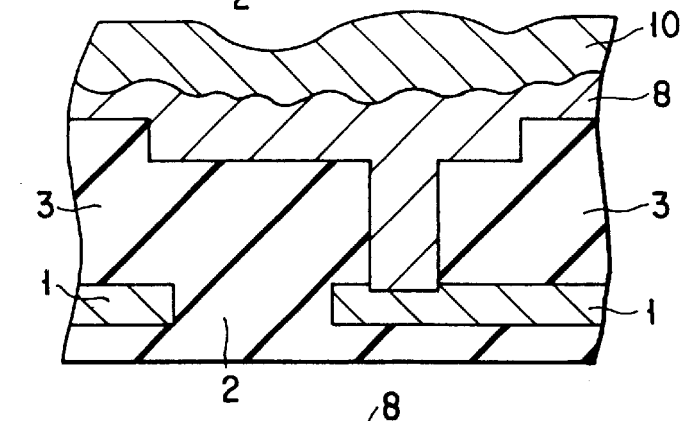

Thereafter, the substrate is heat-treated for one hour at a temperature of 450° C., whereby allowing the Si film 7 to be substituted by the Al film 8 and at the same time allowing a silicide-forming reaction to take place between the Si film 7 and the Ti film 9. Through the formation of the silicide, the Si film 7 is absorbed by the Ti film 9. As a result of this step, a Ti/Ti silicide film 10 is formed (FIG. 11D).

Figure 11E:
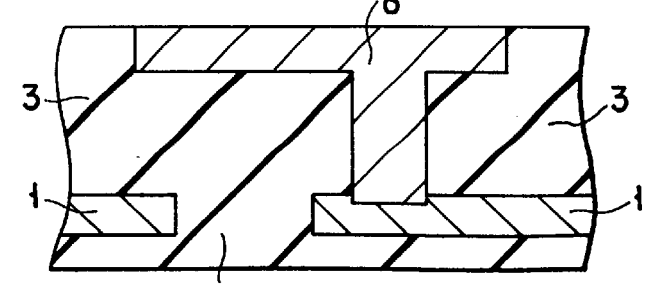

Finally, the Ti/Ti silicide film 10 and a superfluous portion of the Al film 8 are removed by means of the CMP method. As a result, an Al plug and an Al wiring layer (a second wiring layer) both consisting of the Al film 8 are formed in the interiors of the contact hole and the wiring groove 5, respectively (FIG. 11E).

According to this example, $SiO_2$ is employed as a material for the interlayer insulating film 3. The etching rate of $SiO_2$ by means of RIE method can be made faster than that of Si by suitably adjusting the etching conditions. Therefore, when the wiring groove 5 is formed in the interlayer insulating film 3 by means of RIE method, the Si film 7 is caused to protrude from the surface of the wiring groove 5 as shown in FIG. 11B.

As a result, the contacting surface between the Si film 7 and the Al film 8 can be increased whereby increasing the diffusing route of Si into the Al film 8. As a result, the substitution of Al film 8 for the Si film 7 can be easily proceeded.

EXAMPLE 4

A method of manufacturing a semiconductor device according to this example will be explained with reference to FIGS. 12A to 12E.

Figure 12A:
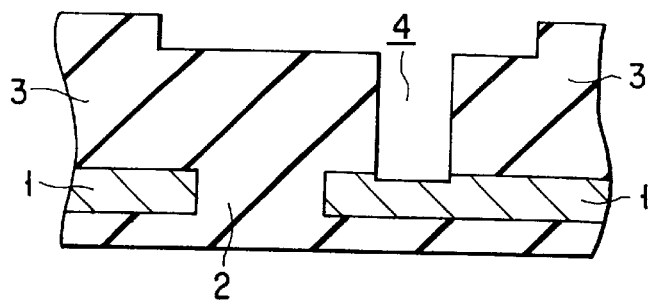
FIGS. 12A to 12E show respectively a cross-sectional view illustrating the manufacturing steps of the semiconductor device according to Example 4.

First of all, a first wiring layer 1 is formed on an Si substrate (not shown) provided with an element. Then, a contact hole 4 and a wiring groove 5 are successively formed in an interlayer insulating film 3 (FIG. 12A).

Then, a native oxide film formed on the upper surface of the first wiring layer 1 which has been exposed on the bottom of the contact hole 4 is removed.

Figure 12B:
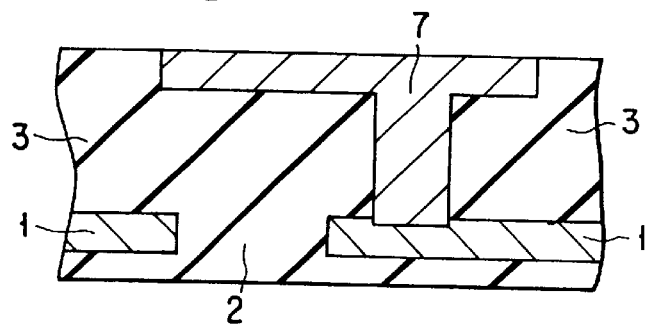

Then, an Si film 7 is deposited all over the substrate by means of CVD method and then abraded by means of the CMP method in such a way that the Si film 7 is selectively left remained in the interiors of the contact hole 4 and the wiring groove 5 (FIG. 12B).

Figure 12C:
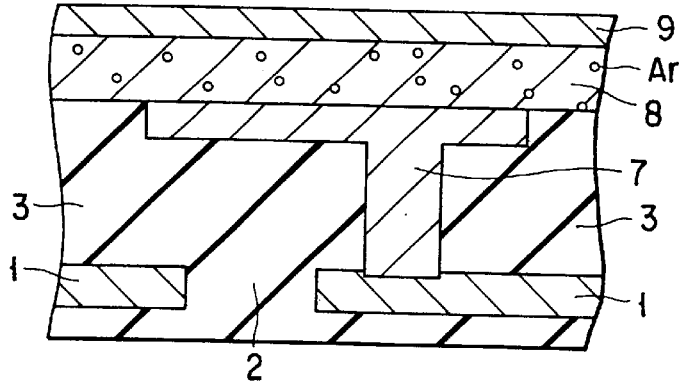

Then, the native oxide film and impurities on the surface of the Si film 7 are removed, and then depositions of an Al film 8 by means of a bias sputtering method and of a Ti film 9 by means of the ordinary sputtering method are successively performed on the entire surface of the Si film 7 in a vacuum (FIG. 12C).

This bias sputtering method is performed as follows. Namely, a sputter target is placed on the cathode side, and a substrate is disposed on the anode side. Then, a high frequency power is applied to the anode thereby to generate plasma, and the formation of film is performed while pulling the Ar ions toward the substrate by means of the self-bias impressed to the substrate.

It is possible with this bias sputtering method to form a film exhibiting a high step coverage due to the physical etching effect of Ar ions being pulled toward the substrate. However, the film thus formed contains a large amount of Ar gas thereby entrapping a large number of voids in the film, thus making the film porous.

However, in this example, the Al film 8 is formed by means of the bias sputtering method under the conditions positively enabling the voids to. be formed.

Figure 12D:
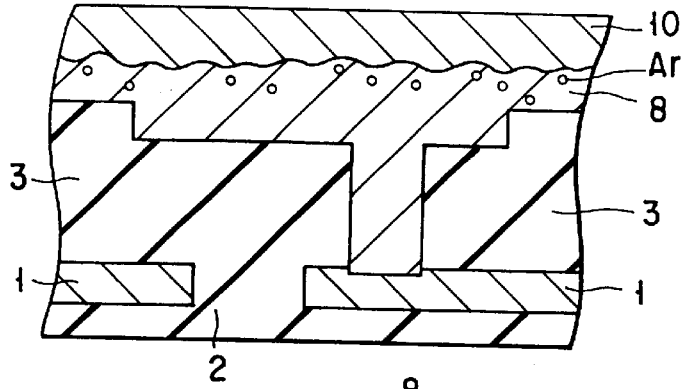

Thereafter, the substrate is heat-treated for 30 minutes at a temperature of 400° C., whereby allowing the Si film 7 to be substituted by the Al film 8 and at the same time allowing a silicide-forming reaction to take place between the Si film 7 and the Ti film 9. Through the formation of the silicide, the Si film 7 is absorbed by the Ti film 9. As a result of this step, a Ti/Ti silicide film 10 is formed (FIG. 12D).

Figure 12E:
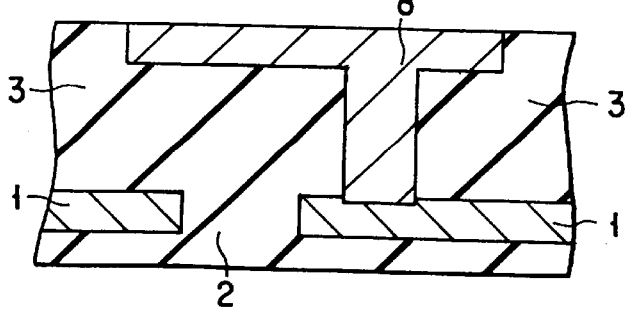

Finally, the Ti/Ti silicide film 10 and a superfluous portion of the Al film 8 are removed by means of the CMP method. As a result, an Al plug and an Al wiring layer (a second wiring layer) both consisting of the Al film 8 are formed in the interiors of the contact hole and the wiring groove 5, respectively (FIG. 12E).

According to this example, a porous Al film 8 which has been formed by means of bias sputtering is employed as a conductive film. This porous Al film 8 is low in crystallinity and very small in crystal grain diameter though it is a polycrystalline film.

Accordingly, the total area of the crystal boundary crossing through the porous Al film 8 is larger as compared with that of dense polycrystalline Al film, and hence the porous Al film 8 is provided with a large grain boundary area, thus facilitating the diffusion of atoms. As a result, the self-diffusion. rate of Al atoms in this porous Al film 8 is relatively high.

The Al wiring formed with an Al film exhibiting a high self-diffusion rate is generally poor in electro-migration resistance and in stress-migration resistance, so that it cannot be employed as a wiring.

However, in the case of this invention, the porous Al film which is formed at first is not directly employed as a wiring. Namely, what is employed as a wiring layer in this invention is the Al film 8 which substitutes for the Si film 7 filled in the interiors of the contact hole 4 and the wiring groove 5. Therefore, the wiring is not porous, thus raising no problem.

Because, since the substitution reaction. is not dependent on the macro Al film quality but on the mutual diffusion between Al atoms and Si atoms. Namely, through the substitution between the Si film 7 and the Al film 8, the Al film is changed into a sufficiently dense Al film which is useful as a wiring layer.

Furthermore, the porous Al film is not only high in self-diffusion rate of Al atoms, but also, effective in promoting the diffusion of Si atoms of the Si film 7 (a film to be substituted) into the Al film 8. When the diffusion of Si in the Al film 8 is promoted, Si atoms can be easily trapped in the Ti film within a short period of time, thus making it possible to shorten the time required for the substitution/absorption step and to lower the temperature of the substitution/absorption step.

These effects can be obtained not only through the use of the porous Al film but also through the use of an amorphous Al film, since the amorphous Al film is effective in accelerating the diffusion rate. Further, not only the transformation of Al film 8 into a porous or amorphous Al film but also the transformation of Si film 7 into a porous or amorphous Si film is effective in accelerating the diffusion rate of Al (a material constituting a conductive film) into the Si film 7 (a film to be substituted), thus making it possible to shorten the time required for the substitution/absorption step and to lower the temperature of the substitution/absorption step.

EXAMPLE 5

A method of manufacturing a semiconductor device according to this example will be explained with reference to FIGS. 13A to 13F.

First of all, a first wiring layer 1 is formed on an Si substrate (not shown) provided with an element. Then, an interlayer insulating film 3 is formed all over the surface of the Si substrate.

Figure 13A:
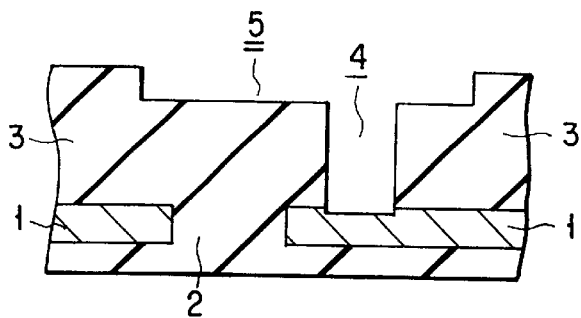
FIGS. 13A to 13F show respectively a cross-sectional view illustrating the manufacturing steps of the semiconductor device according to Example 5.

Then, the interlayer insulating film 3 is selectively etched by making use of photolithography and RIE to a depth reaching to the first wiring layer 1, thus forming a contact hole 4, and at the same time a wiring groove 5 is selectively formed likewise at a region including this contact hole 4. Namely, the contact hole 4 connected with the first wiring layer 1 and the wiring groove 5 are successively formed (FIG. 13A).

Figure 13B:
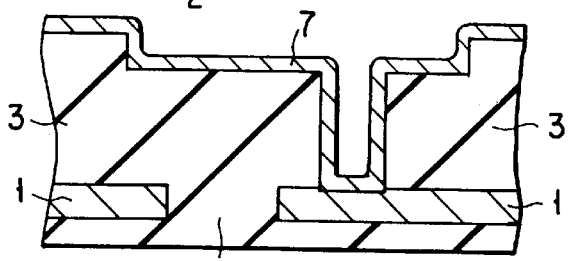

Then, an Si film 7 is deposited all over the substrate by means of LP-CVD method in a manner to avoid the Si film 7 from becoming too thick. Namely, the interiors of the contact hole 4 and the wiring groove 5 are not completely filled with the Si film 7 (FIG. 13B). The Si film 7 is employed in this example not only as a film for the substitution but also as a liner exhibiting an excellent wettability to Al.

Figure 13C:
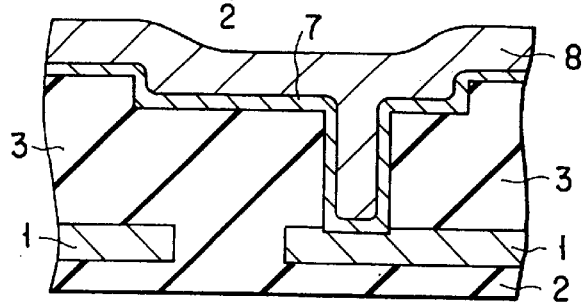

Then, an Al film 8 having a thickness of about ⅓ of the entire film thickness (the final film thickness) is deposited all over the surface of the substrate without heating by making use of a directional sputtering method, and then an Al film 8 having a thickness of about ⅔ of the entire film thickness is deposited all over the surface of the substrate, while heating the substrate, in a vacuum by making use of the ordinary sputtering method (FIG. 13C).

As for the directional sputtering method, a collimation sputtering method or a low pressure-long distance sputtering method for instance can be employed. When the sputtering of the Al film 8 is performed while heating the substrate, the fluidity of the Al film 8 can be increased, thus making it possible to easily fill the interiors of the contact hole 4 and wiring groove with the Al film 8.

Furthermore, when the sputtering of the Al film 8 is performed while heating the substrate, the surface diffusion of the Al film 8 can be accelerated due to the kinetic energy of the incoming sputtered particles (Al particles), so that the interiors of the contact hole 4 and wiring groove can be with the Al film 8 within a short period of time.

Figure 13D:
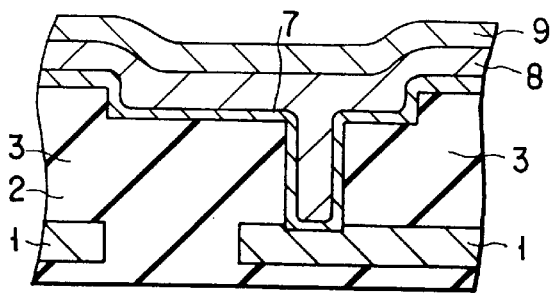

Then, a Ti film 9 is formed on the entire surface of the resultant substrate by making use of a sputtering method (FIG. 13D).

Figure 13E:
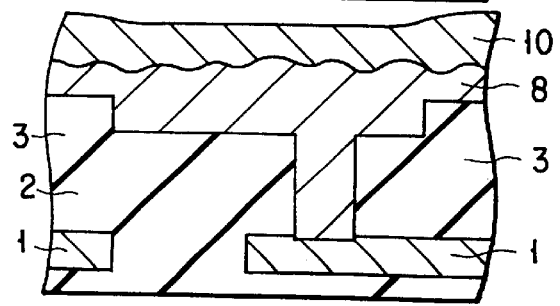

Thereafter, the substrate is heat-treated for one hour at a temperature of 450° C., whereby allowing the Si film 7 to be substituted by the Al film 8 and at the same time allowing a silicide-forming reaction to take place between the Si film 7 and the Ti film 9. Through the formation of the silicide, the Si film 7 is absorbed by the Ti film 9. As a result of this step, a Ti/Ti silicide film 10 is formed (FIG. 13E).

Figure 13F:
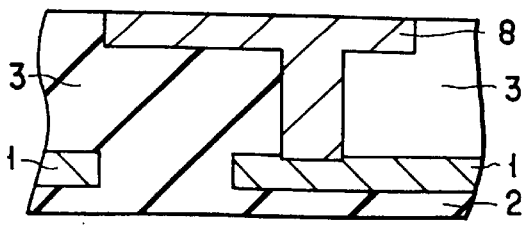

Finally, the Ti/Ti silicide film 10 and a superfluous portion of the Al film 8 are removed by means of the CMP method. At this occasion, the TiN film 6 formed as a barrier film on the upper portion of the substrate is also removed by means of the CMP method (FIG. 13F). As a result, an Al plug and an Al wiring layer (a second wiring layer) both consisting of the Al film 8 are formed in the interiors of the contact hole and the wiring groove 5, respectively.

EXAMPLE 6

First of all, a first wiring layer is formed on an Si substrate provided with an element. Then, an interlayer insulating film is formed all over the surface of the Si substrate.

Then, the interlayer insulating film is selectively etched by making use of photolithography and RIE to a depth reaching to the first wiring layer, thus forming a contact hole, and at the same time a wiring groove is selectively formed likewise at a region including this contact hole. Namely, the contact hole connected with the first wiring layer and the wiring groove are successively formed.

Then, a thin Si film is deposited on the inner walls of the contact hole and wiring groove by means of LP-CVD method.

For example, the thickness of the Si film may be 5 to 50 nm when the diameter of the opening of contact hole is $0.3\mu$ and the depth thereof is $0.9\mu$. This thin Si film can be employed a liner having an excellent wettability to the Al film.

Then, an Al film having a thickness of $0.8\mu$ is deposited all over the surface of the substrate without heating by making use of a directional sputtering method, after which the substrate is heated at a temperature of 400 to 500° C. in a vacuum. As a result, the Al film is fluidized by the heating, thus filling the interiors of the contact hole and the wiring groove with Al.

Although the Al film is formed herein by means of a directional sputtering method, the film thickness of Al film located at the bottom of the contact hole is relatively small in thickness. This thin Al film is more likely to be agglomerated and separated. When the Al film is separated in this manner, the route for the surface diffusion of the Al film is lost so that the Al film would not be fluidized.

However, since the Si film exhibiting an excellent wettability to the Al film is disposed an underlying layer in this example, the agglomeration and separation of the Al film can hardly take place, thus making it possible to fill the interiors of the contact hole and the wiring groove with the Al film. Further, since these Al and Si are allowed to undergo a mutual diffusion, the Si in the Si film gradually diffuses into the Al film in simultaneous with the fluidization of the Al film.

Then, a Ti film is formed on the entire surface of the resultant substrate by making use of a sputtering method while maintaining the temperature of the substrate to the fluidization temperature of the Al film. As a result, the Si film is substituted by the Al film, and at the same time a silicide-forming reaction is allowed to take place between the Si film diffused into the Al film and the Ti film at the upper surface of the Al film, thus forming a stable Ti/Ti silicide film.

Finally, the Ti/Ti silicide film and a superfluous portion of the Al film are removed by means of the CMP method. As a result, an Al plug and an Al wiring layer (a second wiring layer) both consisting of the Al film are formed in the interiors of the contact hole and the wiring groove, respectively.

EXAMPLE 7

First of all, a first wiring layer is formed on an Si substrate provided with an element. Then, an interlayer insulating film is formed all over the surface of the Si substrate.

Then, the interlayer insulating film is selectively etched by making use of photolithography and RIE to a depth reaching to the first wiring layer, thus forming a contact hole, and at the same time a wiring groove is selectively formed likewise at a region including this contact hole. Namely, the contact hole connected with the first wiring layer and the wiring groove are successively formed.

Then, a TiN film as a barrier film is formed all over the upper surface of the substrate by means of a sputtering method.

Then, a thin Si film is deposited on the inner walls of the contact hole and wiring groove by means of LP-CVD method. This Si film can be utilized as a film for increasing the nucleus for Al in addition to the utilization as the aforementioned substitutive film.

Then, an Al film is deposited all over the surface of the substrate by means of a CVD method wherein dimethyl aluminum hydride is employed as a raw material and temperature of the substrate is set to a temperature of 300 to 400° C.

In this case, since the Si film is disposed as an underlying layer for the Al film, i.e. since there are a large number of nuclei for Al, the Al film can be allowed to grow uniformly. As a result, the interiors of the contact hole and the wiring groove can be filled with the Al film.

Then, the temperature of the substrate is increased up to 450° C. and at the same time, a Ti film is deposited on the surface of the substrate in a vacuum by means of a sputtering method. During these processes of increasing the substrate temperature and the Ti-sputtering, the Si film is substituted by the Al film, and at the same time a silicide-forming reaction is allowed to take place between the Si film and the Ti film, thus forming a Ti silicide film, thus allowing the Si film to be absorbed by the Ti film.

If the substitution between the Al film and the Si film is insufficient in this case, the heating should preferably be continued even after the formation of the Ti film.

Finally, the Ti film, the Ti silicide film and a superfluous portion of the Al film are removed by means of the CMP method. As a result, an Al plug and an Al wiring layer (a second wiring layer) both consisting of the Al film are formed in the interiors of the contact hole and the wiring groove, respectively.

EXAMPLE 8

This example is applicable to all of the previous Examples 1 to 7.

There is a possibility in the method of filling the interiors of the contact hole and the wiring groove with an Si film that a CMP abrasive is left attached to the surface of the Si film after the step of removing a superfluous Si film disposed outside the contact hole or wiring groove by means of the CMP method, which is performed in subsequent to the step of forming the Si film.

Further, there is a possibility that a halide is left attached to the surface of the Si film after the step of removing a superfluous Si film disposed outside the contact hole or wiring groove by means of the CDE etch-back method or by means of the RIE etch-back method.

Furthermore, when the substrate is exposed to the external atmosphere after finishing the step of filling the interiors of the contact hole and wiring groove with an Si film, the surface of the Si film may be covered by a native oxide film or contaminated with an adhesion of impurities such as carbon in the air atmosphere.

The presence of these native oxide film and impurities not only obstructs the substitution reaction between Al and Si, i.e. a mutual diffusion therebetween, but also gives rise to various problems such as an increase in electric resistance due to these residues or an increase in time required for the aforementioned substitution reaction.

Accordingly, the employment of a wet etching using a dilute HF or ammonium fluoride is effective in removing these native oxide film and impurities. Further, if the surface of the Si film is subjected to a hydrogen termination treatment by making use of a super pure water containing not more than 10 ppb of oxygen, the natural oxidation due to the exposure to the air atmosphere can be effectively inhibited.

The employment of a dry etching using an Ar ion sputtering is effective in removing these native oxide film and impurities. Furthermore, if the Al film is formed in a vacuum without breaking vacuum after the dry etching, the re-oxidation of the surface of the Si film can be effectively inhibited.

When a method of filling the interiors of the contact hole and the wiring groove with an Si film is performed by a process wherein the Si film is entirely deposited at first and then the Si film is selectively removed by means of a dry etching process such as the CDE etch-back method or the RIE etch-back method so as to leave the Si film only in the interiors of the contact hole and the wiring groove, the re-oxidation of the surface of the Si film can be effectively inhibited, if the Al film is formed in a vacuum without breaking vacuum after the dry etching.

Further, since the native oxide film to be formed on the surface of the Si film that has been filled in the interiors of the contact hole and wiring groove is extremely thin, the native oxide film can be reduced by making use of Al. Thus, if a thermal sputtering wherein the sputtering is performed while heating the substrate is employed, the native oxide film can be reduced during the formation of the Al film, thus assuring the route for the mutual diffusion.

EXAMPLE 9

This example is applicable not only to all of the previous Examples 1 to 7, but also to the cases wherein Example 8 is applied to Examples 1 to 7.

There is a possibility that the surface of the first wiring layer contacting with the contact hole may be covered by a native oxide film or impurities, thus giving rise to an increase in contact resistance between the upper wiring layer and the lower wiring layer due to the presence of these native oxide film and impurities.

The removal of these native oxide film and impurities can be effectively performed before the step of forming the Si film and in a vacuum by the employment of an Ar ion sputtering or a chemical etching using an etching gas containing a halogen. Furthermore, the re-oxidation of the surface of the wiring layer can be effectively inhibited if the Si film is formed in a vacuum without breaking vacuum after the etching.

Since the employment of a single-wafer processing type apparatus is essential for carrying out a physical etching such as the Ar ion sputtering, the formation of Si film in subsequent to the removal of the native oxide film should preferably be performed by making use of a single-wafer processing type apparatus.

By contrast, in the case of chemical etching using an etching gas, it can be performed by making use of either a single-wafer processing type apparatus or a batch type apparatus. Further, the formation of Si film in subsequent to the removal of the native oxide film can be performed by making use of either a single-wafer processing type apparatus or a batch type apparatus.

Alternatively, the native oxide film on the surface of the Al wiring layer may be reduced by depositing a film consisting of a reductive material such as Ti on the surface of the first wiring layer. Ti is a highly reductive material so that the oxide film ($Al_2O_3$ film) on the surface of the Al wiring layer can be reduced by the Ti film, and at the same time, the presence of Ti film is effective in lowering the contact resistance.

However, since Ti is reactive to Si, thus generating a silicifying reaction, there is a possibility of producing a Ti silicide film through a reaction between the Ti film and the Si film before the substitution reaction between the Si film and the Al film takes place in the present invention which is featured in the utilization of the substitution reaction between the Si film and the Al film. If this Ti silicide film is produced, it will give a bad influence to the performance of the device of the present invention. This problem can be overcome by forming a TiN film as a barrier film on the surface of the Ti film in a vacuum without breaking vacuum or immediately after the previous step. It is possible with the formation of the TiN film to inhibit the silicifying reaction and at the same time to lower the contact resistance.

EXAMPLE 10

A method of manufacturing a semiconductor device according to this example will be explained with reference to FIGS. 14A to 14D.

First of all, a first wiring layer 1 consisting of Al is formed on an Si substrate (not shown) provided with an element. Then, an interlayer insulating film 3 is formed all over the upper surface of the substrate.

Then, the interlayer insulating film 3 is selectively etched by making use of photolithography and RIE to a depth reaching to the first wiring layer 1, thus forming a contact hole, and at the same time a wiring groove is selectively formed likewise at a region including this contact hole. Namely, the contact hole connected with the first wiring layer 1 and the wiring groove are successively formed.

Then, a native oxide film formed on the upper surface of the first wiring layer 1 which has been exposed on the bottom of the contact hole 4 is removed by means of a surface treatment. Then, an Si film 7 is deposited all over the substrate by means of CVD method in a manner which makes it possible to prevent any void from generating in the interiors of the contact hole and the wiring groove, thus obtaining the Si film 7 exhibiting an excellent step coverage.

Figure 14A:
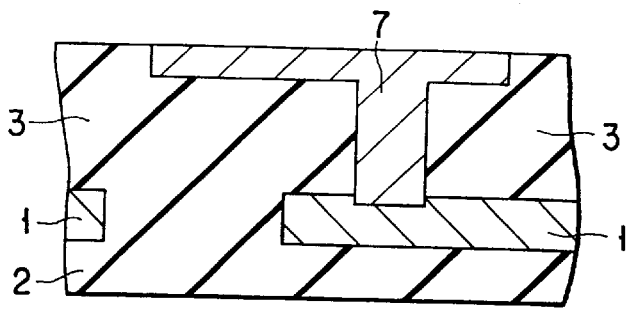
FIGS. 14A to 14D show respectively a cross-sectional view illustrating the manufacturing steps of the semiconductor device according to Example 10.

Then, the Si film 7 is selectively removed by means of the CMP method or CDE method so as to leave the Si film 7 only in the interiors of the contact hole and the wiring groove 5, thus removing any superfluous portion of the Si film 7 (FIG. 14A).

Then, the native oxide film on the surface of the Si film 7 are removed by way of a wet surface treatment or a dry surface treatment, e.g. a reverse sputtering for instance, and thereafter, an Al film 8 is deposited all over the upper surface of the resultant substrate.

In this case, if the Si film 7 is removed to such an extent that a portion of the Si film 7 which has been filled in the interior of the wiring groove is removed by the CDE method in the step of FIG. 14A, the deposition of the Al film 8 should be performed in such a manner that the wiring groove can be completely filled with the Al film 8. Because, if the interior of the wiring groove is not filled fully with the. Al film 8, a Ti film may be formed even in the interior of the wiring groove in a subsequent step, thus possibly making it difficult to remove the Ti film or Ti silicide film after the step of substitution between the Si film and the Al film.

Then, the substrate is transferred to a separate chamber without breaking vacuum, and disposed to face a Ti target with a shadow mask interposed therebetween. Under this condition, Ti film 9a is formed via the shadow mask on the surface of the Al film 8. Since the deposition of the Ti film 9a is performed via the shadow mask, a plurality of the Ti films 9a arrayed in a predetermined pitch can be obtained.

Figure 14B:
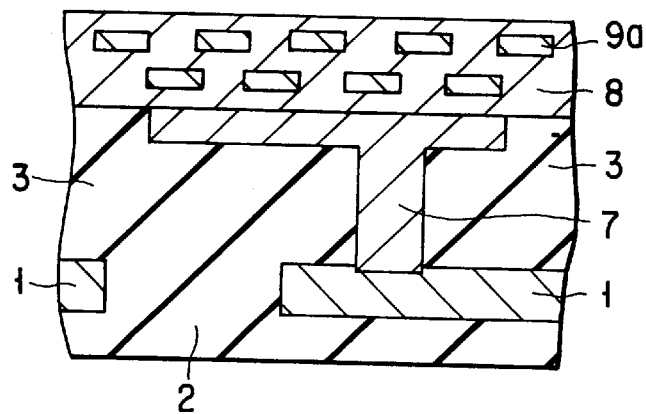

Then, after another Al film 8 is deposited all over the upper surface of the resultant substrate, another Ti film 9a is formed via the shadow mask on the surface of the Al film 8 in a vacuum without breaking vacuum. In this case, the position of the shadow mask is offset from the previous location of the shadow mask. As a result, a group of Ti films 9a which are offset in parallel from the previous group of Ti films 9a can be obtained. It is possible in this manner to minimize the overlapped portion (in the vertical direction) between these groups of Ti films 9a. Thereafter, another Al film 8 is deposited again all over the upper surface of the resultant substrate (FIG. 14B).

If the deposition steps of the Al film 8 and the Ti film 9a are alternately repeated, the contacting surface between the Al film 8 and the Ti film 9a can be effectively increased. Further, since the overlapped portion (in the vertical direction) between these groups of Ti films 9a can be minimized as mentioned above, it is possible to effectively trap the Si atoms which have been diffused into the Al film 8 in the subsequent heat treatment step by the Ti films 9a.

Moreover, when the deposition steps of the Al film 8 and the Ti film 9a are repeated in a vacuum without breaking vacuum, it is possible to prevent any native oxide film from being formed at the interface between the Al film 8 and the Ti film 9a.

In the mutual diffusion between the Si film 7 and the Al film 8, as well as in the silicifying reaction between the Si film 7 and the Ti film 9a, if a native oxide film is formed at the interface of these films, the mutual diffusion would be suppressed by the native oxide film and the silicifying reaction would be also obstructed by the native oxide film, thus suppressing the silicifying reaction.

Therefore, additional step for removing the native oxide film is required for avoiding these suppressions. However, if a plurality of Ti films 9a, each functioning as an absorption film, are successively deposit in vacuum as mentioned above, the step for removing the native oxide film is no more required to be performed.

Thereafter, the substrate is heat-treated for one hour at a temperature of 450° C., whereby allowing the Si film 7 to be substituted by the Al film 8 and at the same time allowing a silicide-forming reaction to take place between the Si film 7 and the Ti film 9. Through the formation of the silicide, the Si film 7 is absorbed by the Ti film 9. As a result of this step, a Ti/Ti silicide film 10 is formed (FIG. 14C).

Figure 14C:
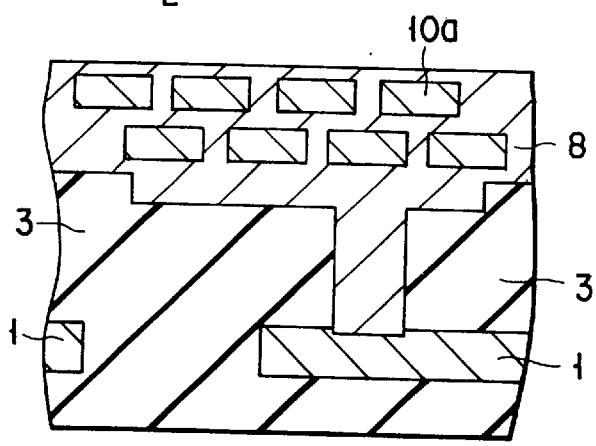
Figure 14D:
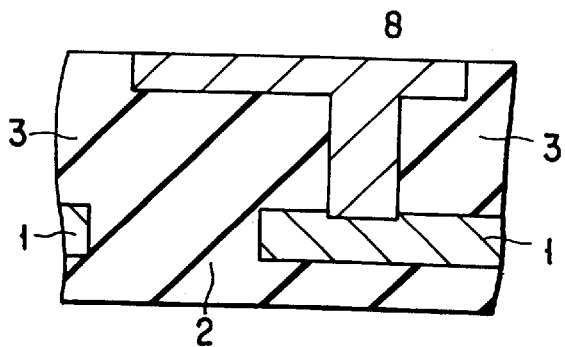

Since the effective contacting surface between the Al film 8 and the Ti film 9a is large and since the overlapped portion (in the vertical direction) between the Ti films 9a is small in the case of this example, the substitution/absorption in the step of FIG. 14C can be effectively enhanced.

Namely, the Si atoms in the Si film 7 that have been diffused into the Al film 8 are trapped (silicided) at the interface between the Al film 8 and the Ti film 9a. Since the effective contacting surface between the Al film 8 and the Ti film 9a is large in the case of this example, the probability of the aforementioned trapping would be increased, thus making it possible to shorten the time required for the substitution/absorption process.

In the foregoing explanation on this example, only two layers of Ti film 9a are employed. However, it is also possible to employ an increased number of Ti layer, whereby further saving the time required for the substitution/absorption process.

Finally, the Ti film, the Ti silicide film 10 and a superfluous portion of the Al film 8 are removed by means of the CMP method. As a result, an Al plug and an Al wiring layer (a second wiring layer) both consisting of the Al film 8 are formed in the interiors of the contact hole and the wiring groove, respectively.

In the foregoing explanation on this example, a plurality of Ti films 9a are formed in the same layer by making use of a shadow mask. However, it is also possible to employ a patterning process through a combination of the photolithography and RIE or a combination of the photolithography and wet etching.

In this case, a more fine Ti film can be formed as compared with the Ti film 9a to be formed by making use of a shadow mask, thus making it possible to further increase the contact area between the Ti film and the Al film 8 and hence to enable more efficient absorption of Si film.

Furthermore, according to these methods, it is also possible to arrange the layout of plural Ti films in the same layer in conformity with the quantity of the underlying Si layer, thus avoiding the formation of superfluous Ti film for the absorption of the Si film.

A specific example of this method will be explained below.

First of all, a first wiring layer is formed on an Si substrate provided with an element. Then, an interlayer insulating film is formed all over the upper surface of the substrate.

Then, the interlayer insulating film is selectively etched by making use of photolithography and RIE to a depth reaching to the first wiring layer, thus forming a contact hole, and at the same time a wiring groove is selectively formed likewise at a region including this contact hole. Namely, the contact hole connected with the first wiring layer an the wiring groove are successively formed.

Then, a native oxide film formed on the upper surface of the first wiring layer which has been exposed on the bottom of the contact hole is removed by means of a surface treatment. Then, an Si film is deposited all over the substrate by means of CVD method in a manner which makes it possible to prevent any void from generating in the interiors of the contact hole and the wiring groove, thus obtaining the Si film exhibiting an excellent step coverage.

Then, the Si film is selectively removed by means of the CMP method or CDE method so as to leave the Si film only in the interiors of the contact hole and the wiring groove, thus removing any superfluous portion of the Si film.

Then, an Al film is deposited all over the upper surface of the resultant substrate.

In this case, if the Si film is removed to such an extent that a portion of the Si film which has been filled in the interior of the wiring groove is removed by the CDE method or RIE method in the previous step, the deposition of the Al film should be performed in such a manner that the wiring groove can be completely. filled with the Al film. Because, if the interior of the wiring groove is not filled fully with the Al film, a Ti film may be formed even in the interior of the wiring groove in a subsequent step, thus possibly making it difficult to remove the Ti film or Ti silicide film (to be formed in the subsequent step) in the subsequent step.

Then, Ti film is formed on the Al film in a vacuum without breaking vacuum.

Then, at least a portion of the Ti film which has been deposited on the contact hole and wiring groove is partitioned by making use of photolithography and RIE.

In this case, the Ti film may be etched under the condition of etching ratio wherein the Al film disposed below the Ti film can be sufficiently left remained, or alternatively both Ti film and Al film are concurrently etched under the condition of etching ratio wherein the Si film filled in the interior of the wiring groove can be sufficiently left remained. Thereafter, the native oxide films formed on the surfaces of the exposed Si film, Ti film and Al film are removed, and then the interior of the wiring groove is again filled completely with an Al film.

The reason for re-filling the wiring groove with an Al film is as follows. Namely, since there is a possibility of Ti film being deposited on the inner wall of the wiring groove depending on the filling ratio of the Si film as mentioned above, if the interior of the wiring groove is not filled fully with the Al film, it may become difficult to remove the Ti film or Ti silicide film in the subsequent step.

Then, the native oxide films on the surfaces of the Ti film and Al film or the native oxide film on the surface of the Si film (when it is exposed) are removed after the aforementioned partitioning step of Ti film. Thereafter, an Al film is again deposited all over the upper surface of the resultant substrate by means of anisotropic sputtering method such as a long slow sputtering or collimation sputtering so as to avoid the formation of voids in the recessed portion formed by the partitioning of the Ti film.

Since a native oxide film would be formed on the surface of each film at the partitioning step of Ti film, there is a high possibility that the silicifying reaction between the Si to be diffused into the Al film in the subsequent step (the substitution/absorption step accompanying a heat treatment) and the Ti film would be obstructed, and at the same time the diffusion between Si and Al would be hindered.

Therefore, it is required to remove the native oxide films on the surfaces of the Ti film, Al film and Si film after the partitioning step of Ti film, thus promoting the substitution reactions, i.e. the diffusion between Al and Si, and the silicifying reaction between Si and Ti.

The reason for depositing an Al film after the partitioning step of Ti film in a manner to avoid the formation of voids at the interface between the Ti film and the Al film is to assure a route which enables the Si to diffuse and reach to the Ti film at the occasion of the substitution/absorption step, thereby to ensure the silicifying reaction.

When the Al film and the partitioned Ti film are formed in this manner, the contact area between the Ti film and the Al film can be effectively increased, thus making it possible to effectively carry out the substitution/absorption reaction.

Since the Si atoms that have been diffused into the Al film 8 are trapped (silicided) at the interface between the Al film and the Ti film, an increase in interface between the Al film and the Ti film leads to an increase in probability of trap, thus making it possible to shorten the time required for the substitution/absorption process.

If the partitioning step of the Ti film and the deposition step of the Al film are repeated plural times, the substitution/absorption can be performed more efficiently.

If the patterning of the Ti film is performed, in the process of repeating the partitioning step of the Ti film and the deposition step of the Al film, in such a manner that the lower partitioned Ti film region does not overlap with the upper partitioned Ti film region in relative to the Si film filled in the contact hole or wiring groove, the Si disposed below the Ti film can be more effectively trapped.

Thereafter, the substrate is heat-treated for one hour at a temperature of 450° C. whereby allowing the Si film to be substituted by the Al film and at the same time allowing a silicide-forming reaction to take place between the Si film and the Ti film. Through the formation of the silicide, the Si film is absorbed by the Ti film.

Finally, the Ti film which is not employed for the silicifying reaction, the Ti silicide film and a superfluous portion of the Al film are all removed by means of the CMP method. As a result, an Al plug and an Al wiring layer (a second wiring layer) both consisting of the Al film are formed in the interiors of the contact hole and the wiring groove, respectively.

In the foregoing explanation of this example, the Ti film is partitioned by making use of a shadow mask and then laminated together with the Al film. However, it is also possible to shorten the substitution time by simply laminating a plurality of contiguous. Ti films (not partitioned) with the Al films as compared with the structure where only one Ti film is formed on the Al film.

Furthermore, if the Ti film is made thinner, the Ti film is turned into a mesh structure when it is viewed microscopically, so that the Si atoms diffusing through the Al film may pass through the Ti film or a silicided thin Ti film, thus reaching an upper Ti film and reacting (silicifying reaction) with this upper Ti film. This phenomenon can be further promoted when a many number of thin Ti films are laminated with a many number of the Al films.

The gist of the present invention resides in the increase of the contact area between a conductive film and an absorption film. The increase of this contact area can be achieved by forming recessed portions or projected portions on the surface of the conductive film. Specific examples of this structure will be explained below.

For example, when an Al film is formed by means of sputtering while heating a substrate, an agglomeration of Al occurs at the initial stage of sputtering, thus forming an Al cluster. When this Al cluster is formed, the Al particles sputtered subsequently diffuse over the substrate and absorbed by the Al cluster, thus growing the Al cluster and hence forming an Al film having an extremely roughened surface.

When a Ti film is formed on this Al film having an extremely roughened surface, the contact area between the Al film and the Ti film can be increased, whereby increasing the possibility to trap the Si atoms of the lower Si film by the interface between the Al film and the Ti film.

It is also possible to introduce Ti atoms into the Al film formed in advance by means of ion implantation method, thereby dispersing Ti atoms on the surface region of the Al film. According to the ion implantation method, it is possible to entrap Ti atom in the Al film without inviting a reaction between Al and Ti, and at the same time to destroy the crystallinity of the Al film thereby to form an amorphous Al film exhibiting a high self-diffusion coefficient. As a result, it is possible to shorten the substituting time in the subsequent substitution step.

EXAMPLE 11

A method of manufacturing a semiconductor device according to this example will be explained with reference to FIGS. 15A to 15H.

Figure 15A:
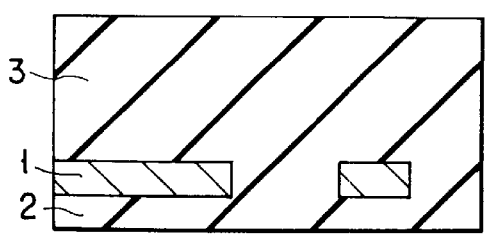
FIGS. 15A to 15H show respectively a cross-sectional view illustrating the manufacturing steps of the semiconductor device according to Example 11.
Figure 15B:
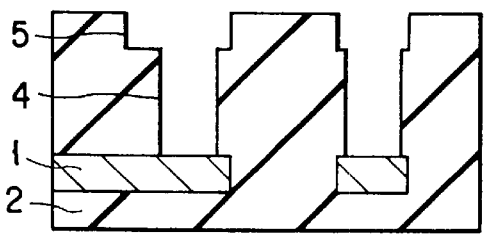

First of all, a first wiring layer 1 consisting of Al is formed on an Si substrate (not shown) provided with an element. This first wiring layer 1 is partially separated from each other via an insulating film 2. Then, an interlayer insulating film 3 is formed all over the surface of the Si substrate (FIG. 15A).

Then, the interlayer insulating film 3 is selectively etched by making use of photolithography and RIE to a depth reaching to the first wiring layer 1, thus forming a contact hole 4, and at the same time a wiring groove 5 is selectively formed likewise at a region including this contact hole 4 (FIG. 14B). Namely, the contact hole 4 connected with the first wiring layer 1 and the wiring groove 5 are successively formed.

Figure 15C:
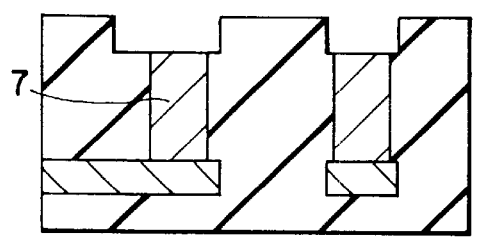

Then, a boron doped amorphous Si film 7 is deposited all over the substrate by means of LP-CVD method in a manner which makes it possible to prevent any void from generating in the interior of the contact hole. Then, the Si film 7 is selectively etched away by means of the CDE method so as to leave the Si film 7 only in the interior of the contact hole 4 (FIG. 15C).

Figure 15D:
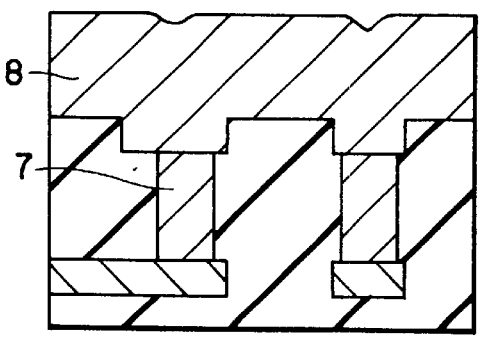

Then, the native oxide film and impurities on the surface of the Si film 7 are removed by means of Ar ion sputtering in a vacuum, and then an Al film 8 is formed on the entire surface of the Si film 7 in a vacuum without breaking vacuum (FIG. 15D).

Figure 15E:
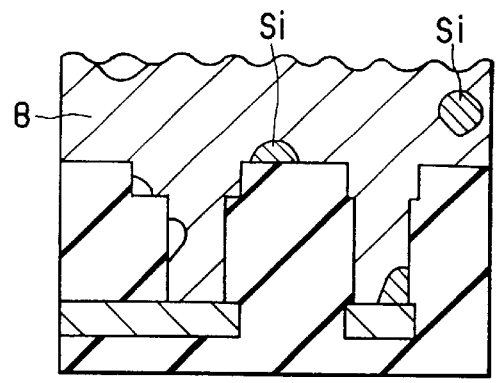

Thereafter, the substrate is heat-treated in an electric furnace for one hour at a temperature of 450° C., whereby allowing Si to be diffused in the Al film 8. As a result of this heat treatment, the surface of the Al film is roughened and Si is diffused in the Al film, part of the diffused Al being uniformly turned into nodules (FIG. 15E).

Figure 15F:
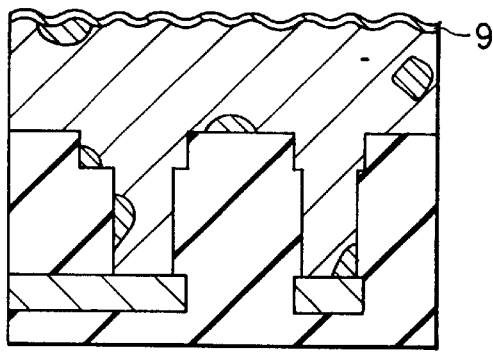

Then, the native oxide film formed on the surface of the Si film 7 and on the surface of the precipitated Si is removed by means of Ar ion sputtering in a vacuum, and then a Ti film 9 is formed by means of sputtering on the entire surface of the resultant substrate in a vacuum without breaking vacuum (FIG. 15F).

Figure 15G:
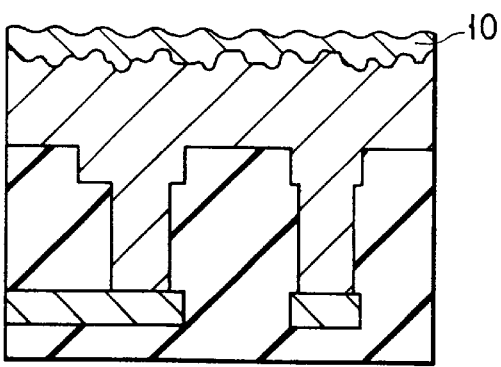
Figure 15H:
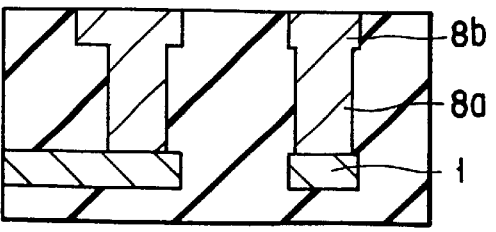

Thereafter, the substrate is heat-treated for one hour at a temperature of 450° C., whereby allowing Si in the Al film to react with the Ti film to form a TiSi compound, thereby allowing Si to be absorbed by the Ti film. During this step, an AlTi compound is also formed as an upper layer 10 in addition to the TiSi compound (FIG. 15G).

Finally, the Ti film, the TiSi compound layer, the AlTi compound layer and a superfluous portion of the Al film are all removed by means of the CMP method. As a result, an Al plug 8$a$ and an Al wiring layer (a second wiring layer) 8$b$ both consisting of the Al are formed in the interiors of the contact hole and the wiring groove, respectively.

As explained in Example 10, the surface of an Al film can be roughened by making use of a thermal sputtering, and, owing to this roughened surface of Al film, the contact area between the Al film and the Ti film can be increased, thus increasing the probability of trapping Si. This roughening of an Al film can be also effected by heat-treating the Al film formed in advance as in the case of this example, thus obtaining almost the same effect.

If this heat treatment is long enough to allow Si to diffuse and mix in an Al film as in the case of this example, Si can be uniformly dispersed throughout the Al film. However, depending on the layout of the wiring pattern for an LSI, a region containing a large quantity of Si and a region containing a small quantity of Si may be non-uniformly formed. Therefore, if the quantity of Si is relatively large in an underlying layer, the upper Ti layer is required to absorb a large quantity of Si. Since the heat treatment time is determined by the time required for finishing the substitution of Si of a region on a substrate where a maximum quantity of Si is contained, the heat treatment time is prolonged by the existence of an Si-enriched region. Accordingly, if the distribution of Si in the Al film is made uniform in advance as in the case of this example, the substitution time would be shortened, and hence the total processing time would be shortened as a whole.

When a heat treatment is performed to allow Si to be absorbed in an upper Ti film, void may be formed in the interior of the first Al wiring layer or in the interior of the second Al wiring layer. The generation of voids is assumed to be caused by a stress gradient to be formed between the surface region of the Al film which has been increased in volume due to the absorption of Si and the wiring groove or contact hole portion which has been decreased in volume due to the diffusion of Si.

In the case of this example however, it is characterized in that a heat treatment is performed for allowing the diffusion and mixing (a partial substitution) of Al and Si before the heat treatment for the absorption of Si into a Ti film. If this method is adopted, Si can be uniformly distributed throughout the Al film by the aforementioned preliminary heat treatment. As a result, the stress gradient due to the gradient of Si concentration in the heat treatment for the absorption of Si into a Ti film can be alleviated.

In the foregoing explanation of this example, the substrate is heat-treated in an electric furnace before a Ti film is formed. However, if the quantity of Si is relatively small, the heat treatment for the aforementioned diffusion and mixing can be shortened, or alternatively, a method of depositing Al while heating the substrate as explained in Example 10 may be employed. When a cluster tool is employed in this case for the formation of Ti film in a vacuum without breaking vacuum, it is possible to avoid the formation of a native oxide film on the surface of the Al film or on the surface of Si that has been precipitated on the surface of the Al film, thus dispensing with a step of removing the native oxide film.

It is possible to obtain almost the same effect even if the substrate is heated after the formation of the Al film and then a Ti film is formed. If the absorption of Si into the Ti film takes a longer time as compared with the time for forming the Ti film, the substrate may be additionally heat-treated in an electric furnace after the deposition of the Ti film on a heated substrate. When the substrate is heated prior to the deposition of the Ti film to be functioned as an absorption film, the Al film can be thermally expanded, thus alleviating the stress.

EXAMPLE 12

A method of manufacturing a semiconductor device according to this example will be explained with reference to FIGS. 16A to 16H.

Figure 16A:
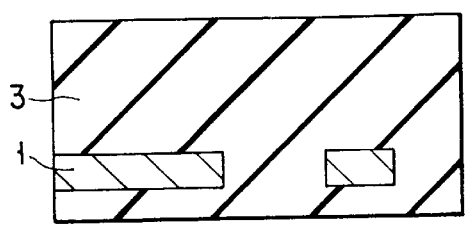
FIGS. 16A to 16J show respectively a cross-sectional view illustrating the manufacturing steps of the semiconductor device according to Example 12.

First of all, a first wiring layer 1 consisting of Al is formed on an Si substrate (not shown) provided with an element. This first wiring layer 1 is partially separated from each other via an insulating film 2. Then, an interlayer insulating film 3 is formed all over the surface of the Si substrate (FIG. 16A).

Figure 16F:
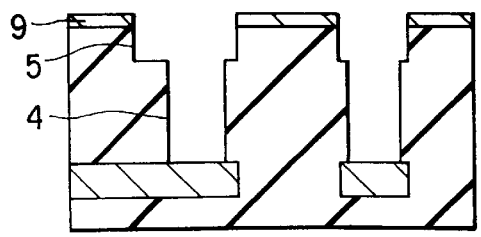
Figure 16B:
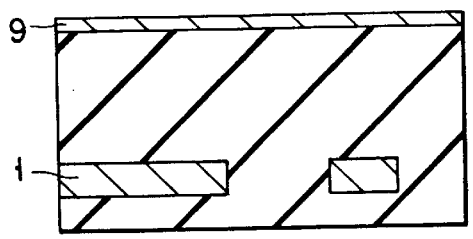

Then, a Ti film 9 having a thickness of 200 nm is formed by means of sputtering (FIG. 16B).

Figure 16G:
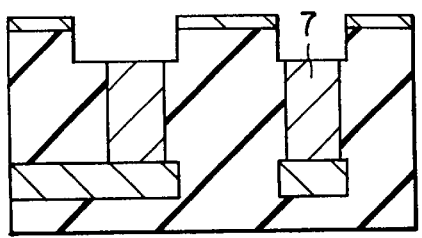
Figure 16C:
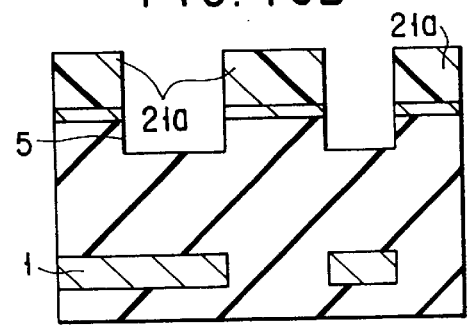

Thereafter, a resist pattern 21 is formed on the Ti film 9 by making use of lithography, and then the Ti film 9 and the interlayer insulating film 3 are successively and selectively etched away thereby forming a wiring groove 5 (FIG. 16C). In this process, a Cl-based gas is employed for etching the Ti film 9 by means of the RIE method, while a F-based gas is employed for etching the interlayer insulating film 3 by means of the RIE method. Subsequently, the resist pattern 21 is removed by ashing it (FIG. 16D).

Figure 16H:
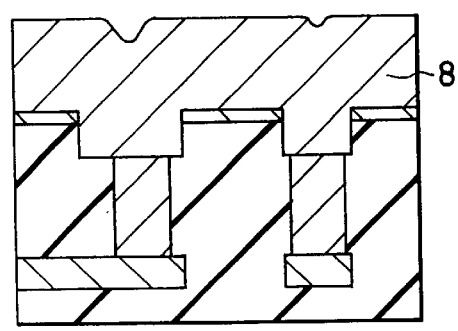
Figure 16D:
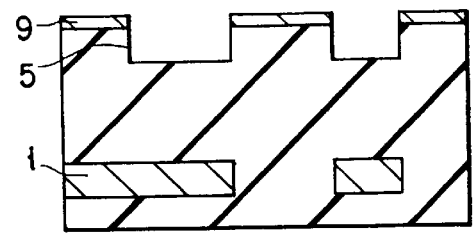
Figure 16I:
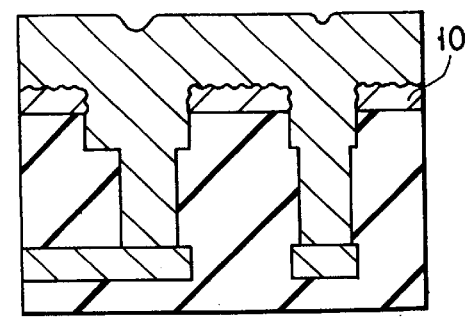
Figure 16E:
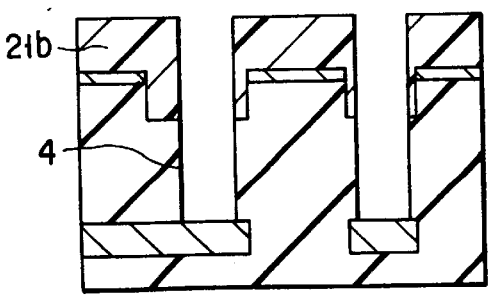
Figure 16J:
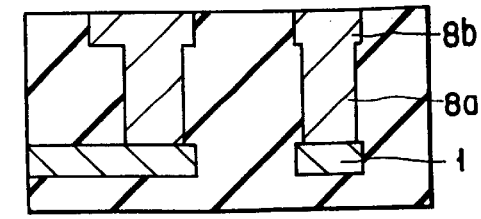

Then, the interlayer insulating film 3 is selectively etched by RIE making use of a resist pattern 21b as a mask to a depth reaching to the first wiring layer 1, thus forming a contact hole 4 (FIG. 16E). Namely, the contact hole 4 connected with the first wiring layer 1 and the wiring groove 5 is formed (FIG. 16F).

Then, a boron doped amorphous Si film 7 is deposited all over the substrate by means of LP-CVD method in a manner which makes it possible to prevent any void from generating in the interior of the contact hole 4. Then, the Si film 7 is selectively etched away by means of the CDE method so as to leave the Si film 7 only in the interior of the contact hole 4 (FIG. 16G).

Then, the native oxide film and impurities on the surfaces of the Ti film 9 and Si film 7 deposited on the interlayer insulating film 3 are removed by means of Ar ion sputtering, and then an Al film 8 is formed on the entire surface of the Si film 7 in a vacuum without breaking vacuum (FIG. 16H).

Thereafter, the substrate is heat-treated in an electric furnace for one hour at a temperature of 450° C., whereby allowing the Si film to be substituted by the Al film and at the same time allowing a silicide-forming reaction to take place between the Si film and the Ti film. Through the formation of the Ti silicide, the Si is absorbed by the Ti film 9. In this step, an AlTi layer is also formed in addition to the Ti silicide film, as indicated by the reference numeral 10 (FIG. 16G).

Finally, the Al film formed outside of the wiring groove, Ti film, the Ti silicide layer and the AlTi compound layer are all removed by means of the CMP method. As a result, an Al plug 8a and an AL wiring layer (a second wiring layer) 8b both consisting of the Al are formed in the interiors of the contact hole and the wiring groove, respectively (FIG. 16H).

In the explanation of Example 10, a method of arraying a plurality of Ti film inside the Al film has been explained. However, the Ti film may be arrayed in plurality at the bottom of the Al film as illustrated in this example, thereby enhancing the trap efficiency of the Si atoms. Since the patterning of Ti film can be performed simultaneous with the formation of the wiring groove according to this example, the employment of a shadow mask for the patterning of Ti film as in the case of Example 10 is no more required, thus making it possible to minimize the peel-off of Ti dust from the shadow mask, which may otherwise become a problem in actual use.

When the Ti film is formed on the Al film, the generation of void may sometimes be recognized in the first Al wiring, in the interior of contact hole, or in the interior of the second Al wiring layer during the heat treatment for effecting the substitution between Si and Al and effecting the absorption of Si by the upper Ti layer. The cause for the generation of such a void may be ascribed to the stress gradient that may be brought about by a change in volume of the AlTi alloy layer to be formed at the interface of Ti/Al or of the TiSi layer to be formed by the absorption of Si. Namely, the void is generated for alleviating the stress being applied to the Al layer, and caused to remain in the first Al wiring or in the interiors of contact hole or the second Al wiring layer even after the Al film disposed outside of the wiring groove is removed. The presence of void inside the wiring invites a cause for the disconnection of wiring or the deterioration in reliability of wiring, thus necessitating some countermeasures.

In the case of Example 10, the Ti layer is not existed on the surface of the uppermost Al film, so that the Al film is not restrained by the TiSi layer or by the AlTi layer. In this case, although the bottom side of the Al film would be inflicted by a stress from the volume change resulting from the TiSi reaction or from the AlTi alloy-forming reaction, the surface of the Al layer is free to deform, thus making it possible to alleviate the stress and hence to prevent the void from generating in the wiring groove, contact hole and first Al wiring layer.

This example is featured in that the Ti film which is capable of absorbing Si in the form of a silicide is formed at the bottom of the Al film. When this Ti film is disposed at the bottom of the Al film, the surface of the Al film would not be restrained by the TiSi layer or AlTi layer. In this case, although the bottom side of the Al film would be inflicted by a stress from the volume change resulting from the TiSi reaction or from the AlTi alloy-forming reaction, the surface of the Al layer is free to deform, thus making it possible to alleviate the stress and hence to prevent the void from generating in the wiring groove, contact hole and first Al wiring layer.

Figure 17A:
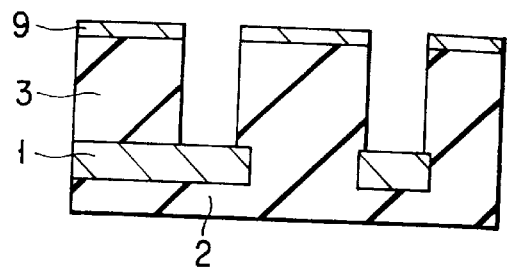
FIGS. 17A to 17E show respectively a cross-sectional view illustrating the manufacturing steps of the semiconductor device according to a modified embodiment of Example 12.
Figure 17B:
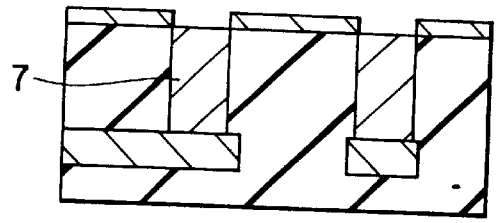
Figure 17C:
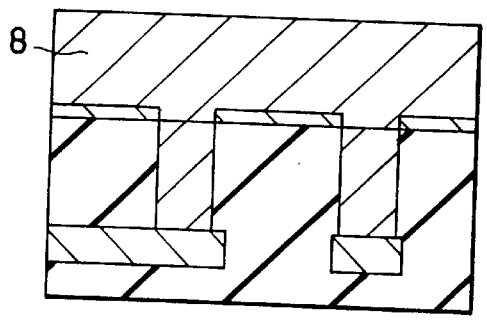
Figure 17D:
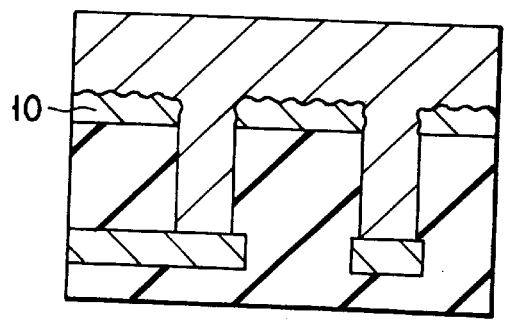
Figure 17E:
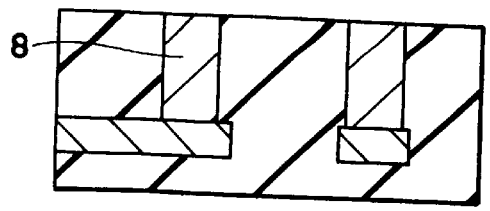

In the foregoing explanation of this example, a method of forming the wiring groove and contact hole, and concurrently filling them with Al has been discussed. However, it is also possible to fill only the contact hole with Al by making use of the aforementioned method. Specifically, a Ti film is formed all over the surface of an insulating film, and the patterning of the Ti film and the insulating film is performed by making use of photolithography and RIE (FIG. 17A). Then, an Si film is deposited all over the substrate, and then etch-backed by means of the CDE method, thereby leaving the Si film only in the interior of the contact hole (FIG. 17B). Then, an Al film is deposited all over the surface of the resultant substrate (FIG. 17C). Under this condition, a heat treatment is performed, thereby causing the Si in the contact hole to be absorbed in the form of silicide by the Ti film formed on the insulating film, and at the same time the substitution between the Si and Al is allowed to proceed (FIG. 17D). Finally, the Al film and the AlTi compound layer/TiSi compound/Ti layer are removed by means of the CMP method (FIG. 17E).

As explained above, in the case where an Al plug is formed in advance, an interlayer insulating film is then formed and a wiring groove is formed in the interlayer insulating film to a depth reaching to the Al plug, thus making it possible, by allowing the wiring groove to be filled with a low resistance metal such as Cu, to realize wiring.

EXAMPLE 13

A method of manufacturing a semiconductor device according to this example will be explained with reference to FIGS. 18A to 18D.

First of all, a first wiring layer 1 consisting of Al is formed on an Si substrate provided with an element. Then, an interlayer insulating film 3 is formed all over the upper surface of the substrate.

Then, the interlayer insulating film 3 is selectively etched by making use of photolithography and RIE to a depth reaching to the first wiring layer 1, thus forming a contact hole, and at the same time a wiring groove is selectively formed likewise at a region including this contact hole. Namely, the contact hole connected with the first wiring layer 4 and the wiring groove are successively formed.

Figure 18A:
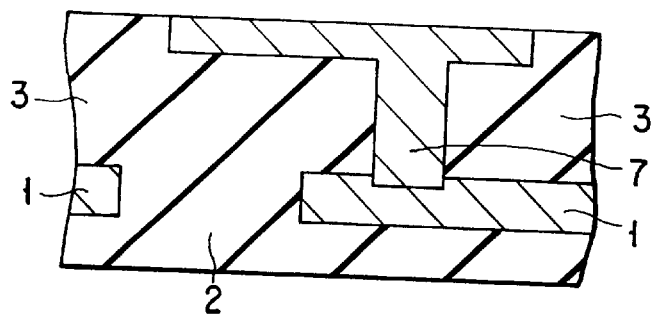
FIGS. 18A to 18D show respectively a cross-sectional view illustrating the manufacturing steps of the semiconductor device according to Example 13.

Then, a native oxide film formed on the upper surface of the first wiring layer 1 which has been exposed on the bottom of the contact hole is removed by means of a surface treatment. Then, an Si film 7 is deposited all over the substrate by means of CVD method in a manner which makes it possible to prevent any void from generating in the interiors of the contact hole and the wiring groove, thus obtaining the Si film 7 exhibiting an excellent step coverage. Then, the Si film 7 is selectively removed by means of the CMP method or CDE method so as to leave the Si film 7 only in the interiors of the contact hole and the wiring. groove, thus removing any superfluous portion of the Si film 7 (FIG. 18A).

Figure 18B:
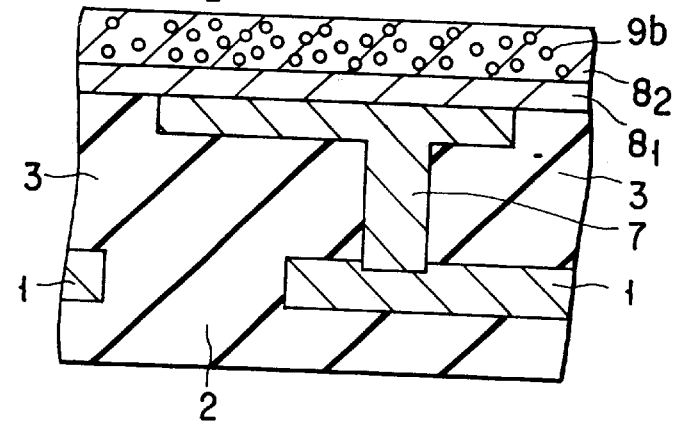

Then, the native oxide film formed on the surface of the Si film 7 is removed by means of a wet type surface treatment or a dry type surface treatment such as a reverse sputtering, and then an Al film 81 is deposited all over the upper surface of the resultant substrate. Thereafter, the substrate is transferred to a separate chamber without breaking vacuum and Ti fine particles are sprayed on the substrate by making use of a shower head type nozzle or any number of nozzle, thereby depositing a Ti layer. Then, Al is entirely deposited without breaking vacuum by means of sputtering method thereby forming an Al film 82 containing the Ti fine particles (FIG. 18B).

In this case, it is also possible to form the Al film 82 by feeding the Ti fine particles in concurrent with the sputtering of Al all over the surface of the Al film 81.

It is also possible to form the Al film 82 by feeding a mixture of Ti fine particles and Al fine particles all over the surface of the Al film 81.

It is also possible to form the Al film 82 by coating a solution containing a uniform dispersion of Ti fine particles and Al fine particles all over the surface of the Al film 81.

Further, it is also possible to form the Al film 82 by a sputtering method where a target comprising Al and Ti fine particles buried the Al is employed. In this method, the Ti fine particles in the target would fall on the substrate to be entrapped by an Al film, thereby enabling an Al film containing a plurality of Ti film 9a to be obtained as in the case of the aforementioned method, but without employing any sophisticated sputtering apparatus.

It is also possible to employ a magnetron sputtering wherein the erosion region (a region where plasma density is high) of the surface of target is fixed, and any Ti particles re-adhered around the erosion region are allowed to fall onto the substrate, thereby dispersing them in the Al film together with the sputtered Ti.

It is also possible to employ a target having a roughened surface, and any Ti particles re-adhered to the roughened surface are allowed to fall onto the substrate, thereby dispersing them in the Al film together with the sputtered Ti.

Figure 18C:
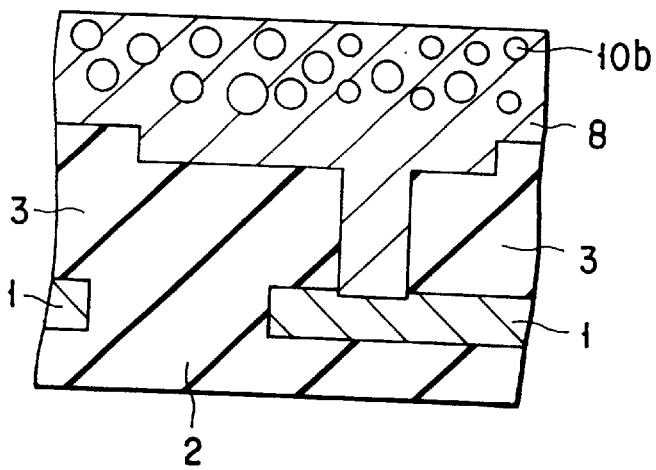
Figure 18D:
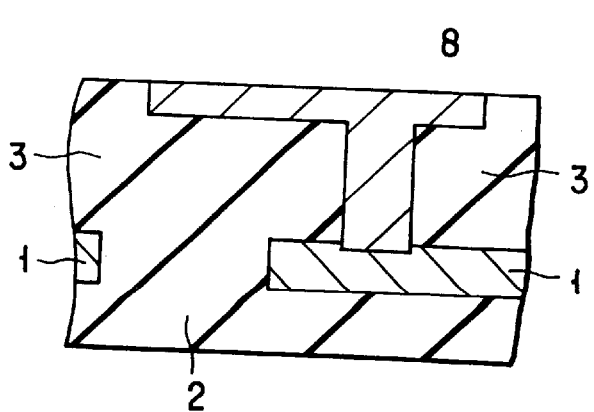

Thereafter, the substrate is heat-treated for one hour at a temperature of 450° C., whereby allowing the Si film 7 to be substituted by the Al films 81 and 82, and at the same time allowing the Si film 7 to be reacted with the Ti fine particles in the Al film 82 to form a Ti silicide compound, thereby allowing the Si film 7 to be absorbed by the Ti fine particles. During this step, a Ti/Ti silicide film 10 is formed (FIG. 18C).

Since the Ti fine particles functioning as an absorbent are dispersed in the Al film 82, the area of Ti film to be reacted with Si is enlarged, thus making it possible to effectively turn the Si film 7 into a Ti silicide. Therefore, the substitution/absorption process in FIG. 18C can be made high in efficiency.

Finally, the Ti/Ti silicide film 10 and any superfluous portion of the Al films 81 and 82 are all removed by means of the CMP method. As a result, an Al plug and an Al wiring layer (a second wiring layer) both consisting of the Al film 8 are formed in the interiors of the contact hole and the wiring groove, respectively.

In the explanation of Examples 10 and 11, a method of forming an Al film containing plural Ti films after the deposition of the Al film on the Si film, or a method of forming an Al film containing Ti fine particles after the deposition of the Al film on the Si film has been explained. However, if the contact hole and wiring groove are completely filled with the Si film, it is also possible to obtain almost the same effect even if a mixed film containing both Al and Ti is directly formed on the Si film.

Namely, when Ti is employed in a manner where a single layer of Ti is partitioned into a plurality of sections, the surface area of the Ti film to be contacted with Al can be increased, so that the effective quantity of Ti useful for the absorption of Si per unit time can be increased.

This invention is intended to obtain a buried type wiring, and hence a high resistance region comprising Ti or Ti compounds can be easily removed in the removing step employing the CMP in the step of forming a wiring layer, thus making it possible to avoid an increase in resistance of the wiring and at the same time to effectively promote the substitution reaction between Al and Si.

EXAMPLE 14

First of all, a first wiring layer consisting of Al is formed on an Si substrate provided with an element. Then, an interlayer insulating film is formed all over the upper surface of the substrate.

Then, the interlayer insulating film is selectively etched by making use of photolithography and RIE to a depth reaching to the first wiring layer, thus forming a contact hole, and at the same time a wiring groove is selectively formed likewise at a region including this contact hole. Namely, the contact hole connected with the first wiring layer and the wiring groove are successively formed.

Then, a native oxide film formed on the upper surface of the first wiring layer which has been exposed on the bottom of the contact hole is removed by means of a surface treatment. Then, an Si film is deposited all over the substrate by means of CVD method in a manner which makes it possible to prevent any void from generating in the interiors of the contact hole and the wiring groove, thus obtaining the Si film exhibiting an excellent step coverage. Then, the Si film is selectively removed by means of the CMP method or CDE method so as to leave the Si film only in the interiors of the contact hole and the wiring groove, thus removing any superfluous portion of the Si film.

Then, the native oxide film formed on the surface of the Si film is removed by means of a wet type surface treatment or a dry type surface treatment such as a reverse sputtering, and then an Al film is deposited all over the upper surface of the resultant substrate. Thereafter, the substrate is transferred to a separate chamber without breaking vacuum, and then a mixed film consisting of Al and Ti (an Al/Ti mixed film) is deposited on the surface of the Al film by means of sputtering method employing a Ti target having Al pellets buried therein (a mosaic target).

Thereafter, the substrate is heat-treated for one hour at a temperature of 450° C. for instance, whereby allowing the Si film to be substituted by the Al film and the Al/Ti mixed film, and at the same time allowing the Si film to be reacted with the Ti in the Al/Ti mixed film to form a Ti silicide compound, thereby allowing the Si film to be absorbed by the Al/Ti mixed film. During this step, a Ti/Ti silicide film is formed.

Finally, the Ti/Ti silicide film and any superfluous portion of the Al film and Al/Ti mixed film are all removed by means of the CMP method. As a result, an Al plug and an Al wiring layer (a second wiring layer) both consisting of the Al film are formed in the interiors of the contact hole and the wiring groove, respectively.

In the explanation of this example, the Al/Ti mixed film is formed after the deposition of the Al film on the Si film. However, if the contact hole and wiring groove are completely filled with the Si film, the Al/Ti mixed film may be directly formed on the Si film.

Because, since the Si in the contact hole and wiring groove is substituted through the heat treatment by the Al in the Al/Ti mixed film disposed over the Si, a silicide that brings about an increase in resistance is not formed in the interiors of the contact hole and wiring groove to be employed as an electrode.

EXAMPLE 15

First of all, a first wiring layer consisting of Al is formed on an Si substrate provided with an element. Then, an interlayer insulating film is formed all over the upper surface of the substrate.

Then, the interlayer insulating film is selectively etched by making use of photolithography and RIE to a depth reaching to the first wiring layer, thus forming a contact hole, and at the same time a wiring groove is selectively formed likewise at a region including this contact hole. Namely, the contact hole connected with the first wiring layer and the wiring groove are successively formed.

Then, a native oxide film formed on the upper surface of the first wiring layer which has been exposed on the bottom of the contact hole is removed by means of a surface treatment. Then, an Si film is deposited all over the substrate by means of CVD method in a manner which makes it possible to prevent any void from generating in the interiors of the contact hole and the wiring groove, thus obtaining the Si film exhibiting an excellent step coverage. Then, the Si film is selectively removed by means of the CMP method or CDE method so as to leave the Si film only in the interiors of the contact hole and the wiring groove, thus removing any superfluous portion of the Si film.

Then, the native oxide film formed on the surface of the Si film is removed by means of a wet type surface treatment or a dry type surface treatment such as a reverse sputtering, and then an Al film and a Ti film are deposited all over the upper surface of the resultant substrate without breaking vacuum.

Figure 19A:
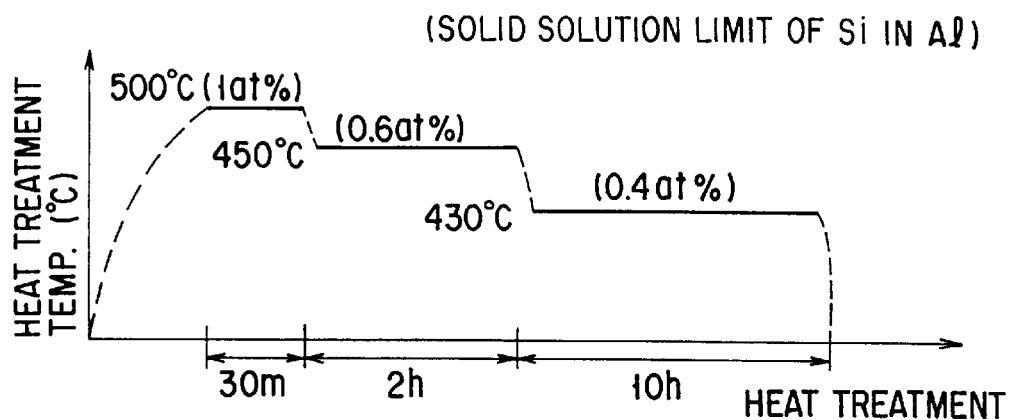
FIGS. 19A to 19C show respectively a graph illustrating the temperature sequence of heat treatment.
Figure 19B:
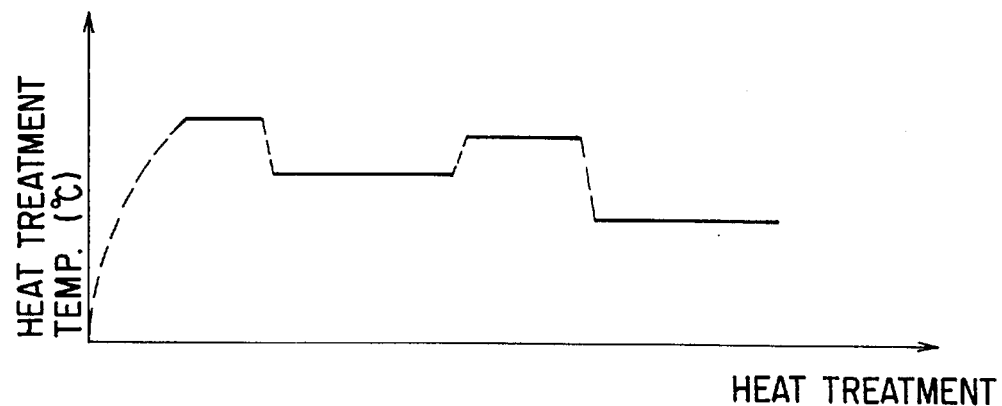
Figure 19C:
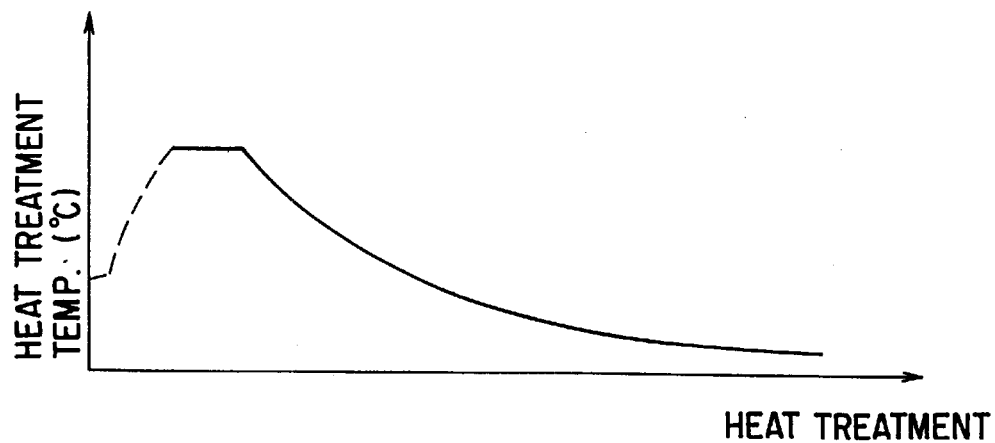

Thereafter, the substrate is subjected to a heat treatment under the temperature sequence as shown in FIGS. 19A to 19C. For example, the substrate is heat-treated for 30 minutes at a temperature of 500° C. thereby allowing a substitution reaction to take place between the Si film and the Al film, and then heat-treated again for two hours at a temperature of 450° C. and then for 10 hours at a temperature of 430° C. (FIG. 19 A).

As a result of this multi-stage heat treatment, the Si film can be substituted by the Al film, and at the same time the Si film is allowed to be reacted with the Ti film to form a Ti silicide compound, thereby allowing the Si film to be absorbed by the Ti film. During this step, a Ti/Ti silicide film is formed.

Finally, the Ti/Ti silicide film and any superfluous portion of the Al film are all removed by means of the CMP method. As a result, an Al plug and an Al wiring layer (a second wiring layer) both consisting of the Al film are formed in the interiors of the contact hole and the wiring groove, respectively.

According to this invention, it is possible with the employment of this multi-stage heat treatment to shorten the substitution time between the substitutive film (Si film) and the conductive film (Al film) as well as the absorption time of the substitutive film (Si film) by the absorption film (Ti film), and at the same time to lower the resistance of the conductive film (Al film) remaining in the wiring groove and contact hole.

Specifically, if an Si film is employed as a substitutive film, an Al film as a conductive film, and a Ti film as an absorption film, the mutual diffusion between Al and Si as well as the absorption. reaction (silicifying reaction) take place vigorously at a temperature of 400° C. or more. Therefore, as far as the substitution and the absorption are concerned, the higher the heat treatment temperature is, the shorter the time that will be required.

However, the solid solution limit of Si in the Al film changes according to temperature, i.e. the higher the temperature is, the larger the solid solution limit of Si is. Accordingly, when the solid solution quantity of an impurity in the Al film is increased, the resistance of the Al film would be increased, and hence the wire resistance would increased, thus raising a problem.

In order to overcome this problem, a low temperature heat treatment is performed after allowing the substitution and the absorption to take place at a high temperature heat treatment, thus discharging the Si to an extent of the solid solution limit of Si in the Al film at low temperature. Therefore, it is possible according to this invention to realize not only the shortening of the substitution/absorption time, but also the lowering of resistance.

The multi-stage heat treatment is not limited to a three-stage heat treatment as explained in this example, but it may be a two-stage heat treatment or a four or more-stage heat treatment. Furthermore, almost the same effect for lowering the wire resistance can be obtained even if a temperature sequence where the temperature is raised or lowered at the middle as shown in FIG. 19B is employed as long as the final heat treatment temperature is lower than the preceding heat treatment temperatures.

It is also possible to obtain almost the same effect of lowering the wire resistance, even if the heat treatment is not constituted by a step-wise temperature changes, but is constituted by a gradual cooling (FIG. 19C).

EXAMPLE 16

A method of manufacturing a semiconductor device according to this example will be explained with reference to FIGS. 20A to 20F.

First of all, a first wiring layer 1 consisting of Al is formed on an Si substrate provided with an element. Then, an interlayer insulating film 3 is formed all over the upper surface of the substrate.

Then, a contact hole and a wiring groove are successively formed in the interlayer insulating film 3. Then, a native oxide film formed on the upper surface of the first wiring layer 1 which has been exposed on the bottom of the contact hole is removed by means of a surface treatment.

Then, an Si film 7 is deposited all over the substrate by means of CVD method in a manner which makes it possible to prevent any void from generating in the interiors of the contact hole and the wiring groove. Then, the Si film 7 is selectively removed by means of the CMP method so as to leave the Si film 7 only in the interiors of the contact hole and the wiring groove 5, thus removing any superfluous portion of the Si film 7.

Then, the native oxide film formed on the surface of the Si film 7 is removed, and then an Al film 81 and a Ti layer 91 successively deposited without breaking vacuum (FIG. 20A).

Thereafter, the substrate is heat-treated for 30 minutes at a temperature of 450° C., whereby allowing the Si film 7 to be substituted by the Al film 81, and at the same time allowing the Si film 7 to be reacted with the Ti 91 to form a Ti silicide compound, thereby allowing the Si film 7 to be absorbed by the Ti 91. During this step, a Ti/Ti silicide film 101 is formed (FIG. 20B).

Then, the Ti/Ti silicide film 101 and any superfluous portion of the Al film 81 are all removed by means of the CMP method (FIG. 20C).

Then, an Al film 82 and a Ti layer 92 are successively deposited all over the resultant substrate as in the case of the Al film 81 and the Ti layer 91 (FIG. 20D).

Thereafter, the substrate is heat-treated for 30 minutes at a temperature of 450° C., whereby allowing the Si remaining in the wiring groove and contact hole to be removed again (FIG. 20E). During this step, a Ti/Ti silicide film 102 is formed.

Finally, the Ti/Ti silicide film 102 and any superfluous portion of the Al films 81 and 82 disposed outside the wiring groove are all removed by means of the CMP method (FIG. 20F).

As a result, an Al plug and an Al wiring layer (a second wiring layer) both consisting of the Al film are formed in the interiors of the contact hole and the wiring groove, respectively.

In the foregoing explanation, the absorption of Si remaining in the Al film filled in the wiring groove is performed by a process wherein the Al film 82 and Ti layer 92 are successively deposited again and heat-treated after the removal of the Ti/Ti silicide film 101 and a superfluous portion of the Al film 81 disposed outside of the wiring groove. However, it is also possible to adopt a process wherein the Ti/Ti silicide film 101 is removed in such a manner that the Al film 81 is left remained in the interior of the wiring groove and in a region outside the wiring groove, and then only the Ti layer 92 is deposited entirely whereby re-absorbing the Si left remained in the Al film 81 filled in the wiring groove.

EXAMPLE 17

A method of manufacturing a semiconductor device according to this example will be explained with reference to FIGS. 21A to 21D.

First of all, a first wiring layer 1 consisting of Al is formed on an Si substrate provided with an element. Then, an interlayer insulating film 3 is formed all over the upper surface of the substrate.

Then, a contact hole and a wiring groove are successively formed in the interlayer insulating film 3. Then, a native oxide film formed on the upper surface of the first wiring layer 1 which has been exposed on the bottom of the contact hole is removed by means of a surface treatment.

Then, an Si film 7 is deposited all over the substrate by means of CVD method in a manner which makes it possible to prevent any void from generating in the interiors of the contact hole and the wiring groove.

Then, the Si film 7 is selectively removed by means of the CMP method so as to leave the Si film 7 only in the interiors of the contact hole and the wiring groove 5, thus removing any superfluous portion of the Si film 7.

Figure 21A:
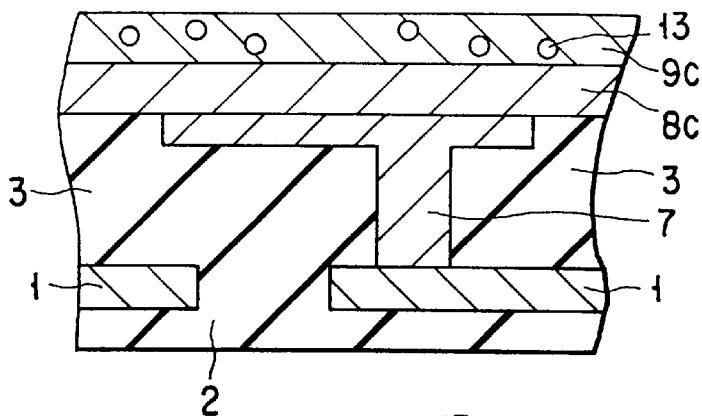
FIGS. 21A to 21D show respectively a cross-sectional view illustrating the manufacturing steps of the semiconductor device according to Example 17.

Then, the native oxide film formed on the surface of the Si film 7 is removed, and then an Al film 8c which is free form impurities is formed and then a Ti layer 9c containing Cu 13 is deposited without breaking vacuum (FIG. 21A). In this case, the Ti layer 9c containing Cu 13 can be obtained for instance by means of sputtering method employing a Ti target containing Cu.

Figure 21B:
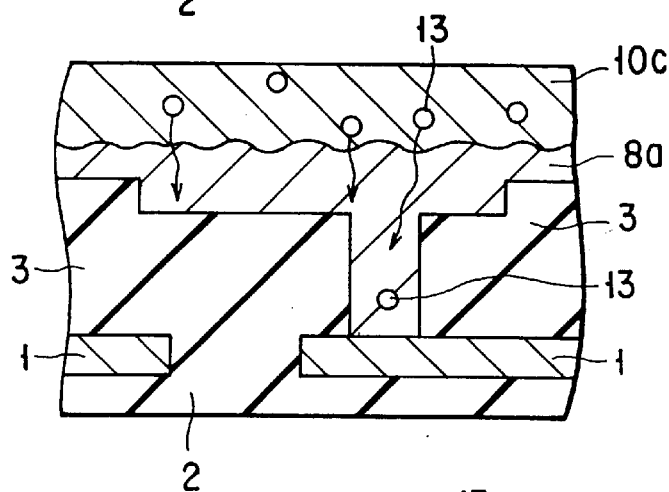

Thereafter, the substrate is heat-treated for two hours at a temperature of 450° C., whereby allowing the Si film 7 to be substituted by the Al film 8c, and at the same time the Cu 13 included in the Ti film 9c is allowed to diffuse into the Al film 8c. At the same time, the Si film 7 is allowed to react with the Ti film 9c to form a Ti silicide compound, thereby allowing the Si film 7 to be absorbed by the Ti film 9c. During this step, a Ti/Ti silicide film 10c and a Cu silicide 10d is formed (FIGS. 21B and 21C).

Finally, the Ti/Ti silicide film 10c, the Cu silicide 10d and any superfluous portion of the Al film 8c disposed outside the wiring groove are all removed by means of the CMP method.

Figure 21C:
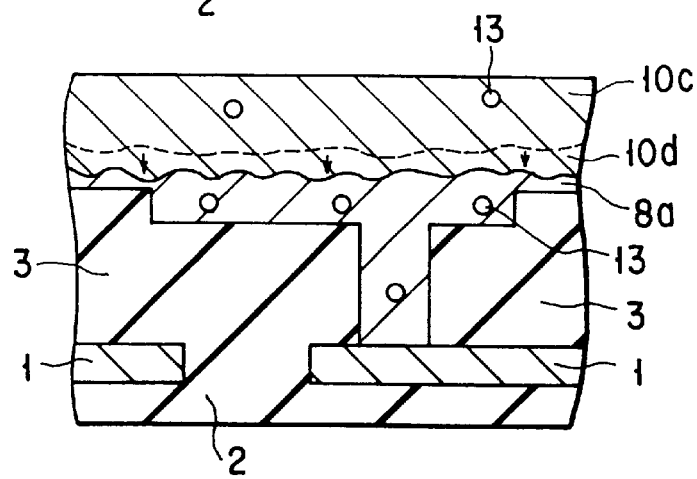
Figure 21D:
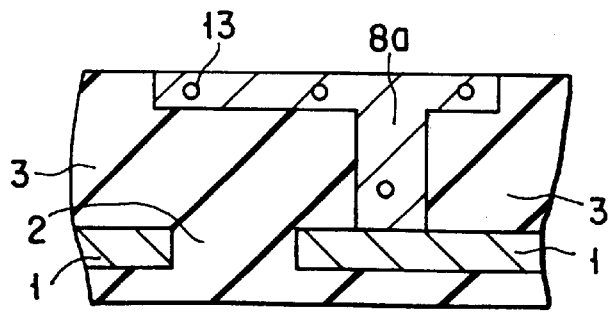

As a result, an Al plug and an Al wiring layer (a second wiring layer) both consisting of the Al film are formed in the interiors of the contact hole and the wiring groove, respectively (FIG. 21D).

Since the Cu 13 is included in the Al film 8c in the substitution/absorption step of FIG. 21C according to this example, the solid solution limit of Si in the Al film 8c at the same temperature can be lowered than that in the Al film to which Cu 13 is not added. Therefore, it is possible according to this-example to achieve the lowering of wire resistance even if the substitution/absorption treatment is performed at a relatively high temperature.

The addition of Cu can be performed by depositing a Cu film after the formation of a silicide, and then by re-heating the Cu film, thereby obtaining almost the same effect. The Cu film may be formed on the surface of the Ti film, at the interface between the Ti film and Al film, or on the bottom of the Al film. Alternatively, Cu may be introduced into the Al film.

In the foregoing explanation, Cu is employed as a material for lowering the solid solution limit of Si in the Al film. However, it is also possible to employ other kinds of material as long as the material does not invite an increase in resistance as compared with Si when the material in introduced into the Al film. In this case, the material may not be a single substance but may be formed of plural kinds of element.

Since Cu is prone to diffuse into an insulating film such as $SiO_2$, if the Cu film is to be formed on the bottom of the Al film, it may be advisable to form a barrier film on the surface of the insulating film for the purpose of preventing the diffusion of Cu.

EXAMPLE 18

A method of manufacturing a semiconductor device according to this example will be explained with reference to FIGS. 22A to 22E.

First of all, a first wiring layer 1 consisting of Al is formed on an Si substrate provided with an element. Then, an interlayer insulating film 3 is formed all over the upper surface of the substrate.

Then, a contact hole and a wiring groove are successively formed in the interlayer insulating film 3. Then, a native oxide film formed on the upper surface of the first wiring layer 1 which has been exposed on the bottom of the contact hole is removed by means of a surface treatment.

Then, a TiN film 14 is deposited as a barrier. layer all over the substrate. Thereafter, an Si film 7 is deposited all over the substrate by means of CVD method so as to fill the interiors of the contact hole and the wiring groove with the Si film 7.

Then, a superfluous portion of the Si film 7 is selectively removed by means of CDE etch-back method or RIE etch-back method so as to leave the Si film 7 only in the interiors of the contact hole and the wiring groove 5.

Figure 22A:
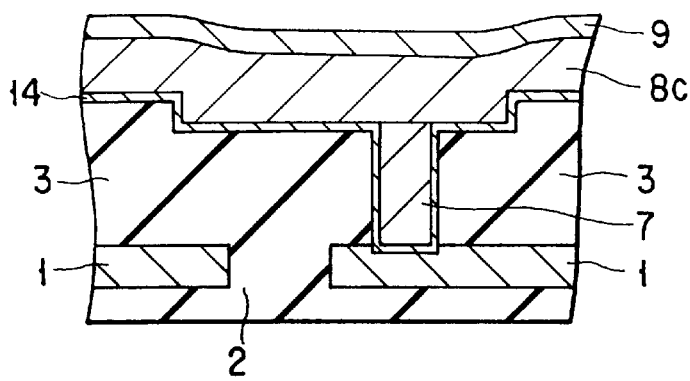
FIGS. 22A to 22E show respectively a cross-sectional view illustrating the manufacturing steps of the semiconductor device according to Example 18.

Then, the native oxide film formed on the surface of the Si film 7 is removed, and then an Al film 8c which is free form impurities is formed and then a Ti layer 9c is deposited without breaking vacuum (FIG. 22A).

Figure 22B:
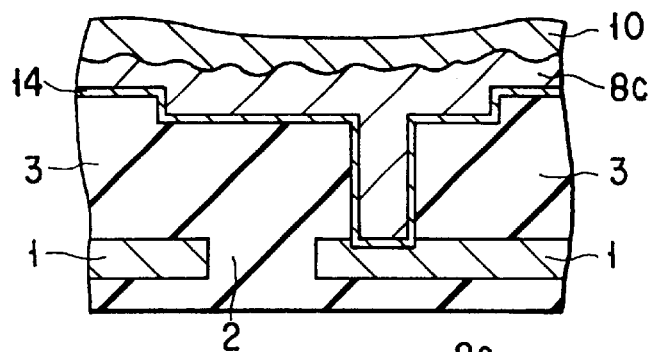

Thereafter, the substrate is heat-treated for two hours at a temperature of 450° C., whereby allowing the Si film 7 to be substituted by the Al film 8c, and at the same time the Si film 7 is allowed to react with the Ti film 9 to form a Ti silicide compound, thereby allowing the Si film 7 to be absorbed by the Ti film 9. During this step, a Ti/Ti silicide film 10c and a Cu silicide 10d are formed (FIG. 22B).

Then, the Ti/Ti silicide film 10c and any superfluous portion of the Al film 8c disposed outside the wiring groove are all removed by means of the CMP method.

Figure 22C:
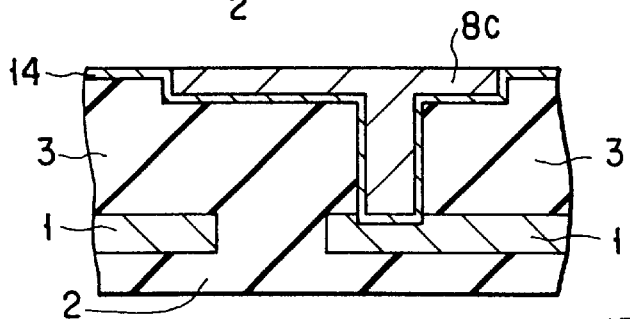

As a result, an Al plug and an Al wiring layer (a second wiring layer) both consisting of the Al film 8c are formed in the interiors of the contact hole and the wiring groove, respectively (FIG. 22C).

Figure 22D:
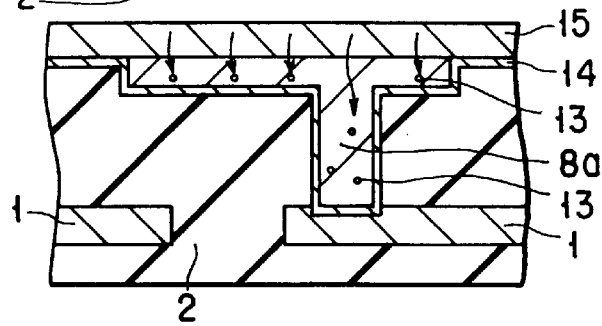

Then, a Cu film 15 is deposited all over the substrate and then heat-treated for 5 minutes at a temperature of 300° C. thus rendering the Cu 13 in the Cu film 15 to diffuse into the Al film 8c (FIG. 22D).

Figure 22E:
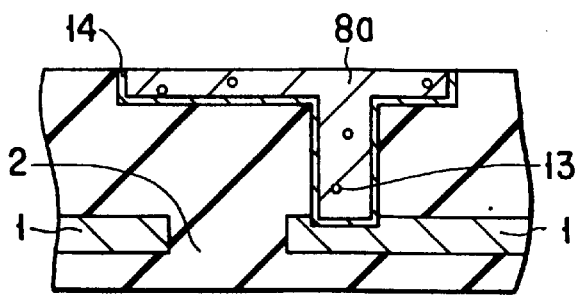

Finally, the Cu film 15 and any superfluous portion of the TiN film 14 are removed by means of CMP method (FIG. 22E).

The Cu 13 added to the Al film 8c is a material which capable of improving the electromigration resistance as well as the stress migration resistance. Namely, in the phenomenon of these migrations, the Cu in the Al wiring is precipitated at the crystal boundary where the diffusion rate of Al is very fast, whereby inhibiting the grain boundary diffusion of Al. Because of this effect, about 0.5% by weight of Cu is generally added in advance to the Al wiring of the recent LSI.

The manufacture of Cu-containing Al film can be performed generally by making use of a sputtering method employing a Cu-containing Al target.

Cu is well known as a material which capable of reacting with Si at a low temperature thereby forming a silicide compound.

Therefore, if an Al film added in advance with Cu is employed as a conductive film in contrast to this example, the Si constituting the substitutive film is absorbed not only by the Ti film but also by the Cu in the Al film functioning as the conductive film, thus generating a reaction product of Si and Cu, such as a Cu silicide.

If the contact hole and the wiring groove are to be completely filled with the Si film 7 in contrary to this example, the reaction product formed through the absorption of Si by the Cu in the Al film would be formed outside of the wiring groove. Therefore, it can be removed at the step of removing the Ti/Ti silicide film 10, thus raising no problem.

However, when only the interior of contact hole is filled with Si, and the interior of the wiring groove is not filled with Si as in the case of this example, the reaction product to be formed through the absorption of Si by the Cu in the Al film would be formed also in the interior of the wiring groove.

Therefore, the reaction product cannot be removed at the step of removing the Ti/Ti silicide film 10.

Accordingly, if only the interior of contact hole is to be filled with Si, it is advisable to form an Al film 9c which is free from any impurities (a pure Al) as a conductive film, and then to add Cu to the Al film 9c.

EXAMPLE 19

First of all, a first wiring layer is formed on an Si substrate provided with an element. Then, an interlayer insulating film is formed all over the upper surface of the substrate.

Then, a contact hole and a wiring groove are successively formed in the interlayer insulating film. Then, a native oxide film formed on the upper surface of the first wiring layer which has been exposed on the bottom of the contact hole is removed by means of a surface treatment.

Then, an Si film is deposited all over the substrate by means of CVD method so as to fill the interiors of the contact hole and the wiring groove with the Si film.

Then, a superfluous portion of the Si film is selectively removed by means of CMP method so as to leave the Si film only in the interior of the contact hole.

Then, the native oxide film formed on the surface of the Si film is removed, and then an Al film and a Co film are successively deposited without breaking vacuum.

Thereafter, the substrate is heat-treated for 30 minutes at a temperature of 400° C., whereby allowing the Si film to be substituted by the Al film, and at the same time the Si film is allowed to react with the Co film to form a Co silicide compound, thereby allowing the Si film to be absorbed by the Co film.

Finally, the Co/Co silicide film and any superfluous portion of the Al film are all removed by means of the CMP method. As a result, an Al plug and an Al wiring layer (a second wiring layer) both consisting of the Al film are formed in the interiors of the contact hole and the wiring groove, respectively.

The Co film employed in this example as an absorption film is capable of effectively substituting and absorbing the Si film being formed as a substitutive film at the diffusion temperature range of Si in the Al film to be employed as a conductive film.

This is because the Co film is capable of generating a silicifying reaction at a lower temperature as compared with Ti film which has been exemplified as an absorption film in the previous examples. Therefore, if a combination of materials including Co is employed, the substitution can be performed with a heat treatment of lower temperature.

Furthermore, when the heat treatment is performed at a higher temperature, the reaction of forming a silicide can be accelerated and hence the substitution time can be shortened as compared with where a Ti film is employed.

The Co film employed in this example is merely one example of an absorption film having such a property. For example, an absorption film consisting of Fe can be employed likewise. Namely, when the aforementioned heat treatment is performed using these absorption films at a temperature range which enables Si to diffuse into an Al film and at the same time enables the silicifying reaction to take place with these absorption films, the substitution and absorption efficiencies which are more than comparable. with those where a Ti film is employed can be obtained.

Further, when a Ge film or an Si/Ge mixed film is employed as a substitutive film, the interdiffusion thereof with an Al film can be taken place at a lower temperature as compared with where an Si film is employed. Namely, since the diffusion temperature of the constituent element of the substitutive film in an Al film can be lowered, the temperature for the substitution/absorption reaction can be lowered, and at the same time, the time required for the substitution/absorption reaction can be shortened.

In the present example, a combination of the materials by which the substitution temperature can be lowered or the substitution time can be shortened as compared with Ti is employed. However, the present invention is not limited to these materials in the case of the process temperature permitted in the other process. For example, Hf, V, Mo, W, Ta, Nb, Zr, or the like is effective in the same manner as Ti.

EXAMPLE 20

A method of manufacturing a semiconductor device according to this example will be explained with reference to FIGS. 23A to 23D.

First of all, a first wiring layer 1 consisting of Al is formed on an Si substrate provided with an element. Then, an interlayer insulating film 3 is formed all over the upper surface of the substrate.

Then, the interlayer insulating film 3 is selectively etched by making use of photolithography and RIE to a depth reaching to the first wiring layer 1, thus forming a contact hole 4, and at the same time a wiring groove 5 is selectively formed likewise at a region including this contact hole 4. Namely, the contact hole 4 connected with the first wiring layer 1 and the wiring groove 5 are successively formed.

Then, a native oxide film formed on the upper surface of the first wiring layer 1 which has been exposed on the bottom of the contact hole 4 is removed by means of a surface treatment. Then, an Si film 7 is deposited all over the substrate by means of CVD method in a manner which makes it possible to fill the interiors of the contact hole 4 and the wiring groove 5 with the Si film 7. Then, any superfluous portion of the Si film 7 is selectively removed by means of the CMP method or CDE method so as to leave the Si film 7 at least in the interior of the contact hole 4.

Figure 23A:
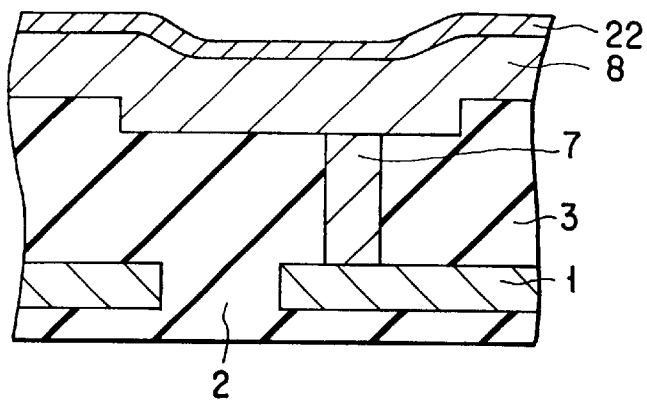
FIGS. 23A to 23D show respectively a cross-sectional view illustrating the manufacturing steps of the semiconductor device according to Example 20.
Figure 23B:
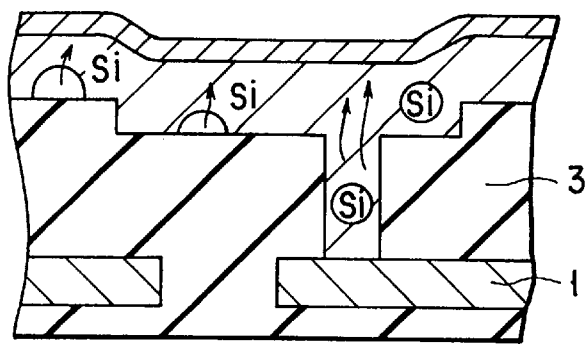

Then, the native oxide film formed on the surface of the Si film 7 is removed, and then an Al film 8. is deposited all over the upper surface of the resultant substrate. Thereafter, an Al film 22 is deposited on the Al film 8 by means of a bias sputtering method in the same manner as explained in Example 4 (FIG. 23A). The Al film 22 to be formed by means of the bias sputtering method is deposited under the conditions which enable a rare gas, crystal defects or impurities to be included in and sustained by the resultant Al film.

Figure 23C:
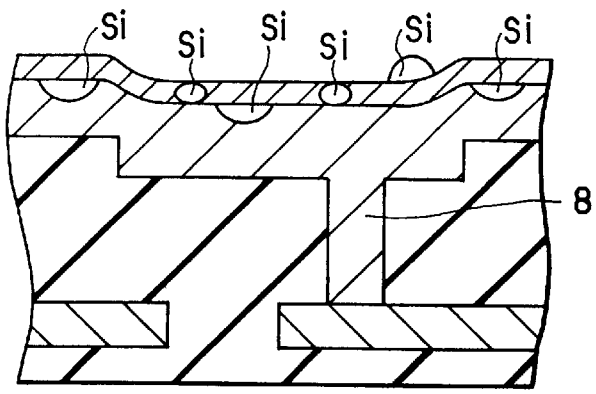
Figure 23D:
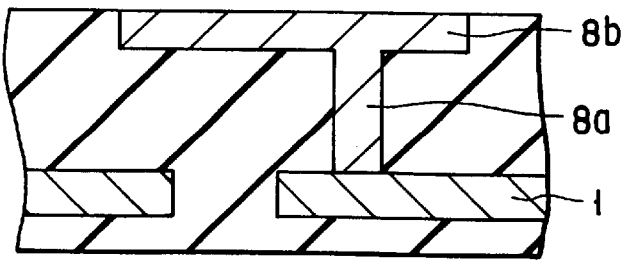

Then, through a heat treatment, the Si filled in the interiors of the contact hole 4 and the wiring groove 5 is caused to diffuse into the Al film (FIG. 23B) and hence to be substituted by Al. At the same time, the Si filled in the interiors of the contact hole 4 and the wiring groove 5 is caused to be segregated at the upper portion of Al film, in particular a porous Al film portion (FIG. 23C).

As shown in Example 11, the Si filled in the interiors of the contact hole and the wiring groove is caused, through a substitution heat treatment, to be substituted by Al and at the same time, to be discharged or segregated out of the contact hole and the wiring groove. This reaction takes advantage of the phenomenon that the interface between Al/vacuum can make the segregated Si lower in surface energy and more stable as compared with the interior of the Al film or with the interface between Al/oxide film constituting the contact hole or the wiring groove.

Furthermore, according to this example, a precipitation-promoting layer 22 is intentionally formed on the surface of the Al film, thereby causing Si to segregate on the precipitation-promoting layer 22 while allowing the substitution reaction to proceed. As a result, a concentration gradient of Si is caused to generate in the Al film, so that even if. Si is existed in a large amount in the pattern, the Si can be sufficiently discharged from the pattern.

Further, even if all of Si disposed outside of the contact hole or wiring groove is formed by means of bias sputtering, the Al to be filled in the pattern can be turned, through the substitution reaction, into an Al wiring or an Al plug each having a sufficiently high density as a wiring layer since the substitution reaction between the Si and the Al is based on the mutual diffusion between the individual Al atom and the individual Si atom as mentioned in Example 4, the residual upper portion of the Al being utilized as a gettering layer for the Si. Since this residual portion of the Al is. ultimately removed, almost the same effect as obtained in the previous example can be obtained.

Since there is no possibility of change in volume of the upper Al layer portion that might be caused by the formation of a TiSi compound or due to the formation of an AlTi compound in contrast to the structure where a Ti layer is formed on the upper surface of the Al film, no stress would be imposed on the Al film.

In this example, an Al layer formed by means of bias sputtering is exemplified as an Si precipitation-promoting layer. However, it is also possible to obtain almost the same effect even if an ion-implanted Al film is employed.

EXAMPLE 21

A method of manufacturing a semiconductor device according to this example will be explained with reference to the same FIGS. 23A to 23D which have been employed for the explanation of Example 20.

First of all, a first wiring layer 1 consisting of Al is formed on an Si substrate provided with an element. Then, an interlayer insulating film 3 is formed all over the upper surface of the substrate.

Then, the interlayer insulating film 3 is selectively etched by making use of photolithography and RIE to a depth reaching to the first wiring layer 1, thus forming a contact hole 4, and at the same time a wiring groove 5 is selectively formed likewise at a region including this contact hole 4. Namely, the contact hole 4 connected with the first wiring layer 1 and the wiring groove 5 are successively formed.

Then, a native oxide film formed on the upper surface of the first wiring layer 1 which has been exposed on the bottom of the contact hole 4. is removed by means of a surface treatment. Then, an Si film 7 is deposited all over the substrate by means of CVD method in a manner which makes it possible to fill the interiors of the contact hole 4 and the wiring groove 5 with the Si film 7. Then, any superfluous portion of the Si film 7 is selectively removed by means of the CMP method or CDE method so as to leave the Si film 7 at least in the interior of the contact hole 4.

Then, the native oxide film formed on the surface of the Si film 7 is removed, and then an Al film 8 and a W film 22 are deposited all over the upper surface of the resultant substrate (FIG. 23A).

Then, through a heat treatment, the Si filled in the interiors of the contact hole 4 and the wiring groove 5 is caused to diffuse into the Al film (FIG. 23B) and hence to be substituted by Al. At the same time, the Si filled in the interiors of the contact hole 4 and the wiring groove 5 is caused to be segregated at the interface between W/Al films or at the grain boundary of W (FIG. 23C).

In this example, a film using a different material from that of the substitutive film is employed. as a precipitation-promoting layer 22. As long as the material is hardly reactive to Al at the temperature of the substitution heat treatment, the material can be employed as a precipitation-promoting layer 22. In this case, the W film 22 functioning a precipitation-promoting layer 22 can be arranged anywhere within the Al film 7. Namely, it may be disposed at the bottom, in the middle or on the upper surface of the Al film 7. Further, the deposition method of the W film 22 is not confined to the CVD method and sputtering method.

It is also possible to utilize the Si constituting the substitutive film as a precipitation-promoting layer. Namely, since the solid solution limit of Si in Al film is determined by the temperature, if Si is formed to have a sufficient volume, the Si segregated acts to minimize its surface area in relative to the volume thereof, whereby causing a regional precipitation to take place as a precipitation-promoting layer and hence generating a concentration gradient of Si to promote the substitution between Al and Si.

EXAMPLE 22

A method of manufacturing a semiconductor device according to this example will be explained with reference to the same FIGS. 24A to 24 C.

First of all, a first wiring layer 1 is formed on an Si substrate provided with an element. Then, an interlayer insulating film 3 is formed all over the upper surface of the substrate.

Then, a contact hole and a wiring groove are successively formed in the interlayer insulating film 3. Then, a native oxide film formed on the upper surface of the first wiring layer 1 which has been exposed on the bottom of the contact hole is removed by means of a surface treatment.

After a W—Si—N film 16 is deposited all over the substrate, an Nb film 17 is deposited all over the substrate so as to fill the interiors of the contact hole and the wiring groove 5 with the Nb film 17.

Then, any superfluous portion of the Nb film 17 is selectively removed by means of the CMP method so as to leave the Nb film 17 in the interiors of the contact hole and wiring groove.

Figure 24A:
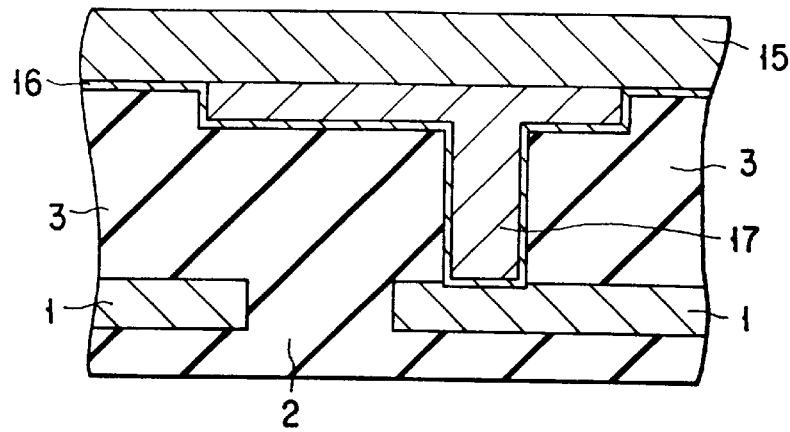
FIGS. 24A to 24D show respectively a cross-sectional view illustrating the manufacturing steps of the semiconductor device according to Example 22.

After the native oxide film formed on the surface of the Nb film 17 is removed, a Cu film 15 is deposited all over the upper surface of the resultant substrate (FIG. 24A).

Figure 24B:
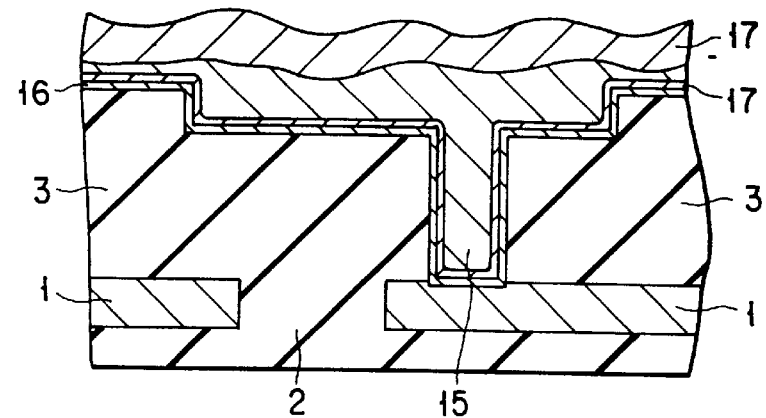

Then, through a heat treatment in a vacuum, the Cu film 15 is substituted for the Nb film 17, and at the same time, Nb is allowed to segregate on the surface of the Cu film 15 (upper surface) and at the interface between the Cu film 15 and the W—Si—N film 16 (FIG. 24B).

Figure 24C:
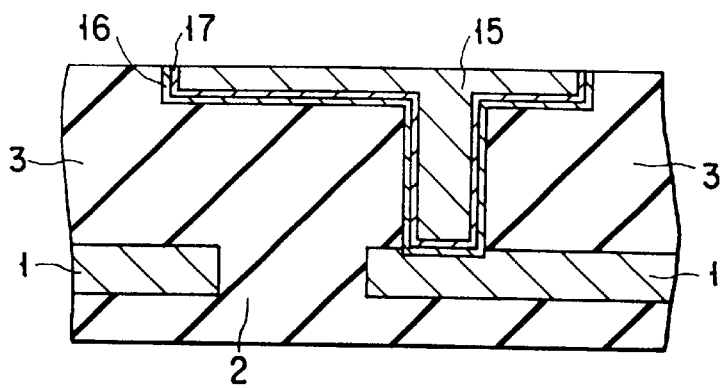

Finally, the Nb film 17 and any superfluous portion of the Cu film 15 are removed by means of CMP method (FIG. 22E). As a result, a Cu plug and a Cu wiring layer (a second wiring layer) both consisting of the Cu film are formed in the interiors of the contact hole and the wiring groove, respectively (FIG. 24C).

Although the heat treatment is performed in a vacuum in this example, a gaseous atmosphere comprising an $N_2$ gas, an $N_2/H_2$ mixed gas or an $NH_3$ gas may be employed in the heat treatment.

Figure 24D:
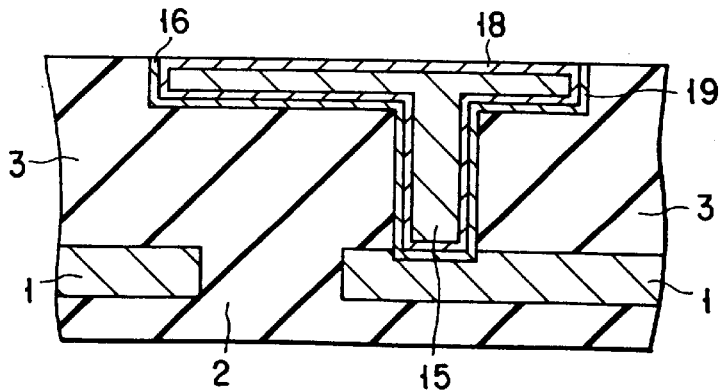

In this case, NbN is allowed to segregate on the surface of the Cu film 15 (upper surface) and at the interface between the Cu film 15 and the W—Si—N film 16. As a result, as shown in FIG. 24D, an NbN film 18 is formed on the surface (upper surface) of the Cu film 15, while a mixed film 19 consisting of NbN and Nb is formed at the interface.

The heat treatment may be performed in the plasma or radicals of an $N_2$ gas, an $N_2/H_2$ mixed gas or an $NH_3$ gas. Ions and radicals are highly reactive, so that the nitrization of the Nb film 17 can be facilitated.

When the upper surface or interface of the Nb film 17 is nitrided, the concentration of the Nb film 17 is reduced on the upper surface side thereof, thereby generating a concentration gradient of Nb in the Cu film 15. As a result, the diffusion flux of Nb is induced to increase at the surface region, thus rendering the diffusion/substitution between the Cu film and the Nb film, as well as the precipitation of Nb on the surface side to take place more efficiently.

These Nb and NbN segregate not only on the surface of the Cu film 15 but also on the interface between the Cu film 15 and the contact hole or wiring groove (W—Si—N film 16), thereby forming a film comprising NbN. This film can be utilized as a barrier film for inhibiting the Cu in the Cu film 15 from diffusing into the interlayer insulating film 3 or into the substrate.

EXAMPLE 23

A method of manufacturing a semiconductor device according to this example will be explained with reference to the same FIGS. 25A to 25C.

First of all, a first wiring layer 1 is formed on an Si substrate provided with an element. Then, an interlayer insulating film 3 is formed all over the upper surface of the substrate.

Then, a contact hole and a wiring groove are successively formed in the interlayer insulating film 3. Then, a native oxide film formed on the upper surface of the first wiring layer 1 which has been exposed on the bottom of the contact hole is removed by means of a surface treatment.

Then, an Nb film 17 is deposited all over the substrate by means of CVD method so as to fill the interiors of the contact hole and the wiring groove 5 with the Nb film 17.

Figure 25A:
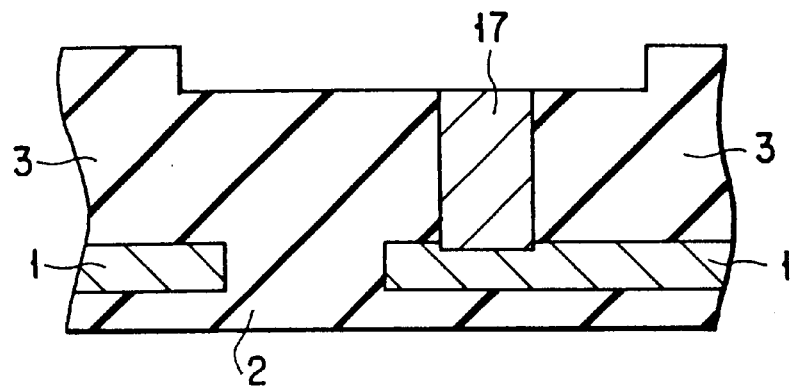
FIGS. 25A to 25C show respectively a cross-sectional view illustrating the manufacturing steps of the semiconductor device according to Example 23.
Figure 25B:
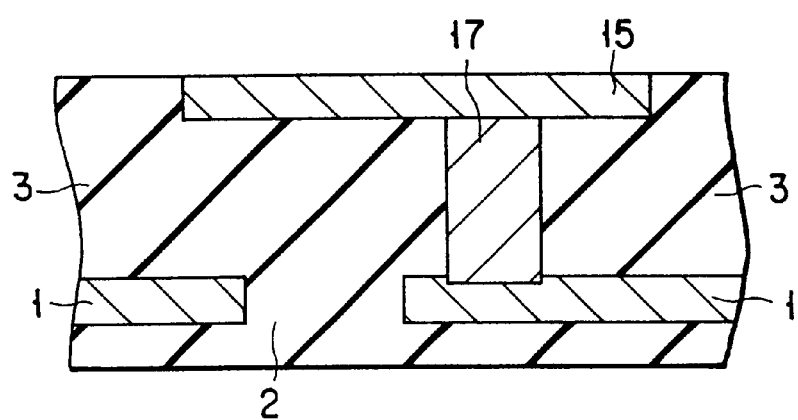

Then, any superfluous portion of the Nb film 17 is selectively removed by means of the CMP method so as to leave the Nb film 17 in the interiors of the contact hole and wiring groove (FIG. 25A).

Then, a Cu film 15 is deposited all over the upper surface of the resultant substrate by making use of a directional sputtering method so as to fill the interior of the wiring groove with the Cu film 15. The wiring groove may be filled with the Cu film 15 by means of CVD method instead of employing the aforementioned directional sputtering method. Subsequently, any superfluous portion of the Cu film 15 is removed by means of CMP method so as to leave the Cu film 15 only in the wiring groove (FIG. 25B).

It is possible in the above step to employ a selective CVD method for filling the wiring groove with the Cu film 15. In this case, a step of removing a superfluous portion of the Cu film 15 can be dispensed with. It is also possible to preliminarily fill at least the interior of the wiring groove with a conductive film for the purpose of facilitating the selective deposition of the Cu film 15. Depending on the material to be employed, this conductive material can be utilized also as a metallic barrier film.

Figure 25C:
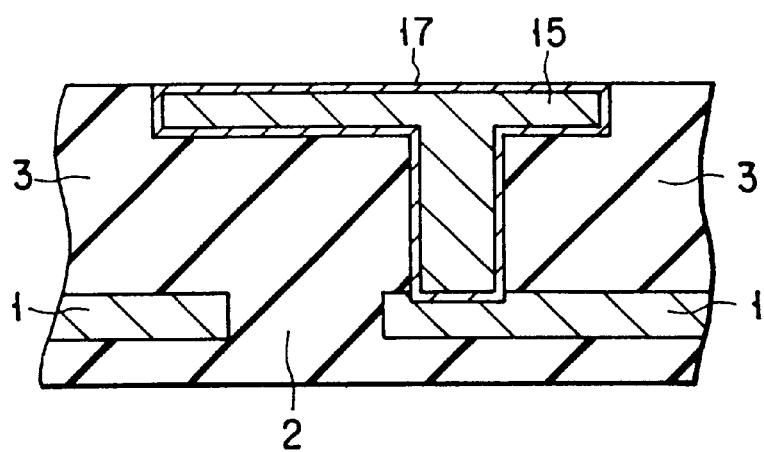

Then, through a heat treatment in a vacuum, the Cu film 15 is substituted for the Nb film 17, and at the same time, Nb is allowed to segregate on the surface of the Cu film 15, thereby forming the Nb film 17 on the surface of the Cu film 15 (FIG. 25C).

Although the heat treatment is performed in a vacuum in this example, a gaseous atmosphere comprising an $N_2$ gas, an $N_2/H_2$ mixed gas or an $NH_3$ gas may be employed in the heat treatment. The heat treatment can be also performed in the plasma or radicals of an $N_2$ gas, an $N_2/H_2$ mixed gas or an $NH_3$ gas. Ions and radicals are highly reactive, so that the surface of Nb film 17 can be nitrided to easily form a surface-nitrided Nb film (NbN film).

The Nb film as well as the surface-nitrided Nb film (NbN film) thus formed can be utilized as a barrier film for inhibiting the Cu in the Cu film 15 from diffusing into the interlayer insulating film 3 or into the Si substrate.

EXAMPLE 24

A method of manufacturing a semiconductor device according to this example will be explained with reference to the same FIGS. 26A to 26D.

First of all, a first wiring layer 1 consisting of Cu is formed on an Si substrate provided with an element. Then, an interlayer insulating film 3 is formed all over the upper surface of the substrate.

Then, a contact hole and a wiring groove are successively formed in the interlayer insulating film 3. Then, a native oxide film formed on the upper surface of the first wiring layer 1 which has been exposed on the bottom of the contact hole is removed by means of a surface treatment.

Then, an Si film 7 is deposited all over the substrate by means of CVD method so as to fill the interiors of the contact hole and the wiring groove 5 with the Si film 7.

Figure 26A:
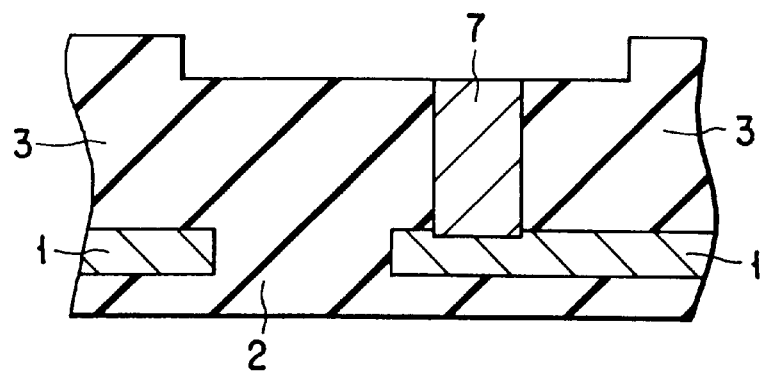
FIGS. 26A to 26D show respectively a cross-sectional view illustrating the manufacturing steps of the semiconductor device according to Example 24.

Then, any superfluous portion of the Si film 7 is selectively removed by means of the CDE method so as to leave the Si film 7 in the interiors of the contact hole and wiring groove (FIG. 26A).

Figure 26B:
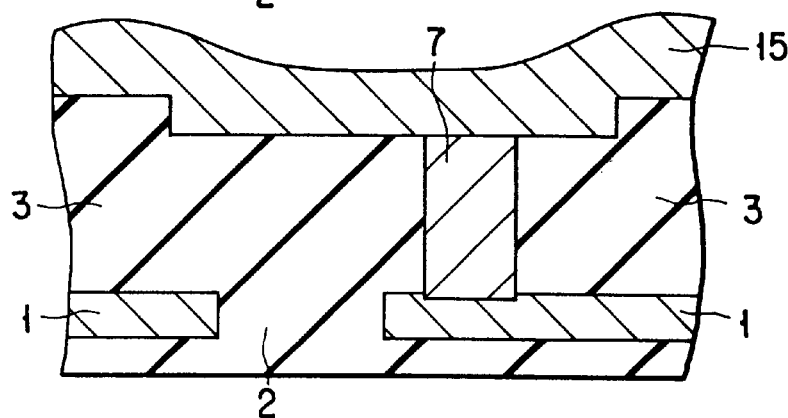

After the native oxide film formed on the surface of the Si film 7 is removed, a Cu film 15 is deposited, without breaking vacuum, all over the upper surface of the resultant substrate by means of a directional sputtering method so as to fill the interior of the wiring groove with the Si film 7 (FIG. 26B).

Figure 26C:
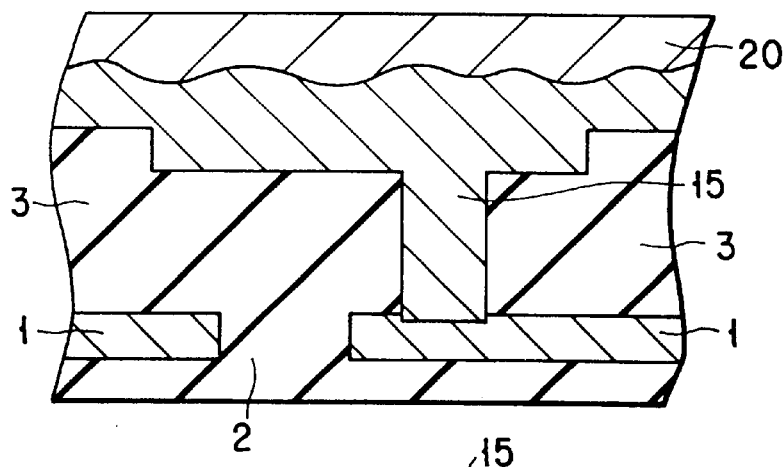

Then, through a heat treatment in an atmosphere containing oxygen ($O_2$), in an atmosphere of oxygen plasma (ions, radicals), or in an atmosphere of oxygen radicals, the Cu film 15 is substituted for the Si film 7, and at the same time, the Si atom of the Si film 7 which has been diffused through the surface of the Cu film 15 is allowed to react with the O in the aforementioned atmospheres to form $SiO_2$. As a result, a mixed film 20 comprising Si and $SiO_2$ is formed on the surface of the Cu film 15 (FIG. 26C).

Cu is highly reactive with Si, so that they are suited for use in forming a silicide at a lower temperature. However, if these elements are subjected to heat treatment in an atmosphere containing oxygen, Si becomes more reactive and hence is reacted with oxygen, thus dissociating from Cu, to form $SiO_2$.

The Cu thus released is allowed, through the $SiO_2$-generating reaction at the surface of the Cu film, to diffuse into the interiors of the contact hole and wiring groove, thus making it possible to fill the contact hole and wiring groove with Cu. The $SiO_2$-generating reaction at the surface of the Cu film may be conducted by a heat treatment in an oxygen-containing atmosphere, or in a plasma- or radical-containing atmosphere.

The heat treatment for effecting the substitution/diffusion may be performed simultaneous with the aforementioned $SiO_2$-generating reaction at the surface of the Cu film. Alternatively, the silicifying reaction between Cu and Si in a non-oxidizing atmosphere or in a vacuum is allowed to take place at first, and then Si is removed from the Cu film 15 through the formation of $SiO_2$ initiating from the surface region.

Figure 26D:
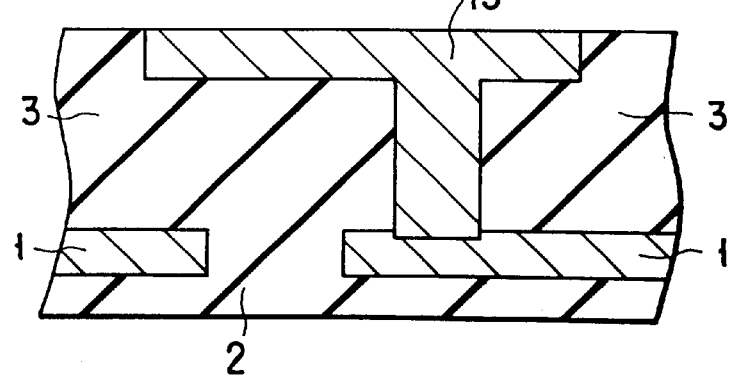

Finally, the mixed film 20 and any superfluous portion of the Cu film 15 are removed by means of CMP method. As a result, a Cu plug and a Cu wiring layer (a second wiring layer) both consisting of the Cu film 15 are formed in the interiors of the contact hole and the wiring groove, respectively (FIG. 26D).

EXAMPLE 25

A method of manufacturing a semiconductor device according to this example will be explained with reference to the same FIGS. 27A to 27D.

First of all, a first wiring layer 1 consisting of Cu is formed on an Si substrate provided with an element. Then, an interlayer insulating film 3 is formed all over the upper surface of the substrate.

Then, a contact hole and a wiring groove are successively formed in the interlayer insulating film 3. Then, a native oxide film formed on the upper surface of the first wiring layer 1 which has been exposed on the bottom of the contact hole is removed by means of a surface treatment.

Figure 27A:
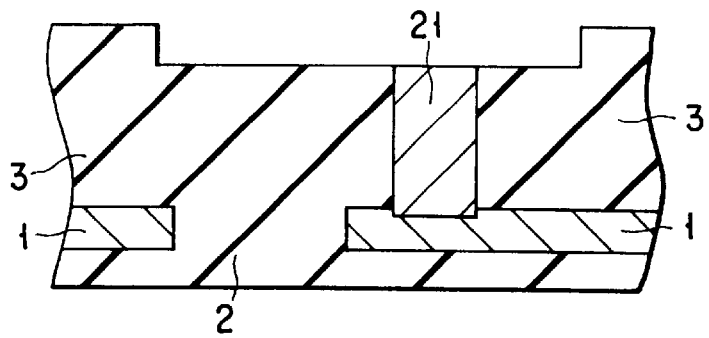
FIGS. 27A to 27D show respectively a cross-sectional view illustrating the manufacturing steps of the semiconductor device according to Example 25.
Figure 27B:
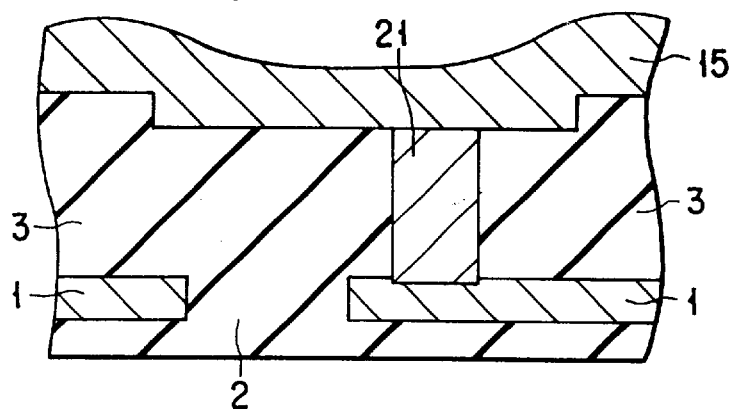

Then, a W film 21 is deposited all over the substrate by means of a selective CVD method so as to fill the interior of the contact hole with the W film 21 (FIG. 27A). After the native oxide film formed on the surface of the W film 21 is removed, a Cu film 15 is deposited, without breaking vacuum, all over the upper surface of the resultant substrate by means of a directional sputtering method so as to fill the interior of the wiring groove with the Si film 7 (FIG. 27B).

Figure 27C:
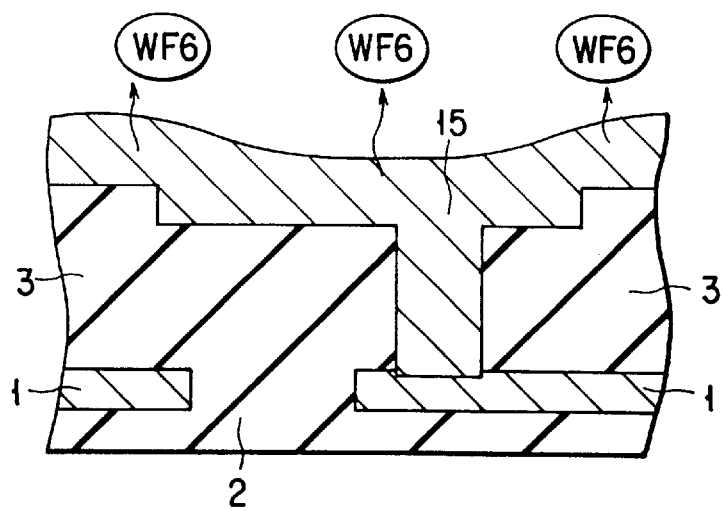

Then, through a heat treatment in an atmosphere containing $CF_4$, in an atmosphere of $CF_4$ plasma, or in an atmosphere of $CF_4$ radicals, the Cu film 15 is substituted for the W film 21, and at the same time, the W atom of the W film 21 which has been diffused through the surface of the Cu film 15 is allowed to react with the F in the aforementioned atmospheres to form $WF_6$ gas, thereby removing the W film 21 (FIG. 27C).

W is highly reactive with F, so that the vapor pressure of a tungsten fluoride compound is very high. This example takes advantage of this phenomenon in the step of substitution, through diffusion, between Cu and W. Namely, F is fed from the surface side in this step thereby to form a $WF_6$ gas, which is then removed during the substitution heat treatment, thereby lowering the concentration of W on the surface region and hence promoting the substitution reaction. Further, this method is advantageous in that the step of removing a compound formed ultimately on the upper portions of the contact hole and wiring groove can be dispensed with.

Figure 27D:
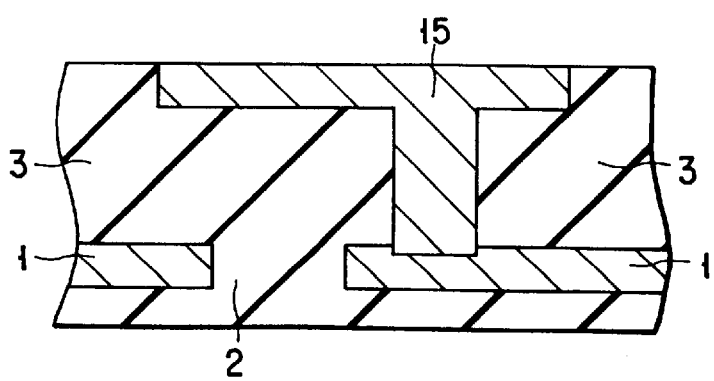

Finally, any superfluous portion of the Cu film 15 disposed outside of the wiring groove is removed by means of CMP method. As a result, a Cu plug and a Cu wiring layer (a second wiring layer) both consisting of the Cu film 1 s are formed in the interiors of the contact hole and the wiring groove, respectively (FIG. 27D).

EXAMPLE 26

A method of manufacturing a semiconductor device according to this example will be explained with reference to the same FIGS. 28A to 28H.

First of all, a first wiring layer consisting of a laminate film comprising a polysilicon film 22 and a tungsten film 23 (tungsten/polyside film) is formed on an Si substrate (not shown) provided with an element.

Figure 28A:
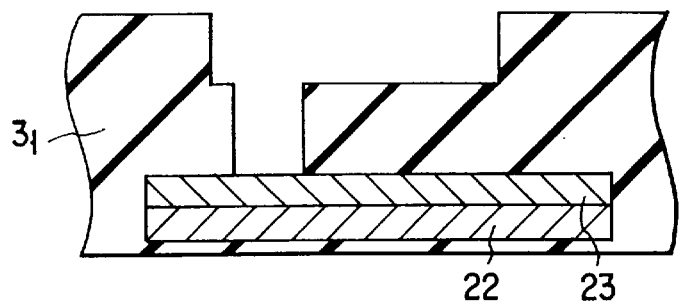
FIGS. 28A to 28H show respectively a cross-sectional view illustrating the manufacturing steps of the semiconductor device according to Example 26.

Then, an interlayer insulating film 31 having a thickness of 0.8 μm and consisting of Si is formed all over the upper surface of the substrate by making use of a plasma CVD method. Then, a first contact hole and a first wiring groove are successively formed in the interlayer insulating film 31 by making use of a photolithography and the RIE method (FIG. 28A).

Then, a first Ti film 91 having a thickness of 20 nm is formed all over the surface of the substrate, and subsequently a TiN film 14 having a thickness of 10 nm is formed all over the surface of the resultant substrate by means of the MOCVD method.

In this step of forming the first Ti film 91, the employment of a collimation sputtering method or a low pressure-long distance sputtering method which are excellent in directivity is preferable in view of obtaining a desired coverage at the bottom of the first contact hole.

Figure 28B:
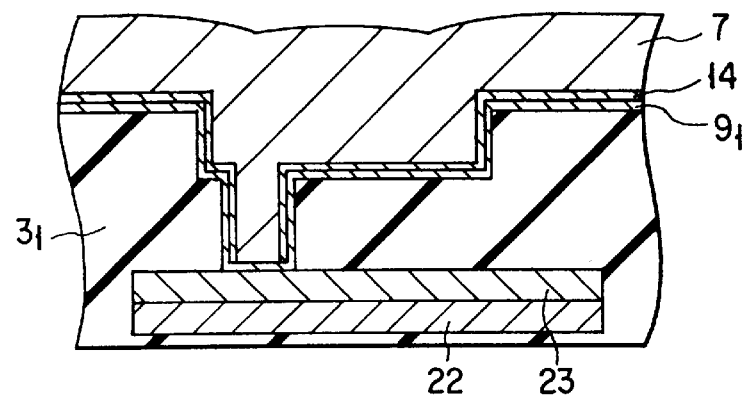

Subsequently, an Si film 7 is formed all over the surface of the substrate by means of CVD method so as to fill the first contact hole and the first wiring groove with the Si film 7 (FIG. 28B).

Figure 28C:
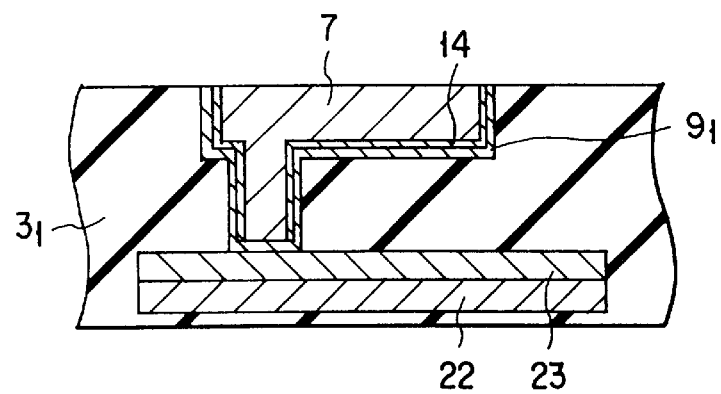

Then, any superfluous portion of the Si film 7 is selectively removed by making use of the CDE method or CMP method so as to leave the Si film 7 in the first contact hole and the first wiring groove (FIG. 28C).

Then, a second interlayer insulating film 32 is deposited all over the substrate by means of the plasma CVD method. Since the first contact hole and the first wiring groove are filled with the Si film 7 at this moment, the method of forming the second interlayer insulating film 32 may be carried out by means of LPCVD method in place of the plasma CVD method. Namely, an insulating film which can be formed at a high temperature such as a BPSG film or a TEOS film (which can be formed making use of the LPCVD method) can be employed as this second interlayer insulating film 32.

Figure 28D:
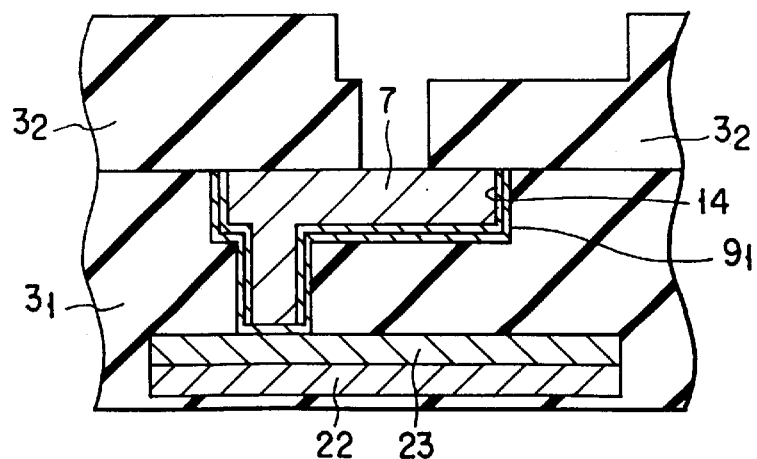

Subsequently, a second contact hole and a second wiring groove are successively formed in the second interlayer insulating film 32 by making use of a photolithography and the RIE method (FIG. 28D). Then, a native oxide film formed on the upper surface of the Si film 7 which has been exposed on the bottom of the second contact hole is removed by making use of a dilute hydrofluoric acid.

Figure 28E:
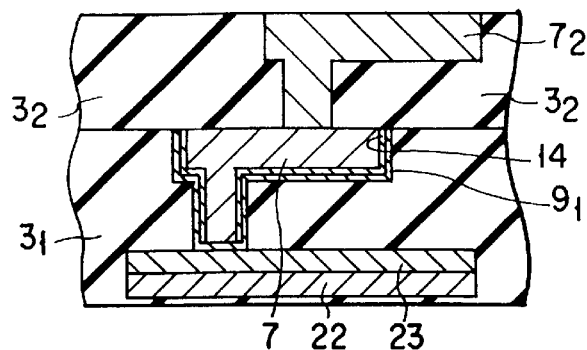

Then, another Si film 7 is deposited all over the substrate by means of CVD method so as to fill the interior of the second contact hole and the second wiring groove with the Si film 7. Thereafter, any superfluous portion of the Si film 7 is selectively removed by making use of the CDE method or CMP method so as to leave the Si film 7 in the second contact hole and the second wiring groove (FIG. 28E).

Figure 28F:
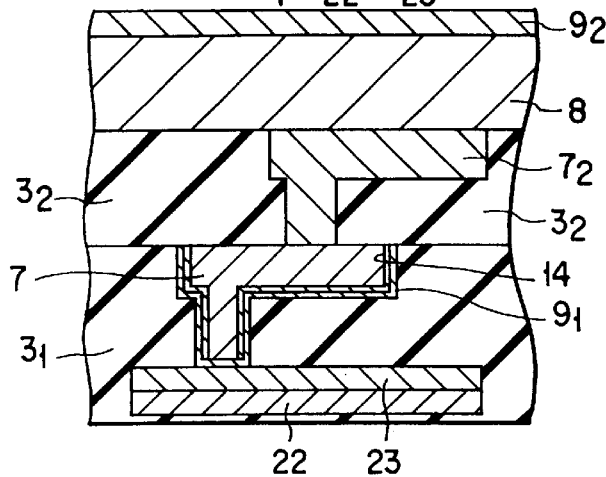

After the native oxide film formed on the surface of the Si film 7 is removed by means of an Ar sputter-etching method, an Al film 8 having a thickness of 2 μm and a second Ti film 92 having a thickness of 200 nm are successively deposited, without breaking vacuum, all over the upper surface of the resultant substrate by means of a sputtering method (FIG. 28F).

Figure 28G:
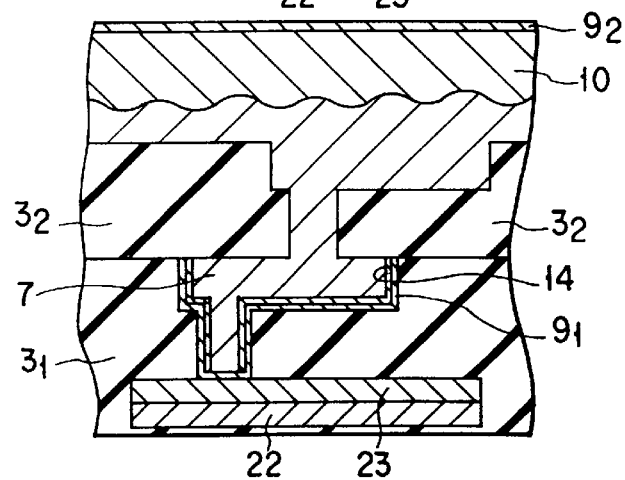

Thereafter, the substrate is heat-treated for three hours at a temperature of 450° C., whereby allowing the Si film 7 filled in the second contact hole and the second wiring groove to be substituted en bloc by the Al film 8, and at the same time the Si film 7 is allowed to react with the Ti film 92 to form a Ti silicide compound, thereby allowing the Si film 7 to be absorbed by the Ti film 92. During this step a Ti/Ti silicide film 10 is formed (FIG. 28G).

According to this method, it is possible, even if the aspect ratio of the contact hole is high, to fill the contact hole as well as the wiring groove with an Al film without generating voids therein.

Finally, the Ti/Ti silicide film 10 and any superfluous portion of the Al film 8 disposed outside of the second wiring groove are removed by means of CMP method.

Figure 28H:
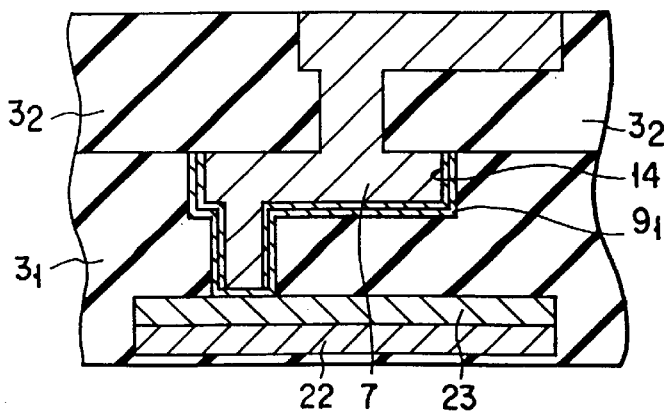

As a result, a first Al plug and a first Al wiring layer (a second wiring layer) both consisting of the Al film are formed in the interiors of the first contact hole and the first wiring groove, respectively, and at the same time, a second Al plug and a second Al wiring layer (a third wiring layer) both consisting of the Al film are formed in the interiors of the second contact hole and the second wiring groove, respectively (FIG. 28H).

Although not particularly pointed out in this example, if a large number of the second contact hole are formed in the same layer, the substitution route between the Si film 7 and the Al film 8 can be increased, thereby making it possible to lower the temperature in the substitution/absorption step and also to shorten the substitution time.

Although a method of performing simultaneous substitution of two layers has been explained in this example, it is also possible to perform a simultaneous substitution of three of more layers by repeating the formation of an Si film-filled wiring groove and an Si film-filled contact hole three times or more, and by carrying out the substitution heat treatment after successively depositing an Al film and a Ti film on the uppermost layer of the laminate structure.

In this case however, since the consumption of Al film and Ti film would be increased as compared. with the two-layer structure, the film thickness of each of Al film and Ti film should preferably be increased for the purpose of reducing the wire resistance.

EXAMPLE 27

A method of manufacturing a semiconductor device according to this example will be explained with reference to the same FIGS. 29A to 29J.

First of all, a first wiring layer consisting of a laminate film comprising a polysilicon film 22 and a tungsten film 23 (tungsten/polyside film) is formed on an Si substrate (not shown) provided with an element.

Figure 29A:
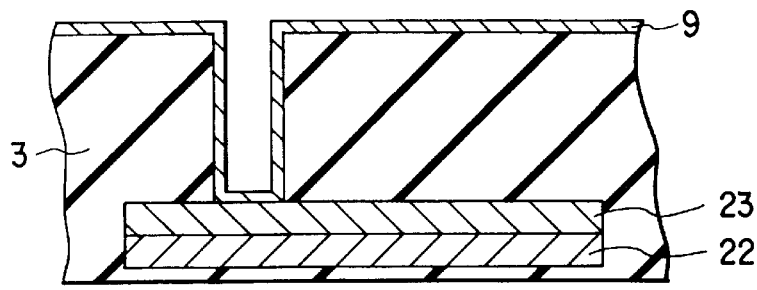
FIGS. 29A to 29J show respectively a cross-sectional view illustrating the manufacturing steps of the semiconductor device according to Example 27.

Then, an interlayer insulating film 3 having a thickness of 0.8 μm and consisting of $SiO_2$ is formed all over the upper surface of the substrate by making use of a plasma CVD method. Then, a first contact hole connected with the first wiring layer is formed in the interlayer insulating film 3 by making use of a photolithography and the RIE method. Subsequently, a Ti film 9 having a thickness of 20 nm is formed by means of a directivity-enhanced low pressure-long distance sputtering method (FIG. 29A). Then, the substrate is heated to 550° C. to perform a heat treatment for 30 minutes in a forming gas atmosphere ($N_2$-10%$H_2$). Through this heat treatment, the surface of the Ti film 9 is nitrided thereby to form a surface-nitrided Ti film 9b having a thickness of about 6 nm.

Figure 29B:
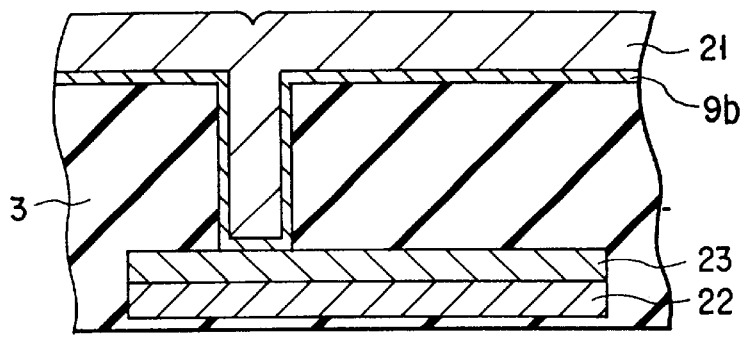
Figure 29C:
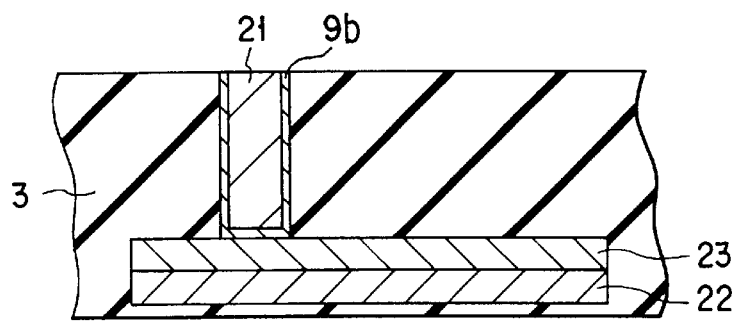

Subsequently, a W film 21 is formed all over the surface of the substrate so as to fill the contact hole with the W film 21. This W film 21 can be formed by making use of a blanket CVD method employing a mixed gas comprising $WF_6$, $SiH_4$ and $H_2$ gas for instance (FIG. 29B). Then, the W film 21 and the surface-nitrided Ti film 9b abraded by making use of the CMP method until the surface of the interlayer insulating film 3 is exposed. As a result, a W plug comprising the W film 21 is formed in the contact hole (FIG. 29C).

Figure 29D:
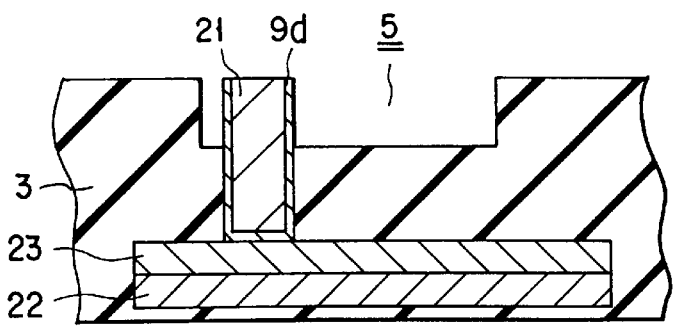

Then, a wiring layer is formed in the interlayer insulating film 3 by making use of a photolithography and the RIE method employing $CHF_3$ gas (FIG. 29D). This wiring groove is formed in a region including the aforementioned contact hole.

Since $CHF_3$ gas is employed in this step, the selectivity ratio among the W film (W plug) 21, the surface-nitrided Ti film 9b and the interlayer insulating film ($SiO_2$) 3 can be made higher. As a result, the surface-nitrided Ti film 9b can be left remained around the W plug 21, and the etch-back of the plug can be limited within 10 nm.

Figure 29E:
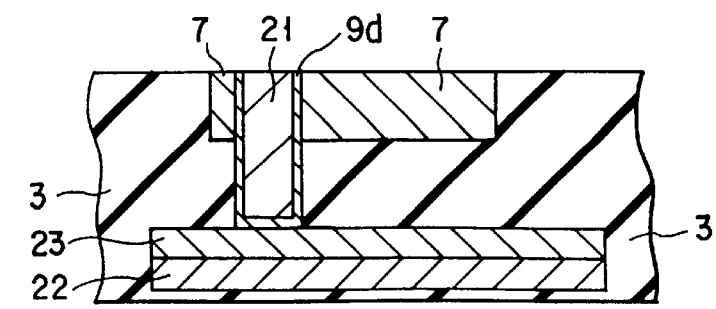

Then, another Si film 7 is deposited all over the substrate by means of LP-CVD method so as to fill the interior of the wiring groove with the Si film 7. Thereafter, any superfluous portion of the Si film 7 which is disposed outside of the wiring groove is selectively removed by making use of the CDE method or CMP method (FIG. 29E).

Figure 29F:
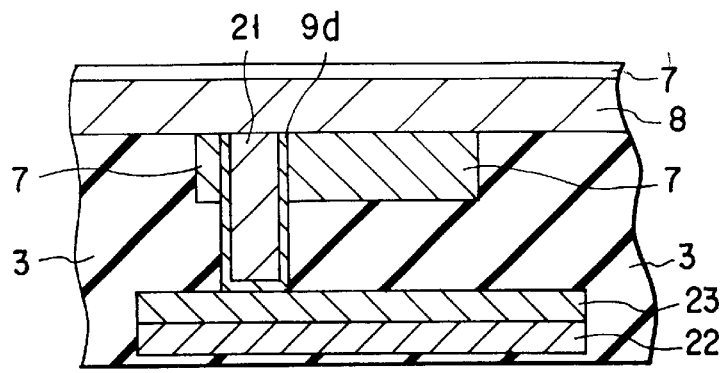

After a native oxide film formed on the upper surface of the Si film 7 is removed by means of Ar sputter-etching, an Al film and a Ti film 9 are successively formed by means of a sputtering method all over the surface without breaking vacuum (FIG. 29F).

Figure 29G:
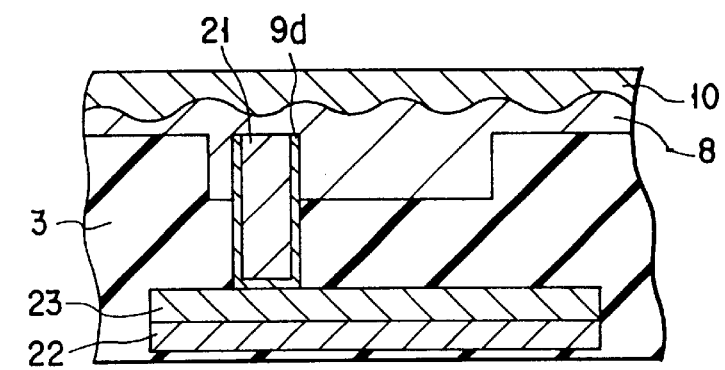

Thereafter, the substrate is heat-treated for 60 minutes in a furnace heated to a temperature of 450° C., whereby allowing the Si film 7 to be substituted by the Al film 8, and at the same time the Si film 7 is allowed to react with the Ti film 9 to form a Ti silicide compound, thereby allowing the Si film 7 to be absorbed by the Ti film 9. During this step, a Ti/Ti silicide film 10 is formed (FIG. 29G).

Then, the Ti/Ti silicide film 10 and any superfluous portion of the Al film are removed (abraded) by means of CMP method. As a result, an Al wiring layer (a second wiring layer) comprising the Al film is formed in the interior of the wiring groove.

Figure 29H:
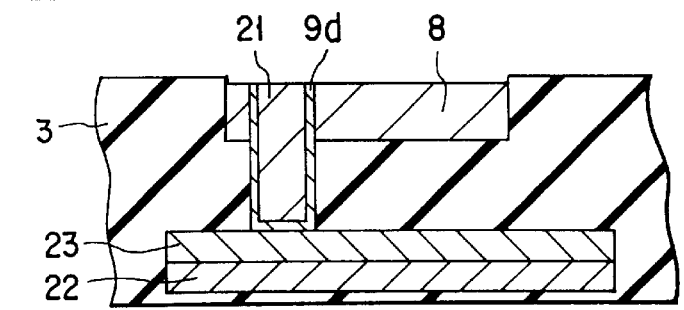

In this case, a soft abrasive cloth can be employed to abrade the Al film (a first wiring layer) 8, thereby lowering the surface level of the Al film 8 from the surface level of the interlayer insulating film 3 by a thickness of about 20 nm (FIG. 29H).

Figure 29I:
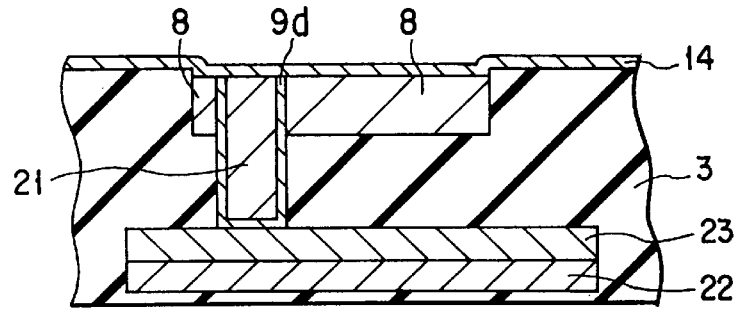

After a native oxide film formed on the upper surfaces of the Al film 8 and W plug 21 is removed by means of Ar sputter-etching, a TiN film 14 having a thickness of 30 nm is formed all over the surface without breaking vacuum (FIG. 29I).

Figure 29J:
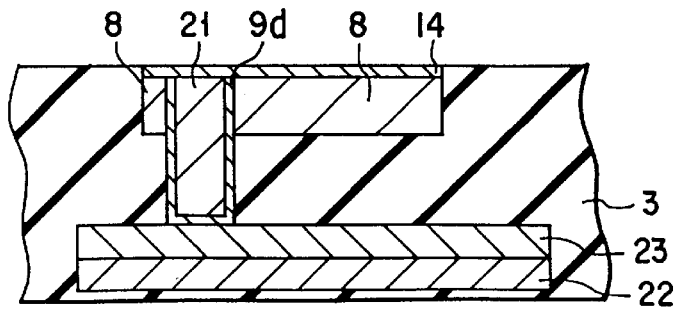

Finally, the Ti/Ti silicide film 10 disposed outside of the wiring groove is removed by means of CMP method (FIG. 29J).

Since the W plug 21 is directly contacted with the TiN film 14 according to this example, the problem of disconnection of wiring can be hardly raised even if the migration of Al in the Al wiring layer 8 occurs during the operation of device, thereby ensuring a high reliability of device.

EXAMPLE 28

There is a problem in the process wherein a substitutive film such as an Si film which has been formed in the interior of a contact hole or a wiring groove is substituted by a conductive film such as an Al film which has been formed on the substitutive film, and the substitutive film thus substituted is then allowed to react with an absorption film such as a Ti film thereby to be absorbed by the absorption film. Specifically, according to this process, a reaction product film to be formed through a reaction between the substitutive film and the absorption film, a superfluous absorption film which is left unused for the reaction, and a superfluous conductive film disposed outside of the wiring groove are caused to remain in the form of a laminate film at the upper portions of the contact hole and wiring groove.

This kind of laminate film is relatively high in resistance as compared with the single layer of a conductive film so that if it is left remained as mentioned above, the wiring cannot be employed as a wiring for an LSI. Therefore, it is imperative to remove any superfluous materials, in particular the reaction product layer, thereby leaving the conductive film only in the interior of the wiring groove.

By the way, in a damascene type (or a dual damascene type) wiring structure as proposed by this invention, it is possible to remove any superfluous portion by means of the CMP method.

However, in the case of the aforementioned laminate film comprising a plurality of films each differing from one another in quality, a treatment by means of a multi-stage CMP method is required to be performed, i.e. the abrasive or abrasive cloth is required to be frequently exchanged so as to meet with the quality of each film to be abraded, thus making the process troublesome.

Further, depending on the layout of pattern of wiring, the quantity of the substitutive film increases locally, thus resulting in the non-uniformity of the thickness of the absorption film remaining as a superfluous material, of the thickness of reaction product, or of the thickness of superfluous portion of the conductive film. Therefore, it is very difficult to perform an uniform abrasion in plane of semiconductor chip or of the wafer.

Even in such a case, it is possible, by removing the upper layer portion by means of a wet etching method or the CDE method, to finish the abrasion with a single CMP process. Specific example of this method will be explained below, wherein an Si film, an Al film and a Ti film are employed as a substitutive film, a conductive film and an absorption film, respectively.

When an Si film, an Al film and a Ti film are employed, a laminate film consisting of a Ti film/a Ti silicide film/an Al film is already formed on the upper portion of substrate at the moment when the substitution reaction between the Si film and the Al film has been finished.

If a heated hydrogen peroxide aqueous solution is employed as an etching solution in this case, the Ti film can be selectively removed. If the laminate film is treated in this manner, the remaining silicide film/Al film can be removed by the CMP employing a common abrasive for the silicide film/Al film, e.g. colloidal silica-based abrasive, i.e. by a single process of the CMP.

There is a problem when the density of Si is relatively high at a lower region that an Si nodule tends to be generated at this region and is turned into particles in the CMP process, thus generating a scratch.

This problem can be solved by removing the Si nodule by means of the CDE method at the moment when the surface of the Si nodule is exposed after an wet etching or during the process of CMP.

Furthermore, when an Si film, an Al film and a W film are employed as a substitutive film, a conductive film and an absorption film, respectively, a laminate film consisting of a W film/a W silicide film/an Al film is already formed on the upper portion of substrate at the moment when the substitution reaction between the Si film and the Al film has been finished.

If a heated hydrogen peroxide aqueous solution is employed as an etching solution in this case, the W film can be selectively removed. On the other hand, the W silicide film can be selectively removed by the CDE method employing $CF_4$. If the laminate film is treated in this manner, the remaining Al film can be removed by a single process of the CMP.

EXAMPLE 29

First of all, a first wiring layer consisting of Al is formed on an Si substrate provided with an element. Then, an interlayer insulating film is formed all over the upper surface of the substrate. Then, a contact hole and a wiring groove are successively formed in the interlayer insulating film.

Then, a native oxide film formed on the upper surface of the first wiring layer which has been exposed on the bottom of the contact hole is removed by means of a surface treatment. Then, an amorphous Si film (a boron doped amorphous Si film) is deposited all over the substrate by means of LP-CVD method so as to prevent any void from generating in the interior of the contact hole.

A specific method of forming this boron doped amorphous Si film is as follows. Namely, the temperature of substrate is set to 350° C. and, after the temperature of substrate is stabilized, disilane gas and diborane gas (flow rate: 50 (disilane gas):1 (diborane gas)) is introduced into a chamber, in-which the boron doped amorphous Si film is allowed to deposit under a pressure of 0.1 torr.

It is also possible to deposit other kinds of Si film, such as a polycrystalline Si film, an amorphous Si film or a boron doped amorphous Si film in place of the aforementioned boron doped amorphous Si film. However, a deposition temperature of at least 600° C. in the case of the polycrystalline Si film, and at least 420° C. in the case of the amorphous Si film would be required for achieving a practically sufficient deposition rate of Si film.

On the other hand, in the case where the constituent material of the first wiring layer contains a low melting point metal, if the substrate is heated after a contact hole is formed in the interlayer insulating film while allowing the first wiring layer formed on the bottom of contact hole to be exposed, the low melting point metal would be caused to swell in the contact hole due to a stress from the insulating film existing near the wiring layer. As a result, a void may be generated in the wiring portion, thus badly affecting the reliability of the wiring.

The swelling of this low melting point metal in a contact hole is known to occur when it is heat-treated at a temperature of more than 400° C. Therefore, the Si film is required to be formed at a temperature of 400° C. or less.

If the first wiring layer is consisted of a low melting point metal as mentioned above, the employment of a polycrystalline Si film or an amorphous Si film as a substitutive film may not be suited because of a high temperature required for the deposition of these films.

Figure 30:
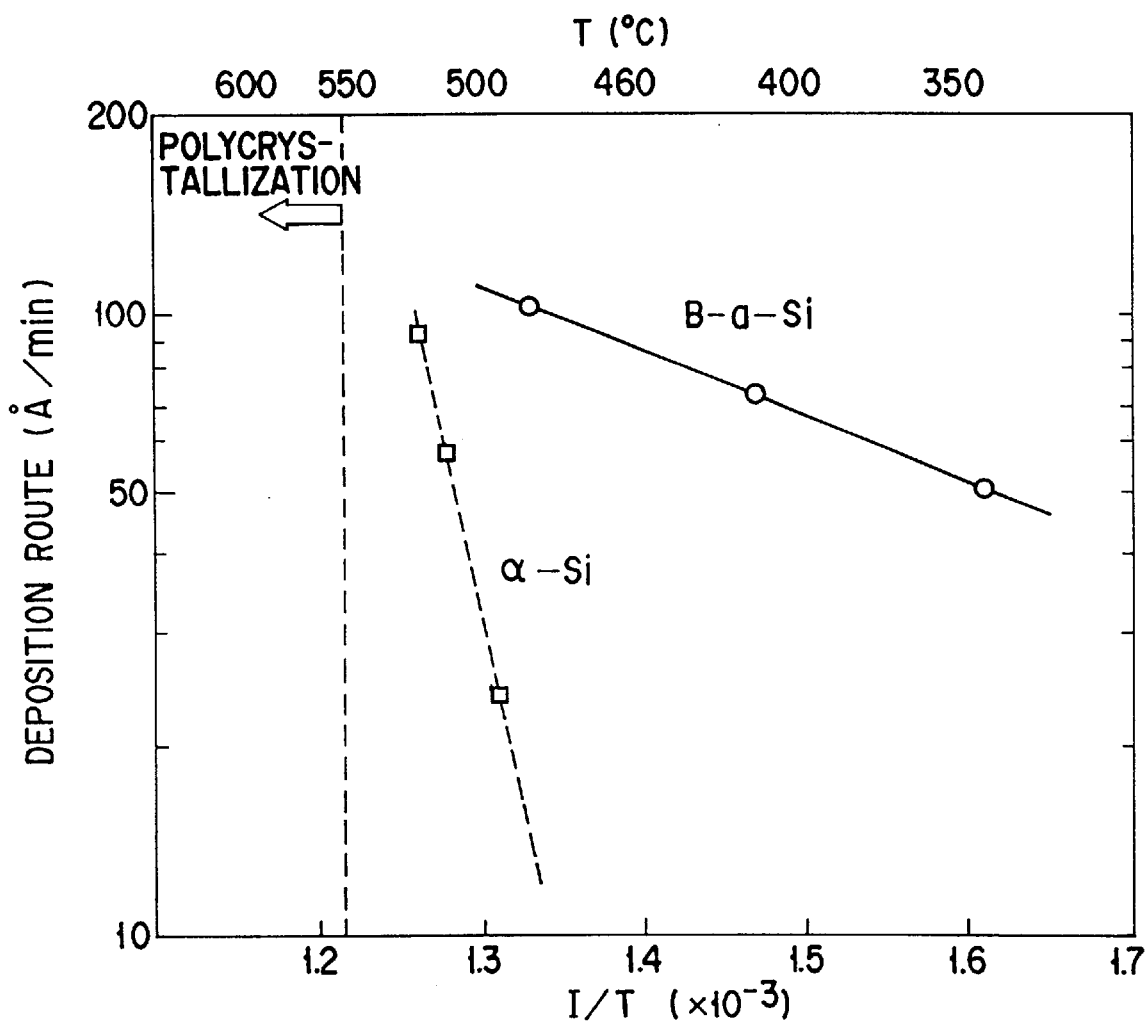
FIG. 30 shows a graph illustrating a relationship between the deposition rate of B-containing a-Si film and B-free a-Si film and the temperature thereof.

By contrast, in the case of the boron doped amorphous Si film (boron doped a-Si film), even if the deposition temperature is 400° C. or less, a sufficient deposition rate can be achieved as shown in FIG. 30, so that the film-forming process of the Si film to be employed as a substitutive film can be performed at a relatively low temperature and within a shorter period of time.

Moreover, the lower the temperature is, the more it becomes possible to proceed the deposition of film on a substrate within a reaction rate-determining region of disilane and diborane, thus making it possible to obtain a more conformal and void-free Si film.

If the substitution reaction between the Si film and the Al film is permitted to proceed by using an Si film (a substitutive film) containing a void, the void may be kept remained in the Al film to be obtained after the substitution. Therefore, the formation of a conformal Si film is desirable.

Since a boron doped amorphous Si film is employed as a substitution film in this example, it is possible to deposit a conformal Si film which can be deposited at a lower temperature and within a shorter period of time.

Then, the boron doped amorphous Si film is selectively removed by means of the CMP method or CDE method so as to leave the boron doped amorphous Si film only in the interiors of the contact hole and the wiring groove, thus removing any superfluous portion of the boron doped amorphous Si film.

Then, the native oxide film or impurities such as F and C which are formed on the surface of the boron doped amorphous Si film are removed by means of reverse sputtering, and then an Al film and a Ti film are successively deposited all over the upper surface of the resultant substrate without breaking vacuum.

Thereafter, the substrate is heat-treated for 90 minutes at a temperature of 450° C., whereby allowing the boron doped amorphous Si film to be substituted by the Al film, and at the same time allowing the boron doped amorphous Si film to be reacted with the Ti to form a Ti silicide compound and a Ti boride, thereby allowing the boron doped amorphous Si film to be absorbed by the Ti film, thus obtaining a contact hole and a wiring groove, both being filled with the Al film. During this step, a mixed layer comprising a Ti/Ti silicide film, a Ti silicide film and a Ti boride film is formed.

Finally, the mixed layer comprising a Ti/Ti silicide film, a Ti silicide film and a Ti boride film. and any superfluous portion of the Al film and Al/Ti mixed film are all removed by means of the CMP method. As a result, an Al plug and an Al wiring layer (a second wiring layer) both consisting of the Al film are formed in the interiors of the contact hole and the wiring groove, respectively.

Meanwhile, for the purpose of comparison with the device of this example, an Al film is selectively left remained in the interiors of the contact hole and the wiring groove by using a substrate bearing the same pattern density and by repeating the same procedures as mentioned above except that a polycrystalline Si film or an amorphous Si film is employed as a substitutive film and filled in the interiors of the contact hole and the wiring groove.

As a result, the specific resistance was 3.7 $\mu\Omega$cm in the case where the substitution was performed using the polycrystalline Si film, and 3.5 $\mu\Omega$cm in the case where the substitution was performed using the amorphous Si film.

By contrast, the specific resistance was 3.3 $\mu\Omega$cm in the case where the substitution was performed using the boron doped amorphous Si film according to this example, thus indicating a lower value as compared with aforementioned different kinds of Si film. Moreover, this low specific resistance is very close to the specific resistance of an alloy wherein Si is incorporated into an Al film to an extent of solid solution limit.

The factors for causing a difference in specific resistance of the Al film filled in the contact hole and wiring groove depending on the kinds of the Si film. (substitutive film) are illustrated in FIG. 31.

Figure 31:
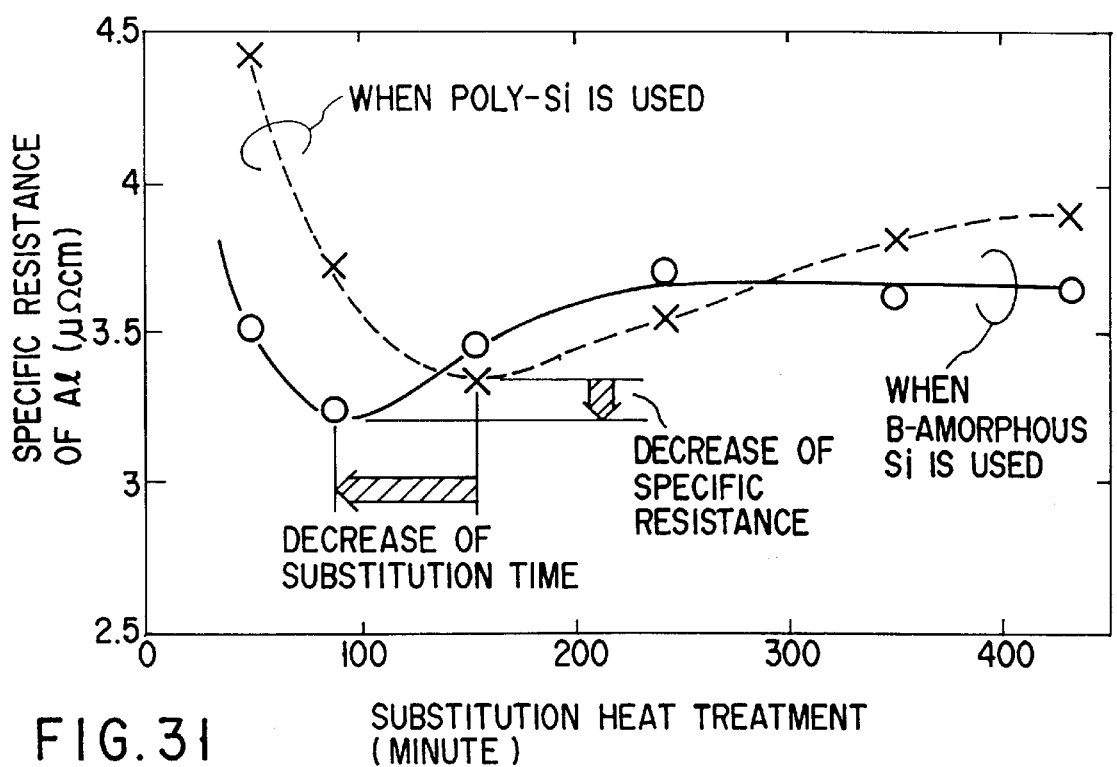
FIG. 31 shows a graph illustrating a cause for a difference in specific resistance of an Al film after the deposition thereof, which has been arisen depending on the kinds of Si film employed as a substitutive film.

Namely, FIG. 31 shows the dependency of the specific resistance of the Al film on the time required for the substitution treatment wherein a boron doped amorphous Si film and a polycrystalline Si film are respectively subjected to the substitution treatment at a temperature of 450° C., thereby filling the contact hole and wiring groove with the Al film in the same procedures as described above.

It will be seen from FIG. 31 that irrespective to the kinds of Si film to be functioned as the substitutive film, there is a heat treatment time, in relative to the heat treatment temperature, that gives a minimum value in specific resistance of the charged Al film.

The heat treatment in this example using a boron doped amorphous Si film as a substitutive film is based on this result, i.e. a heat treatment time of 90 minutes which gives a minimum value in specific resistance at a temperature of 450° C. is adopted.

In the case where the polycrystalline Si film was employed as a substitutive film, the minimum value of specific resistance was obtained when the heat treatment was performed for about 150 minutes at a temperature of 450° C. The specific resistance of the Al film ultimately obtained in this case was lowered to nearly 3.3 $\mu\Omega$cm.

In the case where the amorphous Si film was employed as a substitutive film, the minimum value of specific resistance of the Al film filled in the contact hole and wiring groove that was obtained when the heat treatment was performed at a temperature of 450° C. was located at an intermediate region of time between where the boron doped amorphous Si film was employed and where the polycrystalline Si film was employed.

By suitably combining the substitution heat treatment temperature and the heat treatment time in each kind of Si film so as to achieve a minimum value in specific resistance of the Al film filled ultimately, an Al film of low resistance can be obtained.

In particular, if an amorphous Si film is selected rather than a polycrystalline Si film, furthermore if a boron doped amorphous Si film is selected from among these Si films as an Si film to be initially filled in a contact hole or in a wiring groove, the time required for the substitution heat treatment can be shortened.

Figure 32:
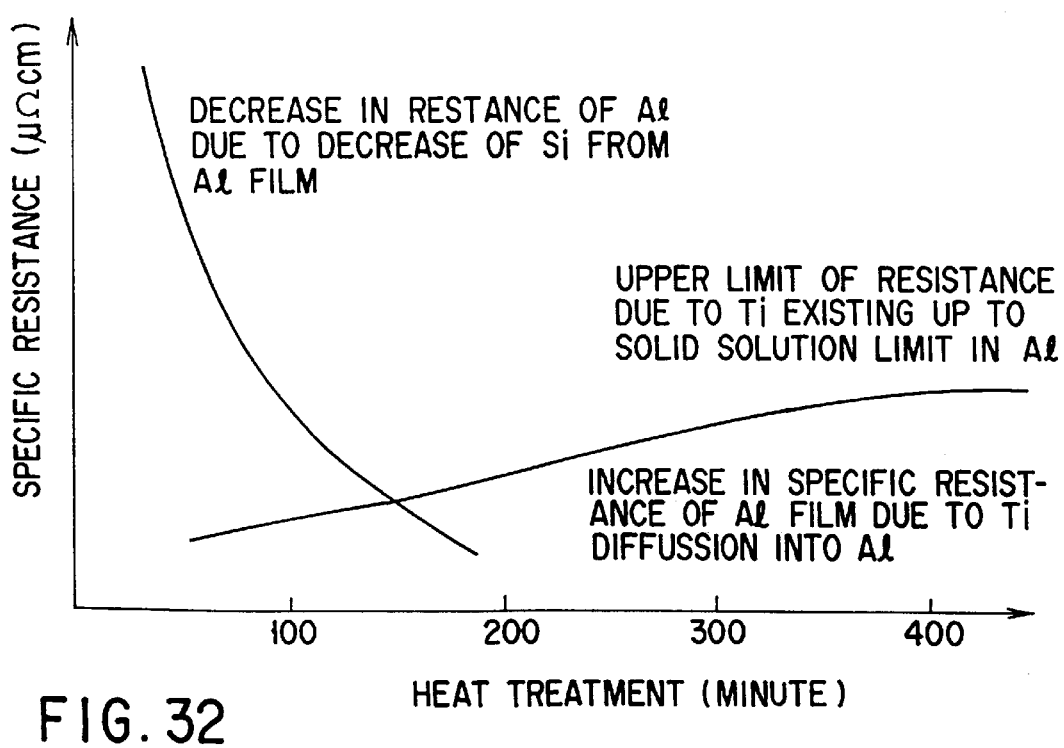
FIG. 32 shows a graph separately illustrating the factors for specific resistance.

Next, the advantage of employing a boron doped amorphous Si film as a substitutive film will be explained with reference to FIG. 32. FIG. 32 shows a graph wherein the factors for constituting the specific resistance shown in FIG. 31 are separately illustrated.

In the substitution heat treatment, the Si film is caused to be drawn out of a contact hole or a wiring groove through the silicidation of the Ti film formed on the Al film, and at the same time, substituted by the Al film. During this substitution process, the diffusion of Ti into the Al film takes place also, in addition to the mutual diffusion between the Si film and the Al film, and the silicidation of Ti.

Since the absorption of Si proceeds more prominently on the side of the Si film which faces the absorption film in the initial stage of substitution reaction, so that the quantity of the Si and Si nodule in the Al film is reduced, thus lowering the specific resistance of the Al film filled in the contact hole or wiring groove.

The time required for the reduction of resistance of the Al film that can be attained by the reduction of the quantity of Si is determined according to the density wiring pattern which has been formed in the underlying layer as well as according to the filling ratio of the Si film in the contact hole or wiring groove.

However, if the heat treatment time is prolonged, due to the diffusion of Ti into the Al film, the diffusion of Ti into the Al film is further promoted, thus leading to an increase in resistive component in the Al film. As a result, the aforementioned minimum value in relative to the substitution heat treatment temperature is cause to be formed in the specific resistance of the Al film to be ultimately filled in the contact hole or the wiring groove.

However, if a boron doped amorphous Si film is employed as the substitutive film, the mutual diffusion between Al and Si is promoted (activated) and at the same time, the movement of B and Si toward the Ti film side is also accelerated, thus making it possible to shorten the substitution reaction between the Al film and the Si film.

Due to this shortening of heat treatment time, the diffusion time of Ti into the Al film can be minimized, and hence the minimum value in specific resistance of the resultant Al film that can be achieved from an appropriate combination of temperature and time in the substitution heat treatment can be obtained in a shorter time as compared with where other kinds of Si film are employed. As a result, an Al film which is lower in specific resistance can be filled in the contact hole or in the wiring groove.

Moreover, since this boron doped amorphous Si film, which can be deposited at relatively low temperature, can contain a larger amount of hydrogen as compared with other kinds of Si film, it is expected that the mutual diffusion between Al and the boron doped amorphous Si film is further activated.

Furthermore, when the substitution reaction of Al film is performed with an employing of this boron doped amorphous Si film, the boron which has been diffused into the Ti film side forms a Ti boride at or near the interface between the Al film and the Ti film, thus inhibiting the Ti from diffusing into the Al film.

Due to these effects, it is possible with the employment of this boron doped amorphous Si film to more effectively alleviate an increase in resistance (due to the diffusion of Ti into the Al film filled in the contact hole or wiring groove) as compared with other kinds of Si film, or even if the heat treatment time is prolonged, as shown in FIG. 31.

These effects can be more effectively utilized if this boron doped amorphous Si film (to be formed as a substitutive film) is deposited so as to form a gradient in concentration of boron, i.e. the concentration of boron increases gradually or step-wise toward the Al film.

When a high concentration region of boron is existed at the upper layer, the reaction of forming a Ti boride is allowed to take place faster than the Ti-silicifying reaction during the substitution heat treatment between the Al film and the boron doped amorphous Si film, so that the diffusion of Ti into the Al film can be inhibited from the early stage of the heat treatment.

When the Ti boride film (which is capable of inhibiting the mutual diffusion between Al and Ti due to the diffusion of Ti, or inhibiting the reaction of them) is interposed in this manner, the formation of Al/Ti compound can be inhibited in the Al film or at the Al/Ti interface. As a result, the gradient of stress to the Al film due to the voluminal expansion resulting from the formation of the Al/Ti compound can be alleviated, thus making it possible to prevent the generation of void in the Al wiring.

Figure 35:
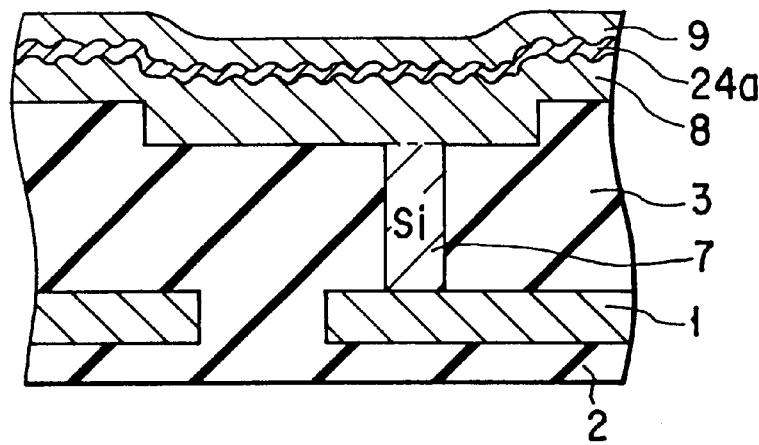
FIG. 35 shows a cross-sectional view illustrating the manufacturing steps of the semiconductor device according to a modified embodiment of Example 29.
Figure 36A:
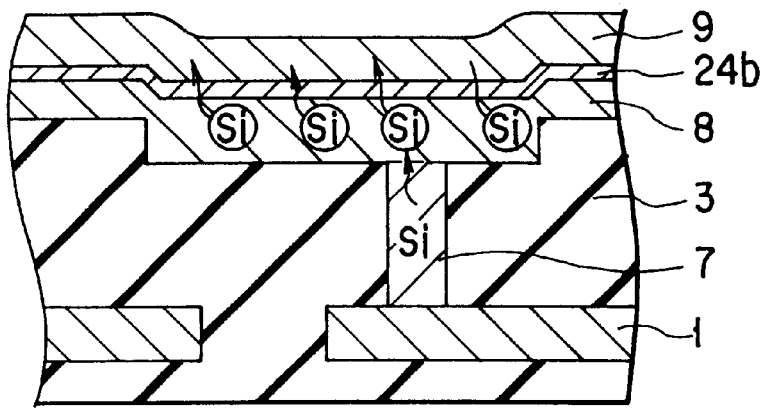
FIGS. 36A and 36B show respectively a cross-sectional view illustrating the manufacturing steps of the semiconductor device according to a modified embodiment of Example 29.
Figure 36B:
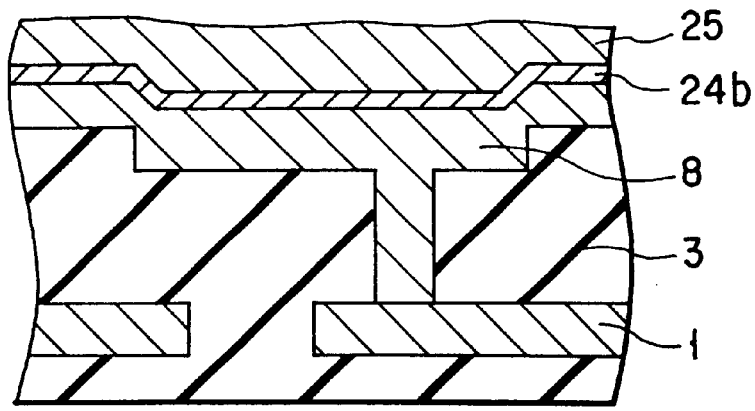

In the explanation of this example, a Ti boride layer is formed as a diffusion-inhibiting layer. However, almost the same effect can be obtained even if a Ti silicide layer 24a is formed as a diffusion-inhibiting layer (FIG. 35). It is also possible to obtain almost the same effect by the application of other kinds of film which is capable of effectively inhibiting the mutual reaction between Al and Ti, i.e. by the formation of a thin W film 24b at the Al/Ti interface, which is incapable of forming a compound with Al at the substitution heat treatment temperature but is capable of allowing Al and Si to pass therethrough (FIG. 36A); or by the formation of a TiSi compound layer 25 through a substitution reaction between Si and Al (FIG. 36B).

The W film in this case can be formed by means of sputtering or by making use of a CVD method.

EXAMPLE 30

Figure 33A:
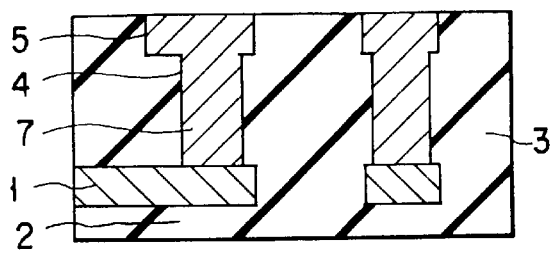
FIGS. 33A to 33D show respectively a cross-sectional view illustrating the manufacturing steps of the semiconductor device according to Example 30.
Figure 33B:
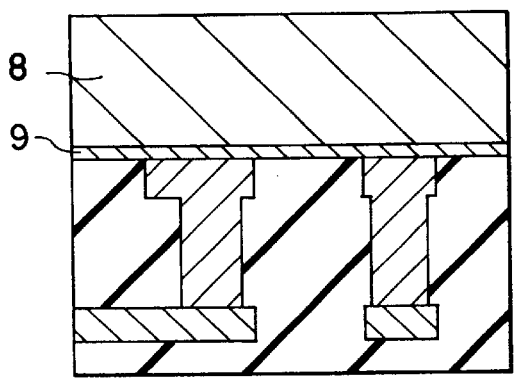
Figure 33C:
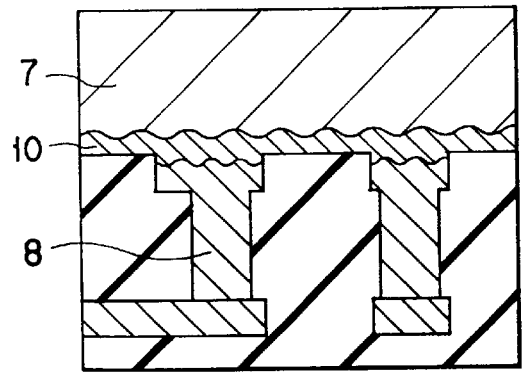

First of all, a wiring groove 5 and a contact hole 4 both being filled with an Si film 7 are formed (FIG. 33A). After a Ti film 9 is formed all over the surface of the substrate, an Al film 8 is formed (FIG. 33B). When these films are subjected to heat treatment as they are, a TiSi compound is formed at the Ti/Si interface, and an AlTi compound is formed at the Al/Ti interface. Since any of AlTi compound layer/Ti layer/TiSi layer is incapable of functioning as a diffusion barrier against Al, Al is allowed to pass through these AlTi compound layer/Ti layer/TiSi layer, thereby making it available for the substitution with Si (FIG. 33C).

Figure 33D:
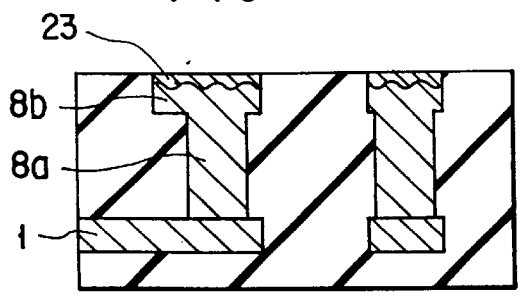

Then, the Al film and the AlTi compound layer/Ti layer/TiSi compound layer 10 are removed by means of the CMP (FIG. 33D). At this moment, the TiSi compound layer 23 is formed even in the inside of the wiring groove during the previous heat treatment, so that even when the CMP is carried out down to the surface of interlayer insulating layer, the TiSi compound layer 23 is left remained in the wiring groove. This TiSi compound layer remained in this manner functions as a compensating lead wire for allowing an electric current to pass therethrough when a void is generated in the Al wire, thus improving the reliability of wire. If the wiring groove is deeply formed in advance, the thickness of the TiSi compound layer can be adjusted by additionally performing the CMP.

Figure 34A:
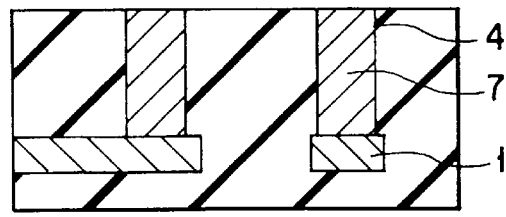
FIGS. 34A to 34D show respectively a cross-sectional view illustrating the manufacturing steps of the semiconductor device according to a modified embodiment of Example 30.
Figure 34B:
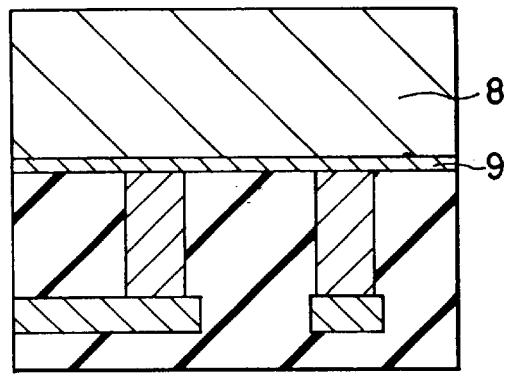
Figure 34C:
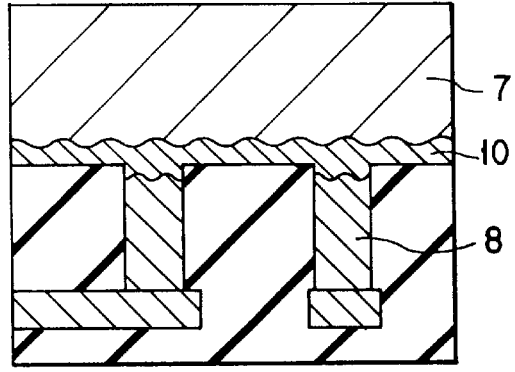

In the foregoing explanation, both wiring groove 5 and contact hole 4 are filled with Al. However, Al may be filled only in the contact hole 4. Namely, the contact hole is filled with the Al film 8 (FIG. 34A), the Ti film 9 is deposited all over the surface of the substrate, and an Al film 8 is formed (FIG. 34B). When these films are subjected to heat treatment as they are, a TiSi compound is formed at the Ti/Si interface, and an AlTi compound is formed at the Al/Ti interface (reference numeral 10). Since any of AlTi compound layer/Ti layer/TiSi layer is incapable of functioning as a diffusion barrier against Al, Al is allowed to pass through these AlTi compound layer/Ti layer/TiSi layer, thereby making it available for the substitution with Si (FIG. 34C).

Figure 34D:
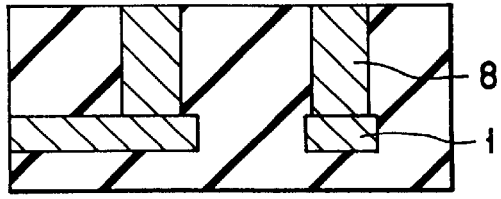

Then, the Al film and the AlTi compound layer/Ti layer/TiSi compound layer are removed by means of the CMP (FIG. 34D). At this moment, the TiSi compound layer is formed even in the inside of the wiring groove during the previous heat treatment, so that even when the CMP is carried out down to the surface of interlayer insulating layer, the TiSi compound layer 23 is left remained in the wiring groove. If the wiring groove is deeply formed in advance for the purpose of lowering the plug, the thickness of the TiSi compound layer can be adjusted by additionally performing the CMP.

After an Al plug is formed in advance as mentioned above, an interlayer insulating film 3 is formed and selectively etched to a depth reaching to the Al plug, thus forming a wiring groove, into which a low resistance metal such as Cu is filled, thereby making it possible to obtain a wiring of low resistance.

EXAMPLE 31

This example explains a method of heat treatment for more positively forming the diffusion-inhibiting layer which has been explained in Example 29.

First of all, a first wiring layer consisting of Al is formed on an Si substrate provided with an element. Then, an interlayer insulating film is formed all over the upper surface of the substrate.

Then, the interlayer insulating film is selectively etched by making use of photolithography and RIE to a depth reaching to the first wiring layer, thus forming a contact hole, and at the same time a wiring groove is selectively formed likewise at a region including this contact hole. Namely, the contact hole connected with the first wiring layer and the wiring groove are successively formed.

Then, a native oxide film formed on the upper surface of the first wiring layer which has been exposed on the bottom of the contact hole is removed by means of a surface treatment. Then, an Si film is deposited all over the substrate by means of CVD method so as to fill the interiors of the contact hole and the wiring groove with the Si film. Then, any superfluous portion of the Si film is selectively removed by means of the CMP method or CDE method so as to leave the Si film in the interior of the contact hole.

Then, the native oxide film formed on the surface of the Si film is removed, and then an Al film and a Ti film are successively deposited all over the upper surface of the resultant substrate without breaking vacuum.

Figure 37:
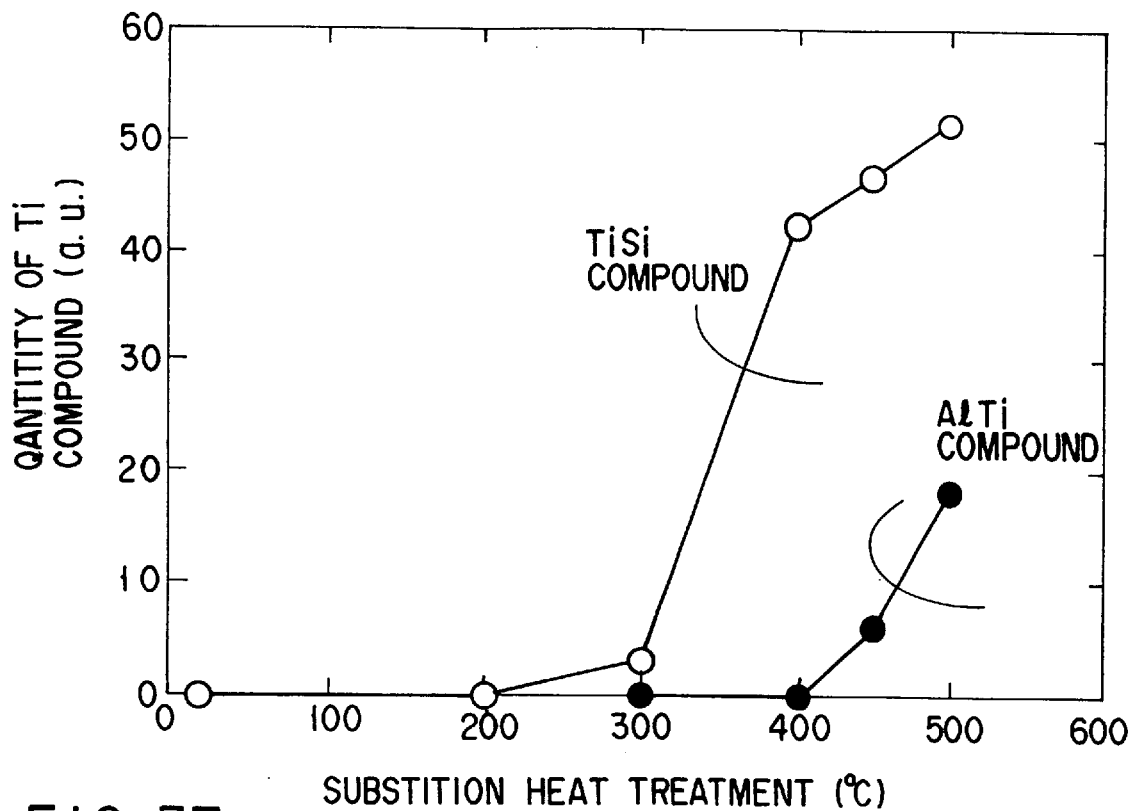
FIG. 37 shows a graph illustrating a relationship between the temperature of substitution heat treatment and the yield of a Ti compound.

Then, as shown in FIG. 37, a heat treatment is performed for 3 hours at a temperature of not more than 400° C. thereby preferentially forming a TiSi compound to be functioned as a diffusion-inhibiting layer against Ti and Al. As a result, a TiSi compound film is formed at the interface of Al/Ti, this TiSi compound film being functioning as an inhibiting layer for inhibiting the interdiffusion of Ti/Al, thus inhibiting the formation of an Al/Ti compound in the Al film and at the interface of Al/Ti. After this diffusion-inhibiting layer is formed, a high temperature heat treatment is performed for one hour at a temperature of 400° C. or more so as to allow a Ti silicide-forming reaction to take place, thereby promoting the absorption of Si by the Ti and at the same time accomplishing the substitution reaction between Al and Si. It is possible with this method to inhibit the formation of the AlTi compound, to inhibit an excessive voluminal expansion of the upper Al film, and to alleviate the stress to Al. At the same time, it is possible to sufficiently shorten the substitution reaction between Si and Al.

EXAMPLE 32

First of all, a first wiring layer consisting of Al is formed on an Si substrate provided with an element. Then, an interlayer insulating film is formed all over the upper surface of the substrate.

Then, a contact hole and a wiring groove are successively formed in the interlayer insulating film. Then, a native oxide film formed on the upper surface of the first wiring layer which has been exposed on the bottom of the contact hole is removed. Then, an Si film is deposited all over the substrate in a manner to prevent any void from generating in the interior of the contact hole.

Then, any superfluous portion of the Si film is selectively removed by means of the CMP method or CDE method so as to leave the Si film in the interiors of the contact hole and wiring groove.

Then, the native oxide film or impurities such as F and C which are formed on the surface of the boron doped amorphous Si film are removed by means of reverse sputtering, and then an Al film and a Ti film are successively deposited all over the upper surface of the resultant substrate without breaking vacuum.

Thereafter, the substrate is heat-treated for 300 minutes at a temperature of 450° C., whereby allowing the Si film to be substituted by the Al film, and at the same time allowing the Si film to be reacted with the Ti to form a Ti silicide compound, thereby allowing the Si film to be absorbed by the Ti film, thus obtaining a contact hole and a wiring groove, both being filled with the Al film. During this step, a Ti/Ti silicide film is formed.

As mentioned in Example 25, during the substitution heat treatment between the Si film and the Al film, not only the silicidation reaction to absorb the Si film by the Ti film but also the diffusion of Ti into the Al film is taken place. This diffusion of Ti becomes a cause for increasing the resistance of the Al film when a heat treatment of long time is required.

Then, the Ti/Ti silicide and any superfluous portion of the Al film are removed by means of the CMP method so as to leave the Al film in the interiors of the contact hole and wiring groove.

Then, through a heat treatment in an $N_2$ gas atmosphere, the Ti which has been diffused into the Al film is allowed to be diffused out of the Al film filled in the contact hole and wiring groove, thereby discharging Ti from the Al film.

Finally, the surface of the Al film on which the precipitated Ti and Ti nitrides are formed is treated again by means of the CMP method, whereby removing these Ti and Ti nitrides. As a result, a connector plug comprising the Al film filled in the interior of contact hole and a wiring comprising the Al film filled in the interior of the wiring groove can be obtained.

Since the Ti which has been diffused into the Al film during the substitution treatment can be discharged out of the Al film by a heat treatment in an $N_2$ gas atmosphere, the specific resistance of the Al film can be effectively lowered.

The step of discharging Ti out of the Al film by a heat treatment in an $N_2$ gas atmosphere can be performed by employing an $N_2$ gas atmosphere in the step of the substitution heat treatment. Alternatively, the step of discharging Ti out of the Al film by a heat treatment in an $N_2$ gas atmosphere can be performed after the substitution heat treatment but prior to the step of removing the Ti/Ti silicide and any superfluous portion of the Al film.

The gas atmosphere is not confined to the $N_2$ gas atmosphere, but may be a gas atmosphere containing N, B, H, C or a combination of these elements, such as $NH_3$, $B_2H_6$ or $CO_2$. Namely, any kinds of gas can be employed as far as the gas atmosphere does not badly affect the process involved and allows the Ti to be discharged out of the Al film.

Further, the discharging step of Ti can be performed as follows. Namely, after filling the contact hole and wiring groove with an Al film, and the upper Ti/Ti silicide and superfluous portion of Al film are removed, the substrate is subjected to additional heat treatment at a temperature which is higher than the solid solution limit of Ti diffused in the Al film but is lower than the substitution heat treatment temperature of the Al film and Si film, and then the substrate is allowed to cool gradually, thereby allowing Ti to discharge until solid solution limit of Ti in the Al film at a lower temperature is reached. Further, when this temperature sequence for discharging Ti is performed in an $N_2$ gas atmosphere or the aforementioned various kinds of gas atmosphere, the discharge of Ti from the Al film can be more effectively carried out.

It may be preferable, at the occasion of forming the Al film on the surface of the Si film, to form a sufficiently thick Al film in relative to the diffusion of Ti into the Al film in the substitution heat treatment. If the Al film is formed in this manner, a high resistance portion where the diffuse Ti remains and disposed higher than the wiring groove can be removed at the occasion of removing the Ti/Ti silicide and a superfluous portion of Al film after the substitution heat treatment, so that even if the substrate is heated at the same temperature and the same time, the interiors of contact hole and wiring groove can be filled with an Al film which is relatively free from a high resistance portion due to the diffusion of Ti.

Namely, if the temperature and time for the substitution heat treatment are determined according to the substitution between the Si film and the Al film, and if the quantity of Ti to be diffused under these temperature and time is adjusted by the film thickness of the Al film, an Al wiring and an Al plug which are low in resistance can be obtained.

It is of course possible to combine various methods illustrated in these examples as a method of reducing an increase of resistance originating from Ti being diffused and remaining in the Al film. For example, when a wiring pattern is consisted of various pattern densities, the time for the substitution heat treatment may be required to be prolonged in conformity with the region where the quantity of Si is highest even if the substitution is already finished and an increase in resistance is initiated due to the diffusion of Ti into the Al film at other region where the quantity of Si is relatively small. Even in such a situation, it is possible through the combination of these methods to form an Al film of ultimately low resistance.

EXAMPLE 33

First of all, a first wiring layer 1 consisting of Al is formed on an Si substrate provided with an element. Then, an interlayer insulating film 3 is formed all over the upper surface of the substrate.

Then, the interlayer insulating film 3 is selectively etched by making use of photolithography and RIE to a depth reaching to the first wiring layer 1, thus forming a contact hole 4, and at the same time a wiring groove 5 is selectively formed likewise at a region including this contact hole 4. Namely, the contact hole 4 connected with the first wiring layer 1 and the wiring groove 5 are successively formed.

Then, a native oxide film formed on the upper surface of the first wiring layer 1 which has been exposed on the bottom of the contact hole 4 is removed by means of a surface treatment. Then, an Si film 7 is deposited all over the substrate by means of CVD method so as to fill the interiors of the contact hole 4 and the wiring groove 5 with the Si film 7. Then, any superfluous portion of the Si film 7 is selectively removed by means of the CMP method or CDE method so as to leave the Si film 7 in the interior of the contact hole 4.

Figure 38A:
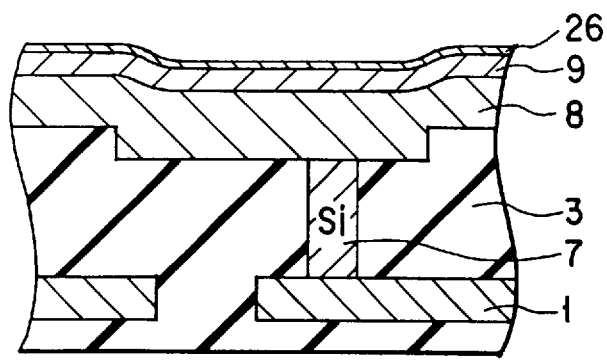
FIGS. 38A and 38B show respectively a cross-sectional view illustrating the manufacturing steps of the semiconductor device according to Example 33.
Figure 38B:
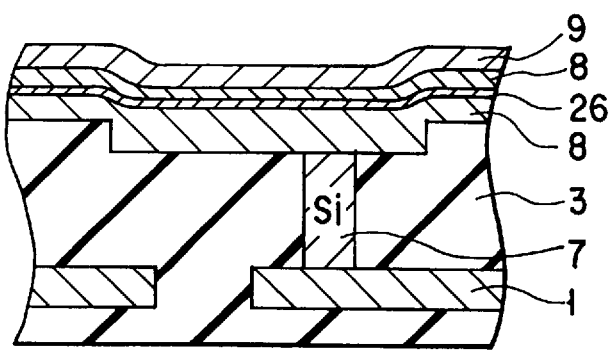

Then, the native oxide film formed on the surface of the Si film 7 is removed, and then an Al film 8 and a Ti film 9 are successively deposited all over the upper surface of the resultant substrate without breaking vacuum. Then, an $SiO_2$ film 26 and a Ti film 9 are formed thereon (FIG. 38A).

Then, a heat treatment is performed for two hours at a temperature of 450° C., during which the substitution between the Si film and the Al film is effected, and the silicidation reaction is allowed to take place between the Si film and the Ti film, thereby forming a Ti silicide and allowing the Si film to be absorbed by the Ti film.

In substitution reaction, due to the formation of the Ti silicide, the volume of the upper portion thereof is caused to expand as compared with the initial Ti volume, thus imposing a tensile stress (in-plane direction) on the Al film. If the volume of the Ti film is large, the quantity of AlTi compound to be formed at the Al/Ti interface would be increased, thus making the voluminal expansion of the compound film becomes more prominent. If the tensile stress due to this voluminal expansion of the compound film becomes excessive, the stress gradient is cause to generate, and hence a void is caused to be generated to alleviate this stress gradient, thus possibly generating a void in the Al wiring.

In this example, there is preliminarily provided on the surface of the Ti film with a film ($SiO_2$ film 26 ) which is capable of giving a stress in the direction of compression in conformity with the voluminal expansion, due to the formation of Ti compound, of the film formed on the Al film. It is possible with this film ($SiO_2$ film 26) to suppress the expansion in planar direction of the Ti compound film and at the same time to inhibit the generation of void in the Al wiring.

In the foregoing explanation of this example, an $SiO_2$ film is employed as a film which is capable of giving a stress in the direction of compression. However, it is also possible to employ a W film or an SiN film. This kind of film may be disposed inside of the Al film as far as it is capable of allowing Al and Si to pass therethrough. For example, when a thin W film is formed inside of the Al film, Al and Si would pass through the grain boundaries of W, thereby allowing the substitution reaction to take place between Al and Si. At the same time, the absorption of Si by the Ti film would proceed. Accordingly, the W in the Al film would not obstruct the substitution reaction between Al and Si, but act to alleviate the stress on the Al film filled in the wiring groove or contact hole.

EXAMPLE 34

First of all, a first wiring layer 1 consisting of Al is formed on an Si substrate provided with an element. Then, an interlayer insulating film 3 is formed all over the upper surface of the substrate.

Then, the interlayer insulating film 3 is selectively etched by making use of photolithography and RIE to a depth reaching to the first wiring layer 1, thus forming a contact hole 4, and at the same time a wiring groove 5 is selectively formed likewise at a region including this contact hole 4. Namely, the contact hole 4 connected with the first wiring layer 1 and the wiring groove 5 are successively formed.

Then, a native oxide film formed on the upper surface of the first wiring layer 1 which has been exposed on the bottom of the contact hole 4 is removed by means of a surface treatment. Then, an Si film 7 is deposited all over the substrate by means of CVD method so as to fill the interiors of the contact hole 4 and the wiring groove 5 with the Si film 7. Then, any superfluous portion of the Si film 7 is selectively removed by means of the CMP method or CDE method so as to leave the Si film 7 in the interior of the contact hole 4.

Figure 39A:
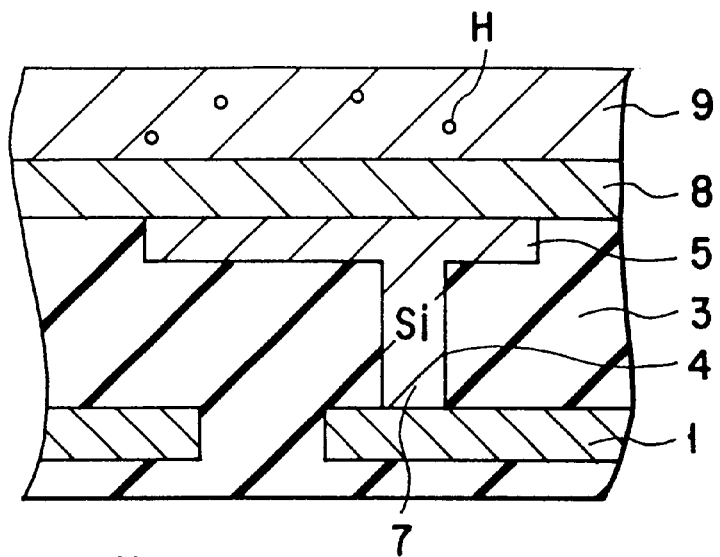
FIGS. 39A to 39C show respectively a cross-sectional view illustrating the manufacturing steps of the semiconductor device according to Example 34.

Then, after the native oxide film formed on the surface of the Si film 7 is removed, an Al film 8 is deposited all over the upper surface of the resultant substrate. Thereafter, the substrate is transferred without breaking vacuum to a chamber provided with a Ti target. Then, the sputtering of the Ti target is performed in a gaseous atmosphere comprising hydrogen and Ar which are mixed in a suitable ratio, thus forming on the Al film 8a film 9 containing Ti or a TiHx compound impregnated with a sufficient amount of hydrogen (FIG. 39A). This film 9 is formed under the condition which enables to obtain a film having a larger volume as compared with the ordinary Ti film that can be obtained through sputtering employing an Ar gas.

Figure 39B:
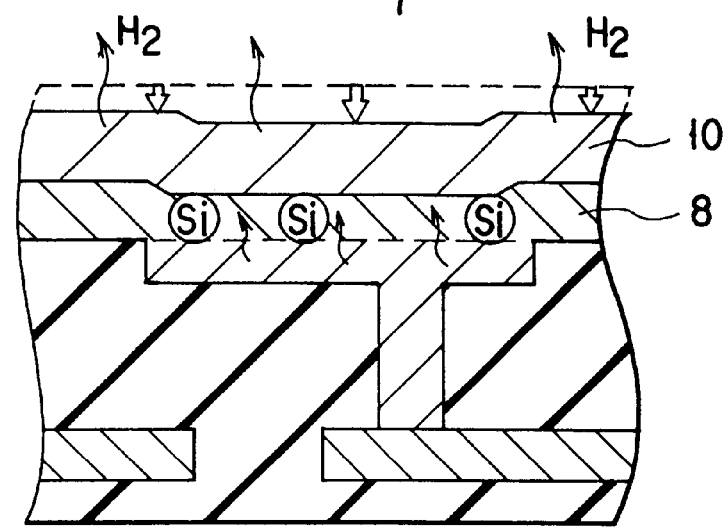

Thereafter, the substrate is heat-treated for two hours at a temperature of 450° C. in a furnace evacuated to a high vacuum level, whereby allowing the Si film to be substituted by the Al film, and at the same time allowing the Si film to reach the Ti or TiHx film impregnated with hydrogen thereby to form a Ti silicide. The hydrogen held in the Ti film is caused to be dispersed out of the Ti film during the heat treatment. While, the hydrogen held in the TiHx film is thermally decomposed at 450° C. or decomposed through a silicifying reaction and then dispersed. When hydrogen is dissociated in this manner, the volume of the absorption film is caused to shrink from the initial volume (FIG. 39B).

Figure 39C:
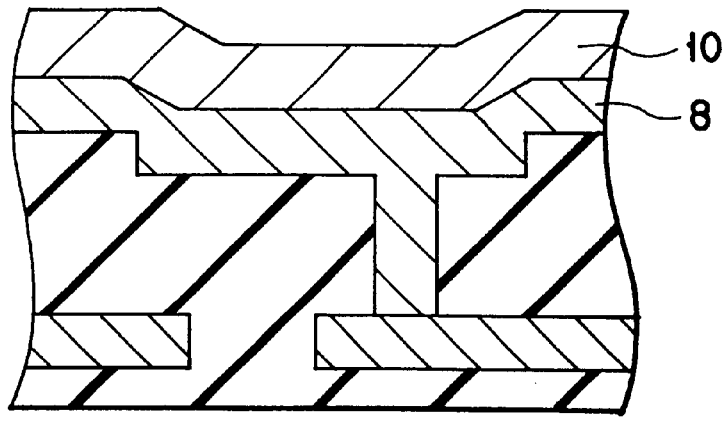

The dissociation/outward dispersion reaction of hydrogen does not cause a large change in volume of a silicide as compared with the case where the ordinary Ti film is turned into a silicide or into an AlTi compound through a silicidation reaction. Therefore, the stress to be imposed on the Al film due to an excessive voluminal change (due to the formation of a TiSi compound or an AlTi compound) of the film formed on the Al film can be alleviated, and at the same time the generation of void in the Al film can be inhibited, thus making it possible to obtain an Al wiring or an Al plug which are excellent in reliability (FIG. 39C).

EXAMPLE 35

FIGS. 40A to 40E show respectively a cross-sectional view illustrating in stepwise the method of forming an Al plug according to this example.

First of all, a first wiring layer 102 is formed on a substrate provided with an element. Then, an interlayer insulating film 103 is formed all over the upper surface of the substrate.

Figure 40A:
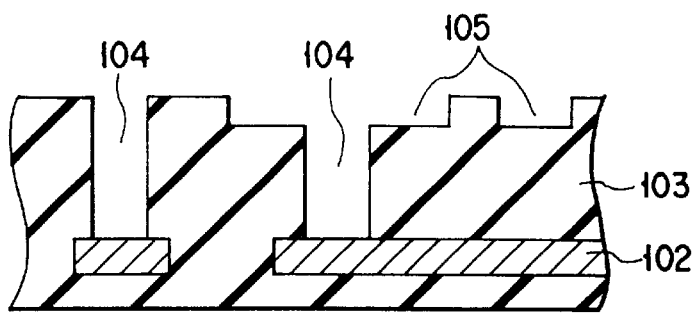
FIGS. 40A to 40E show respectively a cross-sectional view illustrating the method of forming a connecting plug and groove wiring according to Example 35.

Then, the interlayer insulating film 103 is selectively etched to form a contact hole 104 and a wiring groove 105 (FIG. 40A).

Then, an alloy film 106 consisting of a eutectic alloy (Al—Snx; x=about 86 at %) of Al and Si is formed by means of sputtering. The sputtering can be performed by making use of a eutectic alloy target consisting of Al and Sn the mixing thereof being adjusted to form a desired eutectic alloy film, or a mosaic-like target consisting of Al and Sn. In this case, an Al—Sn alloy is formed in advance in the contact hole and wiring groove by means of a sputtering method which is excellent in rectilinearity (i.e. in the direction perpendicular to the surface of substrate), for example, a long throw sputtering method wherein substrate is distanced apart from a target (TS distance).

Figure 40B:
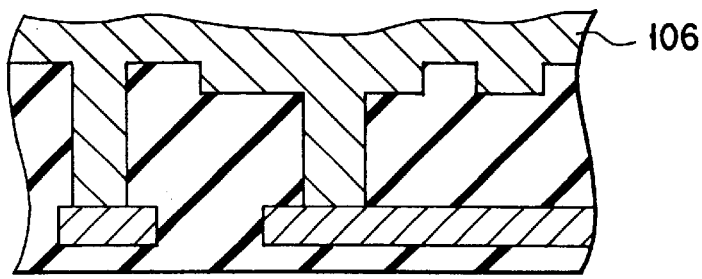

It is possible in this case to heat the substrate up to a temperature to turn the Al—Sn film into a liquid phase, thereby uniformly filling the contact hole and wiring groove with the Al—Sn film. The thickness of the Al—Sn film should sufficient enough to enable the Al in the Al—Sn film to be sufficiently filled in the contact hole and wiring groove (FIG. 40B).

Then, the substrate is heated to a temperature of 420° C. or more (in the case of this alloy composition) but lower than a desired process temperature to obtain a liquid phase of the Al—Sn alloy. The term, "a desired process temperature" herein means a temperature which does not exceed over the highest temperature to be employed in the formation of a multi-layer wiring as well as in the sintering of an Al wiring.

Figure 40C:
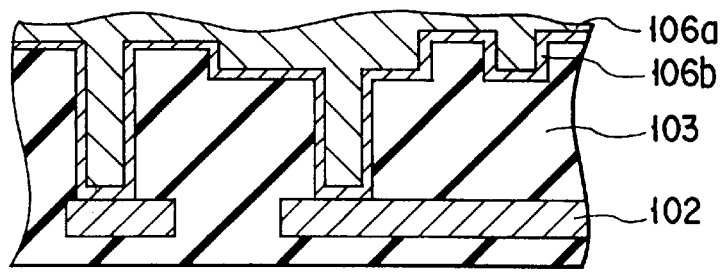

After the Al—Sn film deposited in advance is turned into a liquid phase 106a and kept stand for a while to make it equilibrated, the liquid phase is cooled down to sufficiently lower than 420° C. (a temperature which enable to obtain a liquid phase according the equilibrium phase diagram of the composition where Sn content is 86 at %), i.e. 350° C. As a result, since the liquid phase of Al—Snx alloy (x=about 86 at %) is cooled down to 350° C. (where an equilibrium of the Al—Snx alloy is x=about 92.3 at %), an excessive portion of Al (about 8 at %) is allowed to precipitate on the insulating film including the contact hole and the wiring groove (FIG. 40C).

Figure 40D:
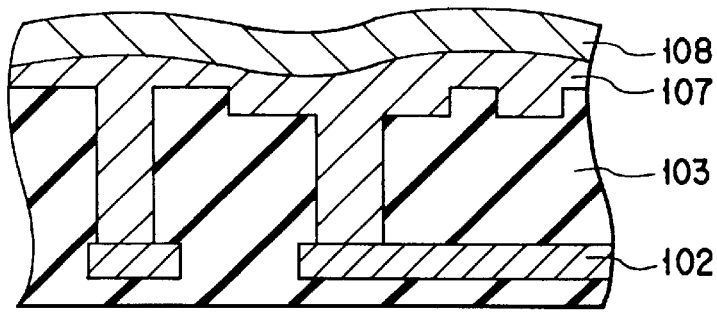

Namely, the contact hole and the wiring groove are filled with the eutectic Al film 106b (FIG. 40D). This eutectic Al film is a film mainly consisting of Al and containing Sn in an amount which corresponds to less than the maximum concentration wherein the Sn of liquid phase can be equilibrated with the Al precipitated when the liquid phase of the Al—Sn film is formed in the contact hole and wiring groove. The temperature at the step of precipitating the Al may be a temperature region which enable the two-phase (solid phase/liquid phase) co-existing region to be kept in an equilibrium condition. Therefore, in the case of the aforementioned Al—Sn alloy, the temperature is more than 228° C. which is a eutectic line in the equilibrium diagram and less than 420° C. which is a liquid phase line.

The step of precipitating Al can be performed not only by shifting the equilibrium concentration through cooling, but also by selectively reducing the concentration of Sn. The main point of the step of precipitating Al, which is to used as a conductive film, is to shift the equilibrium concentration, whereby allowing the conductive film to be precipitated. A combination of Al and Sn is the one which enables a eutectic to be formed, so that these metals do not form a compound in the equilibrium thereof, i.e. they are separated into two phases. Sn is a metal having a very low melting point as compared with Al and being incapable of forming a compound with Al, and hence when Sn is made into a eutectic together with Al, the melting point of the eutectic can be decreased lower than the process temperature to be generally employed in the manufacture of the LSI, thereby making it possible to easily obtain a liquid phase thereof.

By making use of a liquid phase excellent in fluidity, not only the filling of a fine pattern or of a contact hole of high aspect ratio can be facilitated, but also the process temperature for filling a contact hole or wiring groove can be lowered. In the foregoing explanation of this example, the interiors of the contact hole or wiring groove are directly filled with an Al—Sn film. However, a barrier film may be formed on the interiors of the contact hole or wiring groove in prior to filling them with the Al—Sn film thereby to improve the wettability of the contact hole or wiring groove to the Al—Sn film, thus making it possible to achieve an excellent step coverage of the Al—Sn film at the initial stage of forming the film thereof.

When the barrier film is formed prior to forming the Al—Si film, it may be formed in the concave portion, where Al is precipitated, as a barrier or precipitation seed. This barrier film can be easily formed by film forming method such as anisotropic sputtering or the like.

Then, the Sn layer that has been segregated over. the surface of substrate as well as the Al—Sn layer and Al layer which are left remained outside of the contact hole and the wiring groove are removed. This removing step is performed by introducing a gas containing chlorine ($Cl_2$) into the chamber thereby allowing the gas to flow over the surface of the substrate, thereby removing the Sn layer and an excessive Al—Sn layer in the form of chlorides. Since Sn chloride is high in vapor pressure, i.e. higher than that of Al chloride, the Sn can be selectively removed with a suitable selective ratio in relative to Al by suitably selecting the condition.

In this case, if the substrate is heated, the chlorides can be more effectively removed. The removal of the chlorides making use of gas flow containing $Cl_2$ can be performed with the RIE etch-back method or in the CDE etch-back method, thereby obtaining a higher effect. Furthermore, when an oxidizing gas is added to the gas flow in the etch-back process by means of the RIE or CDE, it is possible to improve the selectivity between Al and Sn, so that a plug or a wiring both consisting of an Al-precipitated film can be easily formed in a contact hole or in a wiring groove, respectively. Although a gas containing chlorine is employed for working a plug or a wiring in the foregoing explanation of this example, other kind of gas such as a gas containing Br, F or I may be employed to obtain almost the same effects.

Figure 40E:
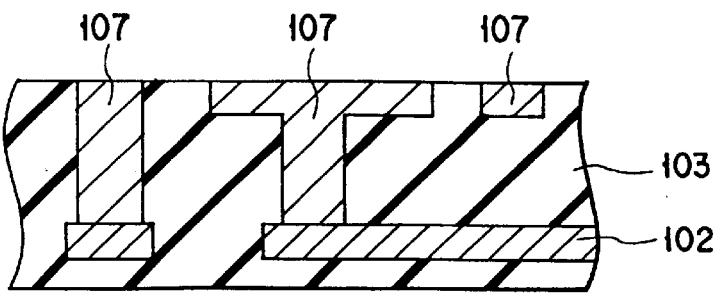

The Sn layer, the Al—Sn layer and the Al layer which are left remained outside of the contact hole and the wiring groove can be removed by means of a chemical mechanical polishing method (CMP) (FIG. 40E).

This example may be summarized by the following process flow.

(1) A step of forming an Al—Sn film in a recessed portion of pattern (contact hole or wiring groove);

(2) A step of forming a liquid phase of an Al—Sn film, or filling the contact hole with a liquid phase;

(3) A step of precipitating Al on the interface or on the bottom of contact hole through a shifting of equilibrium concentration (A step of precipitating Al from a two-phase mixture region comprising the liquid phase and solid phase of an Al—Sn eutectic alloy);

(4) A step of forming a plug consisting mainly of Al through a growth of an Al nucleus and layer with an Al precipitation nucleus formed in (3) being employed as a seed layer; and (5) A step of working the wiring and plug for leaving a material consisting mainly of Al in the contact hole and wiring groove.

In the foregoing explanation, a long throw sputtering method which is one of the PVD methods excellent in rectilinearity of sputtering particles is employed as a method for filling in advance an Al—Sn alloy in the contact hole and wiring groove. However, it is possible to employ other method. For example, it is possible to employ an anisotropic sputtering method such as a collimation sputtering method wherein a collimator is interposed at an intermediate portion of TS distance whereby to allow the sputtering particle components other than the component exhibiting the perpendicular incidence to be adhered thereon; or a bias sputtering method employing an AC voltage or a high frequency voltage for applying it onto a substrate.

Furthermore, as far as it is possible to form an Al—Sn alloy film in the contact hole or wiring groove, the ordinary sputtering method can be employed. Moreover, the employment of ICB (Ion Cluster Beam) other than the sputtering is possible. The substrate may be heated in advance at the occasion of depositing an Al—Sn alloy film up to the liquid phase temperature of the alloy composition irrespective of the kinds of film to be deposited in the contact hole or wiring groove, i.e. the film may be an Al—Sn alloy film or a simple Sn film. Further, for the purpose of sustaining the liquid phase of alloy at least in the contact hole or wiring groove, the liquid phase may be obtained by heating it under pressure.

EXAMPLE 36

A process of forming a connector plug and a groove wiring according to this example will be explained with reference to the same FIGS. 41A to 41E.

Figure 41A:
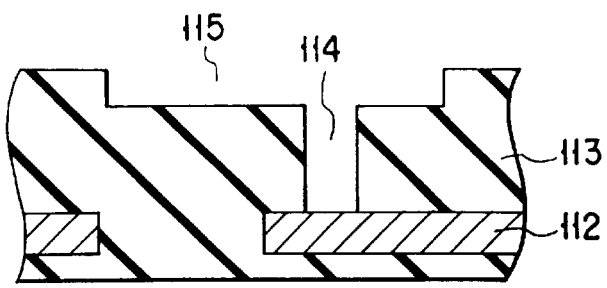
FIGS. 41A to 41E show respectively a cross-sectional view illustrating the method of forming a connecting plug and groove wiring according to Example 36.

As shown in FIG. 41A, first of all, a first wiring layer 112 is formed on a substrate (not shown) provided with an element. Then, an interlayer insulating film ($SiO_2$) 113 is formed over the first wiring layer 112.

Then, the interlayer insulating film 113 is selectively etched by making use of photolithography and RIE to form a contact hole (0.1 $\mu$m in diameter and 10 in aspect ratio) 114 and a wiring groove 115 (FIG. 41A).

Then, a Sn film is formed by means of sputtering. In this case, an Sn film 116 is formed in advance in the contact hole and wiring groove by means of a sputtering method which is excellent in rectilinearity, for example, a long throw sputtering method wherein substrate is distanced apart from a target (TS distance).

Figure 41B:
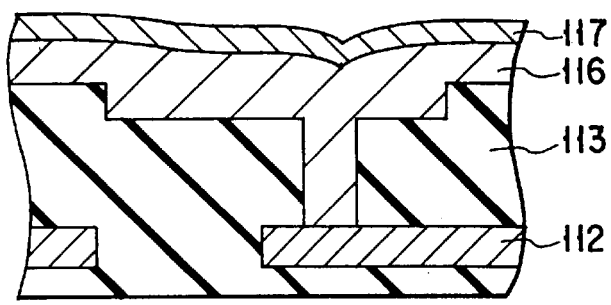

It is possible in this case to heat the substrate up to a temperature of about 232° C., thereby uniformly filling the contact hole and wiring groove with the Sn film. Then, an Al film 117 is deposited all over the substrate by means of sputtering without breaking vacuum thereby to form a laminate film comprising Sn and Al (FIG. 41B).

Then, the substrate is heated to a temperature of 420° C. or more but lower than a desired process temperature. The term, "a desired process temperature" herein means a temperature which does not exceed over the highest temperature to be employed in the formation of a multi-layer wiring as well as in the sintering of an Al wiring.

Figure 41C:
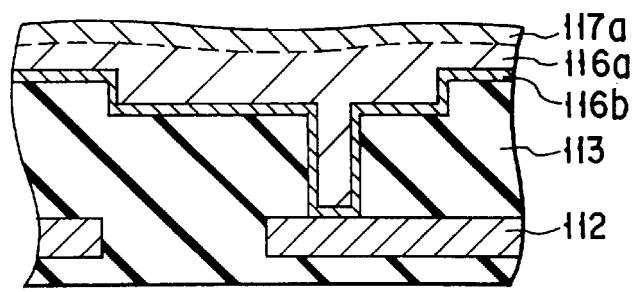

As a result of this heat treatment, the Sn liquid phase 16a deposited in advance and a liquid phase 117a of Al film near the Sn/Al interface are obtained, and at the same time, the Al is allowed to diffuse into the Sn liquid phase, whereby obtaining a liquid phase alloy of Al—Sn (FIG. 41C).

Figure 41D:
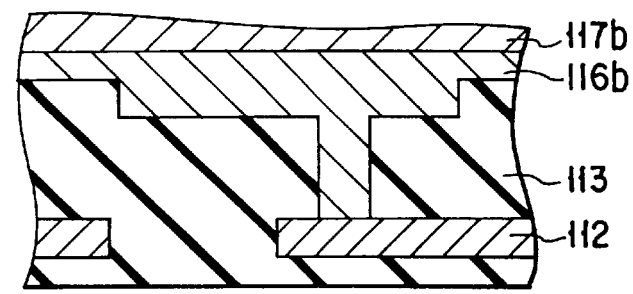

Then, the substrate is allowed to cool, and kept at a constant temperature of about 300° C., during which an excessive portion of Al in relative to the equilibrium concentration at this constant temperature is allowed to precipitate over the insulating film. The resultant precipitated Al nucleus 116b is then utilized as a seed layer for the liquid phase growth of Al, the Al thus precipitated being filled in the contact hole and the wiring groove (FIG. 41D). The process temperature for precipitating the Al in this case is a temperature region which enable the two-phase (solid phase/liquid phase) co-existing region to be kept in an equilibrium condition, so that the temperature is more than 228° C. which is a eutectic line in the equilibrium diagram.

Then, the Sn layer thus segregated as well as the Al—Sn layer 117b and Al layer 116b which are left remained outside of the contact hole and the wiring groove are removed. This removing step is performed by introducing a gas containing chlorine, thereby allowing the gas to flow over the surface of the substrate (if desired, by concurrently heating the substrate), thereby removing these layers in the form of chlorides. The removal of the chlorides making use of gas flow containing $Cl_2$ can be performed with the RIE etch-back method or in the CDE etch-back method, thereby obtaining a higher effect.

Figure 41E:
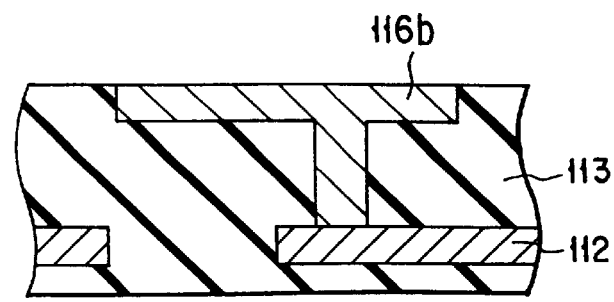

It is also possible to remove the Sn layer, the Al—Sn layer and Al layer which are left remained outside of the contact hole and the wiring groove by means of the CMP. As a result, the plug and wiring 116b, both formed of the precipitated Al film, can be formed in the contact hole and wiring groove, respectively (FIG. 41E).

During the formation of the connector plug or groove wiring in this example, the diffusion of Al into the liquid phase Sn film which corresponds in quantity to that can be existed in the two-phase (solid phase/liquid phase) co-existing eutectic region is taken place. Accordingly, when the Al—Sn liquid phase alloy formed through this diffusion is cooled and kept at a constant temperature, the superfluous portion of Al which has been exuded from the equilibrium composition is allowed to precipitate in the liquid phase alloy. By allowing Al to be precipitated from the surface of the insulating film or from the contact hole, the formation of the plug can be achieved.

When the substrate is to be moved after finishing the step of forming the Sn film and Al film to the step of heat treatment for melting these films, this heat treatment can be performed by transferring it to a vacuum chamber or in the same chamber where the formation of the Sn film and Al film has been performed.

A film rich in Sn component in the Sn—Al film may be employed in place of the Sn film to be employed at the beginning. Other kinds of film which can be turned into a liquid phase at a suitable process temperature can be also employed.

EXAMPLE 37

A process of forming a connector plug and a groove wiring according to this example will be explained with reference to the same FIGS. 42A to 42E.

Figure 42A:
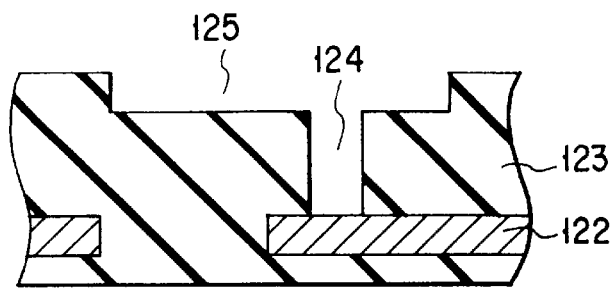
FIGS. 42A to 42E show respectively a cross-sectional view illustrating the method of forming a connecting plug and groove wiring according to Example 38.

As shown in FIG. 42A, first of all, a first wiring layer 122 is formed on a substrate (not shown) provided with an element. Then, an interlayer insulating film 123 is formed over the first wiring layer 122.

Then, the interlayer insulating film 123 is selectively etched to form a contact hole (0.1 $\mu$m in diameter and 10 in aspect ratio) 124 and a wiring groove 125 (FIG. 42A).

Figure 42B:
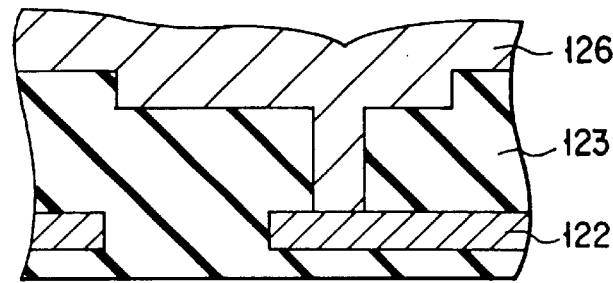

Then, a Sn film is formed all over the substrate by means of sputtering. In this case, an Sn film 126 is formed in advance in the contact hole 124 and wiring groove 125 by means of a sputtering method which is excellent in rectilinearity (FIG. 42B). It is possible in this case to heat the substrate so as to uniformly fill the contact hole 124 and wiring groove 125 with the Sn film.

Figure 42C:
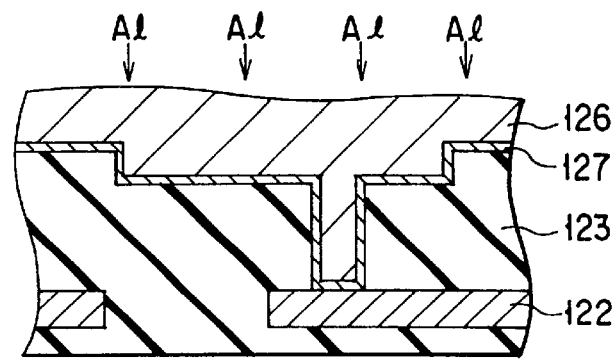

Then, the substrate is transferred to a separate chamber for performing a heat treatment and a film formation through sputtering without breaking vacuum. The film formation may be performed by any other method other than sputtering. Then, the substrate is heated to a temperature of about 300° C. and then kept at this temperature thereby turning the Sn film deposited in advance into a liquid phase. Under this condition, Al is fed through sputtering (FIG. 42C). As a result, an excessive portion of Al which is excluded from the equilibrium composition in the two-phase (liquid/solid phase) co-existing region of Al—Sn at 300° C. is caused to diffuse into the Sn film.

Figure 42D:
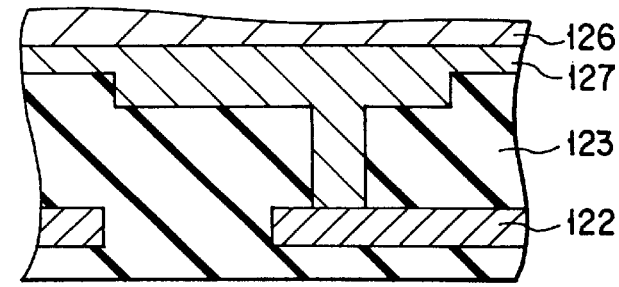

As a result, an excessive portion of Al in. relative to the equilibrium concentration at this constant temperature is allowed to precipitate over the insulating film. The resultant precipitated Al nucleus 127 is then utilized as a seed layer for the liquid phase growth of Al, the Al film 128 thus precipitated being filled in the contact hole 154 and the wiring groove 155 (FIG. 42D).

Figure 42E:
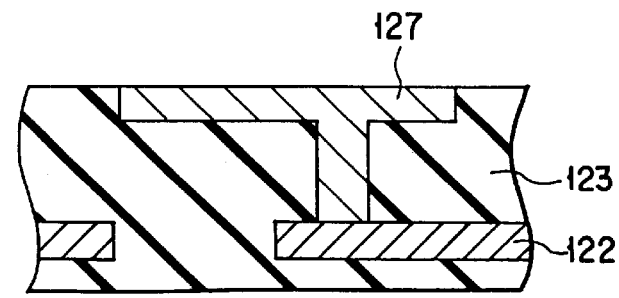

Then, the Sn layer, the Al—Sn layer and Al layer which are segregated outside of the contact hole and the wiring groove are removed, thereby. forming a plug and a wiring 128, both formed mainly of Al, only in the contact hole and wiring groove, respectively (FIG. 42E).

From the equilibrium composition is allowed to precipitate in the liquid phase alloy. By allowing Al to be precipitated from the surface of the insulating film or from the contact hole, the formation of the plug can be achieved.

A film rich in Sn component in the Sn—Al film may be employed in place of the Sn film to be employed at the beginning. Other kinds of film which can be turned into a liquid phase at a suitable process temperature can be also employed.

The precipitation of Al may be performed by cooling the liquid phase during or after the precipitation process of Al from the liquid phase Sn film or from the liquid phase Al—Sn film, which is performed while feeding Al. Further, this precipitation method of Al through cooling may be performed by cooling step-wise the liquid phase while feeding Al.

EXAMPLE 38

A process of forming a connector plug and a groove wiring according to this example will be explained with reference to the same FIGS. 43A to 43E.

First of all, a first wiring layer 132 is formed on a substrate (not shown) provided with an element. Then, an interlayer insulating film 133 is formed over the first wiring layer 132.

Figure 43A:
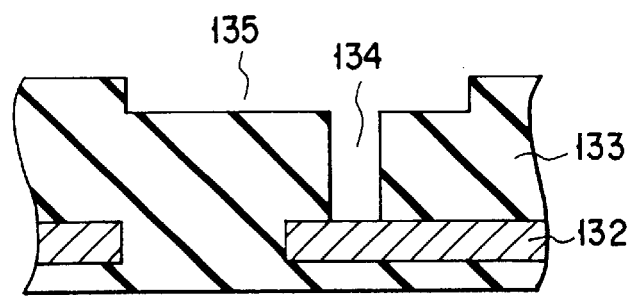
FIGS. 43A to 43E show respectively a cross-sectional view illustrating the method of forming a connecting plug and groove wiring according to Example 39.

Then, the interlayer insulating film 133 is selectively etched by making use of photolithography and the RIE to form a contact hole 134 and a wiring groove 135 (FIG. 43A).

Figure 43B:
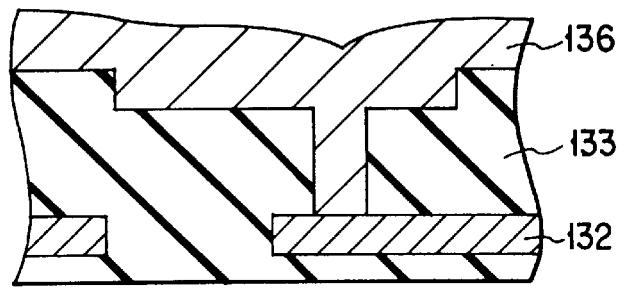

Then, a native oxide film formed on the upper surface of the first wiring layer 132 which has been exposed on the bottom of the contact hole 134 is removed by means of a surface treatment. Then, an Sn film 136 is filled in the contact hole 134 and in the wiring groove 135 (FIG. 43B).

Figure 43C:
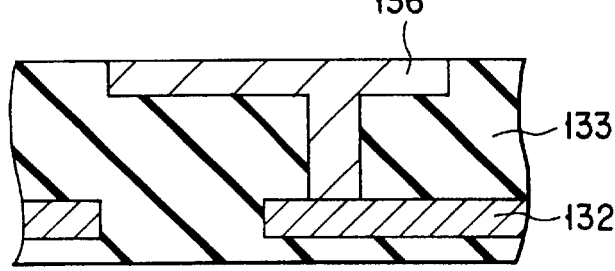

The Sn deposited outside the contact hole 134 and the wiring groove 135 is removed by means of the RIE, CDE or CMP (FIG. 43C).

After the native oxide film deposited on the surface of the Sn film 136 is removed, an Al film 137 is deposited by means of sputtering without breaking vacuum. The removal of the native oxide film on the Sn film 136 can be performed by means of a reverse sputtering, or by exposing the native oxide film to a flow of reductive gas such as $H_2$ or $SiH_4$ while heating the substrate.

If a native oxide film is existed at the Sn/Al interface, the diffusion of Al into the Sn liquid phase may be obstructed. Further, if a native oxide film is existed at the Sn/Al interface, a void may be caused to generate at the interface between a solid phase Al film and the Sn film when the volume of the Sn film is changed as it is turned into a liquid phase. For the purpose of avoiding this phenomenon, the removal of the native oxide film is required at the occasion of depositing an Al film on the Sn film.

Figure 43D:
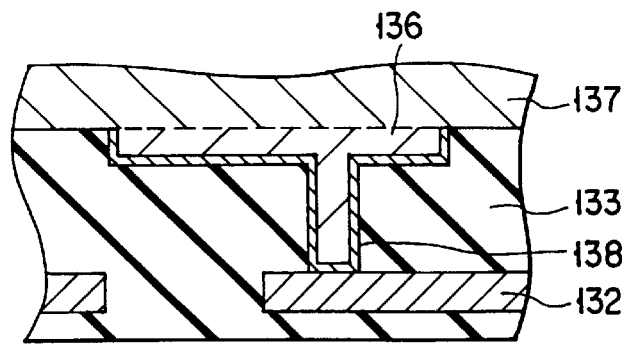

When the substrate is heated up to a temperature which enables the Sn film to turn into a liquid phase, e.g. 450 ° C., the Al diffuses into the liquid phase Sn film and at the same time Sn is caused to diffuse into the Al film disposed on the Sn film, thus forming an Al—Sn liquid phase in the contact hole 134 and the wiring groove 135 (FIG. 43D).

Figure 43E:
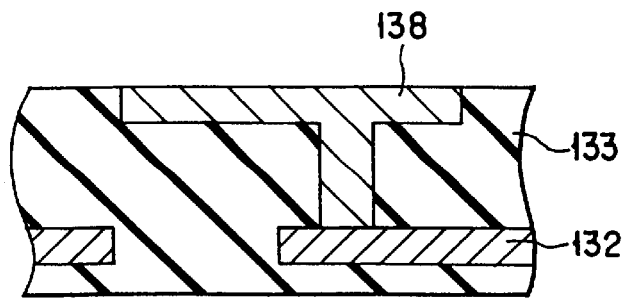
Figure 44A:
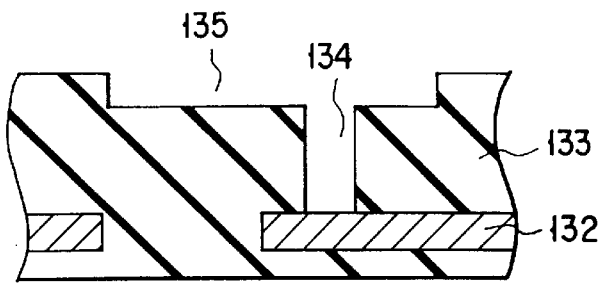
FIGS. 44A to 44E show respectively a cross-sectional view illustrating the method of forming a connecting plug and groove wiring according to a modified embodiment of Example 39.
Figure 44B:
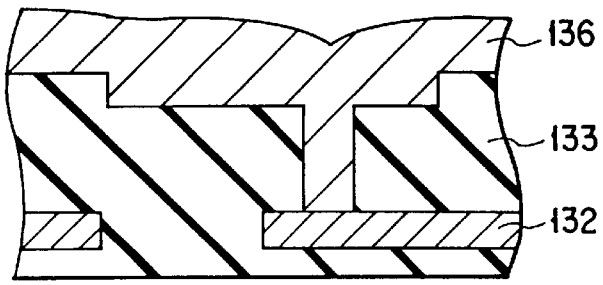
Figure 44C:
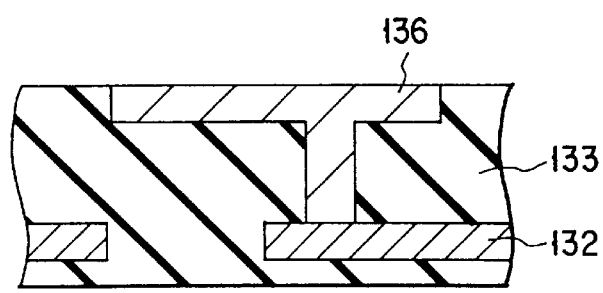
Figure 44D:
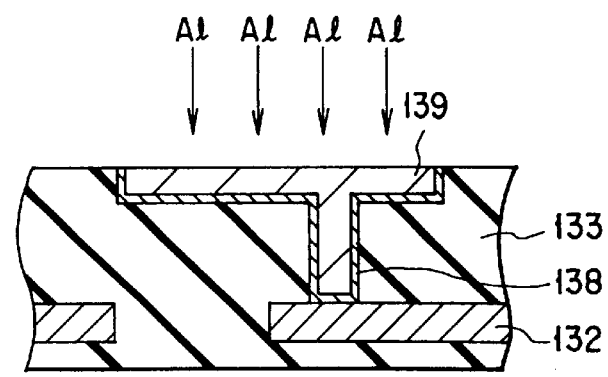
Figure 44E:
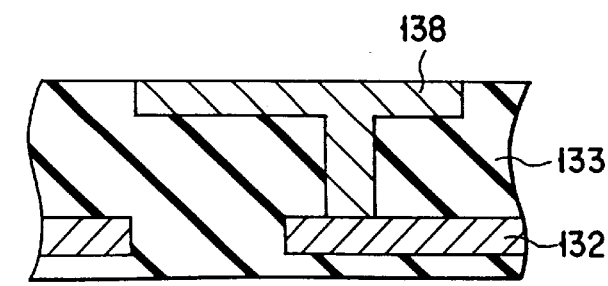

Then, the Sn film, Al film and the Al—Sn layer and Al layer which are segregated outside of the contact hole 134 and the wiring groove 135 are removed by means of the RIE etch-back or CMP, thereby forming a plug and a wiring 138 (FIG. 43E).

It is also possible as shown in FIGS. 44A to 44E to fill the contact hole and the wiring groove with Sn and then to feed Al by sputtering Al while heating the substrate and maintaining the liquid phase of Sn 139.

Subsequently, the temperature of the chamber may be cooled, thereby performing the precipitation of Al in the contact hole and the wiring groove. The precipitation of Al may be performed by cooling the liquid phase during or after the precipitation process of Al from the liquid phase Sn film or from the liquid phase Al—Sn film, which is performed while feeding Al. Further, this precipitation method of Al through cooling may be performed by cooling step-wise the liquid phase while feeding Al.

Although the contact hole and the wiring groove are filled with Sn in the above explanation of this example, an Sn—Al film may be substituted for the Sn.

EXAMPLE 39

A process of forming a connector plug and a groove wiring according to this example will be explained with reference to the same FIGS. 45A to 45E.

First of all, a first wiring layer 142 is formed on a Si substrate 141 provided with an element (not shown). Then, an interlayer insulating film 143 is formed over the first wiring layer 142.

Then, the interlayer insulating film 143 is selectively etched by making use of photolithography. and the RIE to form a contact hole connecting with the first wiring layer 142 and a wiring groove.

Figure 45A:
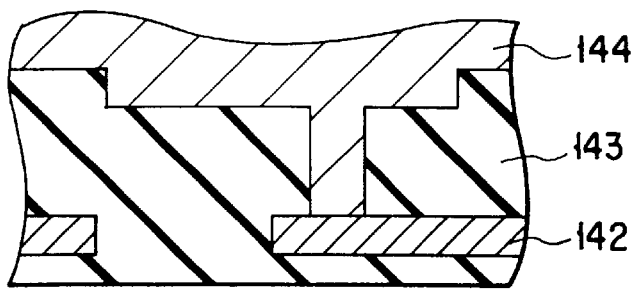
FIGS. 45A to 45E show respectively a cross-sectional view illustrating the method of forming a connecting plug and groove wiring according to Example 40.

Then, a native oxide film formed on the upper surface of the first wiring layer 142 which has been exposed on the bottom of the contact hole is removed by means of a surface treatment such as a reverse sputtering. Then, an alloy film 144 consisting of Al—Snx (x=81.6 at % for instance) is filled in the contact hole and in the wiring groove (FIG. 45A).

Figure 45B:
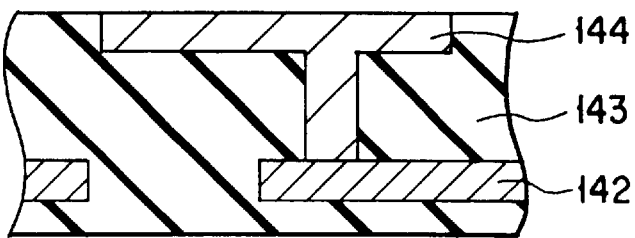

The Sn deposited outside the contact hole and the wiring groove is removed by means of the RIE, CDE or CMP (FIG. 45B).

Figure 45C:
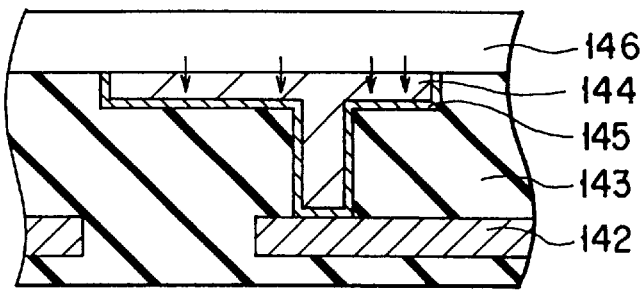

After the native oxide film deposited on the surface of the Al—Sn eutectic alloy film is removed, the substrate is heated up to a temperature which enables the Al—Sn eutectic alloy film to turn into a liquid phase, e.g. 450° C., the temperature is decreased thereby allowing the Al 145 to precipitate in the contact hole and the wiring groove. Then, an Al film 146 is deposited by means of sputtering (FIG. 45C).

Figure 45D:
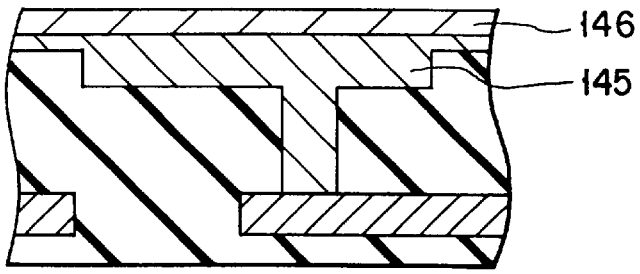

When this laminate film is heated to a temperature (450° C. for instance) which is lower than the temperature which has previously permitted Al to be precipitated from the liquid phase of Al—Sn film, the Al in the upper Al film is caused to diffuse into the liquid phase Sn—Al. As a result, a portion of Al which has been excluded from the equilibrium concentration at 400° C. due to a feeding of Al to the liquid phase Sn—Al (which has been previously filled in the contact hole and wiring groove) is caused to precipitate on the Al layer 145 that has been precipitated in advance in the contact hole and wiring groove. As a result, the contact hole and wiring groove is filled with the precipitated Al film 145 (FIG. 45D). The Al may be fed by means of sputtering while maintaining the Sn—Al alloy in a liquid phase in the contact hole and wiring groove.

The precipitation of Al may be performed by cooling the liquid phase during or after the precipitation process of Al from the liquid phase Sn film or from the liquid phase Al—Sn film, which is performed while feeding Al. Further, this precipitation method of Al through cooling may be performed by cooling step-wise the liquid phase while feeding Al.

Figure 45E:
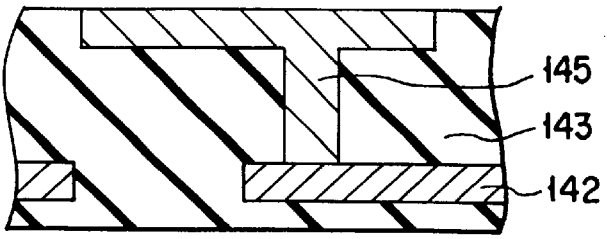

Then, the precipitated Sn film and the conductive Al film which are segregated outside of the contact hole and the wiring groove are removed by means of the RIE etch-back or CMP, thereby forming a plug and a wiring 145 (FIG. 45E).

According to this invention, since an amount of Sn expelled from the contact hole and the wiring groove can be decreased, an amount of Sn compound to be finally removed can be decreased. Accordingly, the material remained outside the contact hole and the wiring groove can be easily removed.

EXAMPLE 40

A process of forming a connector plug and a groove wiring according to this example will be explained with reference to the same FIGS. 40A to 40E.

By means of various methods, at least interiors of the contact hole and the wiring groove are filled with a liquid phase alloy 106 consisting of an Al—Sn alloy (FIG. 40B). Then, under the condition which enables a sufficient etching ratio to be achieved between Al and Sn, the surface of the Al—Sn film is exposed under a heated condition to a gas flow containing $Cl_2$ gas, or to the plasma of radical of $Cl_2$ gas thereby to remove only Sn. Through this process, the concentration of Sn in the fused AlSn alloy is decreased, thereby producing a change in equilibrium concentration and hence causing Al to precipitate. This method may be combined with the process of lowering the temperature of the liquid phase, thereby removing the Sn in the form of chlorides, thus concentrating the Al—Sn liquid phase alloy.

Thereafter, in the same manner as mentioned above, the superfluous Sn film and Al—Sn alloy which are deposited outside of the contact hole and the wiring groove are removed, thereby forming an Al precipitation film in the contact hole and the wiring groove.

In this case, when the native oxide on the Al—Sn film is removed by heat-treating it in a hydrogen atmosphere or in a reductive atmosphere, or by subjecting it to a sputtering before exposing it to the $Cl_2$ flow, the Al—Sn film can be more effectively removed.

EXAMPLE 41

A process of forming a connector plug and a groove wiring according to this example will be explained with reference to the same FIGS. 46A to 46G.

First of all, a first wiring layer 152 is formed on a Si substrate 151 provided with an element (not shown). Then, an interlayer insulating film 153 is formed over the first wiring layer 152.

Figure 46A:
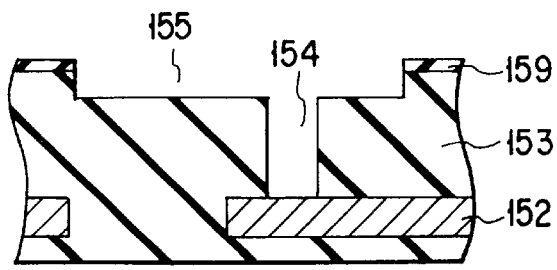
FIGS. 46A to 46G show respectively a cross-sectional view illustrating the method of forming a connecting plug and groove wiring according to Example 42.

After a TiN film 159 is formed on the interlayer insulating film 153, the interlayer insulating film 153 is selectively etched by making use of photolithography and the RIE to form a contact hole 154 connecting with the first wiring layer 152 and a wiring groove 155 (FIG. 46A).

Then, a native oxide film formed on the upper surface of the first wiring layer 152 which has been exposed on the bottom of the contact hole 154 is removed by means of a surface treatment such as a reverse sputtering. Then, an Sn film 156 is filled in the contact hole 154 and in the wiring groove 155. The Sn deposited outside the contact hole and the wiring groove is removed by means of the RIE, CDE or CMP (FIG. 46B).

Figure 46E:
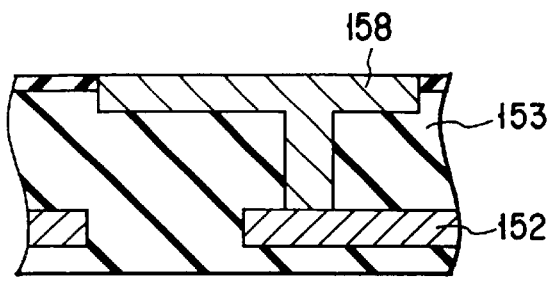
Figure 46B:
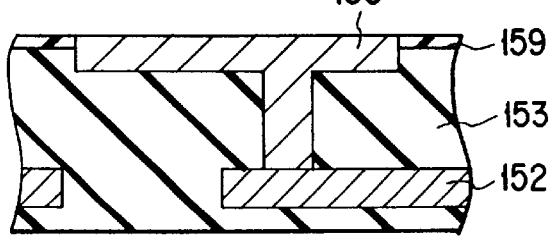
Figure 46F:
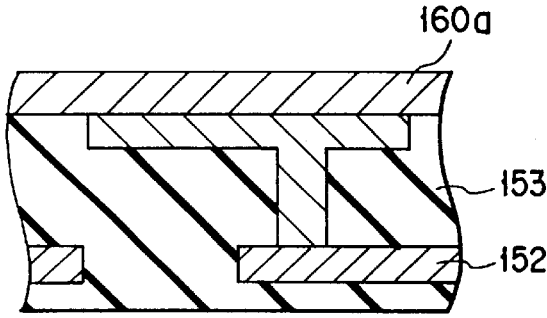
Figure 46C:
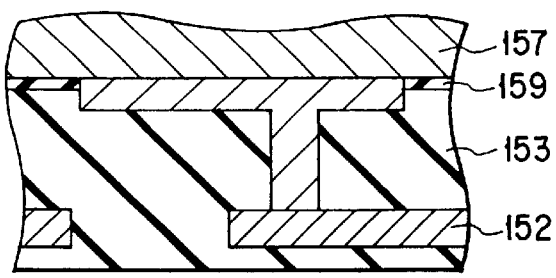
Figure 46G:
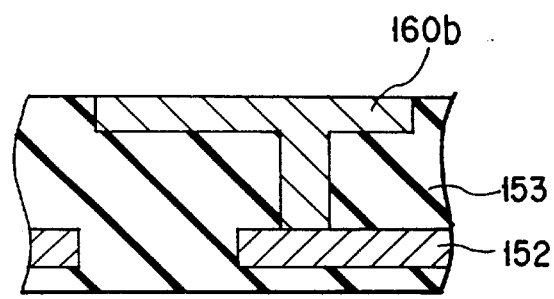
Figure 46D:
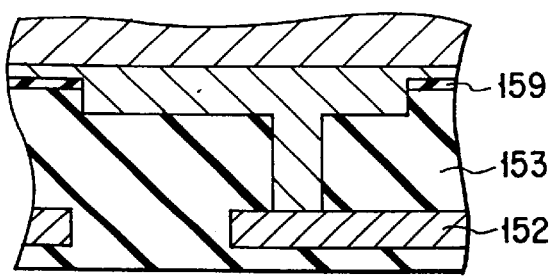

After the native oxide film deposited on the surface of the Sn film is removed, an Al film 157 which is free from impurities is deposited thereon without breaking vacuum (FIG. 46C). Then, the substrate is heated up to a temperature which enables the Sn film to turn into a liquid phase, e.g. 450° C., thereby allowing the Al to diffuse into the liquid phase Sn film, and at the same time, allowing Sn to diffuse into the Al film disposed thereover, thus filling the contact hole 154 and the wiring groove 155 with an Al layer 158 (FIG. 46D).

Then, the segregated Sn film and the conductive Al film which are segregated outside of the contact hole 154 and the wiring groove 155 are removed by means of the RIE etch-back or CMP (FIG. 46E).

Then, a Cu film 160 a is deposited all over the substrate and heat-treated for 30 minutes at a temperature of 300° C, for instance, thereby adding Cu into the Al wiring (FIG. 45F). Then, the Cu film and TiN film deposited outside of the contact hole 154 and the wiring groove 155 are removed by means of the RIE etch-back or CMP, thereby forming a connector plug and groove wiring 160 b (FIG. 46G).

The Cu added to the Al film is an additive element for improving the electromigration resistance as well as the stress migration resistance. Accordingly, Cu is generally added in advance to the Al wiring in the LSI. However, Cu reacts with Sn to form a stable compound. Therefore, when a liquid phase Sn is kept in the contact hole and wiring groove, and at the same time, Al is allowed to diffuse into the liquid phase Sn whereby to cause the Al to precipitate in the contact hole and wiring groove, Cu which has been included in the Cu-containing film employed for feeding Al reacts with Sn in the precipitated Al. As a result, the two-layer separation between Al and Sn may become difficult, resulting in the formation of a highly resistive film containing a large amount of Sn.

Therefore, the Al to be fed employed in this example is free from impurities, and after Al is allowed to precipitate from the liquid phase Al—Sn film into the contact hole and wiring groove, the addition of Cu into the wiring is performed so as to improve the reliability of the wiring. Therefore, it is possible to form a connector plug and groove wiring which are low in resistance and excellent in reliability.

EXAMPLE 42

In the above example, the contact hole and wiring groove are initially filled with an Al—Sn film or an Sn film by making use of only the sputtering method, and then these films are heated to obtain a liquid phase thereof. However, according to this example, the aforementioned liquid phase filling step is performed in a different manner wherein the heat treatment under pressure is performed while applying a uniaxial stress.

An example of applying a uniaxial stress will be explained below with reference to FIGS. 47A to 47C.

After a lower structure of element and a lower wiring are formed on an Si substrate 161, an insulating films 162a and 162b are formed on both surfaces thereof. A contact hole and a wiring groove are formed on one insulating film 162a. The reason for forming an insulating film on the bottom surface of the Si substrate 161 is to prevent the Sn from diffusing toward the substrate side in a subsequent step. Therefore, other kind of film can be employed as far as it is capable of functioning as a barrier film.

Figure 47A:
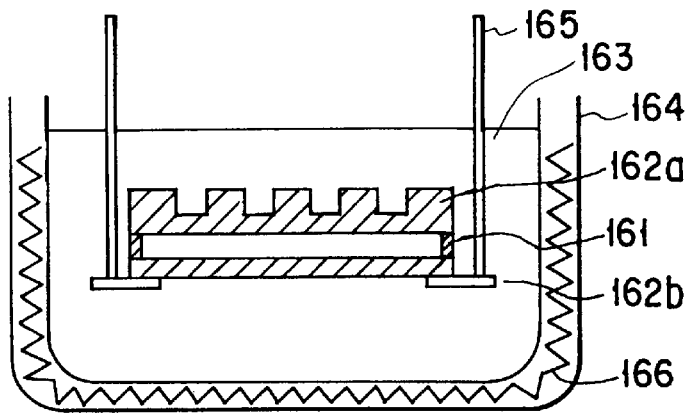
FIGS. 47A to 47C show respectively a cross-sectional view illustrating the steps of applying a uniaxial stress according to Example 40.
Figure 47B:
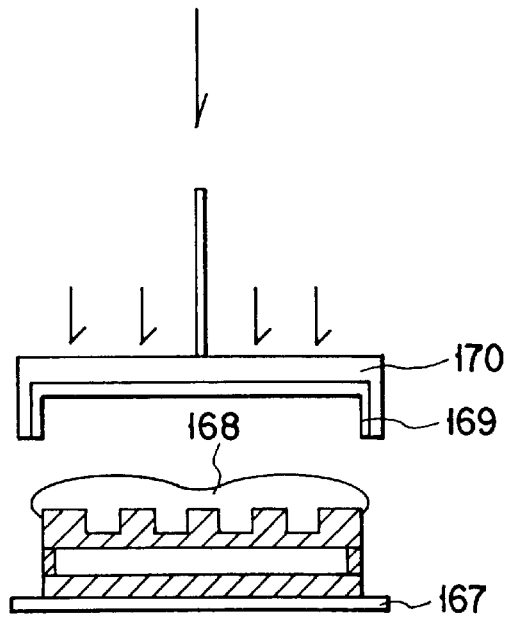

Then, as shown in FIG. 47A, the substrate 161 is mounted on a wafer table 165 in such a manner that the substrate 161 is immersed in a fused Al—Sn alloy or an Sn bath 163 placed in a crucible 164. In FIG. 47A, the number 166 denotes a heater. Then, the Si substrate 161 is taken up from the bath 163 and mounted on a wafer table 167 provided with a heating means and a cooling means as shown in FIG. 47B. At this moment, an Al—Sn alloy film 168 is formed on the insulating film 162a of the substrate 161. A heater 170 provided with a susceptor 169 having the same diameter as that of the substrate 161 and made of quartz is disposed to face the Al—Sn alloy film 168 of the substrate 161.

Figure 47C:
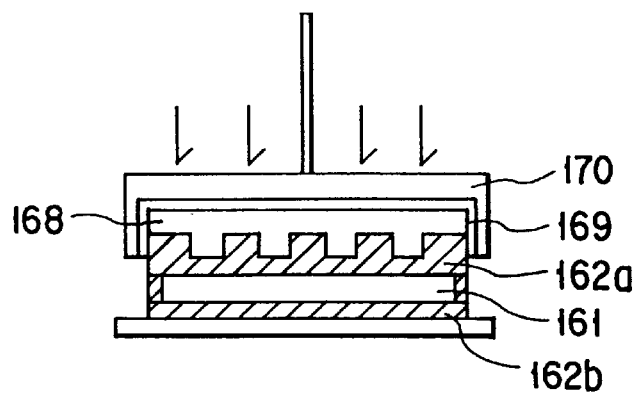

Then, as shown in FIG. 47C, the heater 170 is moved downward so as to closely press-contact with the substrate 161 and then heaters on both sides of the substrate, i.e. a heater 170 and a heater of the wafer table 167, or only the heater 170 is heated so as to obtain a fused Al—Sn alloy or a fused Sn. Due to this, Al—Sn alloy or Sn can be filled in the contact hole and the wiring groove with excellent filling efficiency. Thereafter, the upper and lower heaters or only the heater of the wafer table 167 is cooled to allow Al to precipitate.

Subsequently, the heater of the wafer table 167 is cooled to form a eutectic Al plug, and then the Al—Sn alloy film or the Sn film deposited outside the contact hole and wiring groove is removed in the same manner as mentioned above by making use of a gas flow containing $Cl_2$ gas, the RIE or CDE etch-back method, or the CMP. The barrier film formed on the bottom surface of the substrate is removed by abrasion or by a wet etching after the step of forming the wiring or in the subsequent steps.

EXAMPLE 43

A method of liquid phase filling by means of a uniaxial stress will be explained below with reference to FIGS. 48A to 48D.

Figure 48A:
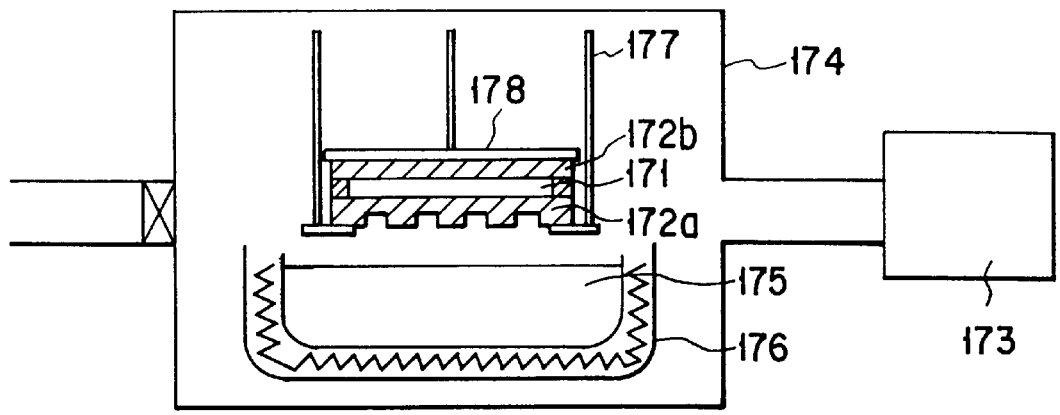
FIGS. 48A to 48D show respectively a cross-sectional view illustrating the steps of a liquid phase filling method employing a uniaxial stress according to Example 44.

As shown in FIG. 48A, an apparatus comprising a chamber 174 provided with an exhauster 173 and housing a crucible 176 filled with an Al—Sn alloy or an Sn bath 175 has been employed. The holding of a wafer is performed by a wafer supporting plate 177 and by a cooling mechanism 178 which is adapted to cool the bottom surface of substrate. Through this mechanism, the substrate is allowed to be move upward or downward, or to be placed into or taken out of the crucible 176.

First of all, an Si substrate 171 is introduced into this apparatus, and mounted on the wafer supporting plate 177. The Si substrate 171 is processed in advance so that it is formed with a lower structure of element and a lower wiring, and also with an insulating films 172a and 172b, a contact hole and a wiring groove being formed on the insulating film 172a. The reason for forming an insulating film on the bottom surface of the Si substrate 171 is to prevent the Sn from diffusing toward the substrate side in a subsequent step. Therefore, other kind of film can be employed as far as it is capable of functioning as a barrier film.

Figure 48B:
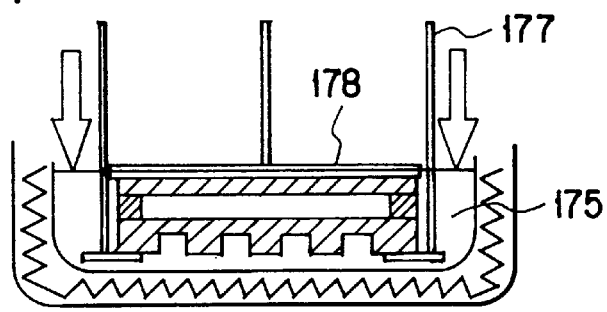
Figure 48C:
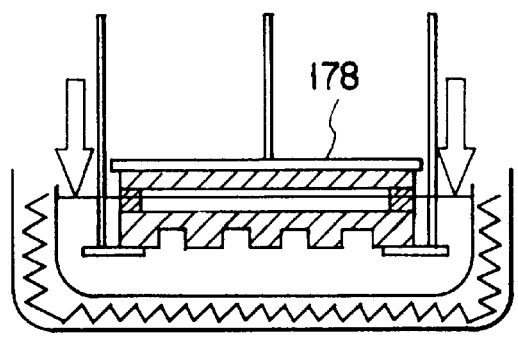
Figure 48D:
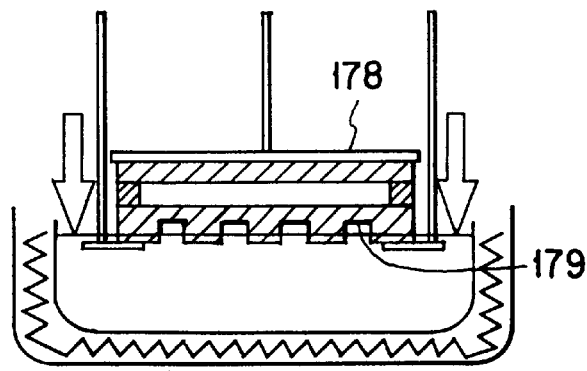

After the chamber 174 is sufficiently evacuated, the wafer supporting plate 177 and the cooling mechanism 178 are moved down into the crucible 176 filled with an Al—Sn alloy or an Sn bath 175, thereby entirely dipping the contact hole and wiring groove in the Sn bath 175. Under this condition, an inert gas Ar or $N_2$ is introduced into the chamber 174 and the inner atmosphere of the chamber 174 is pressurized higher than the air atmosphere, thereby applying a uniaxial stress on the surface of the bath 175 as shown in FIG. 48B.

As a result, even a fine pattern can be filled with the fused Al—Sn alloy or Sn. Under this pressurized condition, the substrate 171 is gradually pulled up during which the substrate 171 is cooled by the cooling mechanism 178. As a result, the contact hole and the wiring groove are filled with an precipitated Al film 179.

Thereafter, the Al—Sn alloy film or the Sn film deposited outside the contact hole and wiring groove is removed in the same manner as explained in the above example by making use of a gas flow containing $Cl_2$ gas, the RIE or CDE etch-back method, or the CMP. The barrier film formed on the bottom surface of the substrate is removed by abrasion or by a wet etching after the step of forming the wiring or in the subsequent steps.

According to this method, the liquid phase of Al—Sn film can be held in the contact hole and wiring groove in a more stable manner at the heating step as compared with the method where the filling of the Al—Sn film is performed by means of sputtering. As a result, the contact hole and the wiring groove can be suitably filled with an precipitated Al film 179.

The procedures of Examples 43 and 44 which are illustrated in FIGS. 47A to 47D are not confined to the embodiment illustrated above, but may be combined with other methods. For example, after Sn is filled according to the method shown in FIG. 16, the Al which has been deposited in the quartz susceptor 169 shown FIG. 47B may be contacted with the Sn which has been filled in the contact hole and wiring groove, and then the application of stress and heating can be performed thereby to allow the Al to precipitate.

EXAMPLE 44

In addition to the methods illustrated in Examples 43 and 44 for applying a uniaxial stress, the method for stably filling the Al—Sn alloy in a fine contact hole and wiring groove in the process of depositing the Al—Sn alloy or in the process of depositing the Al—Sn alloy film, followed by a heat treatment may be performed by taking advantage of the capillary action and capillary electrical phenomenon of the fine contact hole. These methods will be explained below.

After a lower wiring was formed on an Si substrate, an interlayer insulating film was formed all over the upper surface of the substrate. Then, a contact hole and a wiring groove were formed in the interlayer insulating film. Then, in the same manner as illustrated in the above example, an Al—Sn alloy was deposited on the Si substrate so as to fill it down to the bottom of the contact hole. Then, the substrate was heated until a liquid phase was formed. As a result, it was found possible to fill and retain the Al—Sn alloy in the contact hole and wiring groove through a capillary action. When the substrate was cooled under this condition and then held at a constant temperature, the precipitation of a plug mainly consisting of Al was recognized.

Then, an ion shower or a low energy electron was applied to this substrate in the heating process, and at the same time, a bias was applied to the substrate, thereby increasing the $SN^{2+}$ in the Al—Sn alloy. The substrate was kept in this state for a while during which the substrate was insulated entirely from the apparatus. As a result, the surface energy of the Al—Sn alloy was decreased and the fine contact hole was filled uniformly and stably with the Al—Sn alloy without generating void, thus making it possible to effectively form an Al precipitation plug from this liquid phase.

As an alternative method, an Al—Sn alloy was deposited on the Si substrate so as to fill it down to the bottom of the contact hole. Then, the substrate was held in a strong magnetic field while electrically insulating the substrate, thereby allowing an eddy current to generate and at the same time allowing the electric charge to be temporarily held by the surface of the substrate. As a result, almost the same effects as mentioned were obtained.

EXAMPLE 45

A method of modifying the surface of an oxide film for forming a pattern, which is useful for improving the wettability of a liquid phase metal or a liquid phase alloy will be explained with reference to the same FIGS. 49A to 49C.

Figure 49A:
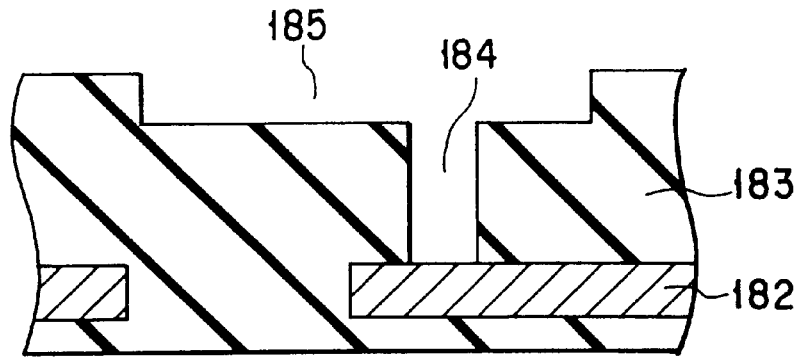
FIGS. 49A to 49C show respectively a cross-sectional view illustrating the method of modifying the surface of oxide film according to Example 46.
Figure 49B:
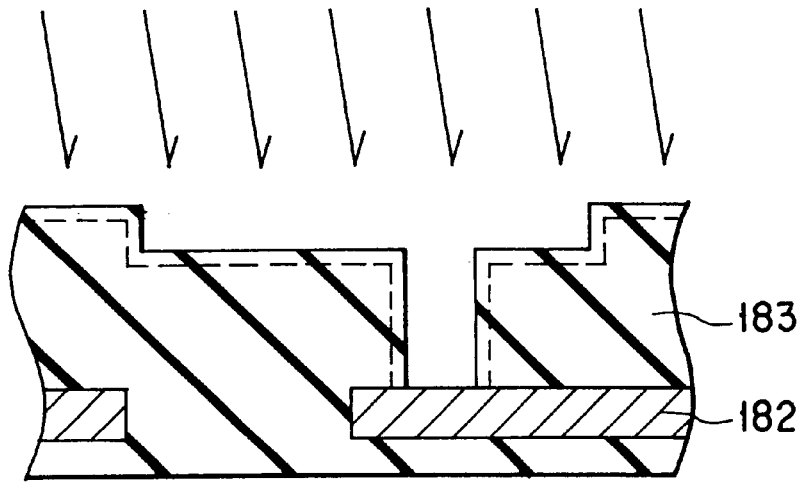
Figure 49C:
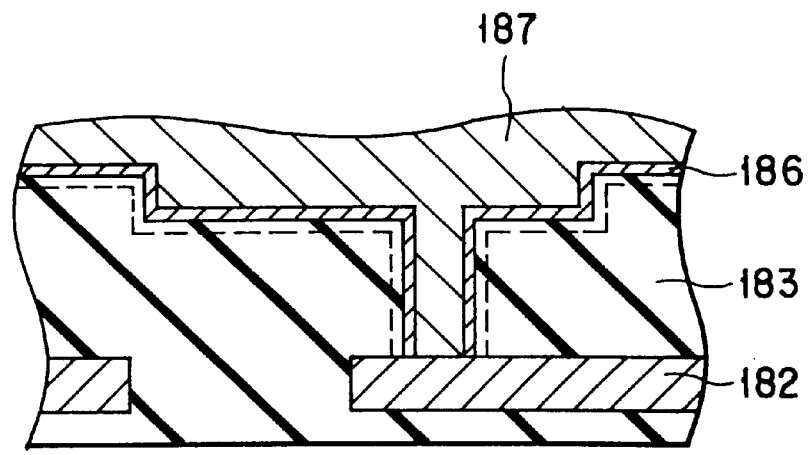

As shown in FIG. 49A, a lower wiring layer 182 and an oxide film 183 are formed on a substrate 181 provided with a contact hole 184 and with a wiring groove 185, and then one or more kinds of inert gas ion selected from Ar, He, Ne and Xe ions are implanted all over the surface of the substrate 181 by means of a low accelerated ion implantation method (FIG. 49B). This ion implantation is performed in a manner to enable the ions to reach to the surface of the oxide film 183 and to the inner wall of the contact hole 184. For example, when the contact hole is 10 in aspect ratio and 0.1 µm in inner diameter, the ions can be introduced with a tilt angle of θ=tan−1 (0.1), thereby to enable a sufficient amount of ions to reach to the inner wall of the contact hole 184. It would be more effective if the incident energy is set to a sufficiently low level to ensure the Rp of the ions would become 1 to 2 nm on the surface of the oxide film 183.

By cutting the Si—O bond of the surface of the oxide film in this manner, the surface will be conditioned such that an interface reaction would be easily taken place between the surface of the oxide film with the liquid phase of the Sn film or Al—Sn alloy.

As a result, a surface modified layer having a good wettability with Sn or Al—Sn alloy is formed.

Under this condition, an Al—Sn alloy is deposited by means of sputtering, and then the substrate is heated to obtain a liquid phase of the Al—Sn alloy. Alternatively, an Al—Sn alloy is deposited by means of sputtering while the substrate is heated to obtain the liquid phase likewise. At this moment, a surface reaction layer 186 is formed at the interface between the oxide film and the Al—Sn alloy. As a result, the liquid phase of the Al—Sn alloy or a simple Sn film 187 can be filled down into the bottom of the contact hole by taking advantage of the excellent wettability thereof with this surface reaction layer 186.

EXAMPLE 46

Figure 50A:
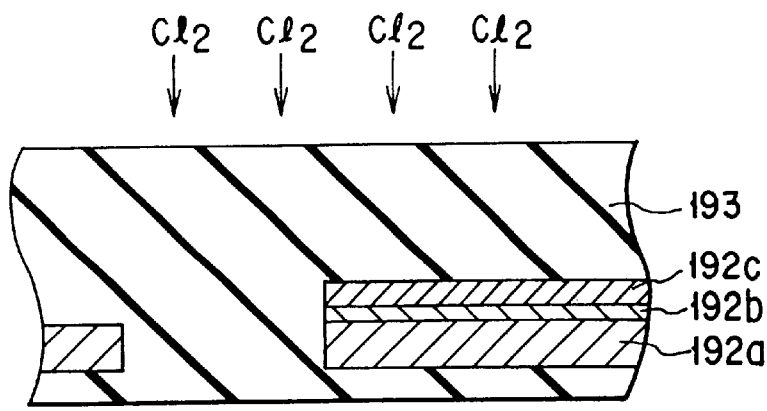
FIGS. 50A to 50C show respectively a cross-sectional view illustrating the method of forming a connecting plug and groove wiring according to Example 47.
Figure 50B:
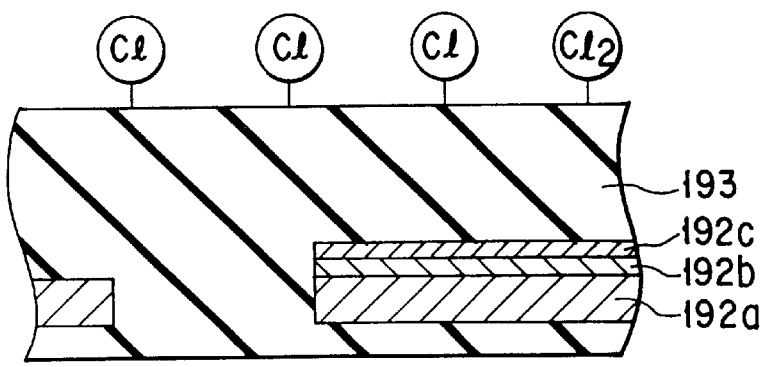

A process of forming a connector plug and a groove wiring according to this example will be explained with reference to the same FIGS. 50A to 50C.

After a lower Al wiring layer 192 is formed on a substrate 191, a Ti/TiN laminate films 192*b* and 192*c* are deposited as a barrier metal and then an $SiO_2$ film 193 is deposited as an interlayer insulating film. Then, the surface of the interlayer insulating film 193 is subjected to a treatment by making use of a low accelerated ion implantation employing a gas mainly consisting of $Cl_2$, a reverse sputtering or the RIE (FIG. 50A). As a result, the entire surface of the interlayer insulating film 193 is terminated with chlorine or adsorbed with chlorine (FIG. 50B).

Figure 50C:
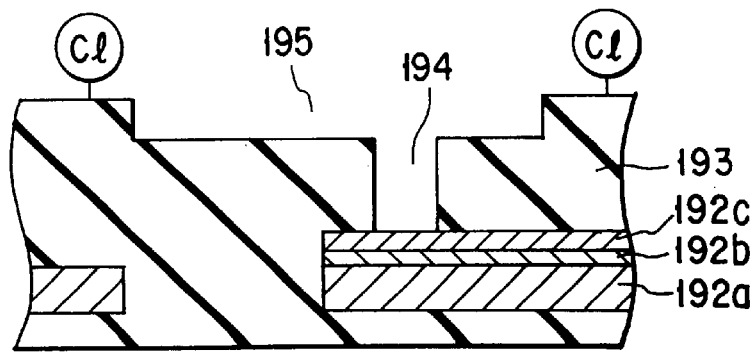

Subsequently, the interlayer insulating film 193 is selectively etched by making use of photolithography and etching to form a contact hole 194 and a wiring groove 195 (FIG. 50C).

Then, the contact hole 194 and the wiring groove 195 are filled with an Sn film or an Al—Sn film. Since the surface of the interlayer insulating film 193 is already conditioned to allow a formation of an Sn chloride having a high vapor pressure, thus hardly permitting the adsorption of Sn or Al—Sn alloy, the Sn and Al—Sn are now allowed to preferentially enter into the contact hole 194 and the wiring groove 195. As a result, the contact hole and the wiring groove can be effectively filled with the Sn film or Al—Sn film at the occasion of the deposition of the Sn film or Al—Sn film, or at the occasion of forming the liquid phase thereof through heating.

EXAMPLE 47

In the step of filling the contact hole and the wiring groove with an Al—Sn film or an Sn film, or in the step of precipitating Al through heating and maintaining a constant temperature of an Al—Sn alloy in the above example, it is preferable to make a structure wherein a material which is excellent in wettability to the Al—Sn film or an Sn film is exposed at the bottom of the contact hole for the purpose of stably retaining an Al—Sn alloy in the contact hole and the wiring groove. It would be possible with such a structure to effectively form a liquid phase of the Al—Sn alloy in the contact hole and the wiring groove, thus making it possible to obtain ultimately an Al precipitation film which is excellent in buried structure.

Therefore, the contact hole should be formed in such a manner that a silicide film is exposed over an lower wiring or over a pn junction, or that the surface of barrier metal of an lower wiring or the surface of reflection-preventing film for lithography is exposed. Alternatively, a barrier metal or an underlying film excellent in wettability may formed in the contact hole and the wiring groove after these contact hole and wiring groove are formed.

A film useful in this case is a film which is higher in surface energy than that of an $SiO_2$ film (surface energy: 605 $erg/cm^2$), e.g. a Ta film (surface energy: 2130 $erg/cm^2$), an Ni62-Nb38 film (surface energy: 1326 $erg/cm^2$) or a Ta-60 at % Al film (surface energy: 1640 $erg/cm^2$) in the case of amorphous film. A nitride, carbide or silicide, such as TiN, TiC, TiB, $TiB_2$, $TiSi_2$, ZrN, ZrC and $ZrSi_2$ are high in surface energy, so that these materials are also useful. In the case of groove wiring, these films should preferably be deposited only on the bottom thereof by means of anisotropic sputtering. In the case of the contact hole having a large inner diameter or the groove wiring having a large width, these films may be formed at least partially in the contact hole or in the groove.

As for the underlying layer which is capable of generating a nucleus of Al precipitation, a film which is capable of forming VC, TiC, $TiB_2$, $AlB_2$, ZrC, NbC and $W_2C$ is useful.

These films can be produced by means of sputtering employing a target containing these elements. As for the carbide and boride, they may be formed by a process wherein Vi, Ti, Al, Zr, Nb or W is deposited at first, after a contact hole is formed therein, an ion implantation of C or B is performed, and then annealing is performed to modify the surface, thus obtaining a carbide film or a boride film.

In the foregoing explanation, a film consisting of a compound is illustrated. However it is also possible to employ a film consisting a single element.

EXAMPLE 48

The step of precipitating Al will be explained with reference to FIG. 51.

Figure 51:
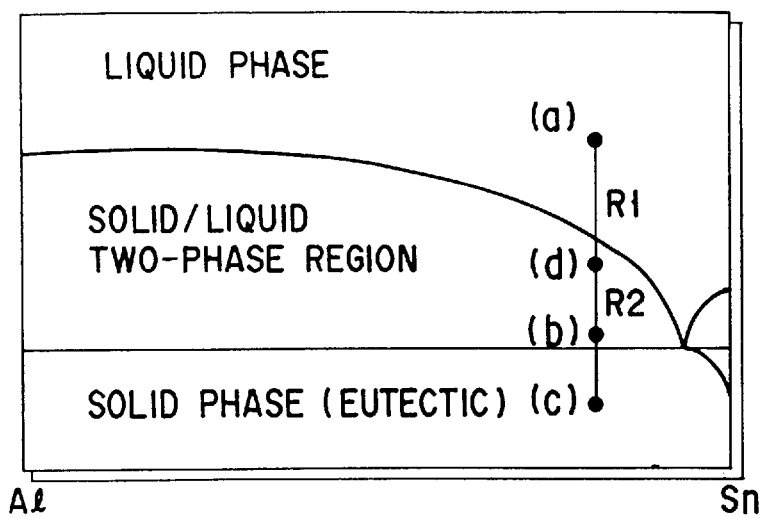
FIG. 51 shows a graph illustrating a phase diagram of Al—Sn.

In the case of Example 35, the liquid phase of Al—Sn alloy is obtained at a point (a) in FIG. 51, which exceeds a temperature of 420° C., then the temperature thereof is decreased down to a point (b) of two-phase (solid/liquid phase) region, for example 350° C., and after maintaining the temperature at this point, the temperature is finally decreased down to a point just over the eutectic temperature thereof.

However, it is also possible to obtain an excellent precipitation of Al and an excellent filling property even in a process wherein the temperature decreased down to the point (b) which is higher than 228° C. and is just over the eutectic line in one time, and after maintaining the temperature at this point, the temperature is decreased to the point (c) to finally obtain a solid phase.

In the step of precipitating Al, the equilibrium concentration in liquid phase is caused to change through a decrease of temperature or through a selective etching of Sn, and a portion of Al corresponding to the difference between these equilibrium concentrations is caused to precipitate. The following Table 1 shows the equilibrium concentrations of Al and Sn in each temperature. This phenomenon is also applicable to other kinds of material. The following Table 2 shows the equilibrium concentrations of Cu and Bi in each temperature.

TABLE 1

| Liquid phase temp. and comp. in Al—Sn eutectic alloy | | |
|---|---|---|
| | Al | Sn |
| 300° C. | 3.2 | 96.8 (at %) |
| 350° C. | 7.6 | 92.4 (at %) |
| 400° C. | 12.0 | 88.0 (at %) |
| 450° C. | 18.6 | 81.2 (at %) |

TABLE 2

| Liquid phase temp. and comp. in Cu—Bi eutectic alloy | | |
|---|---|---|
| | Cu | Bi |
| 300° C. | 0.8 | 99.2 (at %) |
| 400° C. | 2.0 | 98.0 (at %) |
| 450° C. | 2.9 | 97.1 (at %) |

In the step of decreasing the temperature down to a temperature which is lower than the eutectic temperature, the step of maintaining the temperature at a constant point after a decrease of temperature is not confined to once but the step may be repeated twice or more. Further, the step of temperature decrease and the step of maintaining temperature may not necessarily be performed in the relationship of 1:1, but the temperature may be gradually decreased.

Even if the cycle of "temperature decrease/maintaining of temperature to temperature increase (solid/liquid two-phase co-existing region) to temperature decrease/maintaining" is repeated a plural times in the step of increasing the temperature up to a temperature which was higher than the eutectic temperature, it was possible to obtain an excellent filling property. Furthermore, when the temperature decreasing rate in the step of decreasing the temperature down to a point (d) in the solid/liquid two-phase co-existing region is defined as R1, and the temperature decreasing rate from the point (d) to the point (b) is defined as R2, even if the relationship between R1 and R2 was in the condition of R1>>R2 or in the condition of R1–R2, an excellent filling property of Al, i.e. free from void and uniform in thickness, was obtained.

EXAMPLE 49

Specific examples related to the deposition and heating steps of an Al—Sn film or an Sn film in the above example will be explained in reference to FIGS. 52A and 52B.

Figure 52A:
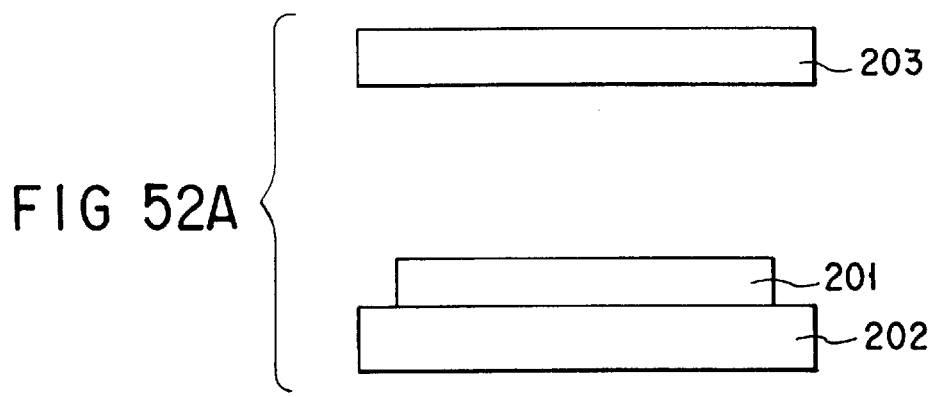
FIGS. 52A and 52B show respectively a schematic view illustrating the deposition and heating steps of an Al—Sn film and an Sn film according to Example 50.

Reference to FIG. 52A, an Si substrate 201 is mounted on a heating/cooling means 202, and an infra-red lamp 203 is disposed over the Si substrate 201.

At the occasion of initially depositing an Al—Sn alloy or an Sn on the contact hole and the wiring groove which are formed on the Si substrate 201, a descending temperature gradient, i.e. at first from the bottom side of the contact hole to the upper surface side is caused to be generated. Namely, the sputtering of the Al—Sn alloy or the Sn is performed while directly heating the bottom of the substrate 201 by making use of the heating/cooling means 202. In this case, the deposition is performed by heating the substrate 201 at the temperature or more which enables a liquid phase to be obtained with the film composition being sputtered (283° C. or more in the case of the Sn film), and at the same time, by controlling the deposition rate which meets the condition of a<b (wherein "a" is a film thickness of liquid phase metal which has been deposited in the contact hole. and in the wiring groove; and "b" is a film thickness of liquid phase metal which has been deposited on the side wall of the contact hole) (FIG. 52B).

After the filling of the Al—Sn alloy and Sn is finished, the cooling of the bottom of the substrate 201 to a temperature which is higher than 228° C. and is just over the eutectic line is performed by making use of the heating/cooling means 202, while heating the upper surface of the substrate 201 up to a temperature which is not less than the liquid phase temperature. Namely, the precipitation of Al in the contact hole is performed under a condition wherein the temperature gradient is opposite to the initial stage of metal deposition.

With respect to the means for generating the temperature gradient, the substrate is heated directly from the bottom of the substrate 201 by making use of the heating/cooling means 202 at the occasion of initially depositing an Al—Sn alloy or an Sn.

However, the substrate may be heated as follows. Namely, an electrode pad is taken out from the Al wiring of lower layer and the substrate is mounted on susceptor which is capable of directly conducting current or heat. Under this condition, the Al of lower layer is utilized as a heating element, thus heating the bottom of the substrate and generating a desired temperature gradient.

Figure 52B:
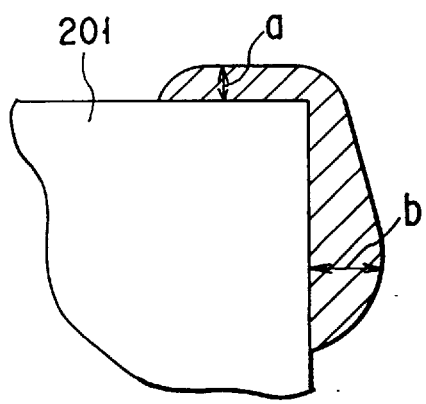

Alternatively, as shown in FIG. 52B, the substrate may be irradiated with an infra-red lamp 203 from the surface thereof. In this case, since $SiO_2$ permit infra-red ray to pass therethrough and the absorption of heat is effected only by the wiring disposed directly below the lamp, the Al wiring of the lower layer can be functioned as a heating element, thus selectively increasing the temperature of the opening of the contact hole and hence promoting the filling. The heating of substrate at the step of precipitating Al may be also performed by making use of the infra-red lamp, i.e. the upper deposition film is heated with the infra-red lamp, thus raising the temperature of the upper surface side.

These heating steps may be effectively performed in a high vacuum chamber, or in a reductive atmosphere containing $SiH_4$, $SiH_2$ or hydrogen. Moreover, the step of forming a film and the step of heat treatment may be conducted continuously, the transfer of the substrate being performed without breaking vacuum.

EXAMPLE 50

A process of forming a connector plug and a groove wiring according to this example will be explained with reference to the same FIGS. 40A to 40E.

First of all, a first wiring layer 102 is formed on a Si substrate 101 provided with an element (not shown). Then, an interlayer insulating film 103 is formed over the first wiring layer 102.

Then, the interlayer insulating film 103 is selectively etched by making use of photolithography and the RIE to form a contact hole 104 connecting with the first wiring layer 102 and a wiring groove 105 (FIG. 40A).

Then, a native oxide film formed on the upper surface of the first wiring layer 102 which has been exposed on the bottom of the contact hole 104 is removed by means of a surface treatment such as a reverse sputtering. Then, the contact hole 104 and the wiring groove are filled with a Cu—Bi by means of a directional sputtering such as the collimation sputtering or a low pressure-long distance sputtering. In this case, the substrate may be heated to fluidize the Cu—Bi thereby to introducing them into the contact hole and the wiring groove. Alternatively, they may be filled in the of liquid phase or by the combination of liquid phase and pressure as illustrated hereinabove (FIG. 40B).

Then, the substrate is heated to obtain the liquid phase of the Cu—B deposited in advance. Then, this liquid phase Cu—Bi alloy is cooled down to the solid liquid two-phase region, or the Bi is selectively removed thereby to shift the equilibrium concentration thereof. As a result, an excessive amount of Al film is allowed to exude from the equilibrium concentration and hence to be precipitated on the insulating film, thus forming a precipitated Cu film in the contact hole and wiring groove. This precipitated Cu film includes Bi the quantity of which is not larger than the maximum concentration where the Bi of liquid phase can be equilibrated with the Cu to be precipitated due to the formation of liquid phase of Cu—Bi film in the contact hole and wiring groove. Therefore, this precipitated Cu film is mainly consisted of Cu.

Then, the Bi film, Bi—Cu alloy and Cu film which are segregated outside of the contact hole 104 and the wiring groove 105 are removed by means of the RIE etch-back or CMP, thus forming a connector plug and groove wiring.

EXAMPLE 51

A process of forming a connector plug and a groove wiring according to this example will be explained with reference to FIGS. 53A to 53D.

Figure 53A:
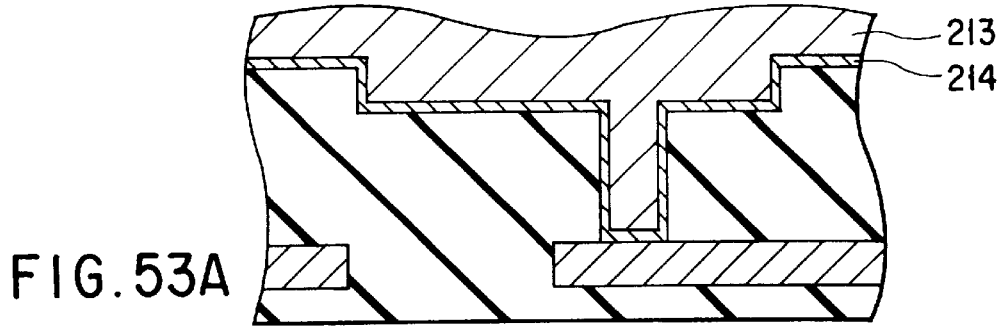
FIGS. 53A to 53D show respectively a cross-sectional view illustrating the method of forming a connecting plug and groove wiring according to Example 52.

The contact hole and the wiring groove are filled with a fused metal film 213 consisting of W—Bi by means of various methods explained above, thereby. precipitating a thin W film 214 in the contact hole and the wiring groove (FIG. 53A).

Figure 53B:
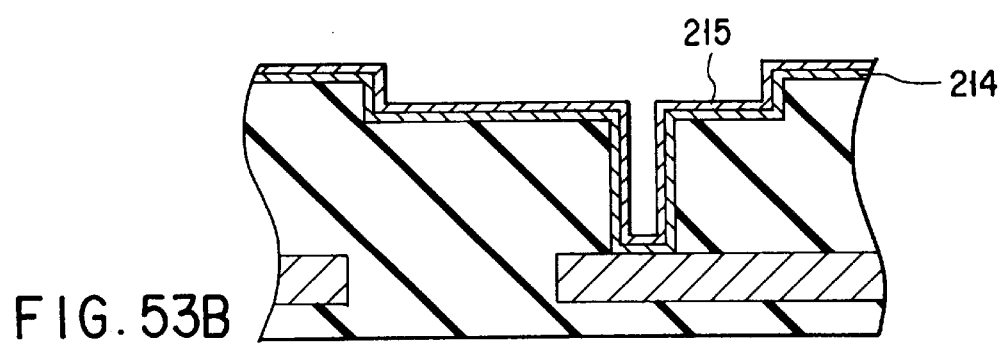

Then, a superfluous portion of Bi is removed by means of the RIE employing a chlorine-containing gas, and a W film 214 is allowed to expose. Then, the substrate is set in a chamber provided with gas inlet ports of $N_2$ and $NH_3$, in which the surface of the W film is nitrided through annealing, by means of plasma, by using a high pressure, or through annealing accompanied in advance by an ion implantation, thereby forming WNx film 215 (FIG. 53B).

Figure 53C:
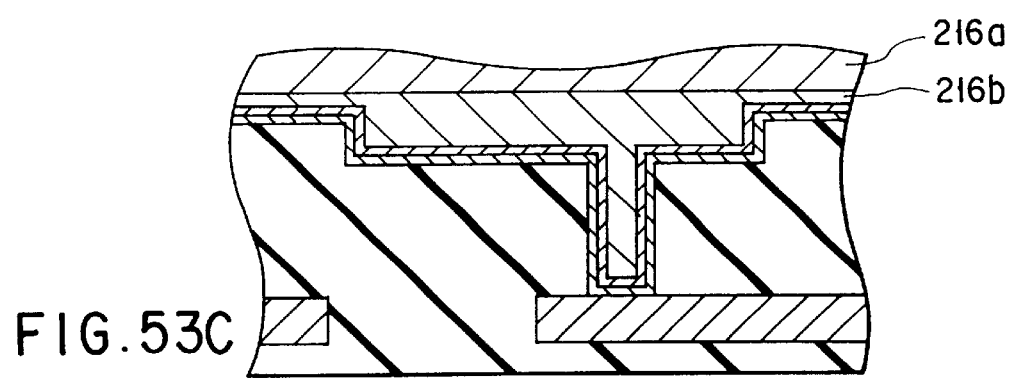

Then, the contact hole and the wiring groove are filled again with a fused metal film 216 consisting of Cu—Bi, thereby precipitating a Cu film 216b, thereby forming a precipitated Cu plug covered with WNx barrier metal film 215 (FIG. 53C).

Figure 53D:
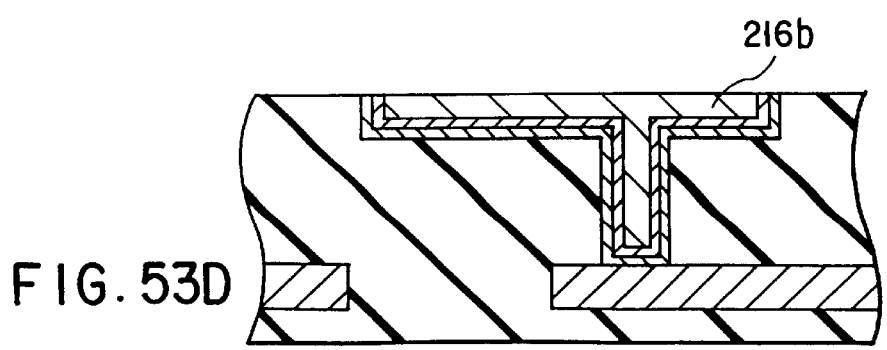
Figure 54A:
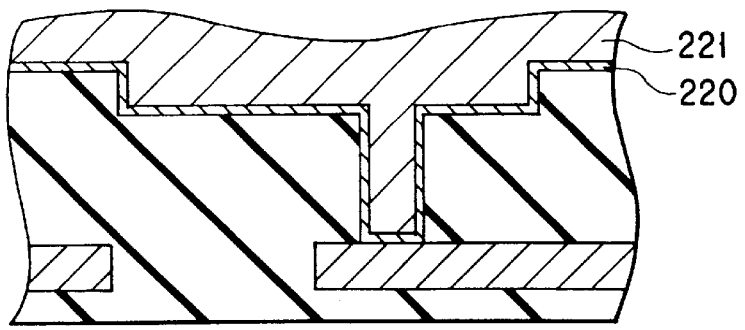
FIGS. 54A to 54D show respectively a cross-sectional view illustrating the method of forming a connecting plug and groove wiring according to a modified embodiment of Example 54.
Figure 54B:
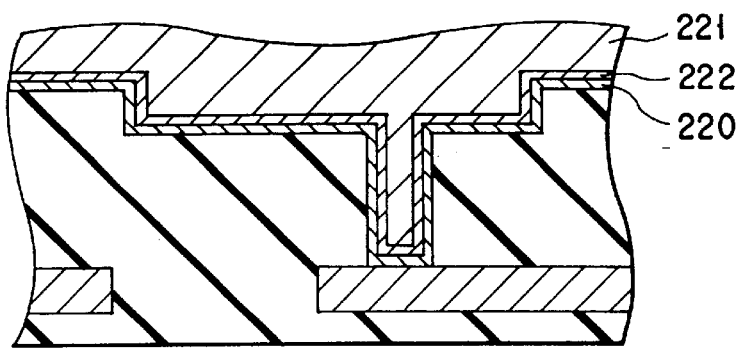
Figure 54C:
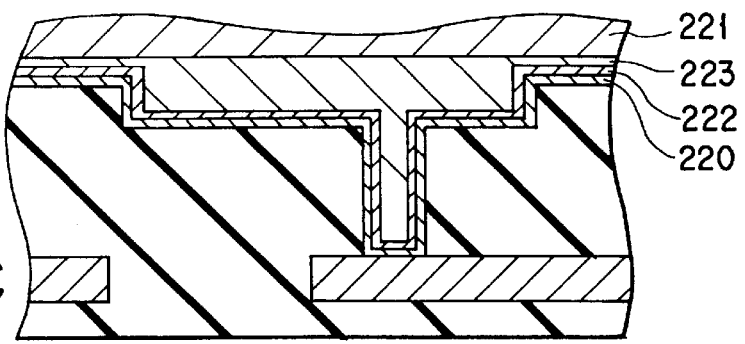
Figure 54D:
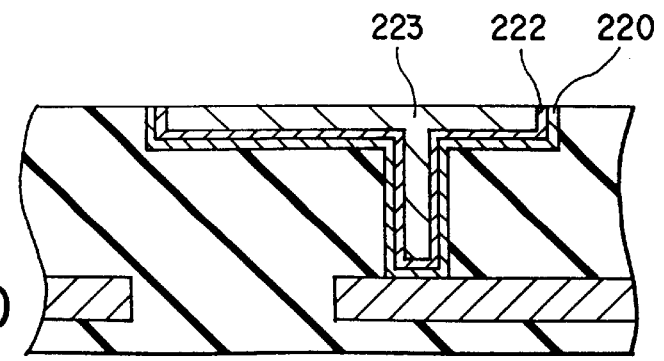

Then, the superfluous portions of Cu—Bi, Bi and Cu film which are segregated outside of the contact hole and the wiring groove are removed as mentioned in the previous examples by means of the RIE or CDE etch-back employing $Cl_2$, $Br_2$ or $F_2$, or CMP (FIG. 53D).

EXAMPLE 52

A process of forming a connector plug and a groove wiring according to this example will be explained with reference to the same FIGS. 53A to 53D as employed in Example 51.

The contact hole and the wiring groove are slightly covered with a fused metal film 213 consisting of W—Ge by means of various methods explained above, thereby precipitating a thin W film 214 in the contact hole and the wiring groove (FIG. 53A).

Then, a Ge-containing W film 214 or a Ge/W laminate film is allowed to expose in the same manner as explained in the previous example. Then, the substrate is set in a chamber provided with gas inlet ports of $N_2$ and $NH_3$, in which the surface of the W film 214 is nitrided through annealing, by means of plasma, by using a high pressure, or through annealing accompanied in advance by an $N_2$ ion implantation thereby forming WN film or W—Ge—N film 215 (FIG. 53B).

Then, the contact hole and the wiring groove are filled again with a fused metal film 216 consisting of Cu—Bi, thereby precipitating a Cu film 216b, thereby forming a precipitated Cu plug covered with WN film or WGeN barrier metal film 215 (FIG. 53C).

Then, the superfluous portions of Cu—Bi, Bi and Cu film which are segregated outside of the contact hole and the wiring groove are removed as mentioned in the previous examples by means of the RIE or CDE etch-back employing $Cl_2$, $Br_2$ or $F_2$, or CMP.

EXAMPLE 53

A process of forming a connector plug and a groove wiring according to this example will be explained with reference to FIGS. 54A to 54D.

The contact hole and the wiring groove are filled with a barrier metal such as WN or WSiN film 220 by means of the CVD. Then, the contact hole and the wiring groove are filled again with a fused metal film 221 consisting of W—Cu—Bi by means of various methods explained above (FIG. 54A).

Then, the fused metal film 221 is cooled from the fused condition thereby precipitating at first W on the WN film 220, and then Cu, thereby forming a WN film or WSiN film 222 as well as a Cu film 223 exhibiting an excellent adhesivity.

After this precipitated Cu plug is formed, the superfluous portions of Cu—Bi, Bi and Cu film which are segregated outside of the contact hole and the wiring groove are removed as mentioned in the previous examples by means of the RIE or CDE etch-back employing $Cl_2$, $Br_2$ or $F_2$, or CMP.

EXAMPLE 54

Figure 55A:
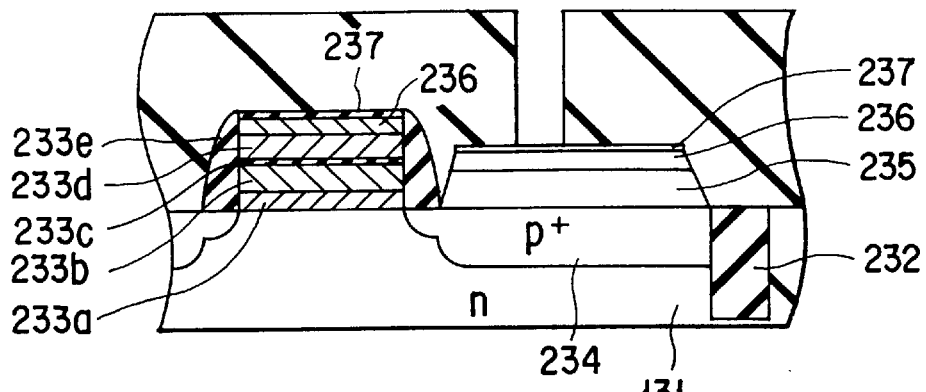
FIGS. 55A to 55C show respectively a cross-sectional view illustrating the method of forming a connecting plug and groove wiring according to Example 55.

A process of forming a connector plug and a groove wiring according to this example will be explained with reference to FIGS. 55A to 55 D.

An Si semiconductor substrate 231 provided with an oxide film 232, a gate electrode 233, and an SiN film 233 e having a thickness of 150 nm formed on the side wall of gate electrode 233 are prepared. Then, an impurity diffusion region 234 is formed by means of ion implantation in the exposed surface portion (or where silicon is exposed) of the substrate 231. Then, a B-doped epitaxial Si film 235 is selectively deposited by means of the CVD, and then a Ti/TiN film is further deposited, after which a $TiSi_2$ film 236 is further formed by way of the RTA process.

Subsequently, the residual Si, Ti and TiN are removed by means of the RIE, thus leaving the silicide film and TiN film 237 which are deposited on the diffusion layer. Then, an interlayer insulating film 238a consisting of $SiO_2$/BPSG is deposited to a thickness of 1.2 μm and made flat by means of CMP, and then a contact hole is formed therein (FIG. 55A).

In the same manner as illustrated in the previous example, after an Al—Sn alloy is filled in the contact hole, an Al precipitation plug 239a is formed through a heat treatment. Then, a superfluous portion of the Sn layer, Al layer and Al—Sn layer are removed by means of the CMP. It is preferable in this case to perform a reductive heat treatment in a reductive atmosphere after the removal of these Sn layer, Al layer and Al—Sn layer in order to improve a contacting property of the contact portion.

Figure 55B:
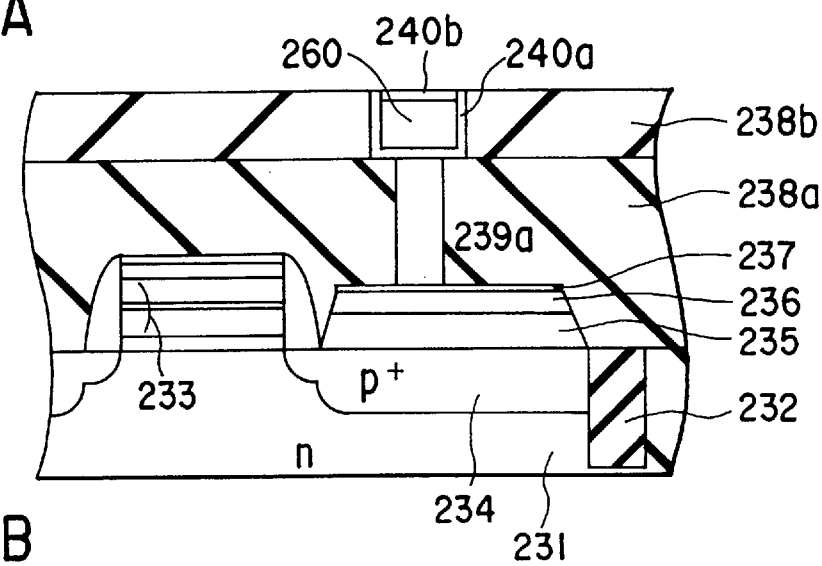

Then, an interlayer insulating film 238b is deposited to a thickness of about 1.0 μm and made flat by means of CMP, and then a groove for filling a first wiring is formed therein. Thereafter, a Ti/Ti nitride laminate film 240a to be functioned as a barrier film is formed in this groove, and then exposed to an oxidizing atmosphere to stuffing the surface of the TiN film, in which a Cu film 260 is deposited to a thickness of 0.3 μm by means of sputtering (FIG. 55B).

The surface of substrate is then subjected to a treatment with the CMP thereby to leave the Cu wiring only in the groove, thus removing the Cu deposited on the oxide film. A Ti/Ti nitride laminate film 240b to be functioned as a barrier film is formed thereon, and then a superfluous portion of the Ti/Ti nitride laminate film which is deposited on the insulating film is removed. An interlayer insulating film 238c is then deposited thereon. A contact hole is then formed in this interlayer insulating film 238c, and an precipitated Al plug 239b is formed in the contact hole in the same manner as described above.

Figure 55C:
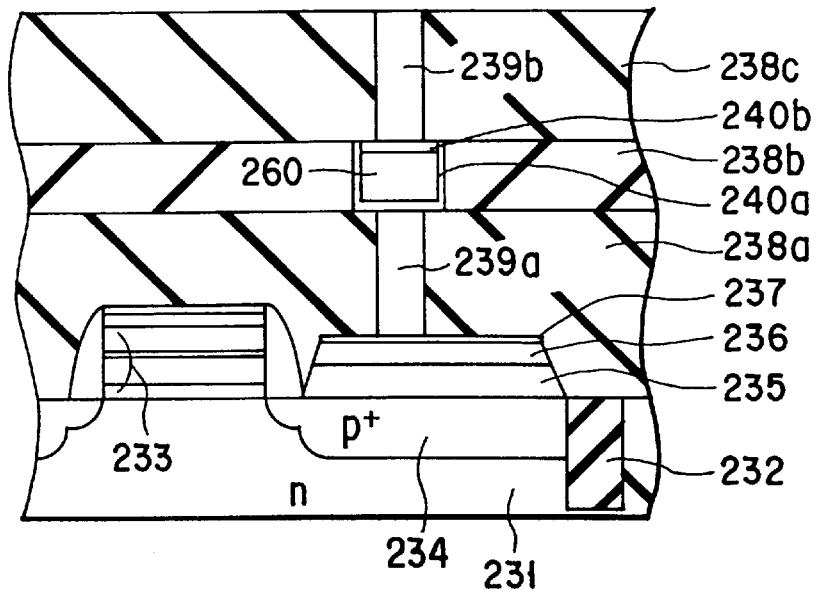

Likewise, the formation of an Al precipitation plug through precipitation from a fused metal is repeated employing a material consisting mainly of Cu as a wiring, and an Al—Sn alloy as a plug (FIG. 55C). As a result, the difficulty of assuring the barrier property by a barrier in the contact hole in the formation of a Cu plug has been dissolved by employing an Al plug which can be precipitated from a fused Al—Sn alloy. At the same time, by constituting the wiring with Cu, the problems of resistance and reliability which are involved in the formation of wiring has been overcome, thus making it possible to form a wiring excellent in reliability through a relatively simple process.

In the foregoing explanation of this example, the Cu wiring is surrounded by a barrier metal. However, the barrier metal can be dispensed with if an insulating film which is capable of preventing the diffusion of Cu is employed.

The combination of materials in the Examples 35 to 54 is not confined to the binary alloy, but may be ternary or more. In the Examples 35 to 54, the explanation has been made centering on the Al—Sn system. However, this invention is not confined to Al—Sn system. When a material to be filled is Al, a low melting point metal to be used together may be selected from Ga, Hg and Ge other than Sn. When a material to be filled is Cu, Bi can be employed as a low melting point metal. When a material to be filled is Ag, Tl can be employed as a low melting point metal. When a material to be filled is W, a low melting point metal to be used together may be selected from Hg, Ga, Ge, Bi, Pr and Pu. Further, Ge and SiGe can be substituted for Si. As for the low melting point metal to be combined in this case, the same materials as in the case of Si can be employed.

In the above examples, the explanation is mainly centered on the manufacture of a connector-plug and groove wiring. However, the wiring may be formed according to the RIE without employing this invention, and the resultant wiring may be used in combination with a connector plug which has been manufactured according to this invention. The Al film employed in Examples 41, 50 to 53 may be substituted by an Al alloy film, such as Al—Cu, Al—Si—Cu.

The term of "liquid phase" employed in this specification is not confined to a fused metal which is to be formed by heating, but includes a state of solid/liquid two-phase coexistence where the precipitation of conductive film is to be initiated due to a change in equilibrium concentration. The gist of this invention resides in the solid precipitation of a conductive film from the condition of liquid phase which exceeds sufficiently beyond the liquid phase line while maintaining the solid/liquid two-phase coexisting region as well as the coexistence.

In Examples 35 to 55, liquid phase line, solid phase line, eutectic point, crystallizing amount, or the like is shown as a value in the equibrium state at normal pressure. However, the present invention is not limited to these cases. The present invention can be applied to the case under the other pressure.

It should be noted that in addition to the combinations set forth in the above examples, various combinations are possible.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

What is claimed is:

1. A method of manufacturing semiconductor device which comprises the steps of:

forming an insulating film on a semiconductor substrate provided with a conductive layer;

forming a contact hole through said insulating film to a depth reaching to said conductive layer and forming a wiring groove in said insulating film;

forming a substitutive film so as to incompletely fill interiors of said contact hole and said wiring groove, but at least partially filling said interior of contact hole with said substitutive film;

forming a conductive film at a region comprising said contact hole and said wiring groove;

forming an absorption layer on said conductive film, and filling said interiors of said contact hole and said wiring groove with said conductive film by substituting said conductive film for said substitutive film and by allowing said substitutive film to be absorbed by said absorption layer under a heat treatment; and removing a compound formed in said process of allowing said substitutive film to be absorbed by said absorption layer, and forming a plug comprising said conductive film in said contact hole as well as a wiring comprising said conductive film in said wiring groove by working said conductive film so as to selectively leave said conductive film in said interiors of said contact hole and said wiring groove.

2. A method of manufacturing semiconductor device which comprises the steps of:

forming a first insulating film on a semiconductor substrate provided with a conductive layer;

forming a contact hole through said first insulating film to a depth reaching to said conductive layer;

forming a substitutive film in an interior of contact hole;

forming a second insulating film all over an upper surface of the substrate;

forming a wiring groove in said second insulating film in a manner to connect it with said substitutive film;

forming a conductive film at a region comprising said contact hole and said wiring groove;

forming an absorption layer on said conductive film, and filling said interiors of said contact hole and said wiring groove with said conductive film by substituting said conductive film for said substitutive film and by allowing said substitutive film to be absorbed by said absorption layer under a heat treatment; and removing a compound formed in said process of allowing said substitutive film to be absorbed by said absorption layer, and forming a plug comprising said conductive film in said contact hole as well as a wiring comprising said conductive film in said wiring groove by working said conductive film so as to selectively leave said conductive film in said interiors of said contact hole and said wiring groove.

3. A method of manufacturing semiconductor device which comprises the steps of:

forming an insulating film on a semiconductor substrate provided with a conductive layer;

forming a contact hole through said insulating film to a depth reaching to said conductive layer;

forming a substitutive film at least in an interior of the said contact hole;

forming a wiring groove in said insulating film;

forming a conductive film at a region comprising said contact hole and said wiring groove;

forming an absorption layer on said conductive film, and filling said interiors of said contact hole and said wiring groove with said conductive film by substituting said conductive film for said substitutive film and by allowing said substitutive film to be absorbed by said absorption layer under a heat treatment; and removing a compound formed in said process of allowing said substitutive film to be absorbed by said absorption layer, and forming a plug comprising said conductive film in said contact hole as well as a wiring comprising said conductive film in said wiring groove by working said conductive film so as to selectively leave said conductive film in said interiors of said contact hole and said wiring groove.

* * * * *